United States Patent [19]
Kajigaya et al.

[11] Patent Number: 5,854,508
[45] Date of Patent: *Dec. 29, 1998

[54] SEMICONDUCTOR MEMORY DEVICE HAVING ZIGZAG BONDING PAD ARRANGEMENT

[75] Inventors: Kazuhiko Kajigaya; Kazuyuki Miyazawa, both of Iruma; Manabu Tsunozaki, Ohme; Kazuyoshi Oshima, Ohme; Takashi Yamazaki, Ohme; Yuji Sakai, Machida; Jiro Sawada, Kokubunji; Yasunori Yamaguchi, Tokyo; Tetsurou Matsumoto, Higashiyamato; Shinji Udo, Akishima; Hiroshi Yoshioka, Akishima; Hirokazu Saito, Tokorozawa; Mitsuhiro Takano, Tokorozawa; Makoto Morino, Akishima; Sinichi Miyatake, Tokyo; Eiji Miyamoto, Ohme; Yasuhiro Kasama, Tokyo; Akira Endo, Hachioji; Ryoichi Hori, Tokyo; Jun Etoh, Hachioji; Masashi Horiguchi, Kawasaki; Shinichi Ikenaga, Koganei; Atsushi Kumata, Kodaira, all of Japan

[73] Assignees: Hitachi, Ltd.; Hitachi VLSI Engineering Corp., both of Tokyo, Japan

[ * ] Notice: The term of this patent shall not extend beyond the expiration date of Pat. No. 5,579,256.

[21] Appl. No.: 618,381
[22] Filed: Mar. 19, 1996

Related U.S. Application Data

[63] Continuation of Ser. No. 455,411, May 31, 1995, Pat. No. 5,544,096, which is a continuation of Ser. No. 159,621, Dec. 1, 1993, Pat. No. 5,548,547, which is a division of Ser. No. 899,572, Jun. 18, 1992, abandoned, which is a continuation of Ser. No. 424,904, Oct. 18, 1989, abandoned.

[30] Foreign Application Priority Data

| Nov. 1, 1988 | [JP] | Japan | 63-277132 |
| Nov. 7, 1988 | [JP] | Japan | 63-279239 |
| Jan. 24, 1989 | [JP] | Japan | 1-14423 |
| Mar. 20, 1989 | [JP] | Japan | 1-65840 |

[51] Int. Cl.$^6$ ................................. H01L 23/48
[52] U.S. Cl. .................. 257/786; 257/666; 257/908; 257/784
[58] Field of Search .......................... 257/666, 786

[56] References Cited

U.S. PATENT DOCUMENTS

| 4,882,289 | 11/1989 | Moriuchi et al. | 357/23.6 |
| 5,068,712 | 11/1991 | Murakami et al. | 257/666 |
| 5,196,910 | 3/1993 | Moriuchi et al. | 437/52 |
| 5,331,201 | 7/1994 | Nishino | 257/666 |
| 5,579,256 | 11/1996 | Kajigaya et al. | 365/51 |

*Primary Examiner*—Teresa Maria Arroyo
*Attorney, Agent, or Firm*—Antonelli, Terry, Stout & Kraus, LLP

[57] ABSTRACT

Herein disclosed is a semiconductor memory device, in which peripheral circuits are arranged in a cross area of a semiconductor chip composed of the longitudinal center portions and the transverse center portions, and in which memory arrays are arranged in the four regions which are divided by the cross area. Thanks to this structure in which the peripheral circuits are arranged at the center portion of the chip, the longest signal transmission paths can be shortened to about one half of the chip size to speed up the DRAM which is intended to have a large storage capacity.

14 Claims, 117 Drawing Sheets

M: MEMORY CELL ARRAY
S: SENSE AMP
W: WL DRIVER
C: ARRAY CONTROL CKT

M: MEMORY CELL ARRAY
S: SENSE AMP
W: WL DRIVER
C: ARRAY CONTROL CKT

M: MEMORY CELL ARRAY
S: SENSE AMP
W: WL DRIVER
C: ARRAY CONTROL CKT

M: MEMORY CELL ARRAY
S: SENSE AMP
W: WL DRIVER
C: ARRAY CONTROL CKT

M: MEMORY CELL ARRAY
S: SENSE AMP
W: WL DRIVER
C: ARRAY CONTROL CKT
X: COMMON X-DECODER
Y: COMMON Y-DECODER

I=0, 1, 2, 3, 4, 5, 6, 7, 8, 9, 10, 11

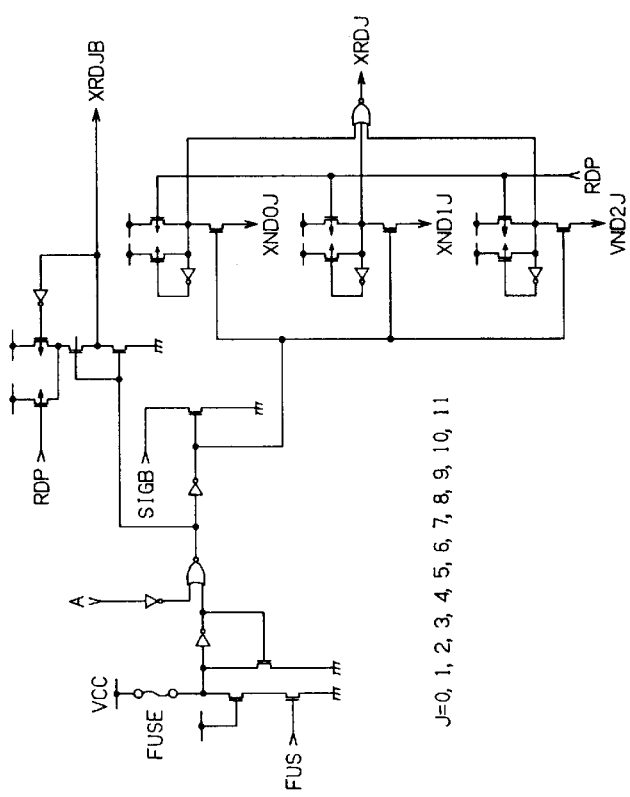
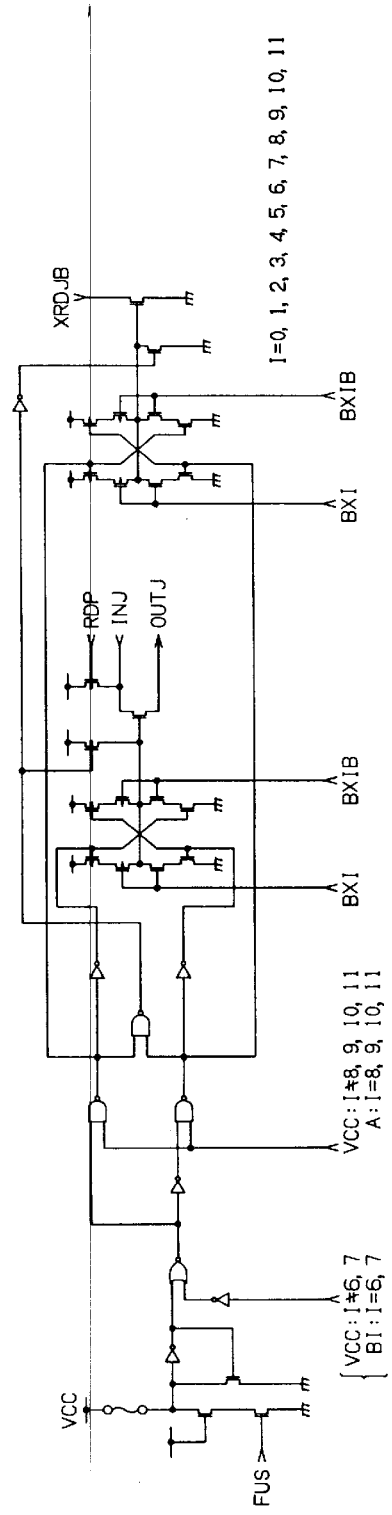
FIG. 36

FIG. 50
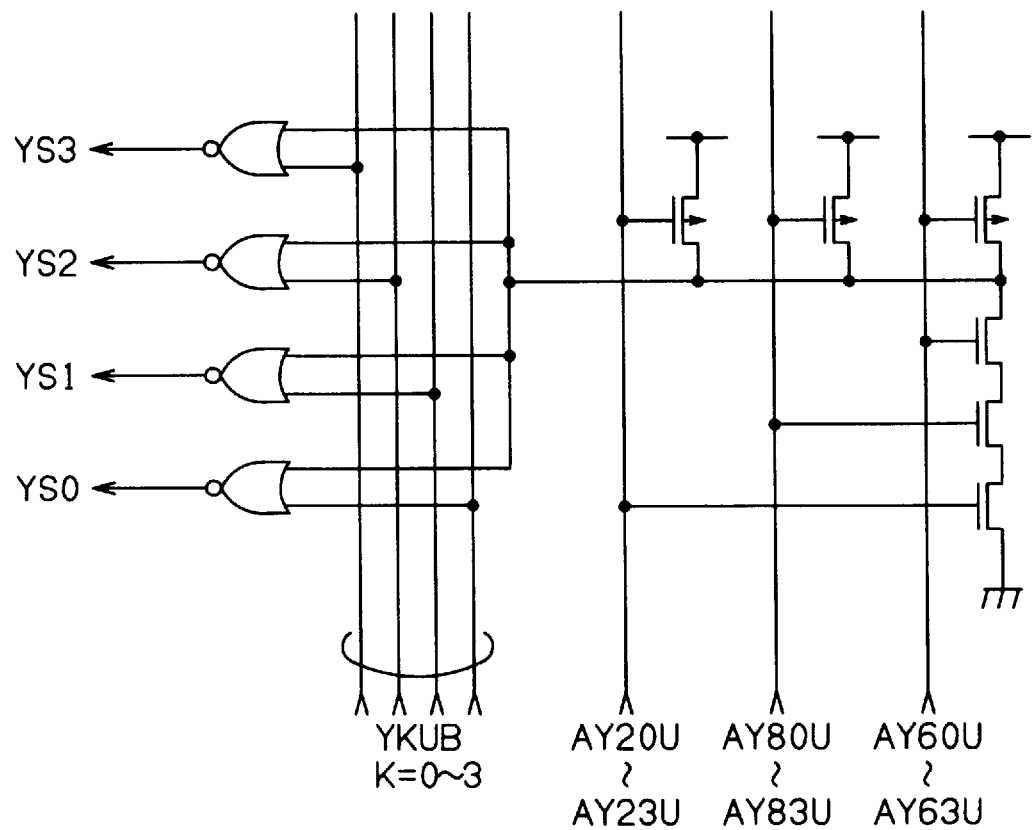
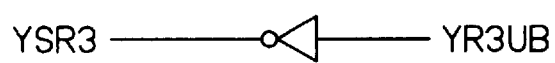
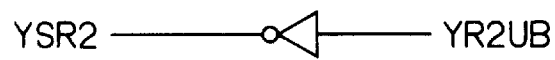
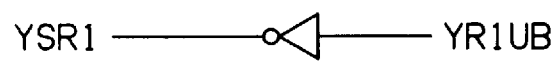
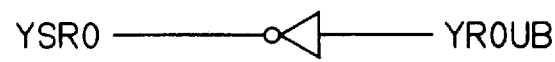

FIG. 52
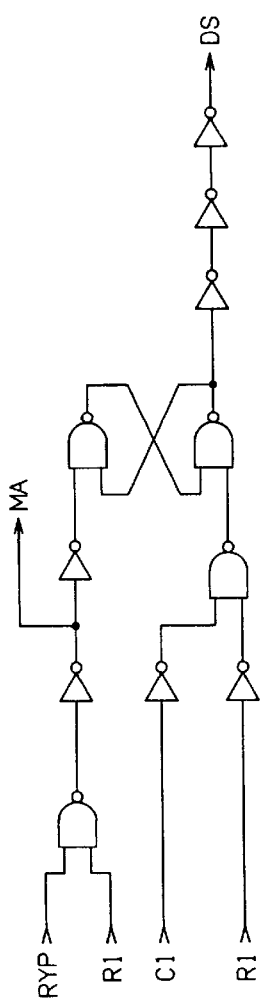
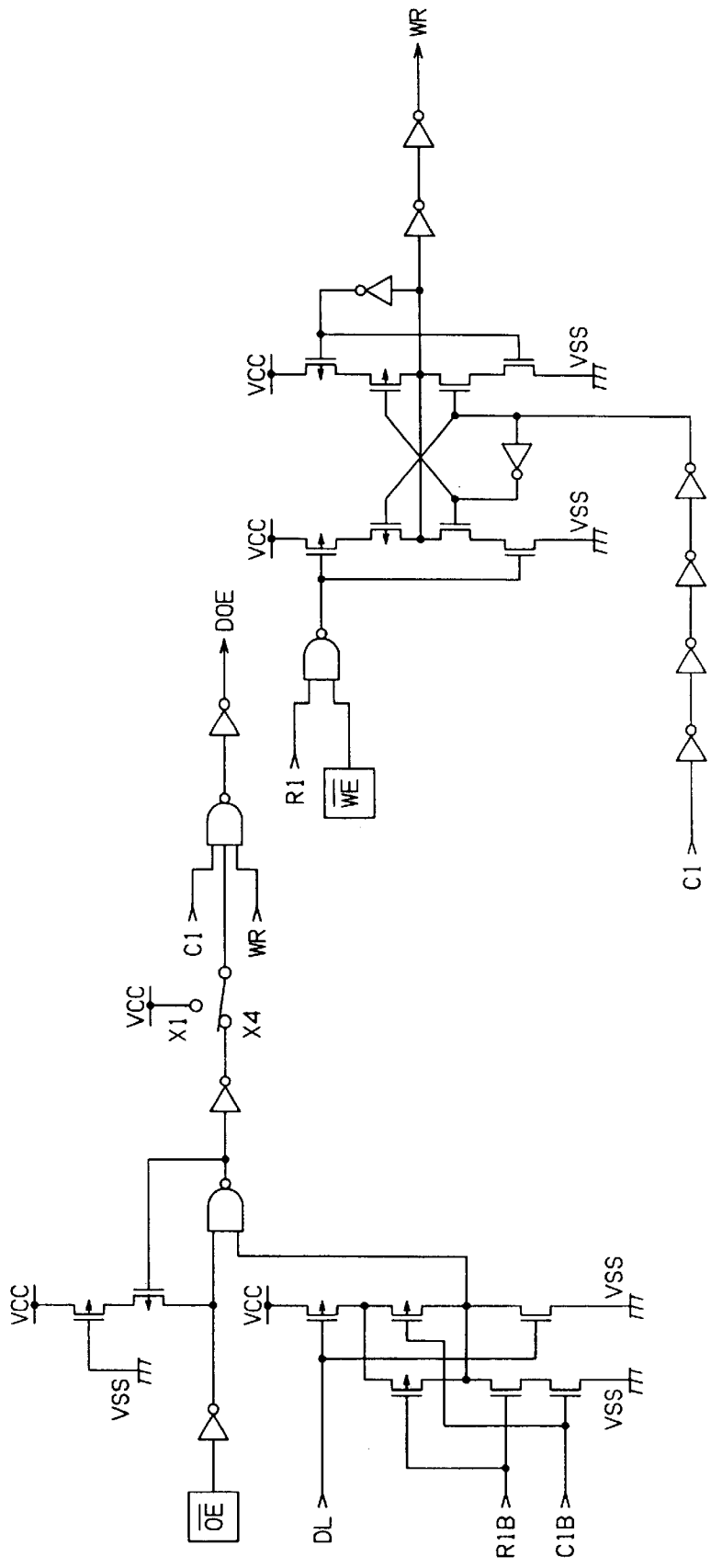

RAS SYSTEM (CLOCK-WL)

RAS SYSTEM (ADDRESS-WL)

RAS SYSTEM (SENSE AMP-BL)

RAS SYSTEM (X-ADDRESS BUFFER CONTROL)

FIG. 74 CAS SYSTEM (CLOCK OPERATION)

CAS SYSTEM (ADDRESS OPERATION)

CAS SYSTEM (WRITE OPERATION)

CAS SYSTEM (Y-ADDRESS BUFFER CONTROL)

CAS SYSTEM (WCBR TEST MODE OPERATION)

FIG. 79 CAS SYSTEM (TEST MODE : SET/RESET)

FIG. 80 CAS SYSTEM (X4-CLOCK OPERATION)

FIG. 81 CAS SYSTEM (WRITE MASK OPERATION)

FIG. 84

NORMAL MODE

SIGNAL TEST MODE

SHL/R GENERATOR

FIG. 86
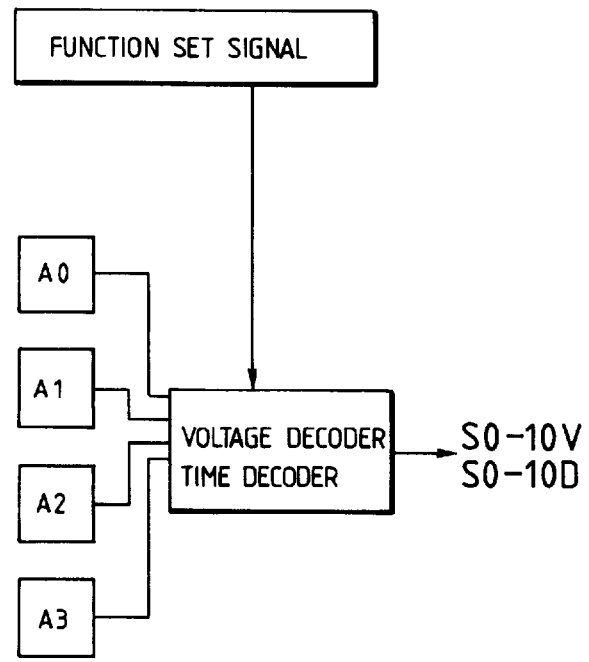
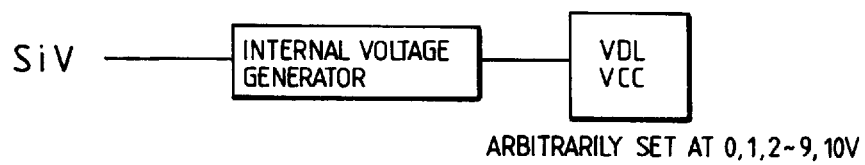
ARBITRARILY SET AT 0,1,2~9,10V
ARBITRARILY SET AT 0,1, 2~9,10ns

NORMAL MODE

COUNTER SET

CKT

M: MEMORY CELL ARRAY
S: SENSE AMP
M. A: MAIN AMP
MSU/D: MAT SELECTION
        SIGNAL

M: MEMORY CELL ARRAY
S: SENSE AMP
M. A: MAIN AMP
MS0-3: MAT SELECTION
SIGNAL

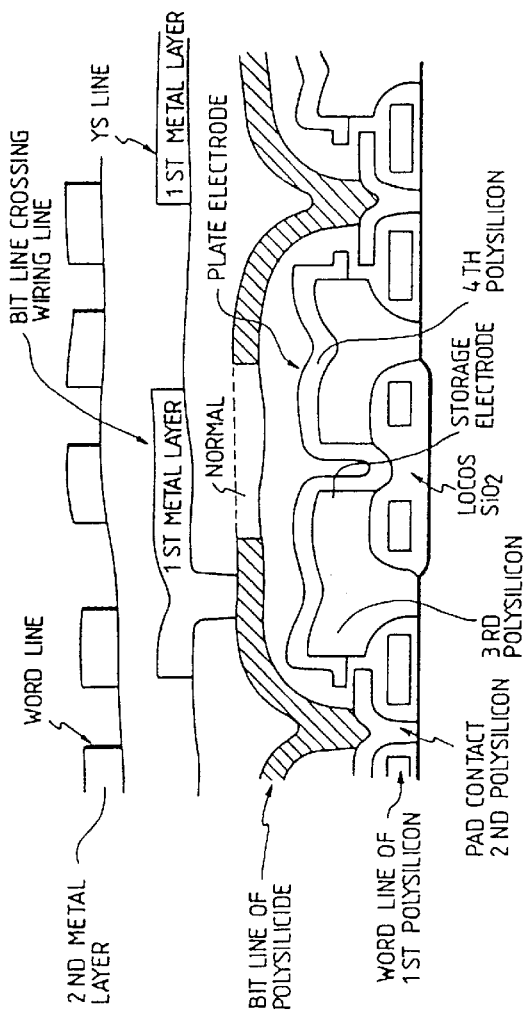
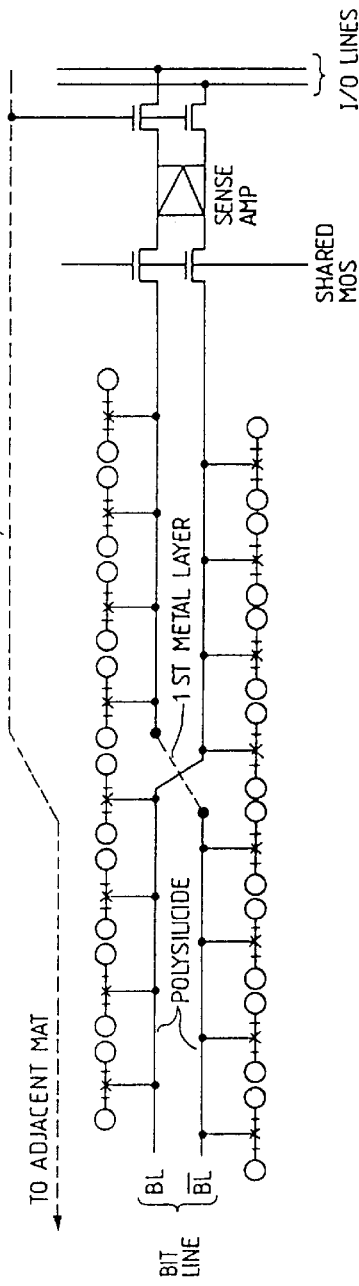
FIG. 96(A)
FIG. 96(B)

MEMORY CELL REGION | STEP DAMPING REGION (OR GUARD RING OF MEMORY ARRAY) | SHARED MOS

WORD DRIVER | STEP DAMPING REGION & GUARD RING | MEMORY ARRAY

WORD DRIVER

FIG. 115(a)

|  | LSB |  |  |  |  |  | MSB |  |
|---|---|---|---|---|---|---|---|---|
| ADDRESS PIN # : | A0 | A1 | A2 | - - - - | Ai-3 | Ai-2 | Ai-1 | |
| ROW ADDRESS : | RA0 | RA1 | RA2 | - - - - | RAi-3 | RAi-2 | RAi-1 | ADDRESS TYPE OF THE PRIOR ART |
| COLUMN ADDRESS : | CA0 | CA1 | CA2 | - - - - | CAi-3 | CAi-2 | CAi-1 | |
| ROW ADDRESS : | RA0 | RA1 | RA2 | - - - - | RAi-3 | RAi-2 | RAi-1 | ADDRESS TYPE OF THE INVENTION |
| COLUMN ADDRESS : | CA0 | CA1 | CA2 | - - - - | CAi-3 | CAi-2 | CAi-1 | |

FIG. 115(b)

|  | LSB |  |  |  |  |  | MSB |  |
|---|---|---|---|---|---|---|---|---|
| ADDRESS PIN # : | A0 | A1 | A2 | - - - - | Ai-3 | Ai-2 | Ai-1 | |
| ROW ADDRESS : | RA0 | RA1 | RA2 | - - - - | RAi-3 | RAi-2 | | ADDRESS TYPE OF THE PRIOR ART |
| COLUMN ADDRESS : | CA0 | CA1 | CA2 | - - - - | CAi-3 | CAi-2 | | |
| ROW ADDRESS : | RA0 | RA1 | RA2 | - - - - | RAi-3 | RAi-2 | RAi-1 | ADDRESS TYPE OF THE INVENTION |
| COLUMN ADDRESS : | CA0 | CA1 | CA2 | - - - - | CAi-3 | | | |

☐ ; REFRESH ADDRESS          ⌐ ¬ ; NIBBLE ADDRESS $2^i = \sqrt{n}$

FIG. 116(a)
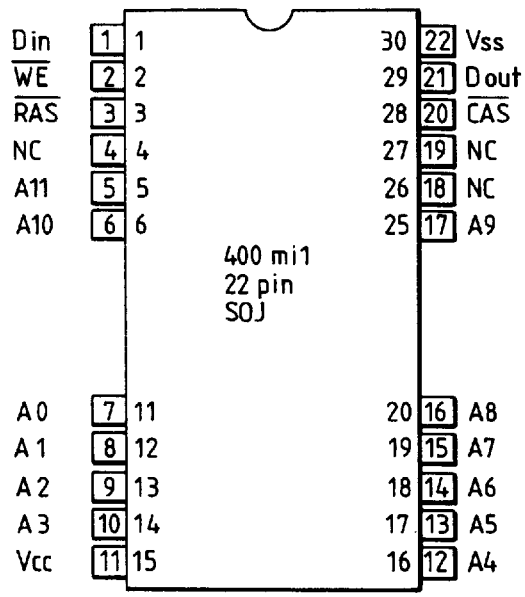
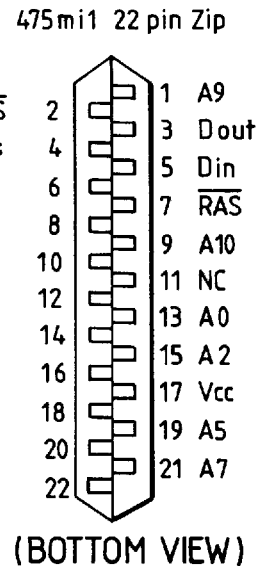
FIG. 116(b)
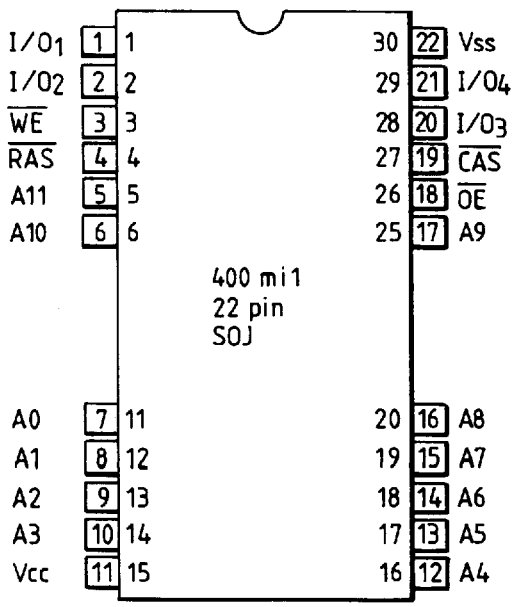
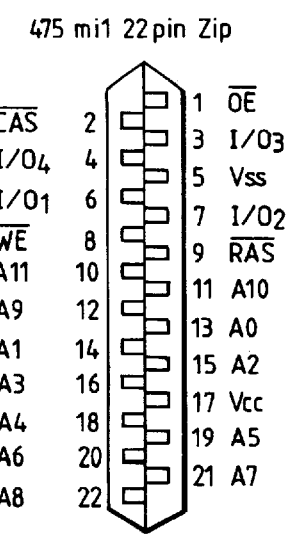

STC

HSPC

SEMICONDUCTOR MEMORY DEVICE HAVING ZIGZAG BONDING PAD ARRANGEMENT

This is a continuation of application Ser. No. 455,411, filed May 31, 1995, now U.S. Pat. No. 5,544,096; which is a continuation of application Ser. No. 159,621, filed Dec. 1, 1993, now U.S. Pat. No. 5,548,547; which is a divisional of application Ser. No. 899,572, filed Jun. 18, 1992, now abandoned; which is a continuation of application Ser. No. 424,904, filed Oct. 18, 1989, now abandoned.

BACKGROUND OF THE INVENTION

1. Field of the Invention

The present invention relates to a semiconductor device and its defect remedying method and, more particularly, to a technology which is effective if applied to a dynamic RAM (Random Access Memory) having a storage capacity as large as about 16 Mbits.

2. Description of the Prior Art

The development of the dynamic RAM having the large storage capacity of about 16 Mbits is being advanced. An example of the dynamic RAM is described on pp. 67 to 81 of "Nikkei Microdevice" issued on Mar. 1, 1988 by NIKKEI McGRAW-HILL.

In accordance with the increase in the storage capacity, the memory chip necessarily has its size enlarged. Accordingly, special considerations have to be taken into the drop of the operation speed, which is caused by making the elements finer and by handling the wiring lines. In other words, the realization of the high storage capacity of about 16 Mbits requires development of a new technology which is different from that used for the dynamic RAM of about 1 or 4 Mbits.

SUMMARY OF THE INVENTION

An object of the present invention is to provide a semiconductor device which aims at having a large storage capacity.

Another object of the present invention is to provide a semiconductor storage device which realizes the large storage capacity while speeding up the operations.

Still another object of the present invention is to provide a rational defect remedying method for the memory device aiming at the large storage capacity.

The aforementioned and other objects and novel features of the present invention will become apparent from the descriptions to be made in the following with reference to the accompanying drawings.

The representatives of the invention to be disclosed hereinafter will be briefly described in the following.

There is provided a semiconductor memory device having a large storage capacity, in which a semiconductor chip is bisected by its longitudinal center line to form two regions, in which peripheral circuits are arranged in a cross area composed of the longitudinal center portions and the transverse center portions of said two regions, and in which memory arrays are arranged in the four regions which are divided by said cross area. In the cross area, the edges contacting with the memory arrays are arranged with X-decoders and Y-decoders, and the regions of the longitudinal or transverse center portion, which are interposed between the X-decoders, are arranged with a main amplifier, a common source switch circuit, a sense amplifier control signal generator and a mat selection control circuit. Those circuits of the peripheral circuits, which may probably inject minority carriers into a substrate on principle, are arranged on two center lines of the cross area or their vicinities. The memory arrays formed in the four quartered areas of said cross area are constructed of a block of plural memory mats as a unit having the same size as includes the sense amplifiers. The unit memory mat includes a control circuit for generating a variety of timing signals for the memory cell selections on the basis of a mat selection signal. The control circuit is activated by the mat selection signal. The memory mat selection signal is prepared by decoding the address signal inputted through a specific address buffer. Bonding pads are partially or wholly arranged in the regions of said cross area. The bonding pads are bonded to LOC lead frame. Of these bonding pads, a plurality of pads for applying the power voltage of the circuit and the ground potential are arranged at a suitable spacing according to circuit blocks requiring them and are connected to the common LOC lead frame to be fed with the power voltage of the circuit and the ground potential. The four regions quartered by the cross area are arranged with the memory arrays, and the semiconductor chip has its four corners stepped. There is provided an internal drop voltage generator which is made operative in response to the power voltage fed from an external terminal and which includes one or more impedance converting output buffers made receptive of a reference voltage prepared by a reference voltage generator. The internal drop voltage generator is provided for each of the memory array operating voltage and the peripheral circuit operating voltage. The internal drop voltage generator drives an output MOSFET of source-follower type having its gate fed with the signal to be outputted through a level converter for converting the signal to be fed and formed by the internal circuit into a signal level corresponding to the power voltage fed from the external terminal. The drop voltage generated by the internal drop voltage generator is selectively outputted, in the output high impedance state of a data output buffer in a test mode, from the output terminal of the data output buffer through a switch MOSFET to be switched by a signal at the bootstrap voltage or external power voltage level. The selection signal of the word lines or the shared sense amplifiers is prepared by a selector which has its operations controlled by a high voltage prepared by boosting the internal drop voltage. At least one pair of memory cell arrays are arranged symmetrically with respect to the main amplifier, and the main amplifier is selectively connected with the input/output lines of the paired memory cell arrays through a switch circuit to be switched in accordance with the selections of the paired memory cell arrays. The shared sense amplifier is given an operation mode for connecting both the data lines at the selected and unselected sides. The pull-up MOSFET of CMOS structure composed of the sense amplifier, the initial-step circuit of the main amplifier and the input/output lines, the short MOSFET composed of the complementary data lines and the complementary input/output lines, and the MOSFET of diode mode constituting the charge pump circuit are caused to have a low threshold voltage. A pair of parallel bit lines are constructed of the bit line cross type, in which the bit lines are interchanged by using a first metal wiring layer formed over the wiring layer forming the bit lines. The first metal wiring layer also forms the column selection lines, one of which is formed to correspond two pairs of bit lines and folded to overlap from one to other bit line pair at portion different from the cross portion of the bit lines. A step damping region made of a dummy wiring layer is formed between a memory cell array of laminated type and a peripheral circuit.

There is also provided a defect remedying method comprising the steps of: constructing a memory array of a block composed of plurality units of memory mats having the same size and including sense amplifiers; forming redundancy word lines and/or redundancy data lines for each of said memory mats, forming redundancy decoders of a number smaller than the total number of the redundancy word and/or data lines of all of said memory mats and larger than the total number of the redundancy word and/or data lines of each of said memory mats so that said redundancy decoders may be used for each of said memory mats or commonly for said memory mats. Preparatory word lines and/or preparatory column selection lines wired to intersect a plurality of word lines and/or column selection lines, respectively, are formed at the output of a word line or column selector, and the word lines and/or the output lines of the column selector are cut by physical means, when a word line and/or a data line are defective, from the column selection lines corresponding to the defective word line and/or the defective data line and are connected with the preparatory word lines and/or the preparatory column selection lines. When in the multi-bit simultaneous testing mode by the multiplex selection of the column system, only the defective data or column selection line of the data lines or column selection lines is switched to a redundancy data line or a redundancy column selection in a manner to correspond to the memory cell array divided into a plurality of memory blocks. The data lines are divided into a plurality of blocks by one of a specific-bit of the address signals of the row and/or column systems, a block address prepared inside, or the combination of the address signal and the block address, and a defective data line in a defective block only is switched to a redundancy data line by making use of a signal designating the block.

Since the major timing signals are propagated four ways from the center of the chip, according to the means specified above, the lengths of the signal wiring lines, which might otherwise accompany the size-up of the chip, can be substantially shortened to realize the large capacity and the speed-up of the DRAM. The influences to be exerted upon the memory arrays can be minimized by arranging a circuit capable of generating minority carriers on or in the vicinity of the two center lines of the aforementioned cross area. The design and control can be simplified by making a block of the unit memory mats of the same size containing sense amplifiers. The bonding pads are connected with the LOC lead frame so that their arrangement can be optimized. Thanks to the provision of the pads for establishing the circuit power voltage and the ground potential, the power impedance can be dropped. The stress from the resin mold can be dispersed by the steps formed in the corners. Thanks to the provision of the internal drop voltage generator, it is possible to prevent the electrostatic breakdown which might otherwise be caused as a result of the low power consumption and the finer element. Since the voltage is dropped in a manner to correspond to the memory array operating voltage and the peripheral circuit operating voltage, it is possible to increase the power noise margin. The output level is retained and speeded up by driving the output MOSFET with the level change. The internal voltage can be monitored by bringing the data output buffer to the output high-impedance state. The speed-up and the stabilization can be achieved by causing the boost power to form the selection signals for selecting the word lines and the shared sense amplifiers. The circuit can be simplified by causing the main amplifiers to correspond to the plural memory cell arrays. The margin test of the sense amplifiers can be executed by connecting the shared sense amplifiers with the two data lines. The speed-up and the level drop can be minimized by using the MOSFET having a low threshold voltage. The high integration can be attained by interchanging the bit lines using the metal wiring layer formed over the bit lines. The metal wiring layer can also be used as the column selection line. The stepped shock absorbing region can prevent the shortage of the steps in the wiring lines.

As the defect remedying method, the redundancy circuit can be simplified by utilizing the redundancy decoder as the multiple memory mats. The circuit can be simplified and speeded up by switching the defective data line or word line directly to the preparatory data line or word line. The preparatory circuit can be simplified by interchanging only the defective circuit when in the multi-bit simultaneous test most by the multiplex selection of the Y-system. Thus, the defect remedy can be achieved with the simple structure by utilizing the block designating signals.

BRIEF DESCRIPTION OF THE DRAWINGS

FIG. 36 is a circuit diagram showing one embodiment of a redundancy circuit of an X-system;

FIG. 50 is a circuit diagram showing one embodiment of the Y-decoder for generating a column selection signal;

FIG. 52 presents circuit diagrams showing portions of one embodiment of a control circuit for generating a Y-control signal;

FIGS. 84(A) to 84(C) are waveform charts and a circuit diagram of one embodiment for explaining a word line testing method;

FIG. 86 is a block diagram showing another embodiment of the function set mode;

FIGS. 96(A) and 96(B) are a section and a schematic diagram for explaining the bit line cross portion of the memory cell array;

FIG. 115(a) is a diagram comparing the address systems having the structure of n words×1 bit of the prior art and according to the embodiment of the present invention;

FIG. 115(b) is a diagram comparing the address systems having the structure of ¼-n words×4 bits of the prior art and according to the embodiment of the present invention;

FIG. 116(a) is a diagram showing the package contour and pin arrangements of the DRAM of 16 Mbits according to one embodiment of the present invention;

FIG. 116(b) is a diagram showing the package contour and pin arrangements of the DRAM of 4 Mbits according to one embodiment of the present invention;

FIG. 121(*b*) is a circuit diagram for changes to the ½·V$\bar{\text{n}}$ refresh cycle only for the column address signal CAS and the before row address signal RAS;

FIG. 122 is a circuit diagram for forming a sense amplifier activation signal from the refresh cycle switching address signals $A_{xi-1}$ and $\overline{A}_{xi-1}$ shown in FIG. 121(*b*);

FIG. 123(*a*) is a diagram showing a peak current increase preventing circuit of single-phase drive type;

FIG. 123(*b*) is a diagram showing a peak current increase preventing circuit of two-phase drive type;

Figure 124A:
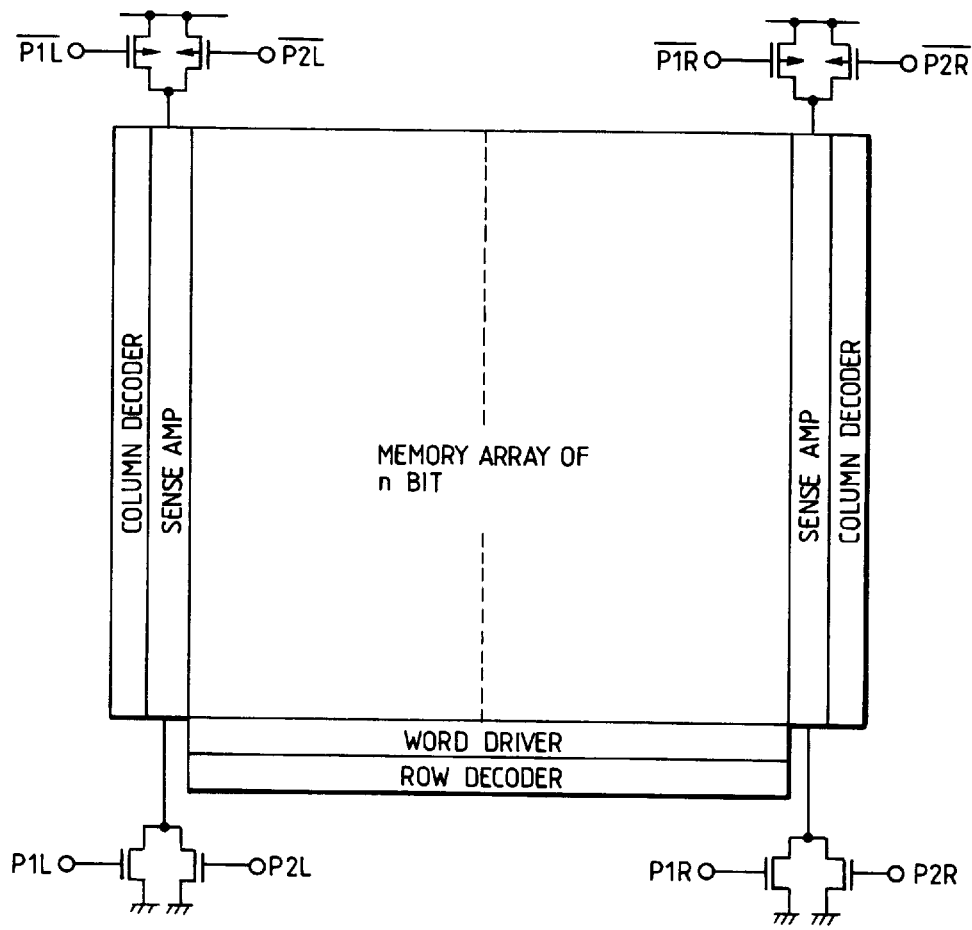
Figure 124B:
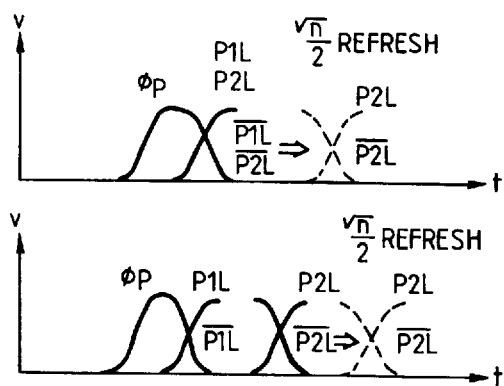
Figure 125:
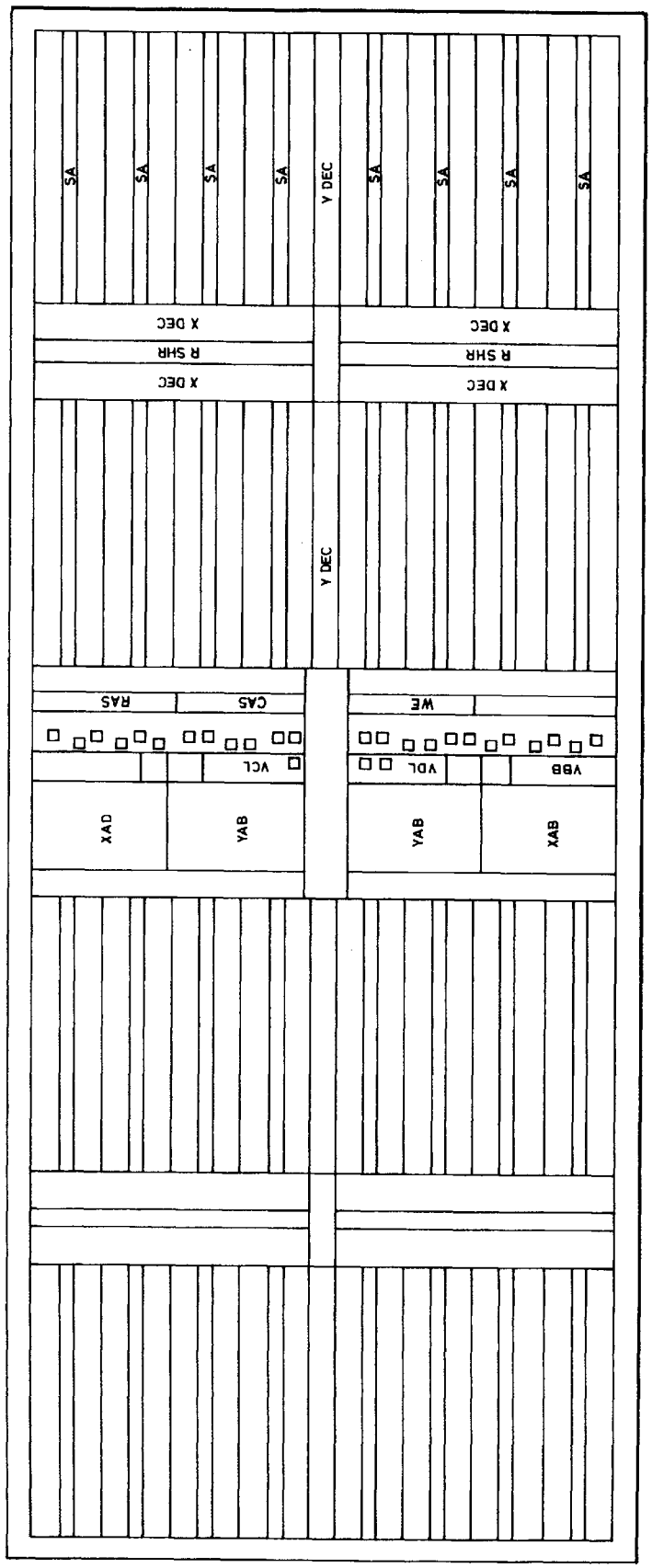
Figure 127:
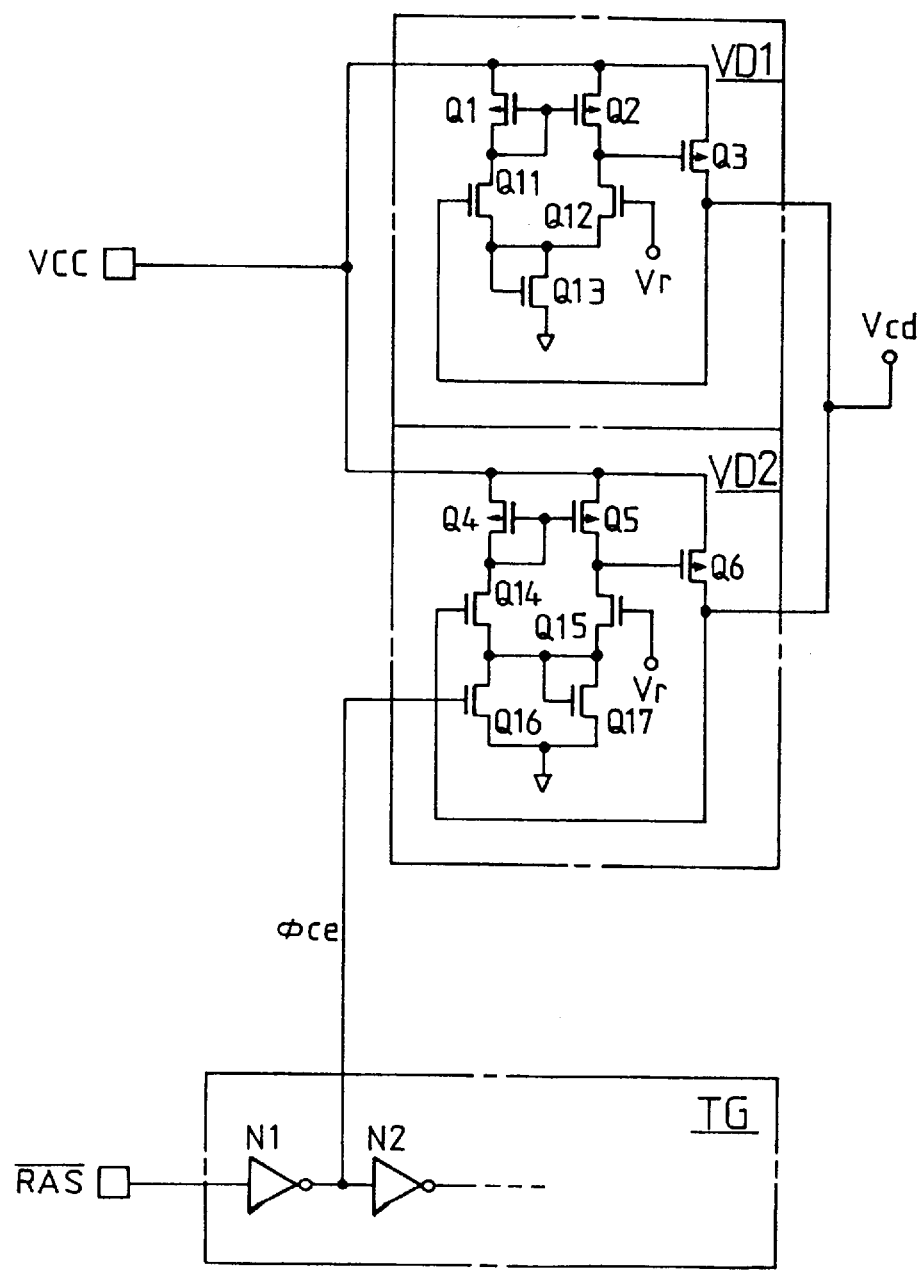
Figure 128:
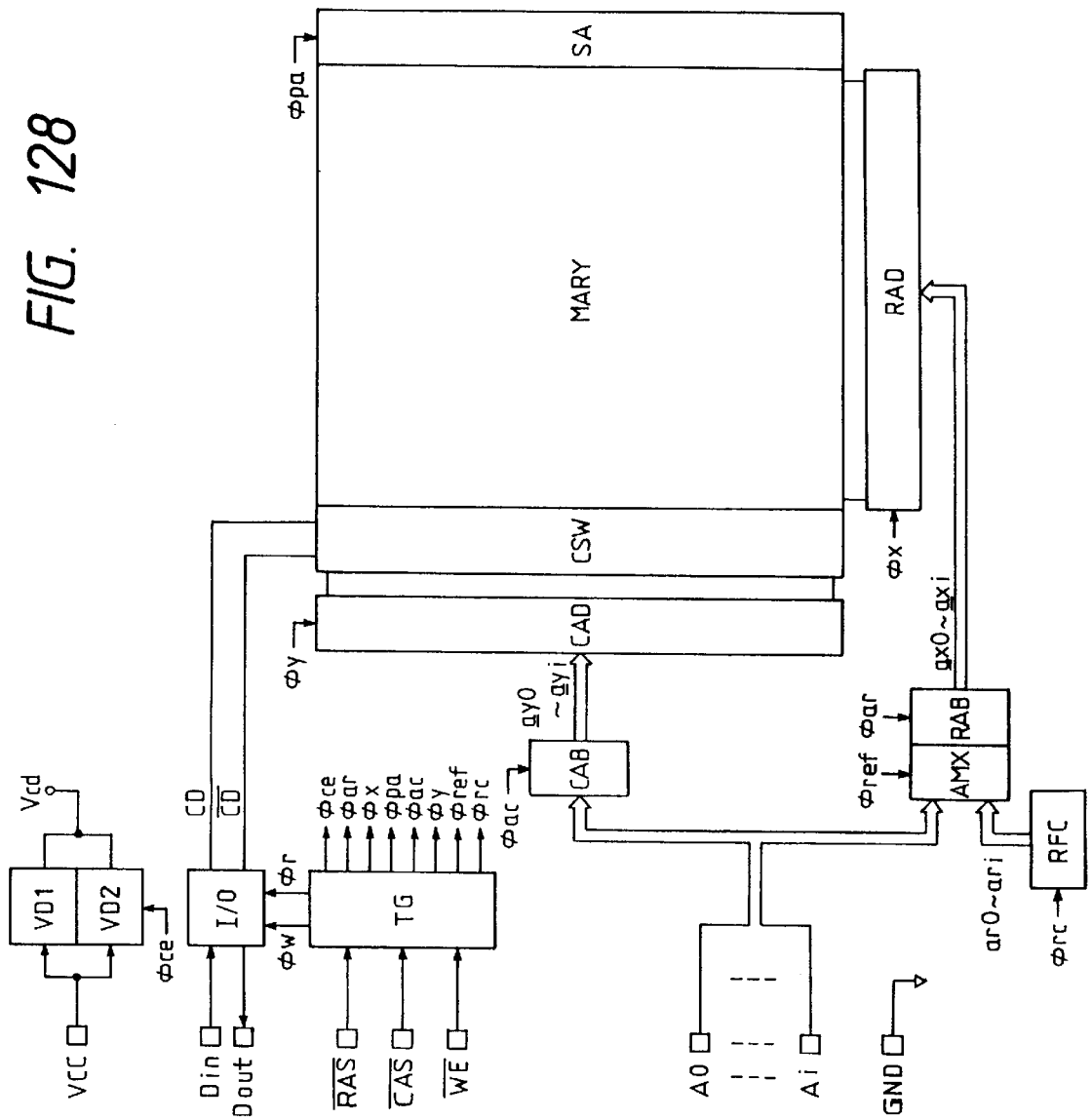

FIGS. 124(*a*) and 124(*b*) are diagrams showing another embodiment of the present invention;

FIG. 125 is a chip layout of the DRAM using one embodiment of the present invention;

FIG. 126(*a*) is a diagram showing the case in which the number of the refresh cycles is 2V$\bar{\text{n}}$ in the present embodiment;

FIG. 126(*b*) is a diagram showing the case in which the number of the refresh cycles is 4V$\bar{\text{n}}$ in the present embodiment;

FIG. 127 is a circuit diagram showing one embodiment of the voltage drop circuit of the dynamic RAM to which is applied the present invention; and FIG. 128 is a block diagram showing one embodiment of the dynamic RAM containing the voltage drop circuit of FIG. 127.

DESCRIPTION OF THE PREFERRED EMBODIMENTS

Figure 1:
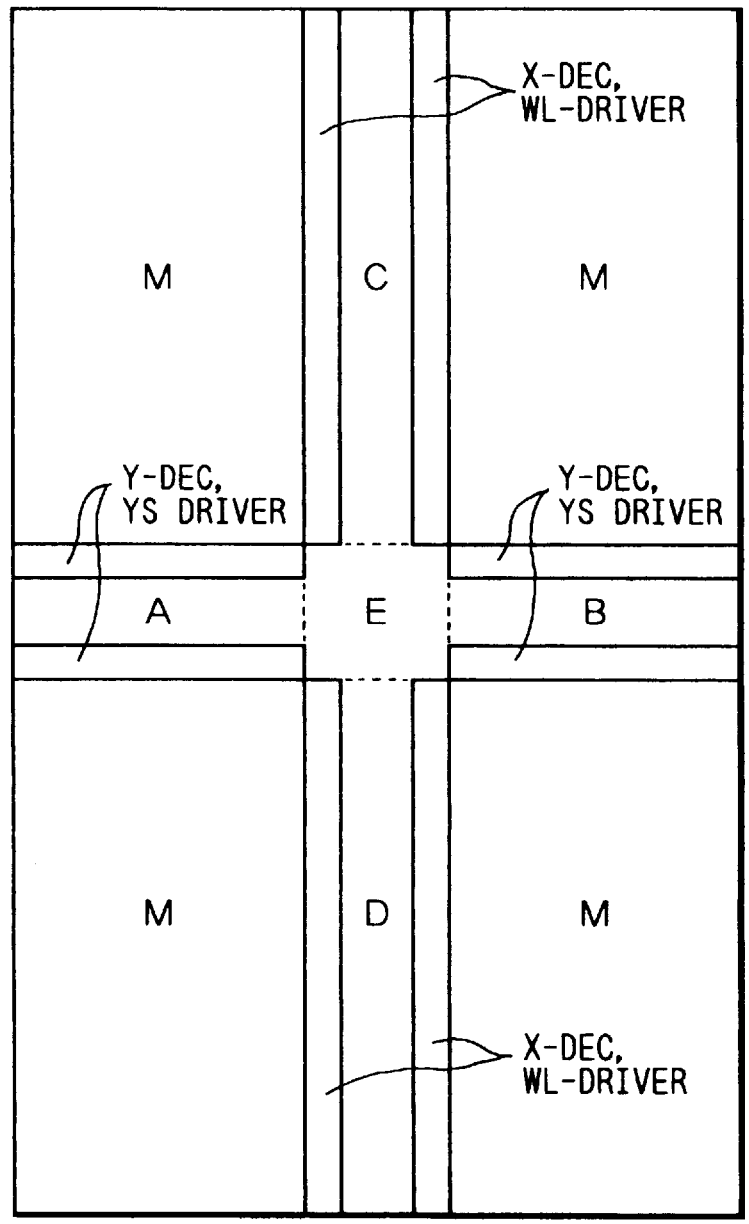
FIG. 1 is a fundamental layout showing one embodiment of the dynamic RAM, to which is applied the present invention.

FIG. 1 is a fundamental layout showing one embodiment of a dynamic RAM to which is applied the present invention.

The RAM will have its operating speed dropped, as the various wiring lengths of control signals or memory array drive signals are elongated as a result of an increase in the chip size accompanying an increase in the memory capacity. In order to prevent this speed drop, the present device has made the following devices in the arrangement of memory arrays composing the RAM and peripheral portions for address selections.

In FIG. 1, there is provided a cross area which is formed in the chip with a longitudinal center portion and a transverse center portion. This cross area is mainly arranged with peripheral circuits, and the four areas divided by the cross area are arranged with memory arrays.

The cross area is divided, as shown in FIG. 1, into areas A to D. Specifically, the area A is located at the lefthand side of the transverse center of the chip, and the area A is located at the righthand side of the transverse center of the chip. The area C is located at the upper side of the longitudinal center of the chip, and the area D is located at the lower side of the longitudinal center of the chip. Moreover, an area E is located at the center of the chip, in which the vertical center portion and the longitudinal center portion of the chip intersect each other.

In the memory chip of this embodiment, the four areas divided by the cross areas A to E are constructed of memory arrays. Each of these four memory arrays is made to have a memory capacity of about 4 Mbits, although not limitative, as will be especially limitative. Accordingly, the four memory arrays totally have a memory capacity as high as about 16 Mbits.

Of the cross areas, the peripheral portions adjoining each of the memory arrays is arranged with a decoder and a driver for selecting the memory arrays. Specifically, the two memory arrays divided longitudinally by the areas A and B are corresponded to by Y (Column) decoders (Ydec) and Y select (Column select) drivers (YS drivers). the two memory arrays divided transversely by the areas C and D are corresponded to by X (Row) decoders (Xdec) and word line drivers (WL drivers). As a result, the four memory arrays are arranged by extending the word lines transversely and the data lines (bit lines or digit lines) longitudinally. Since, however, one memory array has a capacity as large as about 4 Mbits, the number of the memory cells to be connected with one data line is impractically enlarged. As a result, each memory array is composed of such a plurality of memory mats as will be described hereinafter.

The remaining portions of the cross areas A to E are arranged with the following major circuit blocks. The areas A and B are arranged with address buffers, address comparators (redundancy decoders), control clock generators, data input buffers and so on. The areas C and D are arranged with common source switch circuits, sense amplifier control signal circuits, mat selection control circuits, main amplifiers and so on. And, the center area E is arranged with X-decoder and Y-decoder address signal generators, an internal voltage-drop power circuit and so on.

Figure 2:
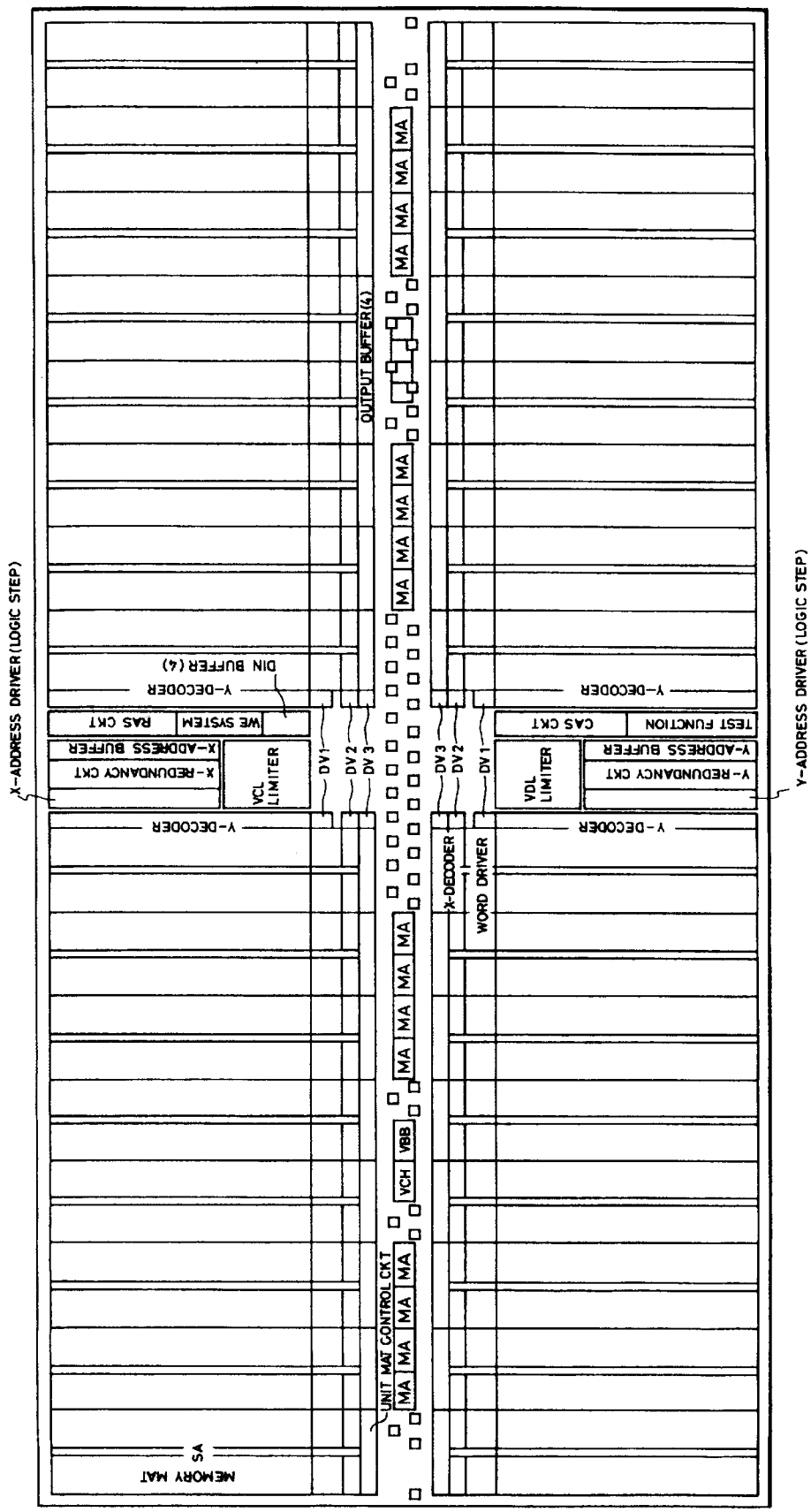
FIG. 2 is an overall layout showing one embodiment of the DRAM according to the present invention.

FIG. 2 is an overall layout showing one embodiment of the dynamic RAM according to the present invention. Specifically, the portion corresponding to the aforementioned area A is arranged with Y-circuits including a Y-address buffer, a Y-redundancy circuit and a Y-address driver (logical step), a test function circuit and a CAS control signal circuit. Closer from the area A to the center, there are arranged an internal voltage-drop VDL limiter circuit for transforming an external power voltage VCCE such as about 5 V to a voltage such as about 3.3 V to be fed to a memory array, and a Y-address driver, an X-address driver and a mat selection driver DV1 to DV3.

The portion corresponding to the aforementioned area B is arranged with X-circuits including an X-address buffer, an X-redundancy circuit and an X-address driver (logical step), a RAS control signal circuit, a WE control signal circuit and a data input buffer. Closer from the area B to the center, there are arranged an internal voltage-drop VCC limiter circuit for transforming an external power voltage VCCE such as about 5 V to a voltage such as about 3.3 V to be fed to a peripheral circuit, and a Y-address driver, an X-address driver and a mat selection driver DV1 to DV3.

If, as in the areas A and B, the address buffers, the redundancy circuits containing the address comparators corresponding to the address buffers, and CAS and RAS control signal circuits for generating control clocks are concentrated in one position, a high integration can be achieved by distributing the clock generators and other circuits across the wiring channel, namely, by sharing the wiring channels. At the same time, the signals can be transmitted at the shortest equal distance so that the operations can be speeded up.

The portion corresponding to the aforementioned area C is arranged with four main amplifiers corresponding to totally eight memory mats arranged symmetrically with respect to the center axis of the area C, an internal boost voltage circuit VCHG, a substrate voltage generator VBBG, and four main amplifiers corresponding to the remaining totally eight memory mats arranged symmetrically with respect to the center axis of the area C. Thus, in this embodiment, one memory array is arranged with eight memory mats, and two memory arrays are arranged symmetrically with respect to the area C so that totally sixteen memory mats are provided. Thanks to this arrangement, the main amplifiers can have their number decreased and their signal propagation distances shortened to speed up the operations.

The portion corresponding to the aforementioned area D is arranged with four main amplifiers-corresponding to totally eight memory mats arranged symmetrically with respect to the center axis of the area D, four data output buffers, and four main amplifiers corresponding to the remaining totally eight memory mats arranged symmetrically with respect to the center axis of the area D. Thus, this embodiment is constructed of four memory arrays, as described above, so that the memory mats are thirty two in total number.

Figure 3:
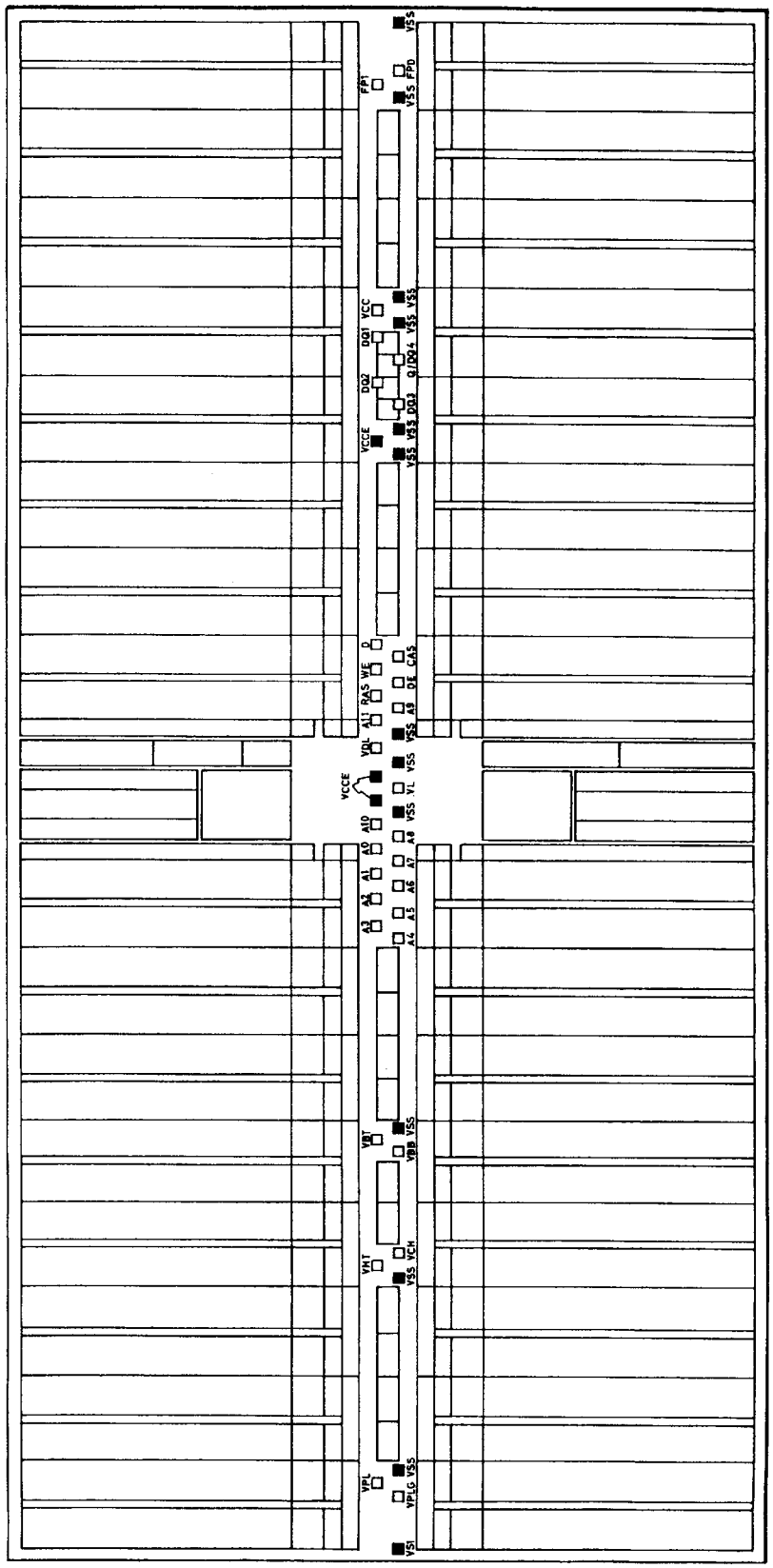
FIG. 3 is a layout showing the detailed arrangement of bonding pads of the DRAM.

In this embodiment, the aforementioned longitudinal center area is arranged with bonding pads indicated by small square symbols, although not especially limitative. The detail arrangement of these bonding pads is specifically shown in the layout of FIG. 3. In FIG. 3, the bonding pads indicated by solid squares are those for external power supply. In order to increase the input level margin, i.e., to decrease the power impedance, totally thirteen pads VSS for supplying the ground potential of the circuit are arranged on one line. These pads VSS are connected with longitudinally extending ground potential leads which are formed by the LOC technology. Of these pads VSS, the pad disposed in each of the areas C and D is used as a ground potential for preventing the floating due to the clearing of the word lines and the coupling of the non-selected word lines of word drivers. Two pads disposed in each of the areas C and D are provided for the common source VSS of a sense amplifier to drop the wiring resistance of the common source there by to speed up the operations. The area D is further arranged with two pads for the data output buffer, and the area E is arranged with pads which are operative to supply the ground potential to the X-address buffer and the Y-address buffer and which correspond to the power generator. Moreover, one pad of each of the areas C and D and two pads of the area E correspond to other peripheral circuits. As a result, the ground potential of the circuit has a lower power impedance for the operations of the internal circuit, and the VSS wires between five kinds of internal circuits thus divided are connected through low-pass filters composed of LOC lead frames and bonding wires, so that not only the generation of noises but also the propagations of the VSS noises between the internal circuits can be minimized.

The pads corresponding to the external power VCCE such as about 5 V are two at the center corresponding to internal drop voltage generator VCC limiter and VDL limiter for the aforementioned voltage transformations, and one in a position corresponding to the data output buffer. These pads are also used for dropping the power impedance and for suppressing the noise propagations of the voltages (VCC, VDL and VCCE) of the internal circuits.

Address input pads A0 to A11 are arranged altogether at the center. These arrangements are intended, in proximity according to the arrangements of the X-address buffer and the Y-address buffer, to minimize the signal transmission distances thereby to speed up the operations.

Control signal pads $\overline{RAS}$, $\overline{CAS}$, $\overline{WE}$ and $\overline{OE}$ are arranged close to their respectively corresponding circuits. Data output pads DQ1 to DQ4 are disposed for data output buffers. A pad D is for data input of 1-it structure, and a pad Q is for data output of 1-bit structure.

In addition to the above-specified external pins, this embodiment is equipped with pads for bonding masters, monitoring and monitoring pad controls. For these bonding masters, there are provided pads FP0 and FP1, the former of which is used to designate an SC (static column) mode and the latter of which is used to designate the write mask function of an NB (nibble) mode×4-bit structure. The monitoring pads are designated at VCC, VDL, VL, VBB, VCH and VPL. These pads are used for monitoring the corresponding internal voltages VCC, VDL, VL, VBB, VCH and VPL. The internal voltage VCC is the peripheral circuit power voltage of about 3.3 V; the voltage VDL is the power voltage of about 3.3 V to be supplied to a memory array, i.e., a sense amplifier; the voltage VCH is the boost power voltage at a selection level for the word line boosted to about 5.3 V in response to the internal voltage VDL, i.e., for selecting a shared switch MOSFET; the voltage VBB is a substrate back bias voltage of −2 V; the voltage VPL is a plate voltage of a memory cell; and the voltage VL is a reference voltage of about 3.3 V for the VCC limiter and the VDL limiter. Pads VBT, VHT and VPLG are used for controlling the monitoring pads, as will become apparent from the later description of the monitor voltage functions.

In this embodiment, the bonding pads are arranged in two rows. Moreover, the arrangement is made alternate with a pitch shift of one half. In other words, the plural bonding pads are arranged zigzag. This arrangement can elongate the substantial distance between the pads. In other words, a number of bonding pads can be arranged in high density in a relatively small area. The bonding pads have to make their pitches relatively large partly because they require a relatively large area to be occupied thereby for the wire bonding or the like and partly because it is necessary to provide an electrostatic breakdown preventing circuit. Thus, the zigzag arrangement like this embodiment makes it possible to arrange the numerous bonding pads in the relatively small area. On the contrary, the structure, in which the bonding pads are arranged in the longitudinal center portion of a long chip, makes it possible to provide a number of pads like the aforementioned one.

Figure 4:
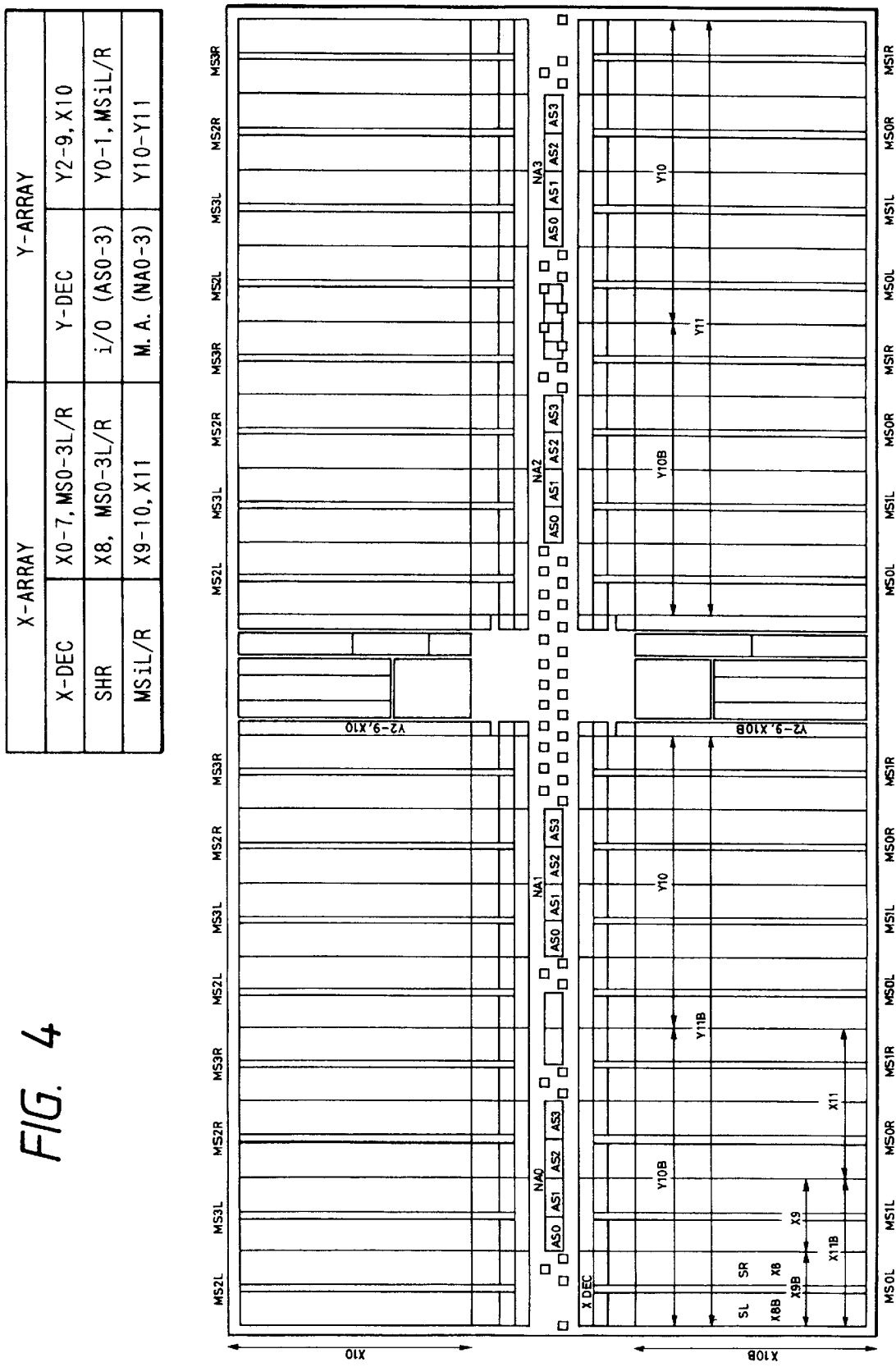
FIG. 4 is a block diagram showing one embodiment of the address assignment of the same.

FIG. 4 is a block diagram showing one embodiment for address assignments for the memory arrays of the aforementioned structure.

The RAM of this embodiment has a memory capacity of about 16 Mbits, as has been described hereinbefore. Moreover, the address signals take the address multiplex method, in which X-address signals and Y-address signals are fed in time-series in synchronism with the address strobe signals $\overline{RAS}$ and $\overline{CAS}$. Of the address signals, the X-address signals are composed of 12 bits of X0 to X1, and the Y-address signals are also composed of 12 bits of Y0 to Y11. As shown, the address signals X0 to X11 are true signals indicating the selection state, when the address signals fed from the outside are at a high level, and address signals X0B to X11B are bar signals indicating the selection state, when the address signals fed from the outside are at a low level. Likewise, the address signals Y0 to Y11 are true signals indicating the selection state, when the address signals fed from the outside are at the high level, and address signals Y0B to Y11B are bar signals indicating the selection state, when the address signals fed from the outside are at the low level.

The memory mat has a minimum unit of two regions SL and SR across the sense amplifier, and the corresponding X-decoder, word line driver and column selector. The quartered memory array is arranged with eight-unit memory mats. These unit memory mats are classified into eight kinds, i.e., MS0L and MS0R to MS3L and MS3R. Since each quartered memory array has eight unit memory mats, the memory mats MS01 and MS0R to MS3L and MS3R are assigned to the four unit memory mats.

The X-decoder of the aforementioned unit memory mat is fed with the address signals of 8 bits of the address signals X0 to X7, the SL and SR signals for designating the two regions across the sense amplifier, and the signals MS0L/R to MS3L/R for designating the memory mat. One memory mat has 512 word lines. The unit memory mat takes the so-called "shared sense amplifier type", in which complementary data lines (e.g., bit lines or digit lines) are arranged at the righthand and lefthand sides of the sense amplifier. Moreover, the address signals X8 and X8B are used as the righthand and lefthand address designating signals SL and SR. Thus, the X-decoder has a function to select one word line by decoding the address signals of substantially 9 bits X0 to X8.

The address signals of 3 bits of the address signals X9 to X11 form the mat selection signals MS1L/R. Specifically, the address signals X9 and X9B select the adjoining memory mats, as shown at MS0L and MS1L as representatives in FIG. 4, and the address signals X11 and X11B selects either of two groups of righthand and lefthand memory blocks each composed of two adjoining memory mats, as shown at MS0L and MS1L and at MS)R and MS1R as representatives in FIG. 4. Moreover, the address signals X10 and X10B are used to select either of the memory arrays which are divided by the areas of the longitudinal center portion of the same Figure. By the aforementioned combination of the address signals of 3 bits, the aforementioned eight address assignments MS0–3L/R are designated at the memory mats of each unit.

When the X-address signal is received in synchronism with the row address strobe signal $\overline{RAS}$, the selections of the X-line are accomplished. At this time, one side of those two of the four memory arrays, which are divided across the area of the longitudinal center portion, is selected in response to the address signal X10 or X10B by the aforementioned address assignments. In response to the address signal X11 or X11B, moreover, one of the memory mats having the letter R or L added is selected, and one of the adjoining memory mats is designated in response to the address signal X9 or X9B. In the four of the totally thirty two memory mats, therefore, there is selected one word line which is designated by the address signals (X0 to X8) of 9 bits.

The Y-decoder corresponding to each memory array (composed of totally eight memory mats) decodes the Y-address signals Y2 to Y9 to select the complementary data lines of the memory array. Specifically, the Y-decoder decodes the address signals of 8 bits Y2 to Y9 to accomplish the address selections of 1/256. However, the column selector selects the complementary data lines at a unit of 4 bits. Thus, one memory mat has a storage capacity of 512×256×4, and one memory array has eight memory mats, so that the memory array has a total storage capacity of 512×256×4× 8=4,194,304, i.e., about 4 M bits. Since the DRAM is composed of four memory arrays, it has a storage capacity as high as about 16 M bits.

Here, one memory block is constructed of totally eight memory mats—one group being composed of four memory mats MS0L to MS3L whereas the other group being composed of four memory mats MS0R to MS3R. For this memory block, there are provided four main amplifiers MA.

When the row address is thus decided, one of the eight memory mats MS0L to MS3L and MS0R to MS3R composing the aforementioned one memory block is selected in response to the address signals of 3 bits X10 and X10B, X1 and X11B, and X9 and X9B so that the aforementioned signals of 4 bits are outputted in a manner to correspond to the four main amplifiers.

One of the four main amplifiers AS0 to AS3 is selected in response to the address signals Y0 and Y1 of the Y-address signals. In response to the remaining address signals Y10 and Y11, moreover, one of the four groups of main amplifiers NA0 to NA3 is selected. Thus, one of the totally sixteen main amplifiers is activated in response to the address signals of 4 bits Y0 and Y1, and Y10 and Y11 so that the read signal of 1 bit is outputted through a data output circuit.

Incidentally, in the case of the memory access at the unit of 4 bits, although not especially limitative, the address signals Y10 and Y11 may be ineffective to output the signals of those totally four main amplifiers of the four groups, which are designated by the address signals Y0 and Y1, in parallel with one another. In the reading operations in the nibble mode, moreover, although not especially limitative, the aforementioned main amplifiers may be addressed and advanced stepwise in response to the address signals Y0 and Y1 or Y10 and Y11 to output signals of 4 bits serially.

Figure 7:
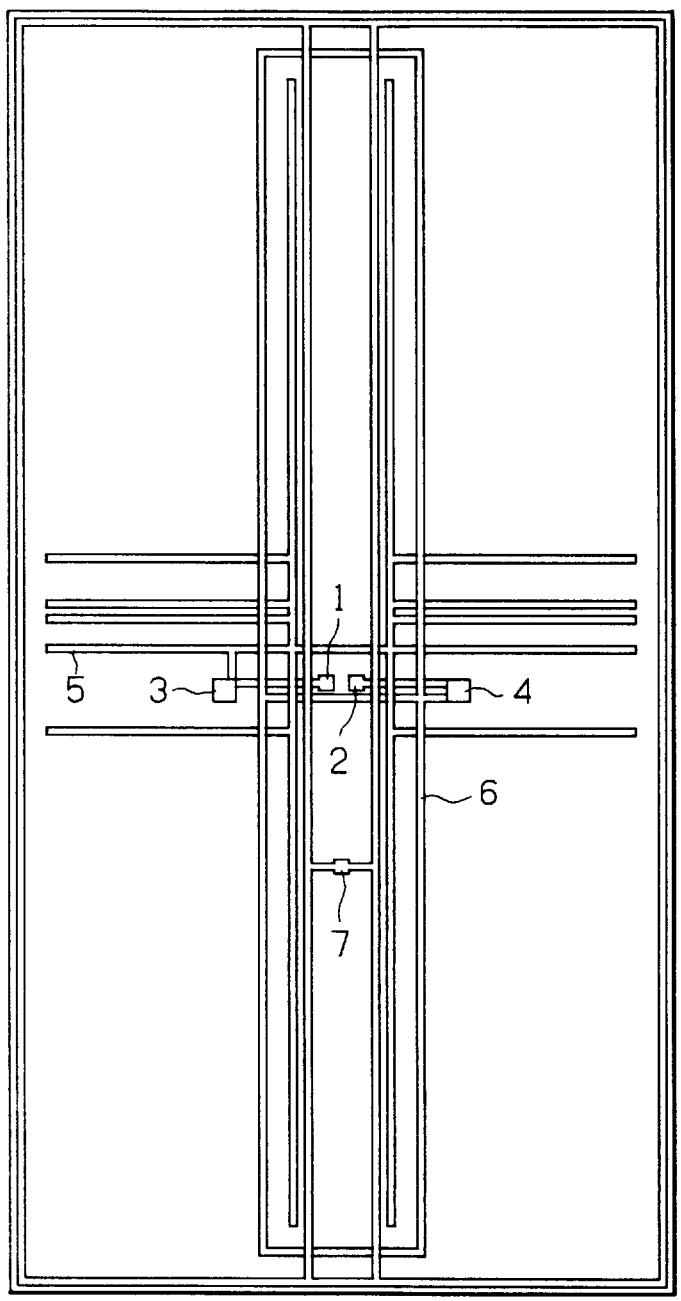
FIG. 7 is a layout for specifically explaining the power supply lines and the relations between the associated power circuits and the pads.

FIG. 7 is a schematic layout for specifically explaining the aforementioned power supply lines and the relations between their associated internal power circuit and the pads.

Reference numerall designates the external power pad VCCE for supplying the power voltage to an internal drop power circuit (VCC) 3 through a wiring layer. The internal drop power circuit (VCC) 3 receives the supply of the power voltage VCCE such as about 5 V and generates the internal voltage VCC such as about 3.3 V for the peripheral circuit. The internal voltage VCC is transversely fed through a wiring line 5 to operate the address buffers or decoders. Moreover, the wiring line 5 is branched at a generally center portion into two halves, which are extended vertically or longitudinally. These extensions correspond to the aforementioned power supplies of the X-decoders and the main amplifiers. Thus, the wiring lines 5 are branched not only vertically, as above, but also transversely in positions corresponding to the redundancy circuits.

Reference numeral 2 designates the external power pad VCCE for supplying the power voltage VCCE to an internal drop power circuit (VDL) 4 through a wiring layer. The internal drop power circuit (VDL) 4 receives the supply of the power voltage VCCE such as about 5 V and generates the operating voltage VDL such as about 3.3 V for the memory arrays (or sense amplifiers). The voltage VDL is distributed generally in the form of two squares sharing one side through wiring lines 6. Specifically, the wiring lines 6 are once extended transversely from the output point of the internal drop power circuit (VDL) 4 and then arranged in a rectangle enclosing the longitudinally extended wiring lines 5. Thus, the wiring lines 6 take the aforementioned form of the two squares sharing one side. Numeral 7 designates a power pad for the data output buffer and the guard ring, which is extended transversely in parallel to enclose the pad or main amplifier at the longitudinally center portion. The extensions of the power pad 7 at the two vertical ends enclose the whole area of the chip, thus establishing the guard ring function.

Figure 8:
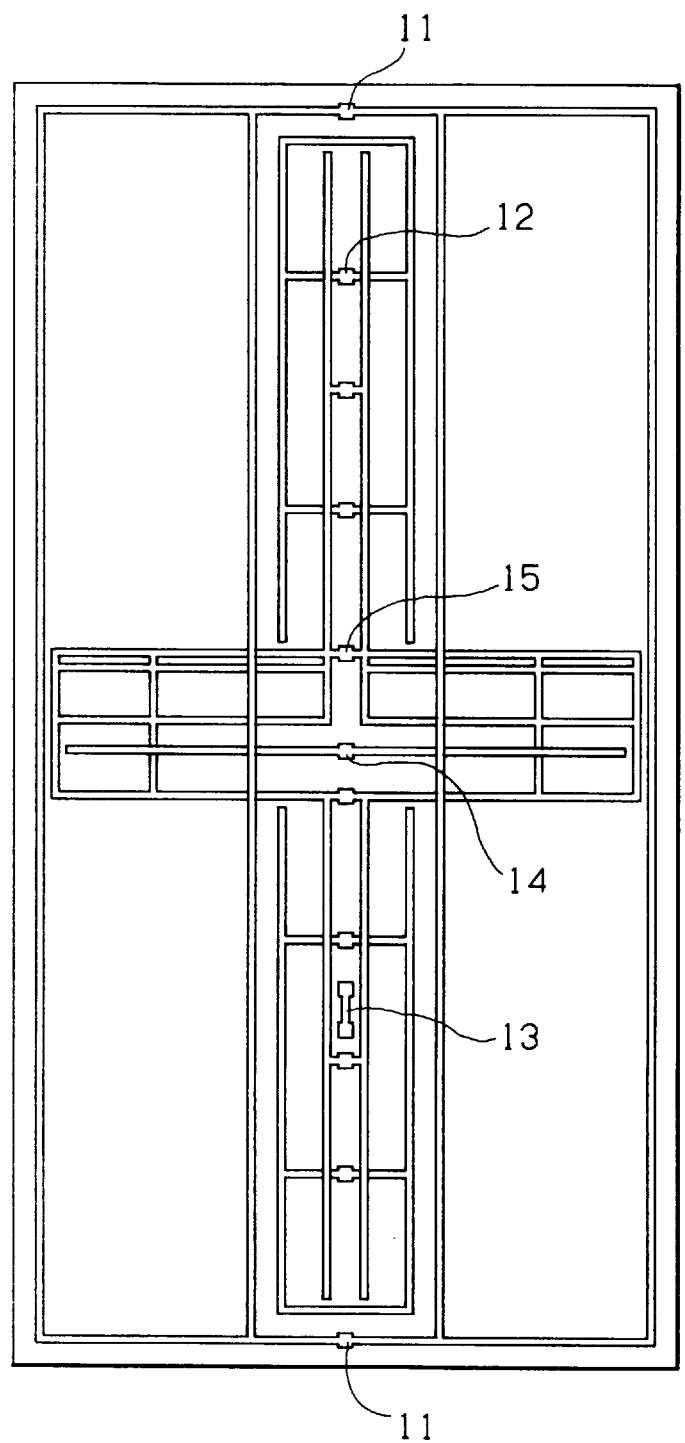
FIG. 8 is a layout for specifically explaining the ground lines and the relations between the associated internal power circuits and the pads.

FIG. 8 is a schematic layout for specifically explaining the ground lines of the aforementioned circuit and the relations between the associated internal power circuit and the pads.

Reference numerals 11 located at the upper and lower ends of the center portion of the chip designate ground potential supplying pads VSS for word clearing and word line latching operations. The pads 11 are once extended transversely and then branched in positions corresponding to the word drivers until they are extended vertically. The pads 11 are further extended transversely and further at the ends corresponding to the word clearing portions until they are connected to each other. Numerals 12 designate ground potential pads for the common sources of the sense amplifiers and for supplying the ground potential to activate the sense amplifiers. In this embodiment, the ground potential pads 12 are arranged vertically symmetrically with respect to the transverse center portion. At the upper side, the pads 12 are two in number and are respectively extended transversely and then vertically in positions where there are provided the power switches MOSFETs for supplying the ground potential to the sense amplifiers. Numeral 13 designates an element for supplying the ground potential to the data output buffers. This element 13 is composed of two pads arranged to correspond to the four data output buffers and wiring lines connecting the pads. Numeral 14 designates a ground potential pad for the internal drop power circuits VCC and VDL and the address buffer. The ground potential pad 14 is connected with the wiring lines which are extended transversely to the right and left. Numeral 15 designates a ground potential pad for another circuit, i.e., for supplying the ground potential to the remaining circuits such as the aforementioned decoder circuits or main amplifiers. Since the number and range of the circuits to be supplied with the ground potential are large and wide, the pads are as many as four, and the wiring lines to be connected with the pads are extended relatively complicatedly in the transverse and longitudinal directions, as shown. In this embodiment, the ground lines are divided into one to five kinds in accordance with the circuit functions and are commonly connected through the lead frame having the LOC structure. As a result, the noise leakage between the circuits having the ground lines divided as above can be suppressed to enlarge the noise margin. Since the ground potential is applied through the independent pads 14 and the relatively short wiring lines to the address buffers having severe restrictions upon the noise margin, it is possible to retain a sufficient input noise margin. This aims at effecting a substantial separation of a portion such as a sense amplifier, which is operative to generate relatively high noises in the ground line, from the aforementioned circuit which has the severe restrictions upon the noises.

Figure 9A:
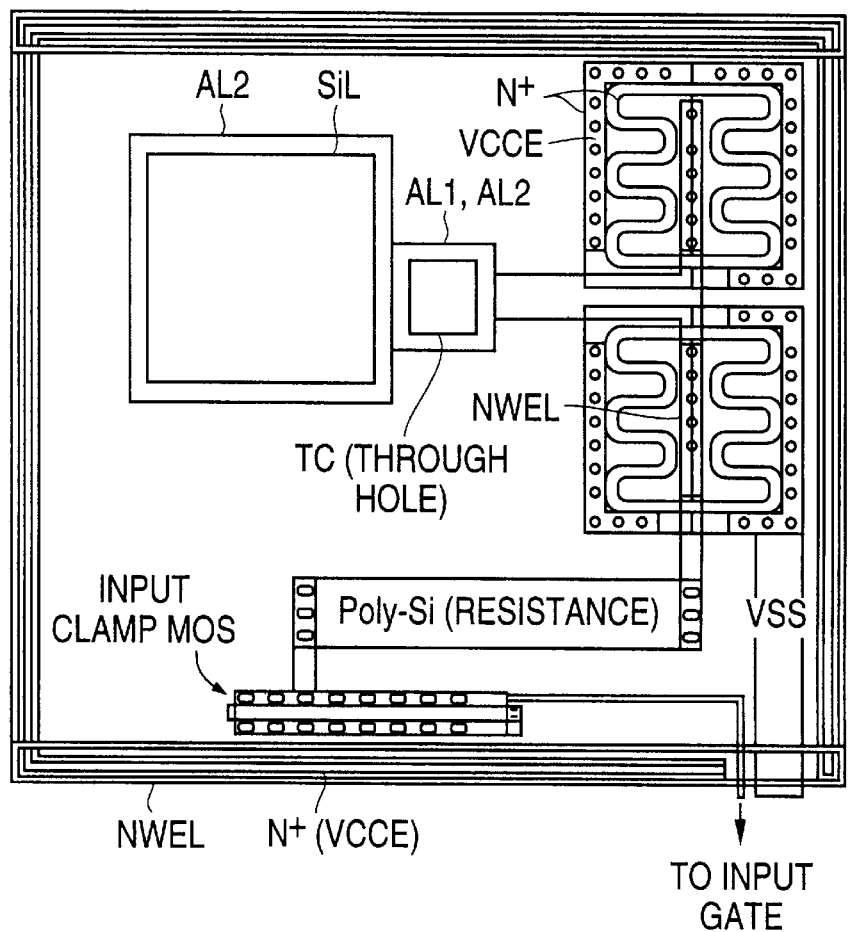
FIGS. 9(A) and 9(B) are a specific layout and a section showing one embodiment of an input protection circuit according to the present invention.
Figure 9B:
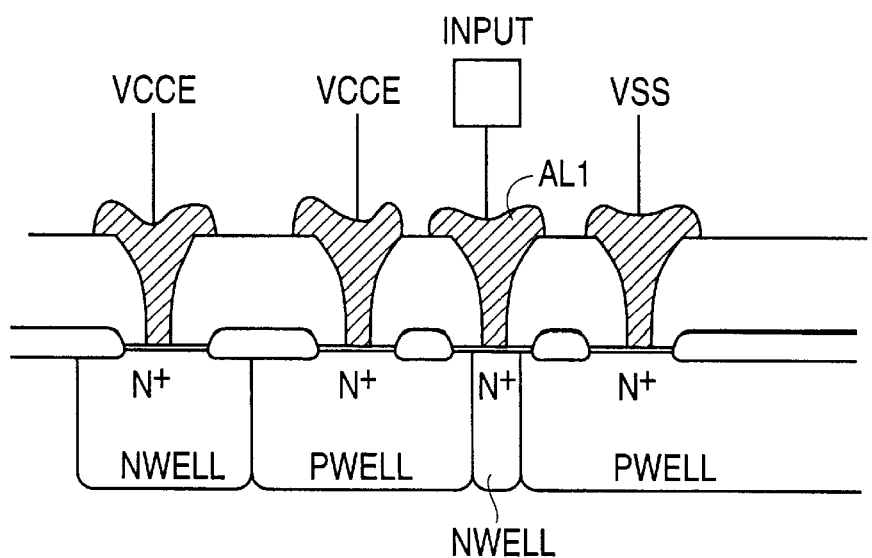

FIGS. 9(A) and 9(B) are a specific layout and a section showing an input protection circuit which is provided for the aforementioned bonding pads.

In this embodiment, as is apparent from the layout (A) and the section (B) of a portion of the former, the protection element is exemplified by a bipolar transistor of lateral type, i.e., $N^+$-PWELL(Substrate)-$N^+$, although not especially limitative. In this case, the emitter uses both the voltages VCCE and VSS. When a high (positive/negative) voltage is applied to the input, its potential is damped in this lateral transistor. In this embodiment, as shown in the layout of FIG. 9(A), the potential to be transmitted to the input gate is dropped by a high-resistance element made of polysilicon. The resistance value of this high-resistance element cannot be raised so high from the standpoint of the transmission speed of the input signal but to an appropriate level such as 300 to 500 ohms in view of the signal transmission function and the protection function.

The guard rings are formed around the NWELLs (N-type well regions) and made of $N^+$ to prevent any abnormal voltage at the input portion from adversely affecting the peripheral circuits. These guard rings are supplied with the voltage VCCE from the outside. In case the bonding pads are arranged in the center portion of the chip as in this embodiment, the memory arrays or the peripheral circuits are more liable to be influenced by the surge voltage than the conventional case in which the bonding pads are arranged in the peripheral portion of the chip. Thus, the influences of the surge voltages through the substrate are reduced by surrounding the bonding pads by the guard rings as the welled diffusion layers and by supplying the external power voltage VCCE to the guard rings.

Moreover, the aims at using the lateral type bipolar transistors as in this embodiment are as follows. Since the lateral type transistor can have its area reduced, it is unnecessary to prevent the current from being concentrated by enlarging the opposed length (or base width) of the $N^+$-type diffusion layers or the collectors or emitters thereby to drop the current value per unit length and to add any special process for forming the transistor.

In FIG. 9, characters AL2 designate a second aluminum layer, and characters AL1 designate a first aluminum layer. Moreover, letters SiL designate a passivation open layer, and letters TC designate through holes for connecting the second aluminum layer AL2 and the first aluminum layer AL1.

Figure 10:
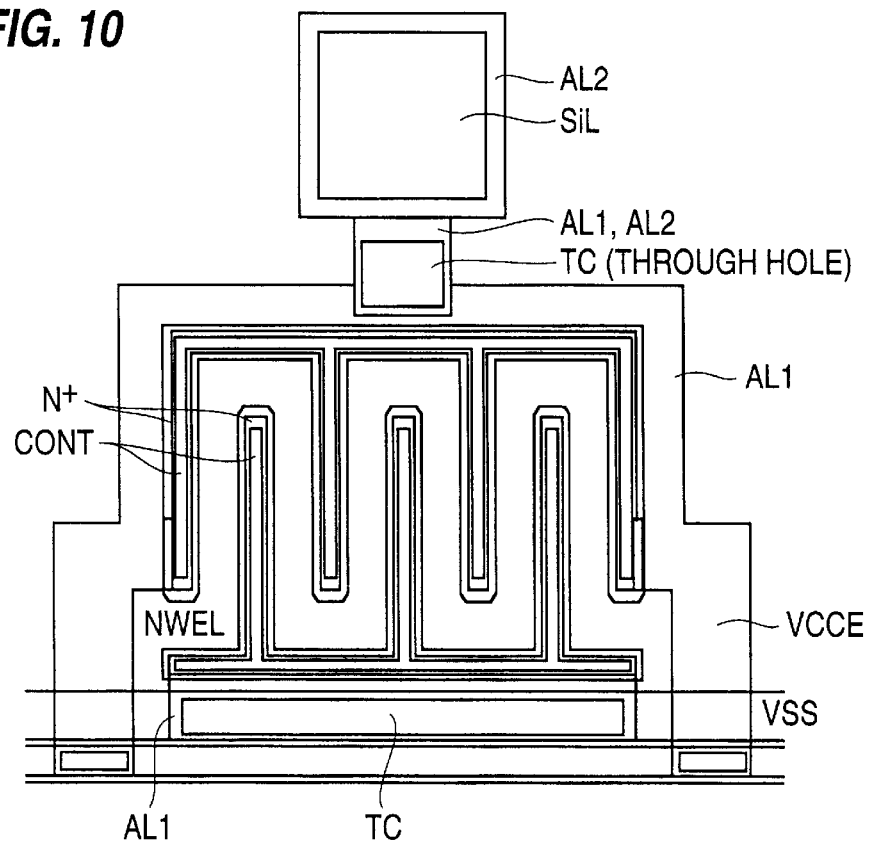
FIG. 10 is a specific layout showing one embodiment of the input protection circuit mounted in the external power source voltage pad.

FIG. 10 is a specific layout showing an input protection circuit to be provided for the external power voltage VCCE pad.

When a high voltage is applied to the VCCE pad, its charges are released to the ground potential VSS by the lateral type bipolar transistor of NWELL-PWELL (substrate)-NWELL. This protection element is disposed in each of the upper and lower ends of the longitudinal center of the chip. As a result, the high voltage can be dropped at the inlet of the leads running longitudinally at the chip center portion of the LOC structure. Thanks to this structure, the protection element is provided not in a one-to-one relation to the plural power pads but only in the paired pads in the vicinity of the inlet of the leads, so that the pads corresponding to the center portion of the leads can be kept away from the high voltage.

Figure 11:
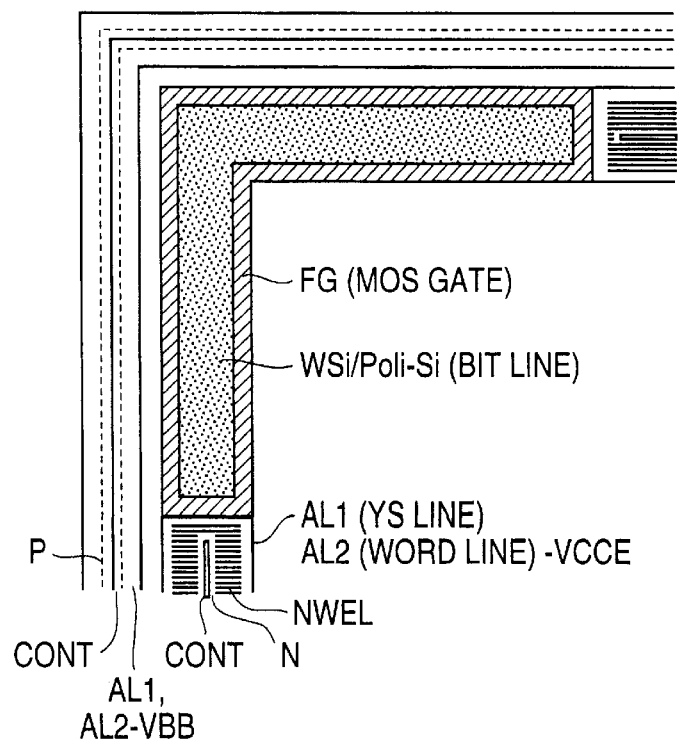
FIG. 11 is a layout showing one embodiment of the peripheral portion of a semiconductor chip.
Figure 12:
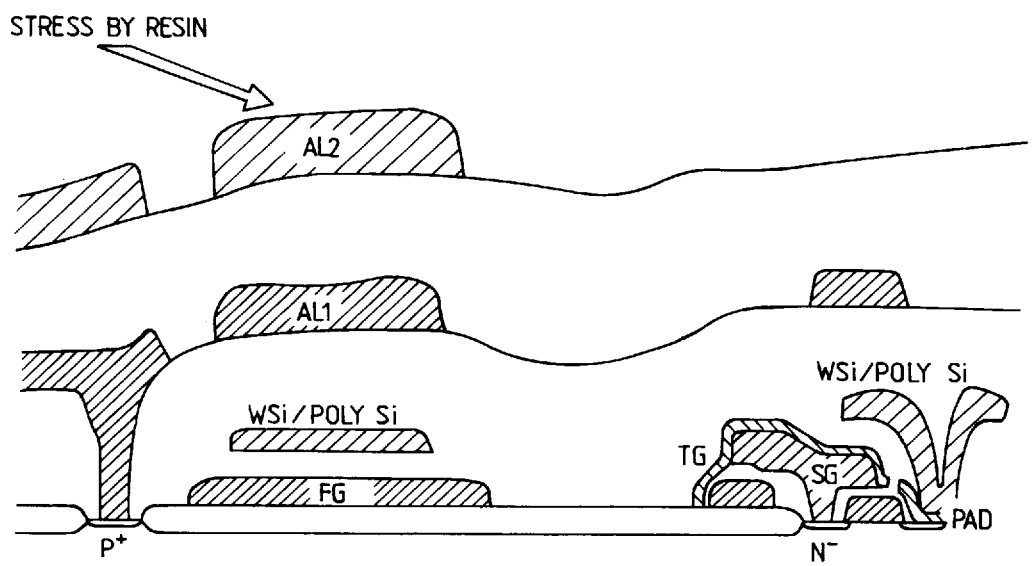
FIG. 12 is a schematic section showing the corner of the peripheral portion.

FIG. 11 is a layout showing the peripheral portion of the semiconductor chip, and FIG. 12 is a section showing a portion of FIG. 11 and a memory cell omitted from FIG. 11.

This embodiment adopts the structure, in which the peripheral circuits and the bonding pads are arranged in the longitudinal and transverse center portion of the chip, as has been described hereinbefore. As a result, the chip is arranged with the memory arrays eve at its peripheral portion and four corners. In this case, the four chip corners may possibly be cracked in the passivations by the stress of the resin of the package. In order to prevent this cracking, namely, to increase the mechanical strength, the step of the memory array, as shown, is utilized to form an FG (i.e., the polysilicon gate electrode of the MOS transistor) and a WSi/PolySi (i.e., the polysilicide layer forming the complementary data lines). As shown in schematic section in FIG. 12, moreover, the first aluminum layer AL1 and the second aluminum layer AL2 are superposed through an inter-layer insulating film. The stress coming from the resin is prevented from being applied directly to the memory array portion by forming such a gentle step in the corners of the chip. Moreover, the stress can be dispersed by elongating the corner portions FG and WSi/PolySi.

Figure 13:
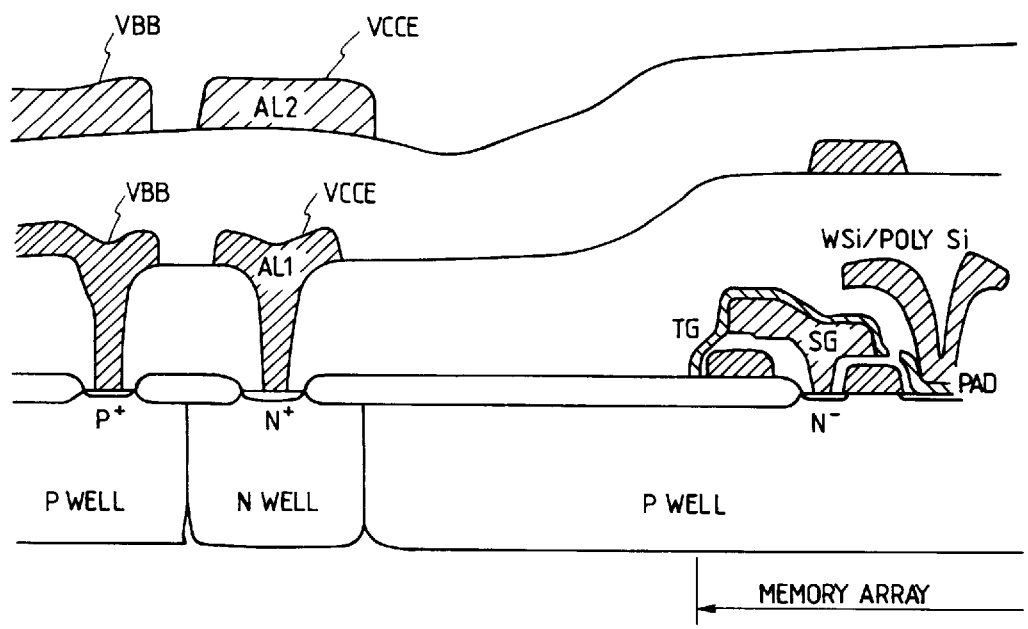
FIG. 13 is a schematic section showing the outermost periphery.

As shown in the layout of FIG. 11 and in the section of FIG. 13, moreover, there is arranged in the outermost periphery of the semiconductor chip a $P^+$-type diffusion layer which is supplied with the substrate bias voltage VBB from the first aluminum layer AL1 and the second aluminum layer AL2. Inside of the $P^+$-type diffusion layer, there is arranged as the guard ring the NWELL which is formed at its center with an $N^+$-type region which is supplied with the external power voltage VCCE from the first aluminum layer AL1 and the second aluminum layer AL2.

The aforementioned guard ring by the NWELL has a function to absorb the minority carriers which are generated from the P$^+$-type diffusion layer supplied with the substrate bias voltage VBB when a voltage of about -2 V generated by the substrate back bias voltage generator VBBG is abruptly changed by some cause. As a result, the minority carriers generated from the P$^+$-type diffusion layer can be prevented from migrating to the memory arrays and and from being coupled to the information charges stored in the memory capacitors of the memory cells, so that the information charges may be prevented from being reduced or broken.

Figure 5:
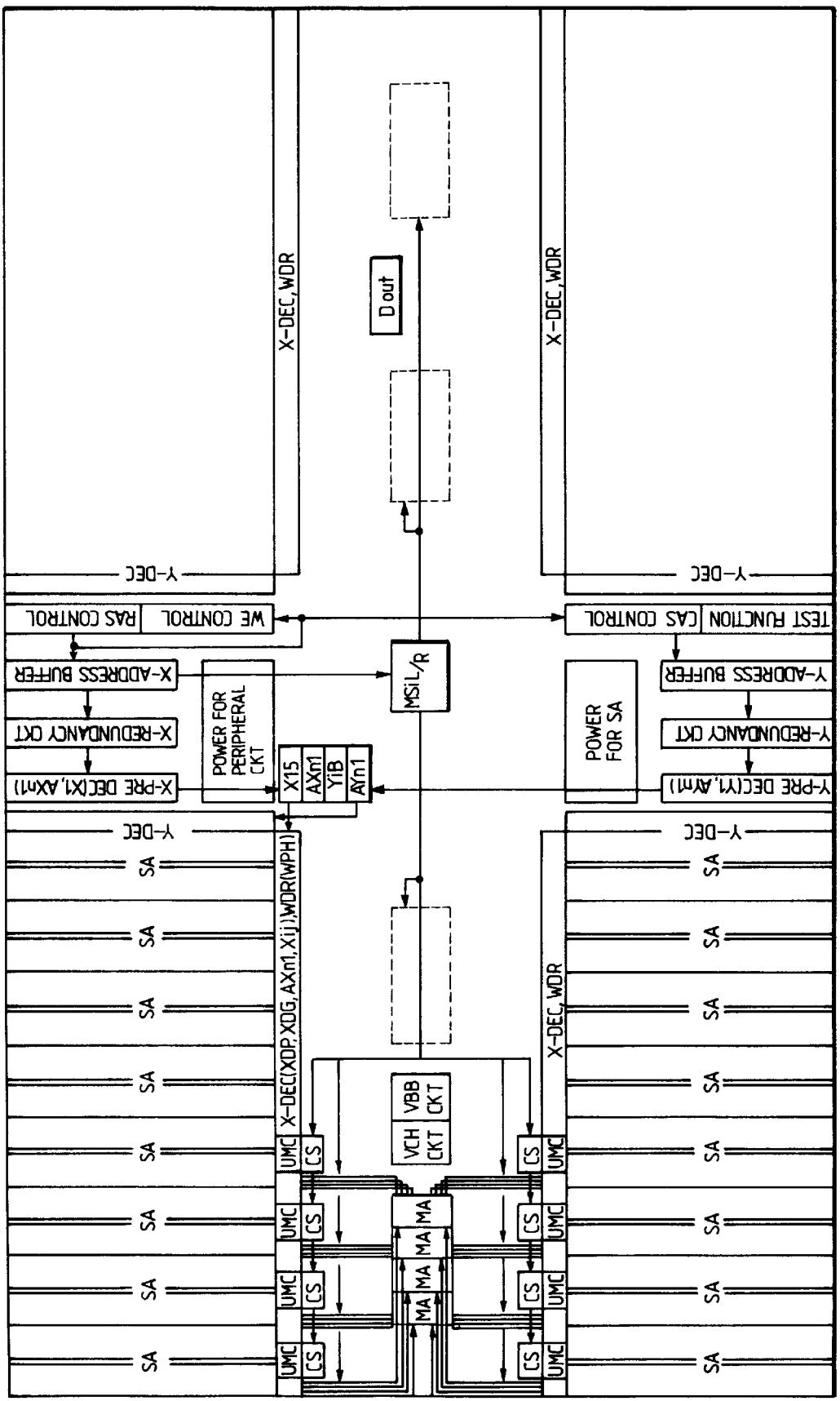
FIG. 5 is a block diagram noting the control signals of the dynamic RAM according to the present invention.

FIG. 5 is a block diagram showing the dynamic RAM according to the present invention while noting the control signals. FIG. 5 is drawn to correspond to the layout shown in FIG. 2.

The RAS control circuit is used to activate the X-address buffer in response to the signal $\overline{\text{RAS}}$. The address signals are fed from the X-address buffers to the X-redundancy circuits. Here, the address signals are compared with the defective addresses stored, and it is decided whether or not the switching should be made to the redundancy circuits. The decided results and the aforementioned address signals are fed to X-predecoders. Here, pre-decode signals Xi and AXn1 are generated and fed through X-address drivers XiB and AXn1 corresponding to the individual memory arrays, to the X-decoders corresponding to the aforementioned memory mats. In the same Figure, only one driver is shown as a representative by way of example.

On the other hand, the internal signals of the RAS system are fed to the control circuits of the WE system and the CAS system. By deciding the input order of the $\overline{\text{RAS}}$ signal, $\overline{\text{CAS}}$ signal and $\overline{\text{WE}}$ signal, for example, the automatic refresh mode (CBR) and the test mode (WCBR) are discriminated.

In the test mode, the test circuit is activated to set the test functions in response to a specific address signal fed at that time.

Of the address signals taken into the X-address buffers, the address signal for instructing the selection of a memory mat is transmitted to the mat selector MSiL/R, from which is selected any of the plural memory mats disposed in each memory array. Here, letters CS designate a common source switch MOSFET which is provided for a memory mat.

Like the address assignments shown in FIG. 4, the four main amplifiers MA correspond to four pairs of complementary data lines (of 4 bits) leading from the totally eight memory mats and arranged symmetrically with respect to the main amplifiers. In response to the memory mat selection signal MSiL/R, one of the eight memory mats is selected. These selections are accomplished by a unit mat control circuit UMC. In the same Figure, four pairs of main amplifiers MA are shown as one group by way of example, and the remaining three groups of main amplifiers are shown in black boxes drawn by broken lines.

The mat selector MSiL/R generates the selection signals MS0L/R to MS3L/R. If the signal MS0L is generated, for example, the four memory mats corresponding to the signal MS0L shown in FIG. 4 are selected. These four memory mats MS0L are made to correspond to the aforementioned four main amplifiers MA because they have input/output nodes of 4 bits.

The control circuit of the CAS system is used to generate a variety of Y-control signals in response to the signal $\overline{\text{CAS}}$. The address signals taken into the Y-address buffers in synchronism with the change of the signal $\overline{\text{CAS}}$ to the low level are fed to the Y-redundancy circuits. Here, the address signals are compared with the defective addresses stored, and it is decided whether or not the switching should be made to the redundancy circuits. The decided results and the aforementioned address signals are fed to Y-predecoders. Here, pre-decode signals Yi and AYn1 are generated and fed through Y-address drivers (at the final step) YiB and AYn1 corresponding to the individual four memory arrays, to the X-decoders corresponding to the aforementioned memory mats. In the same Figure, only one driver YiB and AYn1B is shown as a representative by way of example.

On the other hand, the aforementioned CAS control circuit activates the adjoining test circuit when it decides the input sequence of the $\overline{\text{RAS}}$ and $\overline{\text{WE}}$ signals received there to decide the test mode.

The bonding pads to be fed with the address signals and the control signals are gathered and arranged at the center portion of the chip, although omitted from the same Figure. As a result, the distances from the individual pads to the corresponding circuits can be shortened to a generally equal value. Thus, by taking the layout of this embodiment, the address signals and the control signals can be taken at a high speed to minimize the skew which is caused among the address signals of multiple bits.

As shown in the same Figure, moreover, the sense amplifier (SA) power source VDL and the peripheral circuit power source VCC are also arranged at the center portion of the chip. As a result, the circuits arranged at the four corners of the chip can be supplied with the various voltages through the wiring lines of equal and short distances. In each circuit, moreover, capacitors having a relatively large capacitance for voltage stabilizations, i.e., for dropping the power impedance are dispersed in the circuit along the power wiring lines, although not shown.

Figure 6:
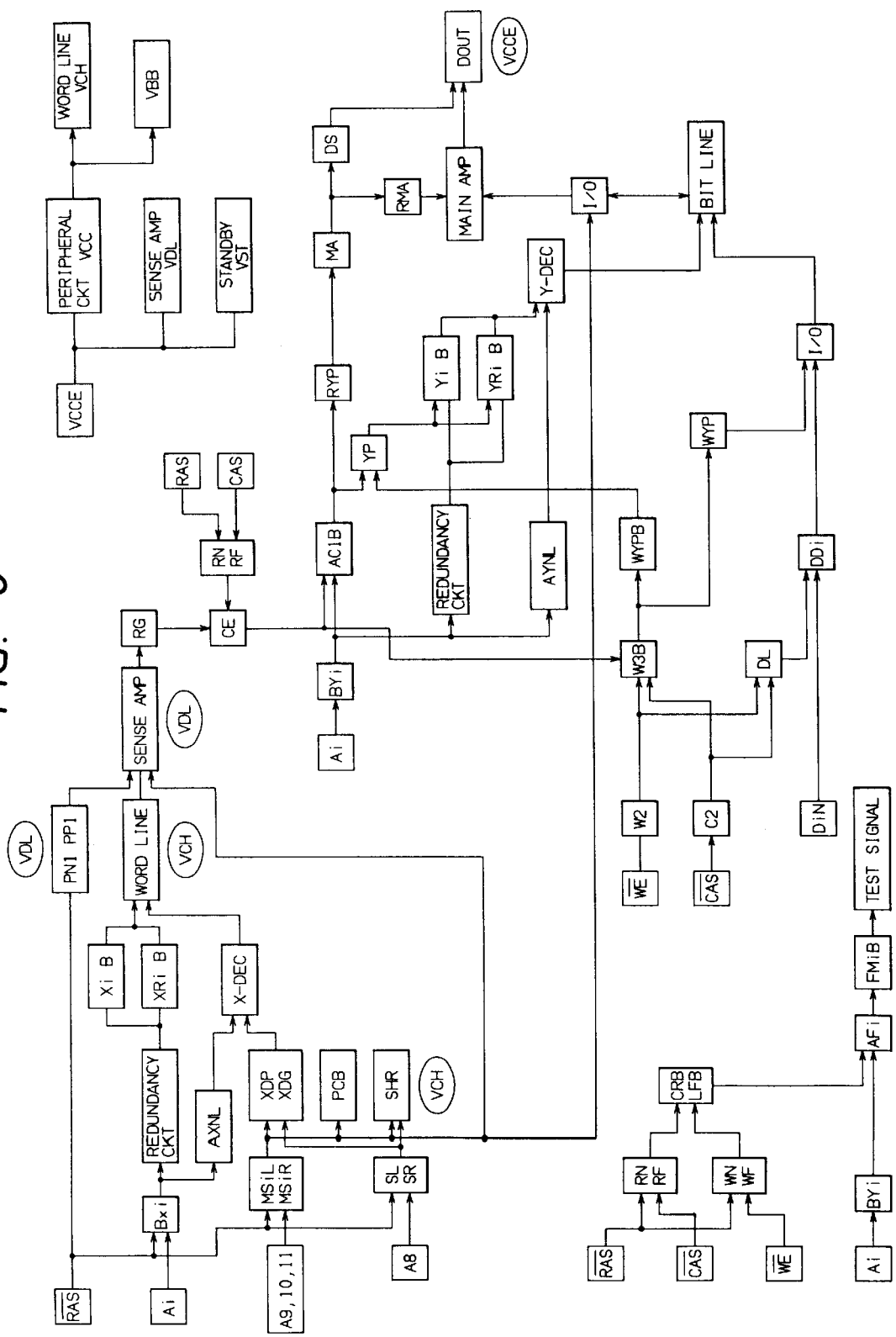
FIG. 6 is a block diagram showing the operation sequence of the dynamic RAM according to the present invention.

FIG. 6 is a block diagram noting the operation sequence for the structure of x 1 bit. In FIG. 6, the circuit blocks are indicated mainly by signal names, and the major circuits are indicated by circuit names. Thus, the signal paths showing the flows of the write/read signals are omitted from FIG. 6.

With reference to FIG. 6, the operations of the dynamic RAM will be schematically described in the following.

The address selecting operations of the row system are accomplished in the following.

The address signal Ai (A0 to A11) and the address signals A9 to A11 and A8 are taken into the address buffers in synchronism with the row address strobe signal $\overline{\text{RAS}}$ so that they are retained as the row internal address signal BXi, MSiL, MSiR, SL and SR. The address signal BXi taken into the address buffers is inputted on one hand to the redundancy circuit to decide whether or not the memory access is to the defective address. On the other hand, the address signal BXi is fed to the predecoder to generate a predecode signal AXNL, which is inputted to the X-decoder X-DEC provided for each memory mat. For the address signals A8 to A11, there are provided another set of buffers MSiL, MSiR, SL and SR. In short, the address signals A0 to A11 have their loads made relatively heavy because they are fed to the redundancy circuit and the predecoder so that they are inputted the numerous address comparators and gate circuits in the redundancy circuit. Thanks to the provision of the mat selecting address buffers MSiL, MSiR, SL and SR, according to this embodiment, the operations are speeded up because of no influence of the delay in the signals, which influence is caused by the input capacities of the redundancy circuit and the predecoder.

The X-decoder X-DEC is fed with an X-decoder precharge signal XDP and an X-decoder extraction signal XDG, which are generated from the mat selection signals MSiL/R, SL and SR for controlling the operation timing of the X-decoder X-DEC. The X-decoder X-DEC decodes, the aforementioned pre-decode signal AXNL in response to the timing signals SCP and SDG to generate the selection signals of the word lines. If, at this time, the accesss is to the defective address, a signal XRiB to be outputted from the redundancy circuit is generated to inhibit the selections of the word lines with the output of the X-decoder X-DEC and to select the redundant word line. For these word line selecting operations, the aforementioned boosted voltage VCH is used. Thus, the transmissions of the signal charges between the memory cells and the complementary data lines can be accomplished without any level loss without any relation to the threshold voltage owned by the address selecting MOSFET having its gate coupled to the redundant word line.

The aforementioned mat selection signals MSiL/R generate a complementary data line precharge signal PCB. Since the memory mat to be selected is decided by the mat selection signals MSiL/R, the precharging operations are released (or ended) at the complementary data lines of the selected mat. Then, the selection signals SL/SR are generated to designate the lefthand region SL or righthand region SR of the memory mat designated by the address signal A8. From the signals SL/SR and the mat selection signals MSiL/R, there is generated a selection signal SHR for controlling the switch MOSFET for selecting the region SL or SR to be coupled to the sense amplifier. The selection signal SHR to be used here is exemplified by the aforementioned boosted voltage VCH. As a result, the signals are transmitted without any level loss between the sense amplifiers and the complementary data lines selected.

The sense amplifiers are activated, if the conditions for control signals PN1 and PP1 of the power switch MOSFET prepared from the $\overline{RAS}$ signal, the selection signals of the word lines and the mat selection signals MSiL/R are satisfied. At this time, the sense amplifiers are activated by the voltage VDL which has been dropped in the inside, as has been described hereinbefore. At this time, the two-step amplifications are accomplished, although not shown, because of the drop in the peak current according to the operations of the sense amplifiers. At the first step, more specifically, the switch MOSFET for a relatively small current is turned ON to activate the sense amplifiers. At the second step for the relatively large amplified output, the switch MOSFET for a relatively large current is turned ON to effect the high-speed amplifications.

A signal RG determines the timing at which the Y-switch MOSFET is turned ON. After a sufficient signal is attained on the complementary data lines, the signal RG is generated to control the timing for selecting a later-described column system.

Signals RN and RF decide the normal read mode and the refresh mode. If the signal $\overline{CAS}$ is changed from the high to low levels before the signal $\overline{RAS}$ is changed from the high to low levels, the signal RF is generated to cause the refresh mode (i.e., CAS before RAS refresh). In this case, the address selections of the column system to be accomplished thereafter are omitted by a signal CE.

If the signal $\overline{CAS}$ is changed from the high to low levels when the signal $\overline{RAS}$ is at the low level, the normal mode signal RN is generated. In response to this, the signal CE for the read/write controls is generated. An address signal BYi taken in the Y-address buffer is fed to the Y-redundancy circuit and the predecoder to generate a pre-decode signal AYNL. A signal AC1B controls the operations of the main amplifiers and the Y-decoders and is generated as the address signals are changed at the break or at the high level of the signal CE.

A signal YiB is generated in the absence of the relief address in the redundancy circuit, whereas a signal YRiB is generated in the presence of the relief address.

The Y-decoder Y-DEC decodes the pre-decode signal AYNL, in the absence of the defect relief, to generate a Y-(column) selection signal and invalidates the address selection corresponding to the pre-decode signal AYNL, in the presence of the defect relief, to generate a relief Y-(column) selection signal.

A write signal W2 is prepared from the signal $\overline{WE}$. From the signal $\overline{CAS}$, there is prepared a signal C2 which is used for controlling the RAS/CAS logic, the read/write discriminaiton, and the setup and holding characteristics. A signal W3B is a one-shot pulse for read-modify-write operations and early-write operations to generate internal write pulses.

A signal WYP is used for controls from the data input buffers to input/output lines I/O, and a signal WYPB takes charge of controls from the input/output lines I/O to the complementary data lines. A signal DL determines a data setup/hold time when a write signal Din is taken into the data input buffers. A write data DDi taken into the data input buffers is transmitted in response to the signal WYP.

The write signal of the input/output line I/O is transmitted to the complementary bit (or data) line selected by the Y-decoder circuit Y-DEC and is written in one memory cell which is coupled to the complementary bit line to have its word lines selected.

The signal YP is an operation control signal for the Y-decoder system, and a signal RYP is an operation control signal for the main amplifier. The former signal YP is generated in the write operation, too, because it controls the Y-decoder Y-DEC.

From the signal RYP, activation signals MA and RMA are prepared to activate the main amplifier. A signal DS controls the data output timing of the main amplifier.

From the mutual input timing relations of the signals $\overline{RAS}$, $\overline{CAS}$ and $\overline{WE}$, there are respectively prepared test mode signals RN and RF, signals WN and WF, and signals CR and LF. The signals RN and RF and the signals WN and WF control CBR (CAS before RAS refresh) and WCBR (WE, CAS before RAS). The signals CR and LF control the testing circuits, e.g., sets/resets the address signal Ai in the aforementioned WCBR. The address signal AFi taken into the testing circuit is converted into FMiB for determining test modes to generate various test signals.

As the power circuit, there is prepared from the voltage VCCE such as about 5 V, which is fed from the external terminal, a drop voltage VCC such as about 3.3 V for a peripheral circuit, from which is further prepared a bootstrap voltage VCH such as about 5.2 V for determining the selection level of the word lines. Moreover, the voltage VCC is used to prepare the substrate back bias voltage VBB at about −2 V. From the voltage VCCE fed from the outside, moreover, there are independently prepared the drop voltage VDL such as about 3.3 V for the memory array (or sense amplifiers) and the drop voltage VST which is fed when in the standby.

From the schematic operations described above, the plural memory mats each composed of the memory arrays contain the X-decoders for selecting the word lines. These X-decoders are fed, as shown in the block diagram of FIG. 5, through the final driver stages with the mat selection signals MSiL/R prepared by the mat selection circuits MSiL/R and the pre-decode outputs AXNL and XiB prepared by the predecoder. The individual circuits arranged at the center portion are corresponded to by the address inputting bonding pads, the control signal $\overline{RAS}$, the address buffers and the redundancy circuits. As a result, the wiring length for transmitting the address signals can be shortened to speed up the operations. For example, in the layout in which the bonding pads are arranged on the two shorter sides of a rectangular chip such as the DRAM of the prior art to distribute the address terminals and the control terminals accordingly, the signal transmission length are elongated according to the size of the chip. In other words, there are mixed longer and shorter distances from the bonding pads to the input terminals of the address buffers. The distances from the address buffers to the address decoders become accordingly longer and shorter according to the positions of the address buffers. Thus, this layout system aiming at taking a large storage capacity as large as about 16 Mbits has its operating speed dropped in proportion to the size of its chip partly because the operating speed is determined by the longest one of the signal paths for handling the signal lines and partly because it is necessary to take the timing margin.

In the DRAM of this embodiment, on the contrary, the address inputting bonding pads and the control inputting bonding pads are concentrated at the center portion, as has been described hereinbefore, and the address buffers and the control circuits are arranged in proximity. Since, in this structure, the signal lines extend radially from the center portion of the chip, the signal propagation distances can be shortened to about one half of the size of the chip. The wiring resistance and wiring capacity get larger in proportion to the wiring length. Hence, the signal propagation delay time is delayed on principle in proportion to the square of the signal propagation distance. It follows that the substantial reduction of the signal propagation distance to one half of the size of the chip causes the reduction of the signal propagation delay time to one quarter.

The embodiment takes a structure in which only the memory mat at the unit selected by the mat selection signal MSiL/R is activated. On the basis of the mat selection signal MSiL/R, there are generated for each memory mat the signals SHR and PCB necessary for the address selecting operations of the mat and the sense amplifier activation signal. According to this structure, a timing margin for the aforementioned signals SHR and PCB and the sense amplifier activation pulses need not be taken between the memory mat arranged at a relatively short distance from the mat selection circuit arranged at the center and the memory mat arranged at a longer distance. In other words, the memory mat thus activated starts its operation, when it is fed with the aforementioned mat selection signals MSiL/R, to generate a variety of signals for the address selections by the timing system optimized in the subsequent unit mat.

According to this structure, the mat selection circuit to be arranged at the center portion of the chip is sufficient, if it feeds eight mat selection signals to thirty two mats in the foregoing embodiment, so that it can lighten the signal load and reduce the number of signal lines. As a result, the delay of the selection signals to be transmitted to each mat can be reduced. Moreover, the memory mat thus selected operates at the timing optimized for each mat and needs no timing margin between the mats so that a high-speed memory access can be accomplished.

As in the address assignments of the memory mats shown in FIG. 4, on the other hand, the two axially symmetric memory mats, e.g., MS0L and MS1L or MS2L and MS3L constitute one sub-block. Four sub-blocks are provided for one memory array. In this structure, only one of the aforementioned two axially symmetric memory mats is activated. Thus, one control circuit can be used commonly for the two memory mats.

In the aforementioned sub-block composed of two memory mats, the memory mats, e.g., MS0L, MS1L, MS2L and MS3L, which are in axially symmetric relation between the memory arrays separated by the longitudinal center area, may be used as one memory block for one control circuit. In this case, too, only one of the memory mats MS0L, MS1L, MS2L and MS3L is activated so that one control circuit can be commonly used. In this case, eight memory blocks are made for all the memory arrays.

The control circuit is effective, if it generates only one of the various signals such as the aforementioned ones for the precharging operations of the complementary data lines, the activations of the sense amplifiers, the shared sense amplifier controls, the activations of the X-decoders, the activations of the word drivers, the activations of the Y-decoders, the selections of the common input/output lines I/O, and the selections and activations of the main amplifiers. The control circuit can be more effective if it can generate all of the various signals.

In case the memory array is to be constructed as the block of the unit mats, the number of operable mats can be easily changed merely by changing the mat selection circuit, i.e., the mat selection logic. Thus, the kind development (to a lower power) can be easily accomplished.

Moreover, the X-decoders or Y-decoders for selecting the word lines or data lines may be disposed either adjacent to the memory mat of the unit or commonly for the plural unit mats. In this embodiment, the X-decoder is disposed for each memory mat, whereas the Y-decoder is disposed for each memory array so that it may be shared among the eight memory mats to provide an efficient layout.

Figure 14:
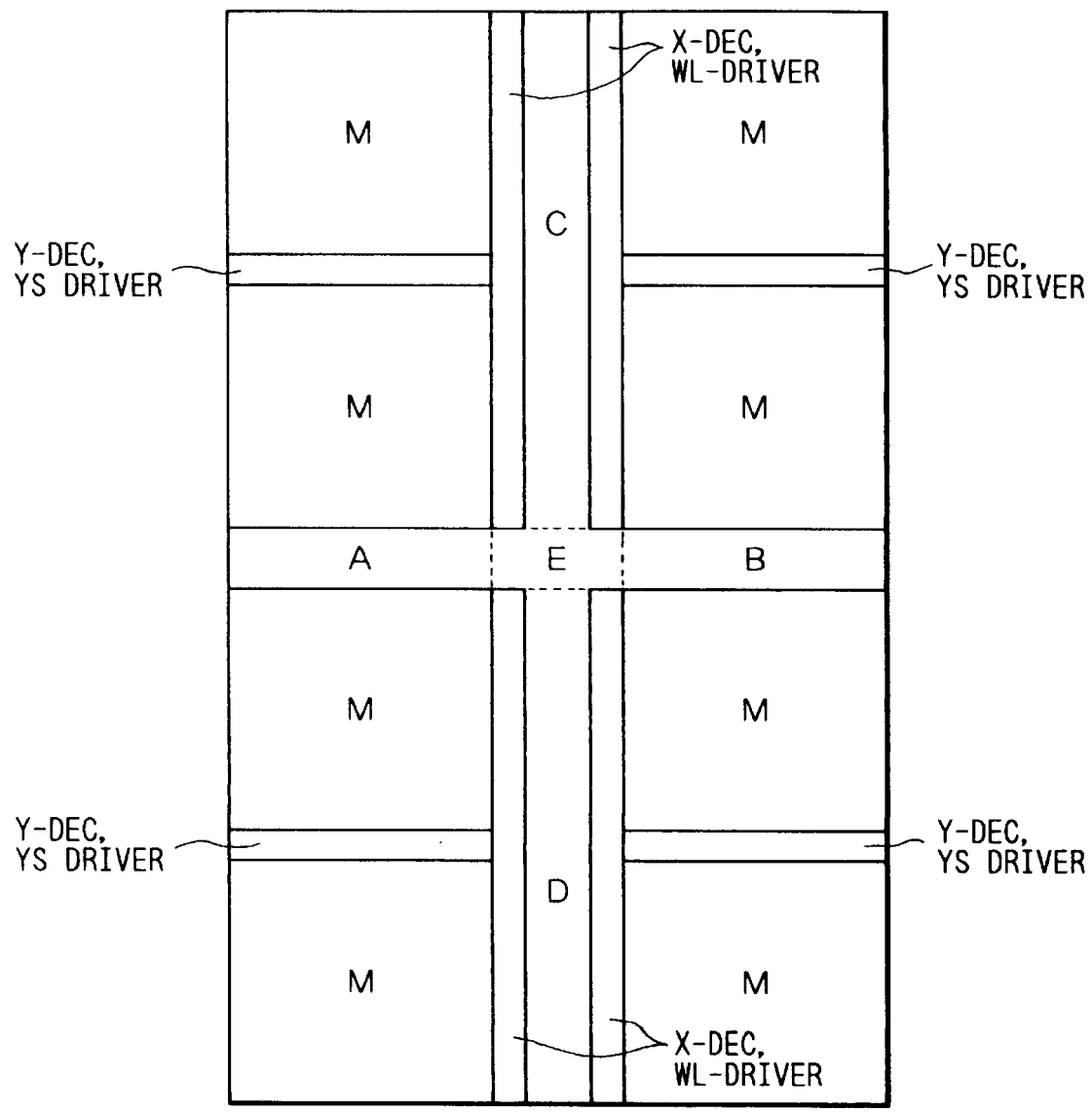
FIG. 14 is a fundamental layout showing another embodiment of the dynamic RAM according to the present invention.

FIG. 14 is a fundamental layout showing another embodiment of the dynamic RAM according to the present invention.

In this embodiment, like the aforementioned embodiment of FIG. 1, each of the four memory arrays, which are divided by the cross area composed of the longitudinal center portion and the transverse center portion, is equipped with a Y-decoder. In this structure, the Y-decoder is arranged at the center of each memory array so that the column selection lines can be shortened. This makes it possible to speed up the selecting operations of the Y-system. In accordance with this structure, the pre-decode signals of the Y-system are fed to the individual Y-decoders through wiring channels disposed in the longitudinal center portion. Here, what are disposed at the sides adjacent to the longitudinal center portion are X-decoders similar to the aforementioned ones.

In this structure, too, similar speed-up can be achieved by arranging at the center portion of the aforementioned chip the bonding pads, the input circuit such as the corresponding address buffers, the memory mats, the sub-blocks or the memory block selector.

Figure 15:
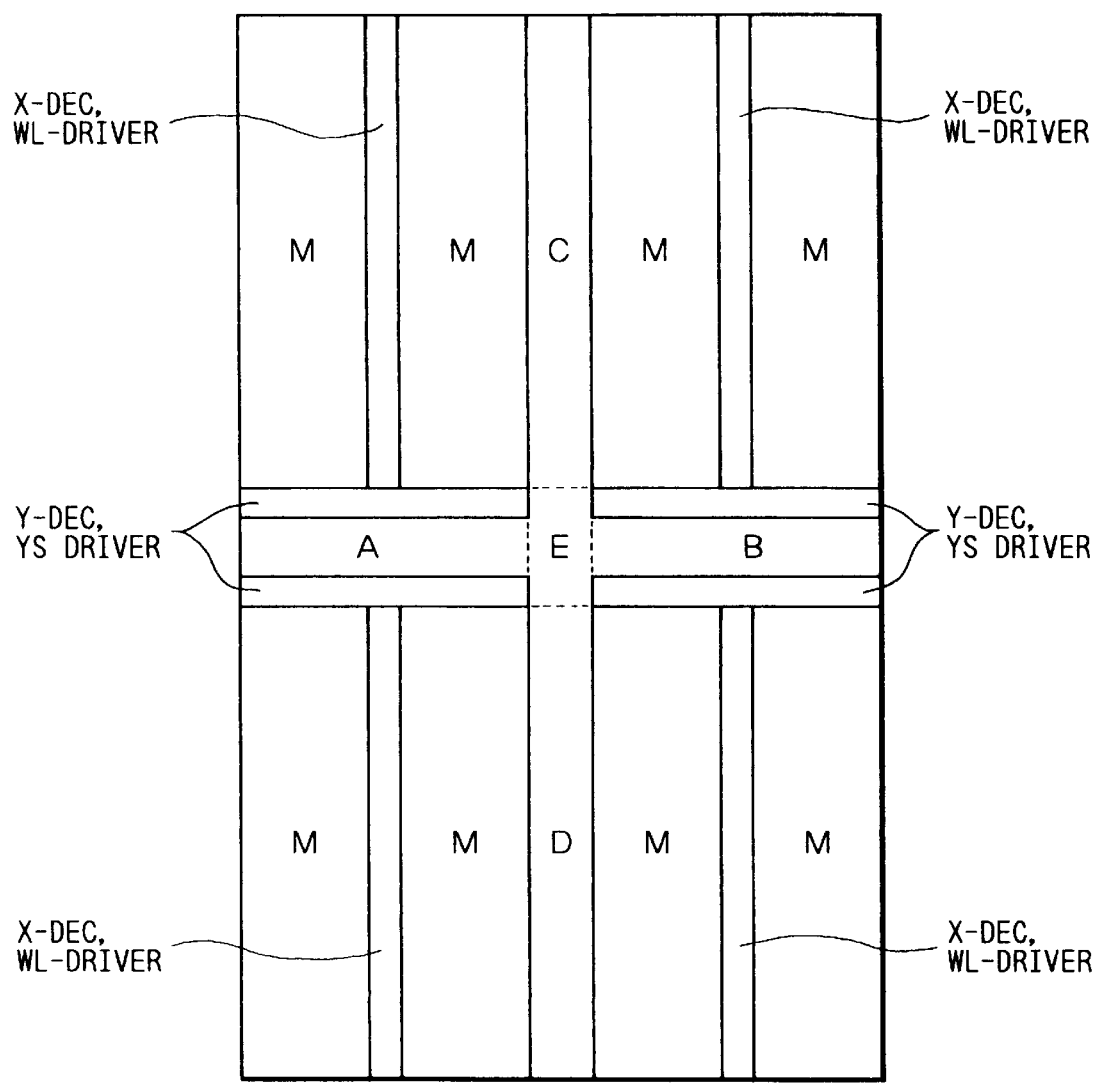
FIG. 15 is a fundamental layout showing still another embodiment of the dynamic RAM.

FIG. 15 is a fundamental layout showing another embodiment of the dynamic RAM according to the present invention.

In this embodiment, like the aforementioned embodiment of FIG. 1, the four memory arrays, which are divided by the cross area composed of the longitudinal center portion and the transverse center portion, are equipped with X-decoders at their respective center portions. According to this structure, the lengths of the word lines at each unit memory mat can be halved to accordingly lighten the loads upon the word lines so that the word line selecting operations can be speeded up. In according to this structure, the pre-decode signals of the X-system are fed to the X-decoders corresponding to the individual memory mats through the wiring channels formed in the X-decoders. Here, what are disposed at the sides adjacent to the transverse center portion are the Y-decoders like the aforementioned ones.

In this structure, too, similar speed-up can be achieved by arranging at the center portion of the aforementioned chip the bonding pads, the input circuit such as the corresponding address buffers, the memory mats, the sub-blocks or the memory block selector.

Figure 16:
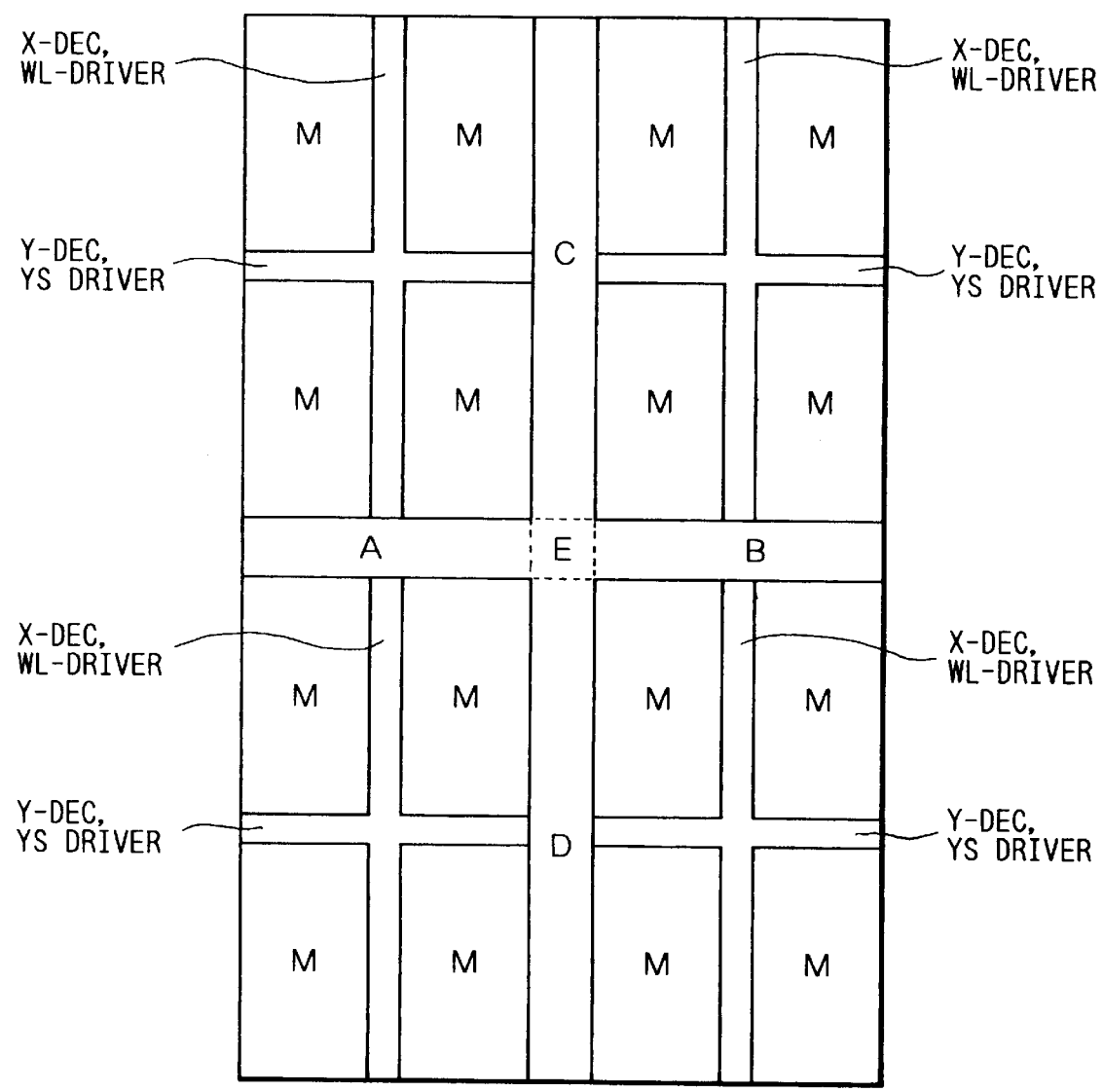
FIG. 16 is a fundamental layout showing a further embodiment of the dynamic RAM.

FIG. 16 is a fundamental layout showing another embodiment of the dynamic RAM according to the present invention.

In this embodiment, like the foregoing embodiment of FIG. 1, the four memory arrays, which are divided by the cross area composed of the longitudinal center portion and the transverse portion of the chip, are equipped with X-decoders and Y-decoders in the longitudinal and transverse directions. According to this structure, the lengths of the word lines and the column selection lines can be halved to lighten the loads accordingly to speed up the word line selections and the column line selections. In this structure, one of the four memory areas divided by the X- and Y-decoders may be selected and equipped at its center portion with control circuits for generating a variety of signals for the precharging operations of the complementary data lines, the activations of the sense amplifiers, the controls of the shared sense amplifiers, the activations of the X-decoders, the activations of the word drivers, the activations of the Y-decoders, the selections of the common input/output lines I/O, and the selections and activations of the main amplifiers.

In this structure, too, similar speed-up can be achieved by arranging at the center portion of the aforementioned chip the bonding pads, the input circuit such as the corresponding address buffers, the memory mats, the sub-blocks or the memory block selector. Incidentally, the X-decoders and the Y-decoders may be interchanged in the foregoing embodiments of FIGS. 14 to 16.

Whatever of the modifications of the aforementioned fundamental layouts might be adopted, the memory arrays are quartered by the cross regions of the longitudinal and transverse center portions of the chip so that they may be formed with the peripheral circuits and the bonding pads. Especially in the structure which is arranged at its center with the address pads, the address buffers, the predecoders or the final-stage driver for feeding the pre-decode signals to the individual decoders, the propagation paths of the signals for the memory access are radially extended longitudinally and transversely at the shortest equal distance to the four corners. As a result, the aforementioned high-speed operations can be accomplished.

The chip is also arranged generally at its center portion with the internal power source such as the drop voltage generator for generating the operating voltage VDL of the memory arrays (or sense amplifiers) or the operating voltage VCC of the peripheral circuits. According to this structure, the wiring length for the power supply can also be shortened like the foregoing embodiment of FIG. 7. As a result, the power impedance can be suppressed at a low level to speed up the operations of the circuit and drop the noises.

FIG. 17 presents layouts showing the fundamental structures of another embodiment of the memory mat and another embodiment of the memory block constructed by composing the fundamental structures.

Figure 17A:
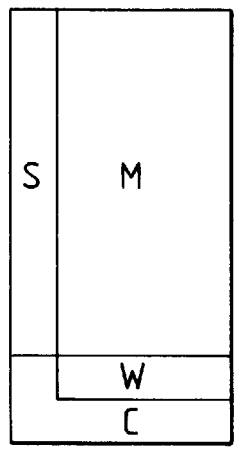
FIGS. 17(A) to 17(C) are layouts showing the fundamental structure of another embodiment of the memory mat and another embodiment of the memory block constructed by combining the former.

FIG. 17(A) shows the fundamental structure of the memory mat. In FIG. 17(A): letter S designates a sense amplifier; letter M a memory cell array; letter W a word line driver (including an X-decoder); and letter C a control circuit. In the embodiment of FIG. 17(A), the sense amplifier S is disposed at the lefthand side of the memory cell array M. Therefore, the memory mat of this embodiment does not adopt the shared sense amplifier system unlike the foregoing embodiment.

Figure 17B:
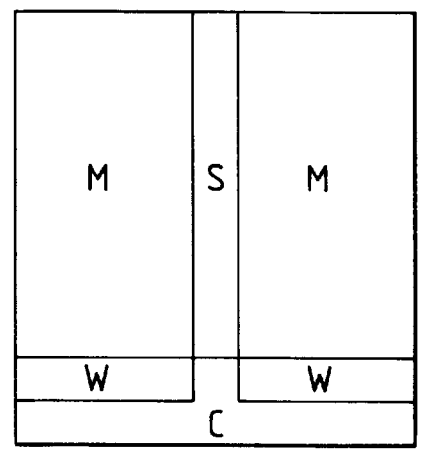

FIG. 17(B) shows the structure in which the memory cell arrays M are arranged symmetrically with respect to the sense amplifier S of the aforementioned memory mats to construct the sub-block. In this case, the sense amplifier S may be used, by the shared sense amplifier system, selectively for either of the righthand and lefthand memory cell arrays M, or two sense amplifiers S may be arranged adjacent to each other in a manner to correspond to the individual memory cell arrays. A plurality of these sub-blocks are combined to construct the aforementioned memory array. If, in this structure, the righthand and lefthand memory cell arrays are selected, the control circuit C can be shared.

Figure 17C:
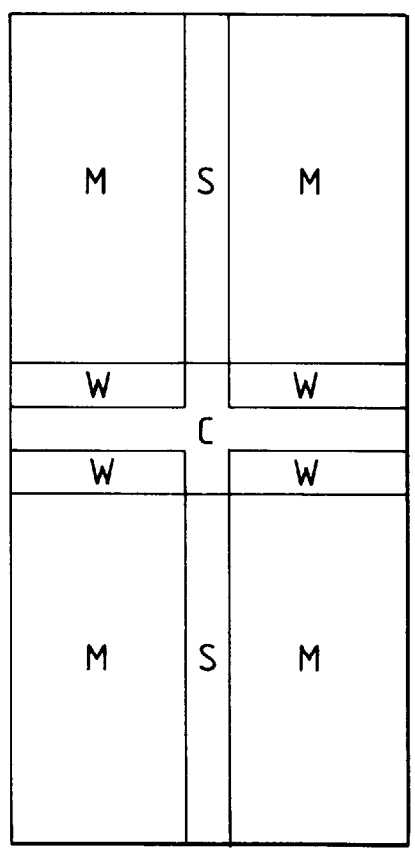

FIG. 17(C) shows one memory block, which is constructed by combining the memory mats of FIG. 17(A) such the word line drivers W, the memory cell arrays M and the sense amplifiers S are arranged vertically symmetrically to have the control circuit C located at the center of the sub-block of FIG. 17(B). In this case, each of the paired vertically symmetrical sub-blocks may be composed of two memory arrays. By making such an address assignment that one of the four quartered memory cell arrays M (or unit memory mats) may be selected, the sense amplifier S is coupled selectively to the righthand and lefthand memory cell arrays through the switch MOSFET by the shared sense amplifier system, and the word line drivers W may be shared between the upper and lower memory cell arrays. According to this structure, the control circuit can be shared for the four memory mats. In this case, however, the Y-signal circuit is eliminated because there is no Y-decoder in the mats or blocks.

FIG. 18 presents layouts showing the fundamental structures of another embodiment of the memory mat and another embodiment of the memory block constructed by composing the fundamental structures.

Figure 18A:
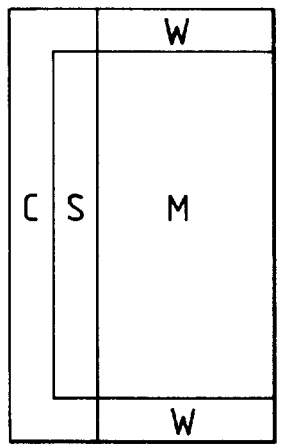
FIGS. 18(A) to 18(C) are layouts showing the fundamental structure of another embodiment of the aforementioned memory mat and another embodiment of the memory block constructed by combining the former.

FIG. 18(A) shows the fundamental structure of the memory mat. In the embodiment of FIG. 18(A), the control circuit C is disposed adjacent to the sense amplifier S. The word line drivers W are disposed at the two vertical sides of the memory cell array M. The word line drivers W are used to bring one word line into its selected/unselected state so as to effect the high-speed selecting operations of the word line. This structure may be replaced by another structure in which the word line of the memory cell arrays M is vertically bisected so that the two word lines may be selected by the aforementioned two word line drivers W. In this case, the word lines can be selected at a high speed by shortening the word lines. Moreover, the word lines may be alternately selected by the two vertical word line drivers. According to this structure, the pitch of the word lines to be selected can be twiced for the vertically divided word line drivers. In other words, the word line drivers requiring a relatively large area of occupation are vertically divided so that they can drive the word lines which are arranged at a smaller pitch. The memory mats of this embodiment do not adopt the shared sense amplifier system like the foregoing embodiment.

Figure 18B:
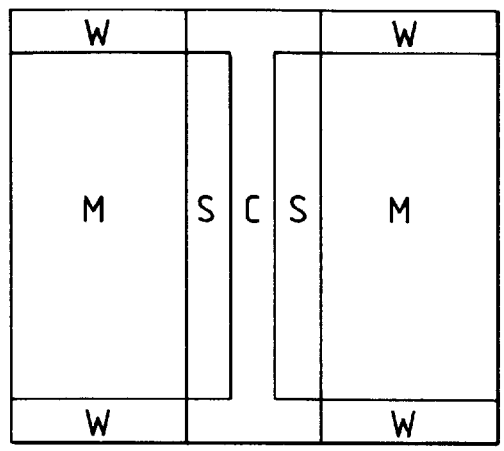

FIG. 18(B) shows a sub-block which is constructed by arranging the memory cell arrays M and the corresponding sense amplifiers S symmetrically with respect to the control circuit C of the aforementioned memory mat. In this case, the control circuit C is shared. There may be adopted the shared sense amplifier system, in which the control circuits C are vertically distributed and the sense amplifier S may be shared and used selectively for the two memory cell arrays.

Figure 18C:
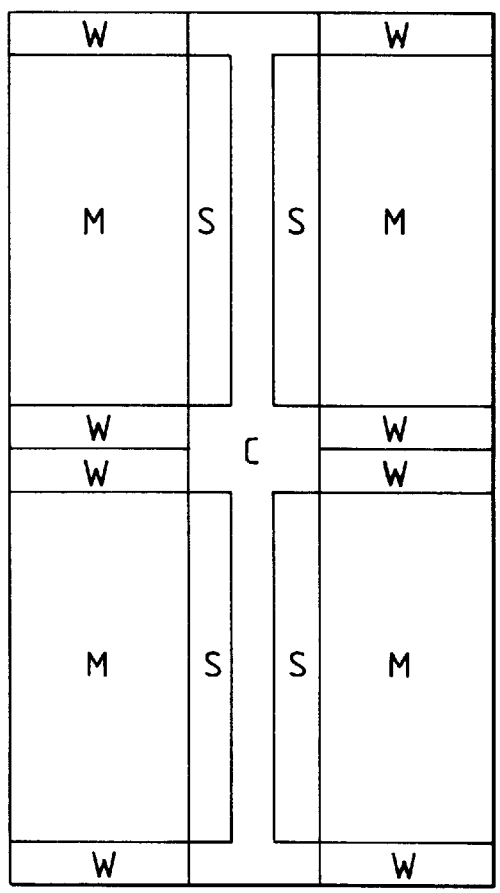

FIG. 18(C) shows one memory block which is constructed by arranging the memory cell arrays M, the sense amplifiers S and the control circuit C vertically symmetrically with respect to the word line drivers W of the aforementioned sub-block. In this case, those of the quartered memory cell arrays (or unit memory mats), which constitute the sub-block, may be constructed into two memory arrays. By making such an address assignment that one memory cell array M of the aforementioned memory block may be selected, the control circuit can be shared for the memory block among the four memory mats. In this case, however, the signal circuit of the Y-system is eliminated because no decoder of the Y-system is present in the mat or block.

FIG. 19 presents layouts showing the fundamental structures of another embodiment of the memory mat and another embodiment of the memory block constructed by composing the fundamental structures.

Figure 19A:
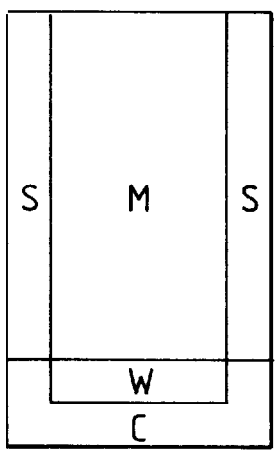
FIGS. 19(A) to 19(C) are layouts showing the fundamental structure of another embodiment of the aforementioned memory mat and another embodiment of the memory block constructed by combining the former.

FIG. 19(A) shows the fundamental structure of the memory mat. In the embodiment of FIG. 19(A), the sense amplifiers S are disposed at the righthand and lefthand sides of the memory cell array M. As a result, the complementary data line (or bit line) of the memory cell array M is divided at the center. Thus, the number of the memory cells of the complementary data lines to be coupled to the inputs of the sense amplifiers can be halved to reduce the parasitic capacitance thereby to lighten the load and to increase the amount of signals read out from the memory cells so that the sense amplifiers S can be speeded up. This structure may be replaced by another in which the sense amplifiers S are connected with the two ends of the complementary data lines to amplify the signals read out from the two ends of the complementary data lines. According to this structure, the currents of the sense amplifiers can be dispersed to speed up the operations and to drop the noises.

On the other hand, the sense amplifiers may be distributed to the right and left alternately of the pair of the complementary data lines. In this case, it is possible to loosen the pitch of the sense amplifiers. In other words, by the aforementioned distribution of the sense amplifiers, one of these sense amplifiers can be formed in an area corresponding to two pairs of complementary data lines so that the pitch of the complementary data lines can be made more tight. Below the memory cell arrays M, there is disposed the word line driver W which is enclosed by the control circuit C.

Figure 19B:
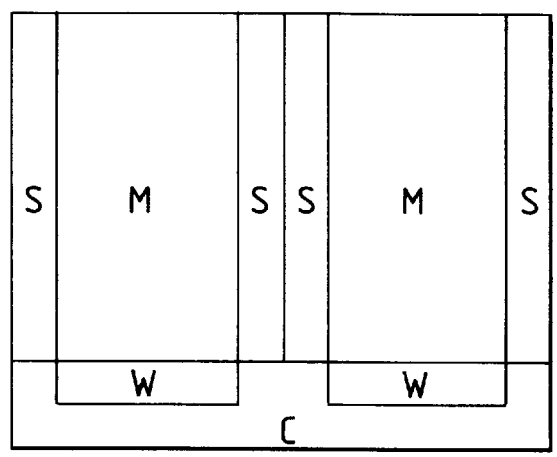

FIG. 19(B) shows a sub-clock which is constructed by arranging two memory mats symmetrically with respect to one sense amplifier S of the aforementioned memory mat. In this case, the control circuit is shared. In case the word line of the righthand and lefthand memory cell arrays is selected only alternately, there may be taken the modified shared sense amplifier system in which the central sense amplifiers S are shared and selectively used for the two memory cell arrays. If, in this case, the sense amplifier at the center is used for auxiliary amplifications, its input/output are connected directly with one end of the complementary data lines of one memory cell array, and the other end is coupled without any difficulty to the input/output of the sense amplifier through the switch MOSFET.

Figure 19C:
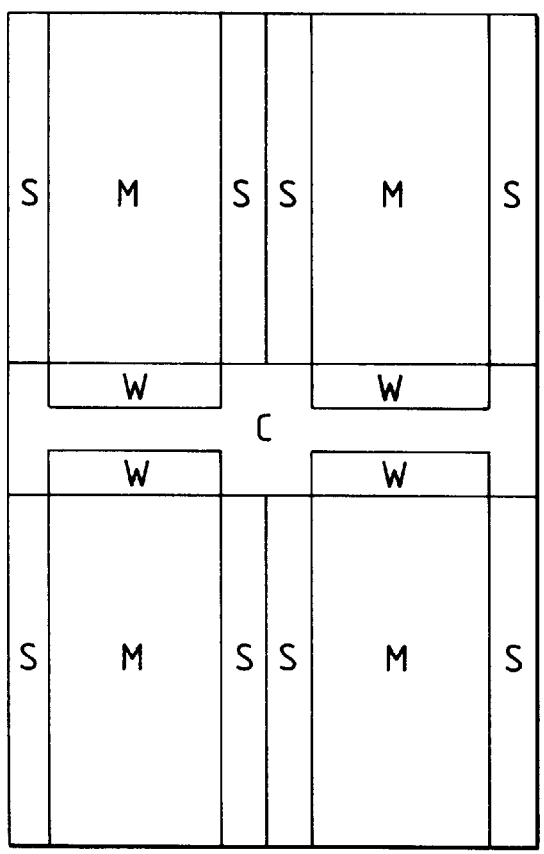

FIG. 19(C) shows a memory block which is constructed by arranging four memory mats vertically symmetrically with respect to the control circuit C of the aforementioned sub-block. In this case, those of the quartered memory cell arrays M (or unit memory mats), which constitute the sub-block, may constitute each of the two memory arrays. By making such an address assignment that one memory cell array M of the aforementioned memory block may be selected, the control circuit can be shared for the memory block composed of the four memory mats. In this case, however, the signal circuit of the Y-system is eliminated because there is no decoder of the Y-system in the mat or block.

FIG. 20 presents layouts showing the fundamental structures of another embodiment of the memory mat and another embodiment of the memory block constructed by composing the fundamental structures.

Figure 20A:
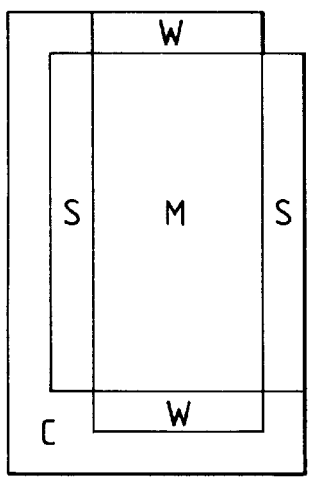
FIGS. 20(A) to 20(C) are layouts showing the fundamental structure of still another embodiment of the aforementioned memory mat and another embodiment of the memory block constructed by combining the former.

FIG. 20(A) shows the fundamental structure of the memory mat. In the embodiment of FIG. 20(A), the sense amplifiers S are disposed at the righthand and lefthand sides of the memory cell array M, and the word line drivers W are disposed above and below the memory cell array M. As a result, the complementary data line (or bit line) of the memory cell array M is divided at the center. Thus, the number of the memory cells of the complementary data lines to be coupled to the inputs of the sense amplifiers can be halved to reduce the parasitic capacitance thereby to lighten the load and to increase the amount of signals read out from the memory cells so that the sense amplifiers S can be speeded up. This structure may be replaced by another in which the sense amplifiers S are connected with the two ends of the complementary data lines to amplify the signals read out from the two ends of the complementary data lines. According to this structure, the currents of the sense amplifiers can be dispersed to speed up the operations and to drop the noises. For the high integration like the aforementioned embodiment, moreover, the sense amplifiers may be alternately arranged at the two ends of the complementary data lines.

The word line drivers W are used to bring one word line into its selected/unselected state so as to effect the high-speed selecting operations of the word line. This structure may be replaced by another structure in which the word line of the memory cell arrays M is vertically bisected so that the two word lines may be selected by the aforementioned two word line drivers W. In this case, the word lines can be selected at a high speed by shortening the word lines. Like the foregoing embodiment, moreover, the word line drivers may be arranged alternately at the two ends of the word lines to effect the highly dense arrangement of the word lines.

The control circuit C is arranged to enclose the word line driver below the memory cell array M and the lefthand sense amplifier.

Figure 20B:
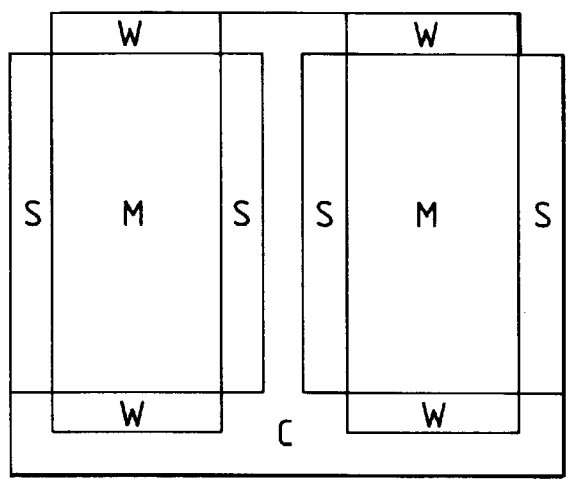

FIG. 20(B) shows a sub-clock which is constructed by arranging two memory mats symmetrically with respect to the lefthand control circuit C of the aforementioned memory mat. In this case, the control circuit is shared. In case the word line of the righthand and lefthand memory cell arrays is selected only alternately, there may be taken the modified shared sense amplifier system in which the central sense amplifiers S are shared and selectively used for the two memory cell arrays. If, in this case, the sense amplifier at the center is used for auxiliary amplifications, its input/output are connected directly with one end of the complementary data lines of one memory cell array, and the other end is coupled without any difficulty to the input/output of the sense amplifier through the switch MOSFET.

Figure 20C:
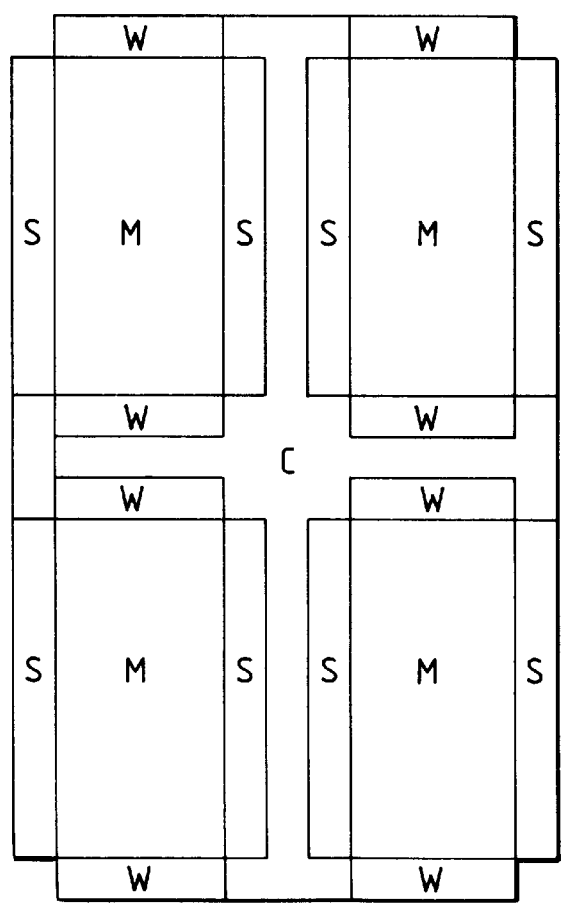

FIG. 20(C) shows a memory block which is constructed by arranging four memory mats vertically symmetrically with respect to the control circuit C below the aforementioned sub-block. In this case, those of the quartered memory cell arrays M (or unit memory mats), which constitute the sub-block, may constitute each of the two memory arrays. By making such an address assignment that one memory cell array M of the aforementioned memory block may be selected, the control circuit can be shared for the memory block composed of the four memory mats. In this case, however, the signal circuit of the Y-system is eliminated because there is no decoder of the Y-system in the mat or block.

FIG. 21 presents layouts showing the fundamental structures of another embodiment of the sub-block and another embodiment of the memory block constructed by composing the fundamental structures.

Figure 21A:
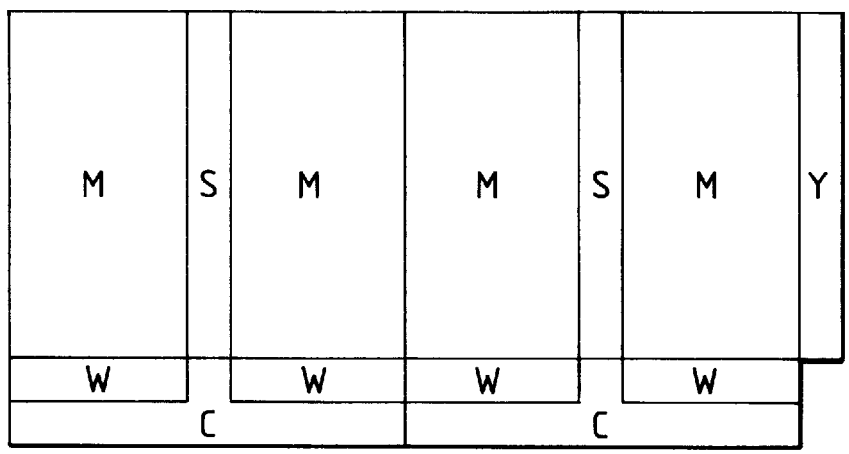
FIGS. 21(A) and 21(B) are layouts showing the fundamental structure of another embodiment of the aforementioned memory mat and another embodiment of the memory block constructed by combining the former.

In FIG. 21(A), the sub-blocks shown in FIG. 17(B), each of which is composed of the memory arrays M arranged at the righthand and lefthand sides of the sense amplifier S, the word line drivers W arranged below the memory cell arrays M and the control circuit C arranged therebelow, are either arranged symmetrically or juxtaposed, and a Y-decoder to be used commonly for the memory cell arrays M is disposed at the righthand side.

Figure 21B:
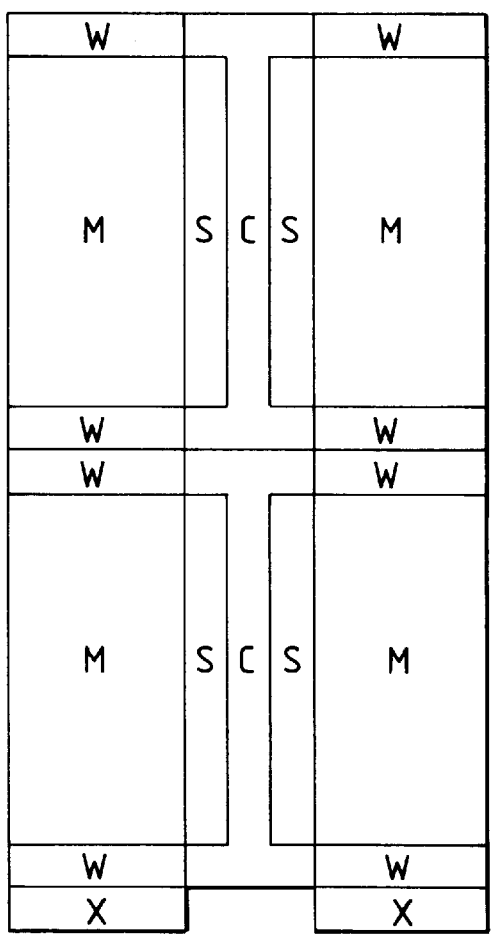

In FIG. 21(B), the memory block shown in FIG. 18(C) is equipped with common X-decoders. In this embodiment, the letter W designates merely the word line drivers which have no decoding function. If, in this embodiment, only one of the four memory cell arrays M selects the word lines, the word line drivers may be shared by the two memory cell arrays.

Even the foregoing structures of the memory mat, the sub-block and the memory block, as shown in FIGS. 17 to 21, can activate the unit memory mat in response to a suitable mat selection signal. In response to this mat selection signal, there are generated for each memory mat the signals SHR and PC necessary for selecting the address of the mat and the sense apmlifier activation signals. According to this structure, no timing margin is required for the signals SHR and PC and the sense amplifier activation signals between the memory mat, which is arranged at a relatively short distance from the mat selector arranged at the center, and the memory mat which is arranged at a relatively long distance. In other words, the memory mat to be activated starts its operation, at the instant when it is fed with the mat selection signals, and the various signals for the unit mat activations are then generated by the timing system which is optimized in the unit mat. Thus, the mat selector arranged at the center of the chip may supply the selection signals for activating any of the aforementioned mats so that the signal loads can be lightened to reduce the number and delay of the signals to be transmitted to each mat. Moreover, the memory mat thus selected can operated at the timing optimized therefor, but no timing margin is required between the mats so that the memory access can be accomplished at a high speed.

Figure 22:
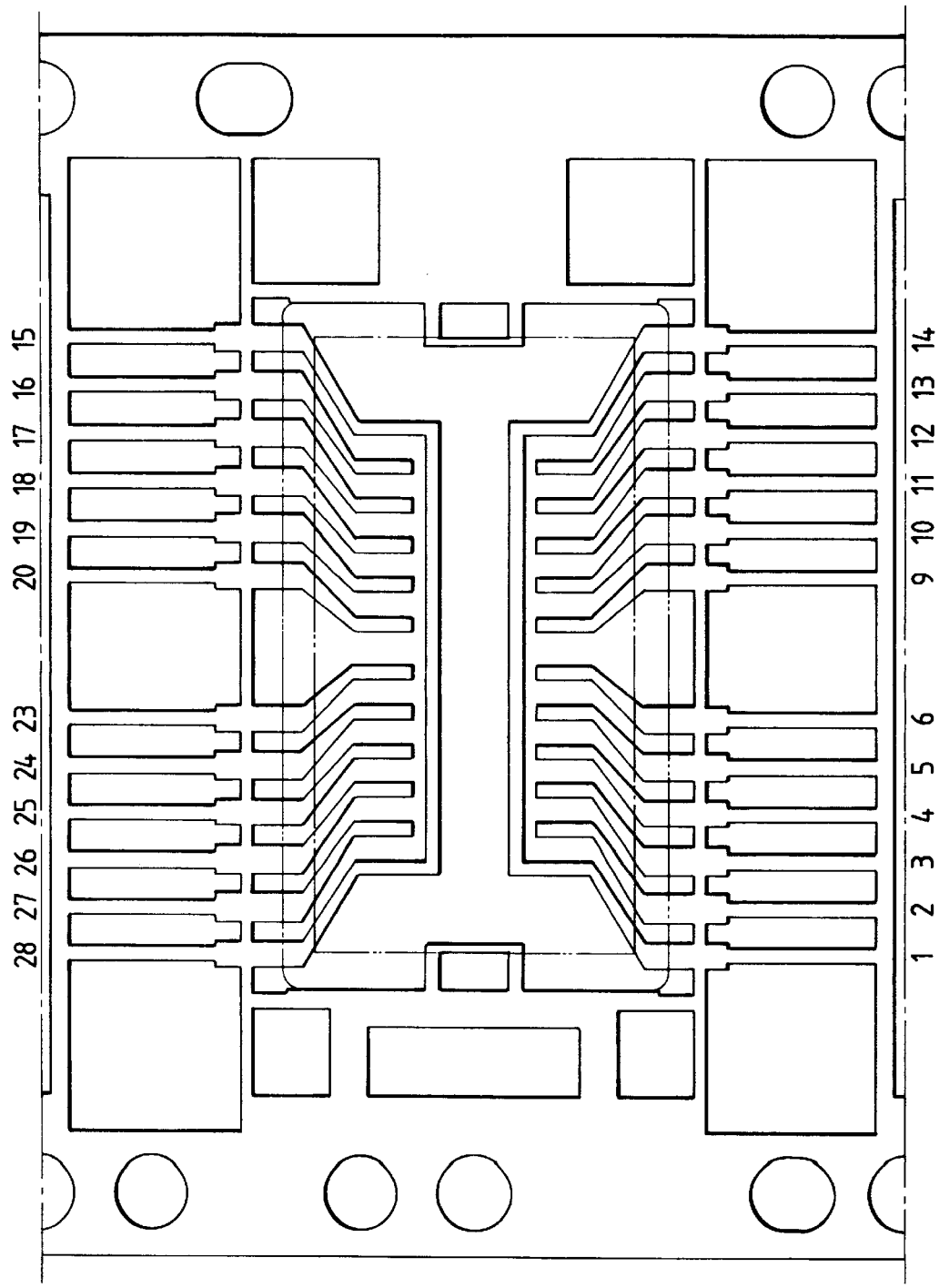
FIG. 22 is a top plan view showing one embodiment of the lead frame to be used in the dynamic RAM according to the present invention.

FIG. 22 is a top plan view showing the SOJ (Small Outline J-bend package) lead frame to be used in the DRAM according to the present invention.

The packaged DRAM chip is indicated by double-dotted lines in FIG. 22. A pair of leads extended transversely through the center of the chip are used for supplying the ground potential VSS and the power voltage VCCE. With this arrangement of the leads across the center of the chip, the leads are bonded to the plural power pads VSS and VCCE. Moreover, the power terminals are composed of the aforementioned two terminals VCCE and VSS, and the ground potential VSS and the power voltage VCCE are fed to the plural portions of the chip through the wiring material having a low resistance such as the lead frame so that the power inpedance to be fed with those potentials can be suppressed at a low value. As a result, it is possible to suppress the noises which are caused in the power lines by the operation current of the circuit.

On the other hand, the leads for exchanging the signals are formed to have their connection ends extended from the top and bottom to the center of the chip, as shown. Thus, the connections to the address signal terminals and the control terminals, which are collected at the center of the chip, can be efficiently accomplished.

Figure 23A:
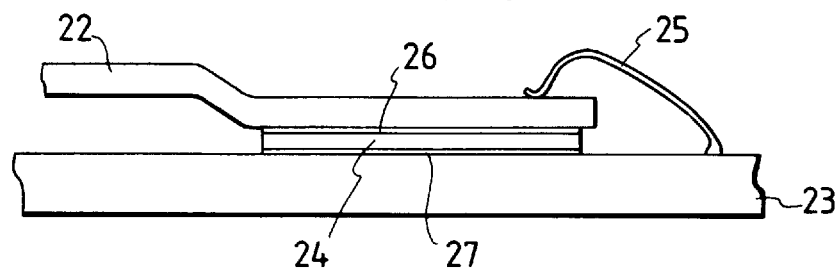
FIGS. 23(A) to 23(C) are schematic side elevations showing examples of connection between the lead frame and the semiconductor chip.
Figure 23B:
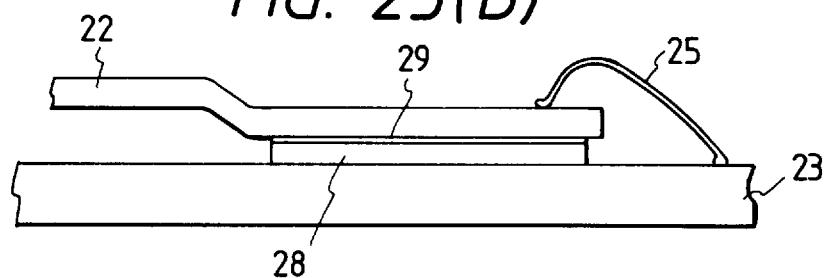
Figure 23C:
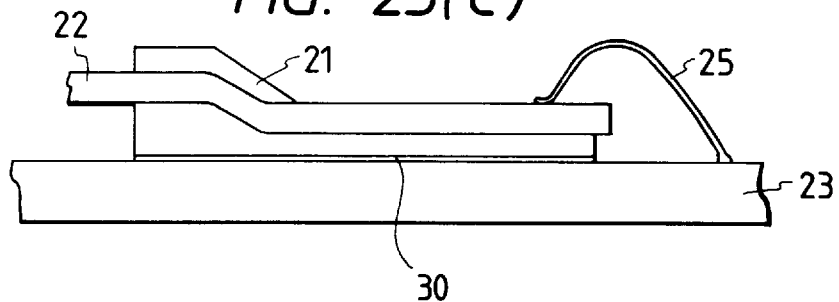

FIGS. 23(A) to 23(C) show an example of the connection between the lead frame and the semiconductor chip.

In the example of FIG. 23(A), a lead frame 22 and the surface of a chip 23 are connected through a film 24 by an adhesive A 26 and an adhesive B 27. Moreover, the lead frame 22 has its terminal connected through a gold wire 25 to the bonding pad of the chip 23.

In the example of FIG. 23(B), the lead frame 22 is connected by an adhesive C 29 to an insulator 28 which is formed over the surface of the chip 23. The terminal of the lead frame is connected through the gold wire 25 to the bonding pad of the chip 23.

In the example of FIG. 23(C), the lead frame 22 is covered with a mold resin 21 except its surface portion to be connected for the bonding and is connected by an adhesive D 30 to the surface of the chip 23. The terminal of the lead frame is connected through the gold wire 25 to the bonding pad of the chip 23.

In case such lead frame is used, it can be so arranged on the surface of the semiconductor chip as to form a part of wiring lines. As a result, the bonding pads can be arranged without any problem at the center portion of the chip and can be connected to the leads.

Figure 24A:
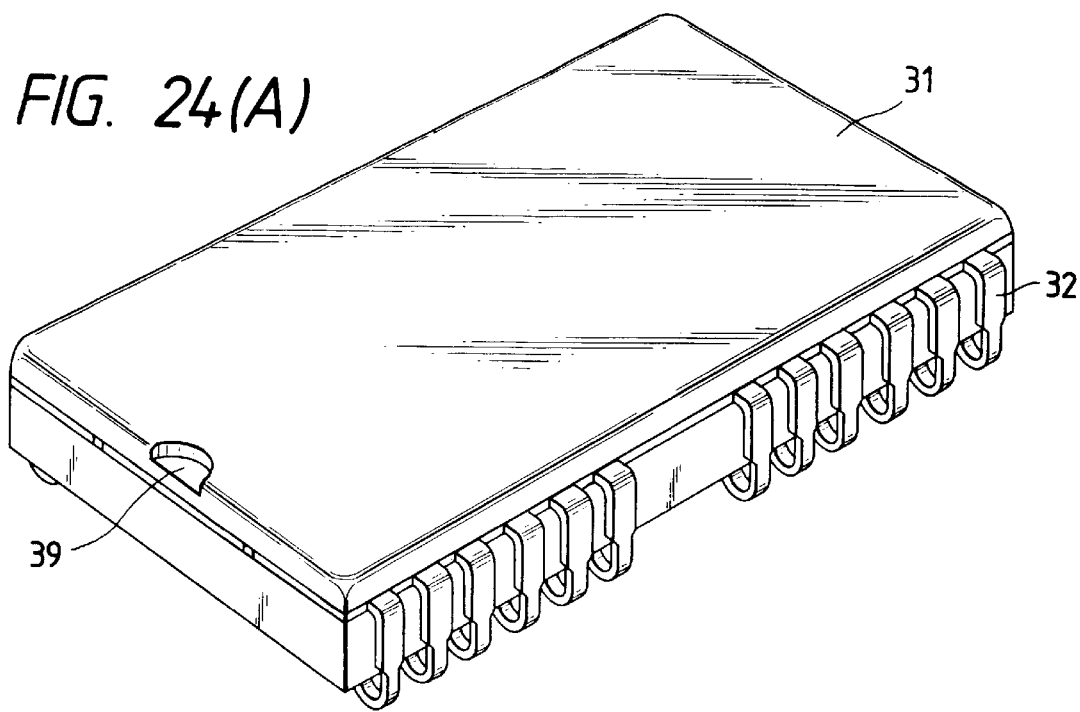
FIGS. 24(A) and 24(B) are external views and an internal perspective view showing one embodiment of the dynamic RAM according to the present invention.
Figure 24B:
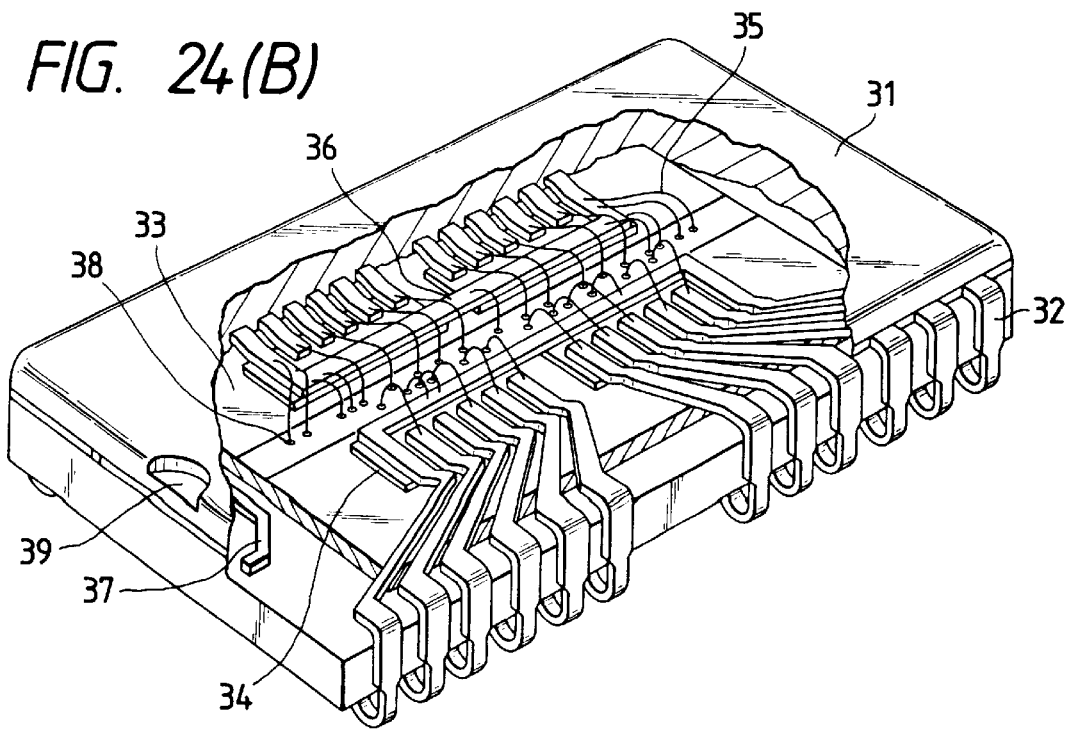

FIG. 24(A) is an exterior view showing the DRAM of the LOC (Lead On Chip) structure using the aforementioned lead frame, and FIG. 24(B) is a perspective view showing the inside of the DRAM.

In these Figures: reference numeral 31 designates a mold resin, numeral 32 a an external terminal (or lead frame); and numeral 33 a chip. This chip 33 is coupled through an insulating film 34 to the lower side of the lead by means of the aforementioned adhesive. In the inside, each lead has its leading end connected through a gold wire 35 to a bonding pad 38 of the chip 33. Numeral 36 designates a bus bar lead which is used for supplying the aforementioned voltages VCCE and VSS. Numeral 37 designates a suspension lead, and numeral 39 designates an index.

Figure 25A:
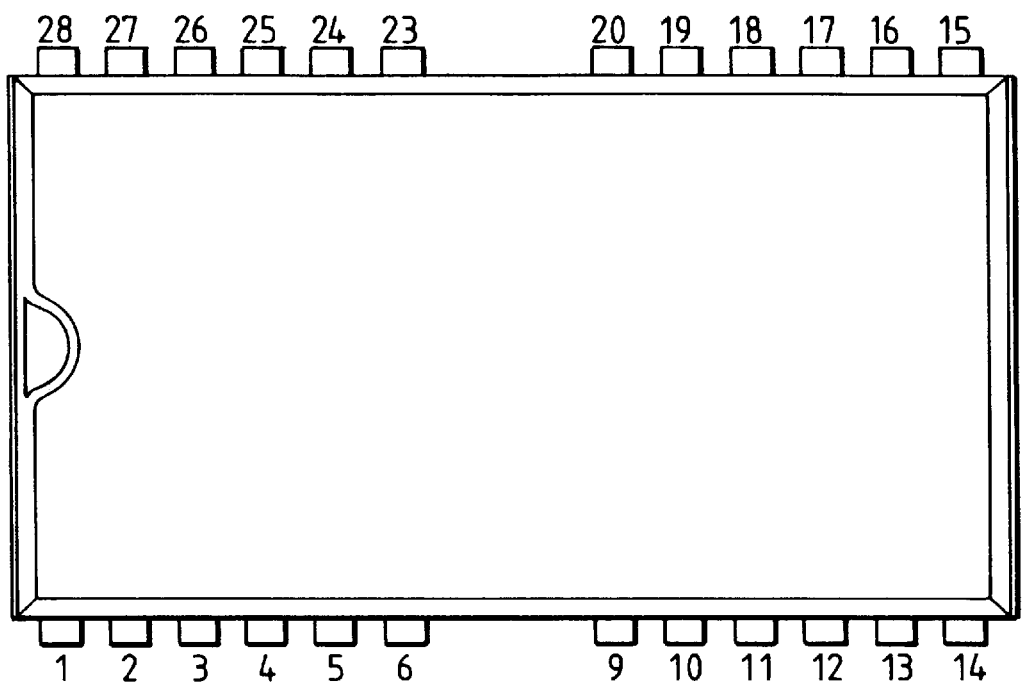
FIGS. 25(A) to 25(C) are views showing the pin arrangements of external terminals according to one embodiment of the dynamic RAM of the present invention.
Figure 25B:
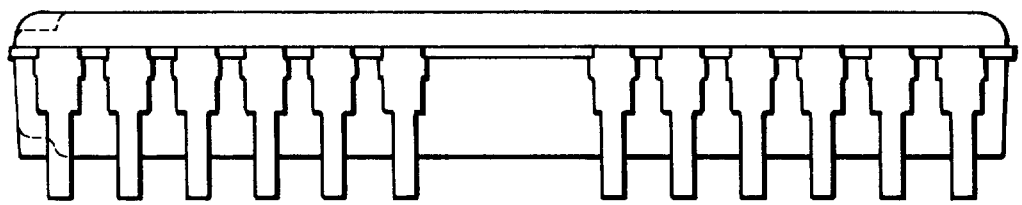
Figure 25C:
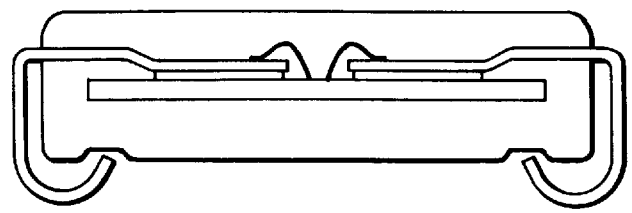

FIG. 25(A) is a diagram showing the pin arrangement of the external terminals. The aforementioned dynamic RAM of 16 Mbits is pack ed in the package having twenty eight bins, although not especially limitative. FIG. 25(B) is a side elevation showing the side at which the pins are arrayed, and FIG. 25(C) is a section taken along the side at which the pins are not arrayed.

Figure 26:
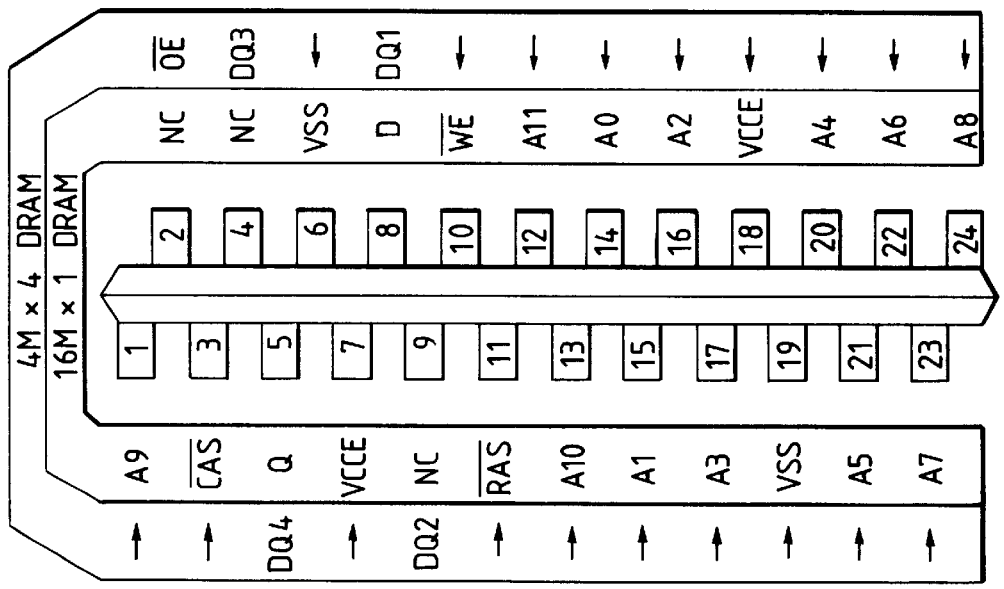
FIG. 26 is a layout showing the pin arrangement of the external terminals according to one embodiment in case a ZIP package is used.

FIG. 26 is a diagram showing the arrangements of the pins of structures of ×1 bit and ×4 bits in case the ZIP (Zigzag In-line Package) is used in the dynamic RAM according to the present invention. In FIG. 26, letters NC designate empty pins, and the arrows appearing in the DRAM of the structure of ×4 bits indicate the same signal pins as those of the structure of ×1 bit.

Figure 27:
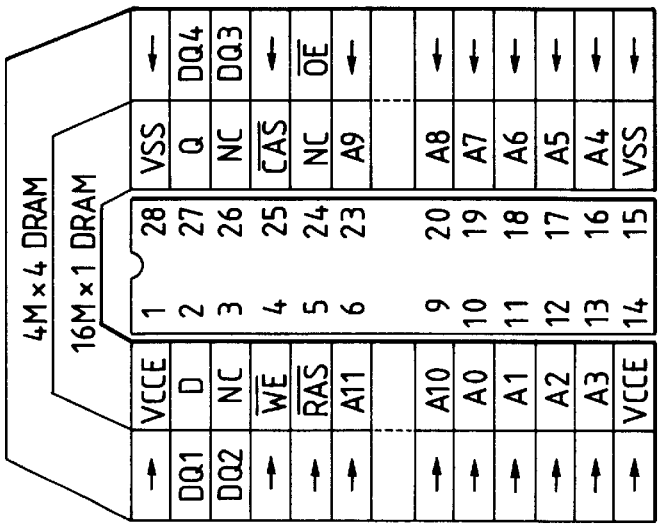
FIG. 27 is a layout showing the pin arrangement of the external terminals according to one embodiment in case an SOJ package is used.

FIG. 27 is a diagram showing the arrangements of the pins of the structures of ×1 bit and ×4 bits in case the SOJ type package is used in the dynamic RAM according to the present invention. In FIG. 27, letters NC designate empty pins, and the arrows appearing in the DRAM of the structure of ×4 bits indicate the same signal pins as those of the structure of ×1 bit.

In case the lead frame of the aforementioned LOC structure is used, the bus bar lead extending the longitudinal direction of the chip is used as the ground potential VSS of the circuit, and the ground potential supplying pads are provided at the side of the DRAM chip in a manner to correspond to the operation units of the chip so that the ground potential may be supplied from the plural portions. According to this structure, the ground potential is applied directly to the circuit of each operation unit from the lead frame of the low impedance so that a high level margin can be taken at the ground potential side. Another bus bar lead extending the longitudinal direction of the chip is used for the external voltage VCCE, and the power pad is provided for the circuit requiring the external voltage VCCE such as the data output buffer or the internal drop voltage generator VCC or VDL. As a result, the power impedance can be dropped to reduce the power noises resulting from the internal operations. Especially the output buffer for generating the output signal is used to feed a high drive current for driving a relatively large load. Therefore, the special power pads VCCE and VSS are arranged for and in the vicinity of the aforementioned output buffer, thus making it possible to reduce the noises and to prevent the noises, if any, from adversely affecting another circuit.

The dynamic RAM according to the present invention will be specifically described in the following with reference to specific circuit diagrams and their operation waveforms.

In the following specific circuit diagrams, signals designated at letters terminated by B such as a signal WKB are bar signals using their low level as the active level.

Figure 28:
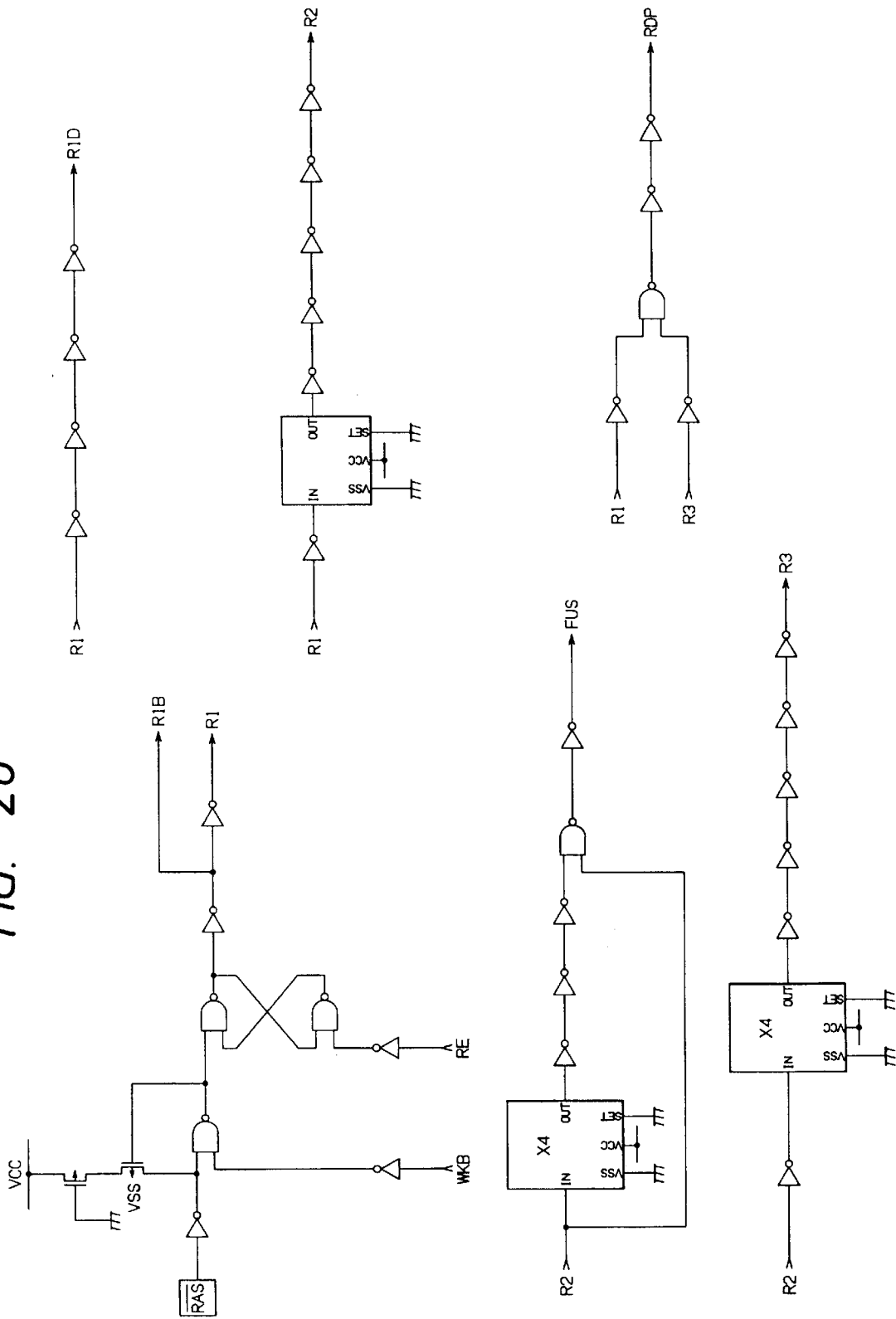
FIG. 28 presents diagrams showing portions of the circuit according to one embodiment of the RAS control circuit of the dynamic RAM of the present invention.
Figure 70:
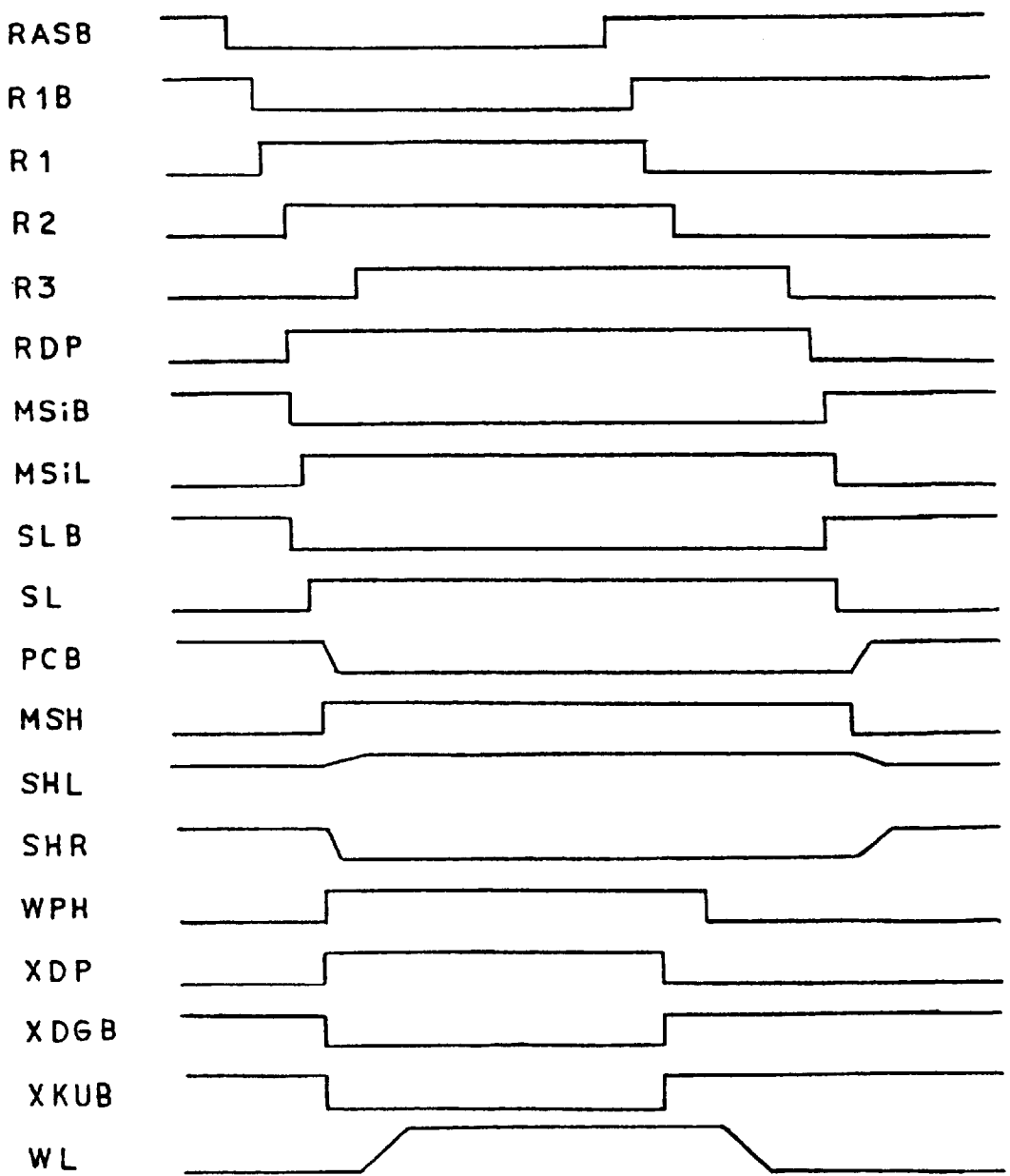
FIG. 70 is a timing chart showing one example of the operations of the RAS system.

FIG. 28 presents circuit diagrams showing portions of one embodiment of the control circuit of the RAS system. FIG. 70 is a timing chart showing one embodiment of the individual signals of the RAS system.

The $\overline{RAS}$ (Row Address Strobe) signal is fed to the input circuit having the CMOS inverter structure. This CMOS inverter circuit for the input buffer is constructed of P-channel and N-channel MOSFETs having an absolute value of threshold voltage of about 0.5 V, although not especially limitative. By equalizing their conductance ratio, moreover, the CMOS inverter circuit is made to have a logic threshold voltage of about 1.6 V. The power voltage VCC for the peripheral circuit of the DRAM of this embodiment is set at 3.3 V which is about two times as high as the logic threshold voltage of 1.6 V. These voltage values hold at each input buffer which is made receptive of another control signal $\overline{CAS}$ or $\overline{WE}$, an address signal or a write data. The aforementioned logic threshold voltage corresponds to the signal TTL level.

In the DRAM aiming at increasing the capacity as in this embodiment, the element is made fine. In the circuit dislike the dispersion of the element constant like the MOSFET composing the internal inverter circuit, therefore, the portion having flat characteristics in the channel length Lg—the threshold voltage Vth is used. As a result, the channel length Lg is relatively enlarged to raise the threshold voltage Vth to a relatively high level so that the operating speed is dropped in case the DRAM is operated at the relatively low voltage VCC.

Therefore, the MOSFET composing the initial-stage inverter circuit of the input buffer required to have the high speed is set, although not especially limitative, to have the aforementioned low threshold voltage by making its channel impurity concentration lower than that of the MOSFET composing the inverter circuit used as the internal circuit. The MOSFET having such low threshold voltage is also used as the input initial-stage circuit for other control signals or address signals. Moreover, the MOSFET having the low threshold voltage from the viewpoint of the operating speed or the level drop is used as the output stage MOSFET of the output buffer in the DRAM of the CMOS structure like that of this embodiment, the initial-stage MOSFET of the main amplifier, the pull-up MOSFET of the input/output lines I/O, the short MOSFET of the complementary data lines, or the MOSFET of diode mode used in the charge pump circuit. Incidentally, the method of attaining the aforementioned low threshold voltage can take a variety of modes of embodiments in addition to the aforementioned one in which the impurity concentration of the channel is changed by the ion implantation.

The DRAM is rendered operative, if the signal $\overline{RAS}$ is set at the low level, and inoperative if the signal $\overline{RAS}$ is set at the high level.

The RAS signal having passed through the inverter circuit acting as the aforementioned input buffer is introduced through a NAND gate circuit, which uses the signal WKB as its gate control signal, into the latch circuit which is composed of two NAND gate circuits having their inputs and outputs connected crossly.

The aforementioned signal WKB is raised to the high level when the level of the substrate back bias voltage VBB is shallow. As a result, the output of the inverter circuit takes the low level to fix the output of the NAND gate circuit at the high level so that the reception of the signal $\overline{RAS}$ is inhibited. When the substrate back bias voltage is not sufficient, the operations of the internal circuit cannot be warranted to inhibit the RAM access. Moreover, the output of the NAND gate circuit is positively fed back to the gate of the P-channel MOSFET which is disposed at the input of the NAND gate circuit. Between the P-channel MOSFET and the operating voltage VCC, there is connected in series the P-channel MOSFET which has its gate steadily fed with the ground potential to act as a resistance element. As a result, once the signal $\overline{RAS}$ is taken into the aforementioned gate circuit, it is made reluctant to be inverted, by shifting the logic threshold voltage to the low level.

If the substrate back bias voltage VBB is at the desired deep level, the signal WKB is at the low level. Then, the NAND gate circuit is opened so that the $\overline{RAS}$ signal having passed through the input buffer is taken into the latch circuit. The signal RE is a rewrite warrant signal to hold the internal $\overline{RAS}$ signal when it is at the high level.

A signal R1 having passed through the aforementioned latch circuit is used to control the X-address buffers and input buffers for the mat selections, $\overline{CAS}$, $\overline{WE}$ or Din. In other words, the individual circuits are activated in response to the high level of the signal R1. A signal R1B is inverted from the signal R1.

From this signal R1, a delay signal R1D is formed by an inverter circuit of tandem connection (which will be shortly referred to as an "inverter circuit array"), and a signal R2 is formed by an inverter circuit and a flip-flop circuit. The signals R1 and R1D control the later-described X-address buffer, i.e., determines the set-up/hold of the X-address signal.

The signal R2 is used to set/rest the word lines. Moreover, the reset timing of the word lines is delayed for compensating the write level.

From the signal R2, a signal FUS is formed by the flip-flop circuit, the inverter circuit and the NAND gate circuit. The signal FUS is used to set the initial value of a later-described redundancy circuit. The signal FUS is a one-shot pulse having a constant pulse width from the signal R2 to feed an electric current to a defective address storing fuse for a constant period so that the level may be held in the latch circuit as the fuse is cut or not. As a result, the defective address memory circuit is initialized. Thanks to the use of such one-shot pulse, no steady DC current is fed to the uncut fuse so that the power consumption is reduced.

From the signal R2, a signal R3 is formed by the inverter circuit array and the flip-flop circuit. This signal R3 is used to control the complementary data line system (e.g., the sense amplifier SA, the precharge PC or the shared sense SHR) and the redundancy decoder precharge RDP. The reset timing is delayed to make a sufficient delay from the reset (R2) of the word lines thereby to reset the complementary data lines.

From the aforementioned signals R1 and R3, a signal RDP is formed by the NAND gate circuit and the inverter circuit.

Figure 29:
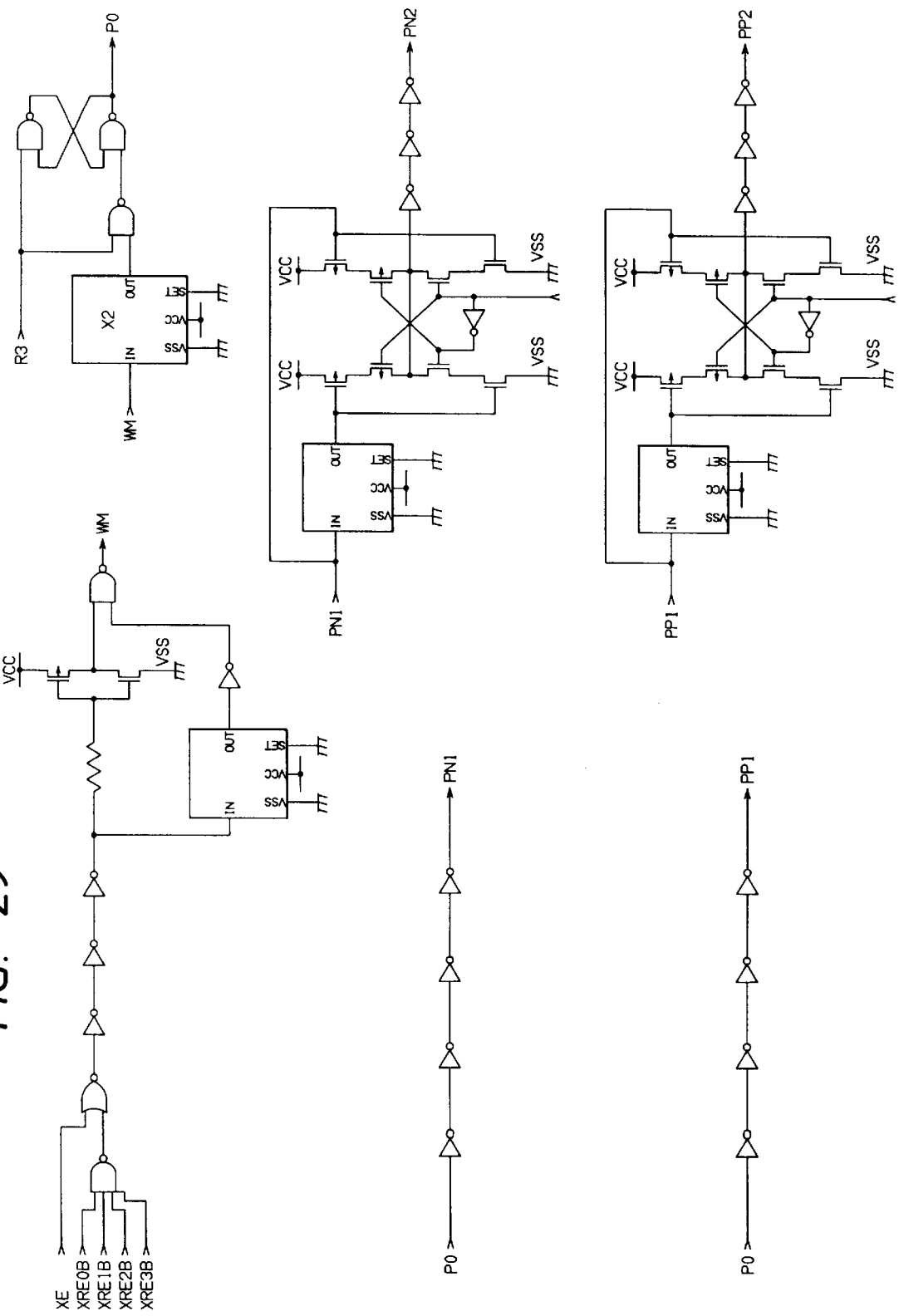
FIG. 29 presents diagrams showing portions of the circuit according to one embodiment of the aforementioned control circuit.

FIG. 29 presents circuit diagrams showing other portions of one embodiment of the control circuit of the RAS system.

A signal WM is used to monitor the set timing of the word lines thereby to control the operations of the complementary data lines (or sense amplifier). Therefore, the signal WM is formed from signals XE and XRE0B to XRE3B, which are formed by the later-described redundancy circuit. Otherwise the remedy address, the signals XRE0B to XRE3B are at the high level so that the signal WM is formed from the signal XE. In the remedy address, on the other hand, the signal WM is formed by setting the signal XE and one of the signals XRE0B to XRE3B at the low level.

A signal P0 is formed from the aforementioned signals WM and R3. Signals PN1 and PP1 are formed by delaying the signal P0 to determine the amplification timing at the first step. These signals PN1 and PP1 are used to form either delay signals, which are formed to have relatively large delay times by a multiplexer and a flip-flop circuit, or signals PN2 and PP2 which are formed to have relatively small delay times by the multiplexer and three inverter circuit arrays. These signals PN2 and PP2 are used to determine the second-stage amplification timing of the sense amplifiers. The aforementioned multiplexer is switched in the test mode to make variable the peak current of the sense amplifiers.

Figure 30:
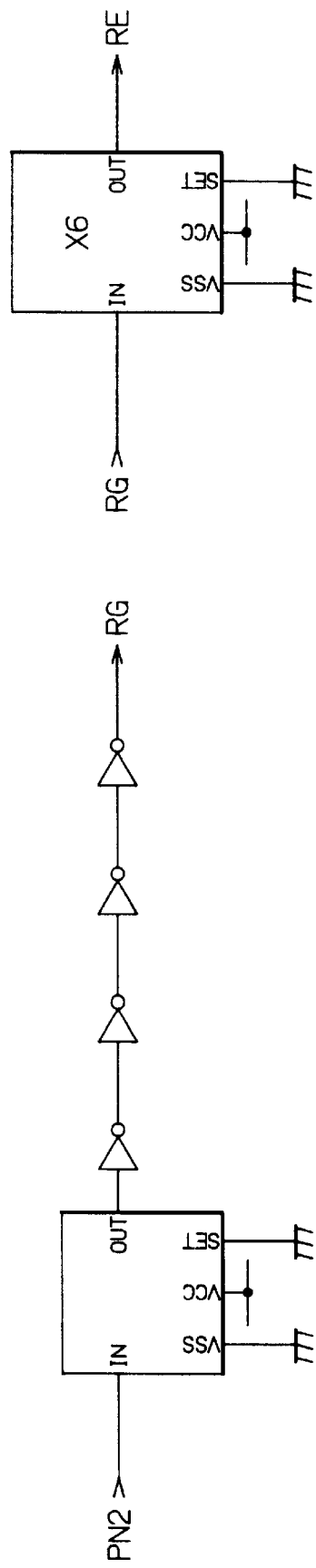
FIG. 30 presents diagrams showing other portions of the circuit according to one embodiment of the aforementioned control circuit.

FIG. 30 presents circuit diagrams showing another portion of one embodiment of the RAS control circuit.

The aforementioned signal PN2 is delayed to form a signal RG by a delay circuit composed of a flip-flop circuit and an inverter circuit. The signal RG determines the timing at which the Y-(column) switch is to be turned ON. When a sufficient signal is attained on the complementary data line by the amplification of the sense amplifier, the Y-(column) switch is opened to output the signal to the input/output line I/O.

The signal RG is delayed to form a signal RE by a flip-flop circuit. The signal RG is a rewrite warrant signal and is used when the $\overline{RAS}$ signal is timed out. In the dynamic memory cell for selecting the memory cell by the address selections of the row system, more specifically, the information charges of the information storage capacitor are once to be broken by the selections, but the information storage charges are retrieved by the rewriting operation, in which the amplified output of the sense amplifier is received as it is. As a result, even if the $\overline{RAS}$ signal is raised to the high level before the aforementioned rewrite, the time period for this rewrite is retained by the high level of the aforementioned signal RE.

Figure 31:
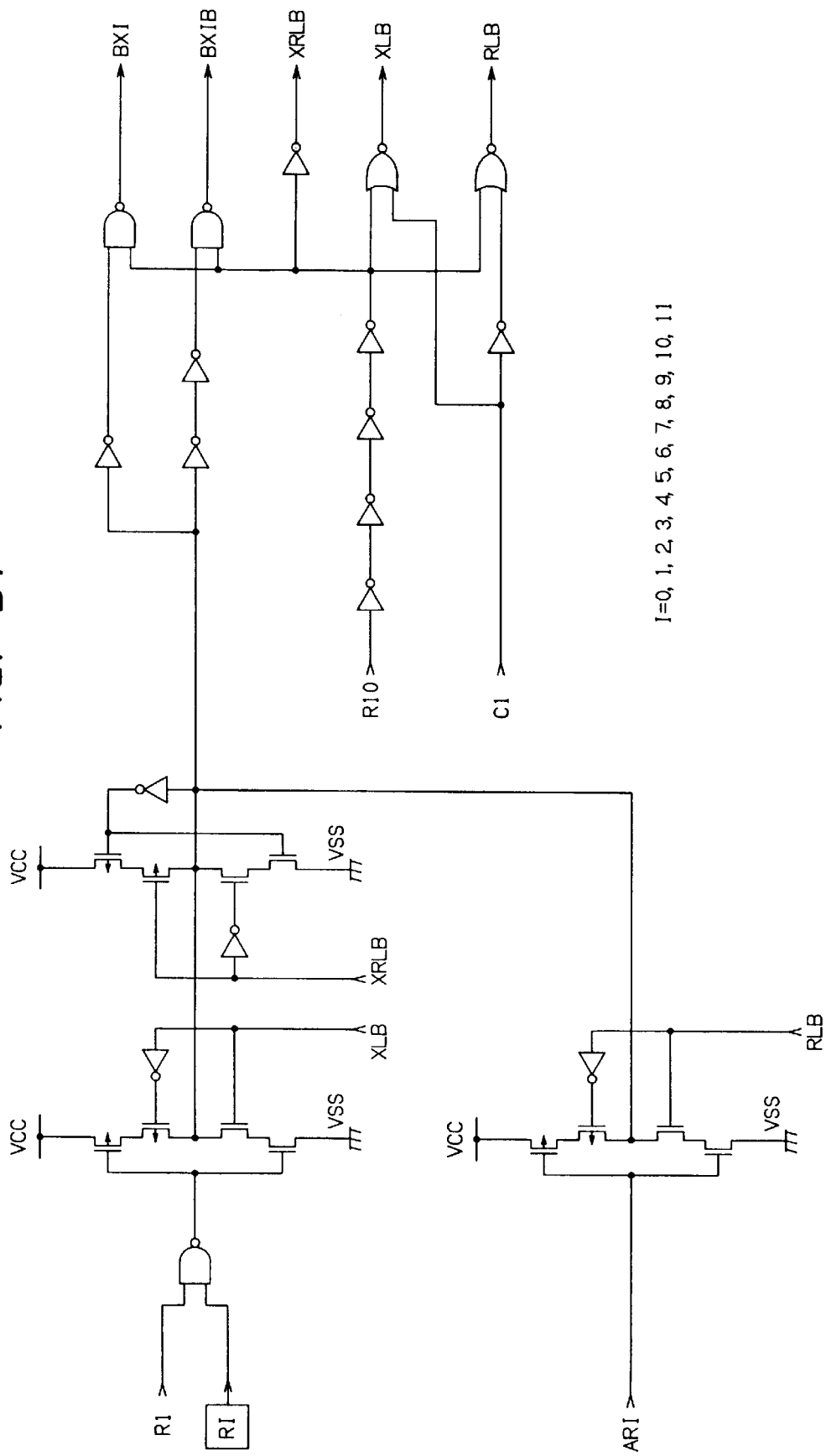
FIG. 31 is a circuit diagram showing one embodiment of the X-address buffer of the dynamic RAM according to the present invention.

FIG. 31 is a circuit diagram showing one embodiment of a unit circuit constituting the X-address buffer.

A NAND gate circuit made receptive of both an address signal AI fed from an external terminal and a signal R1 constitutes an input buffer. In other words, the NAND gate has its gate opened, when the signal R1 takes the high level, to take thereinto the address signal fed from the external terminal AI. In the input buffer having this gate function, too, the logic threshold voltage is set at the aforementioned level of about 1.6 V, and the operation voltage VCC is set at a twice level of 3.3 V, as has been described hereinbefore. As a result, the logic threhsold voltage is set at a middle point of the operation voltage VCC so that the operation voltage can be efficiently used to enlarge the input level margin.

A tri-state output circuit having its output high-impedance state controlled by a signal XLB is used as an input gate circuit for taking the aforementioned address signal AI thereinto. A similar tri-state output circuit to be controlled by a signal RLB is used as an input gate circuit for taking a refresh address signal ARI thereinto. The address signal taken selectively through the two input gate circuits is transmitted to the input of a CMOS inverter circuit. Between the input of this CMOS, there is connected a similar tri-state output circuit which is to be controlled by a signal XRLB, thus constituting an address latch circuit.

From the output of this address latch circuit, there are formed internal address signals BXI and BXIB through an inverter circuit and an NAND gate circuit.

From signals RID and CI, there are formed control signals XRLB, XLB and RLB for controlling the aforementioned tri-state output circuit.

Here, letter I designates one of the numerical values 0 to 11. In other words, the circuit appearing in the same Figure is a unit circuit corresponding to each of the address signals A0 to A11. The unit circuits corresponding to the address signals A0 to A11 have their outputs fed to the redundancy circuits of the X-system so that they are used as address signals to be referred to with the defective address stored. For the address signals A8 to A11, moreover, there are provided the following address buffer circuits for forming the memory mat selecting signals.

Figure 32:
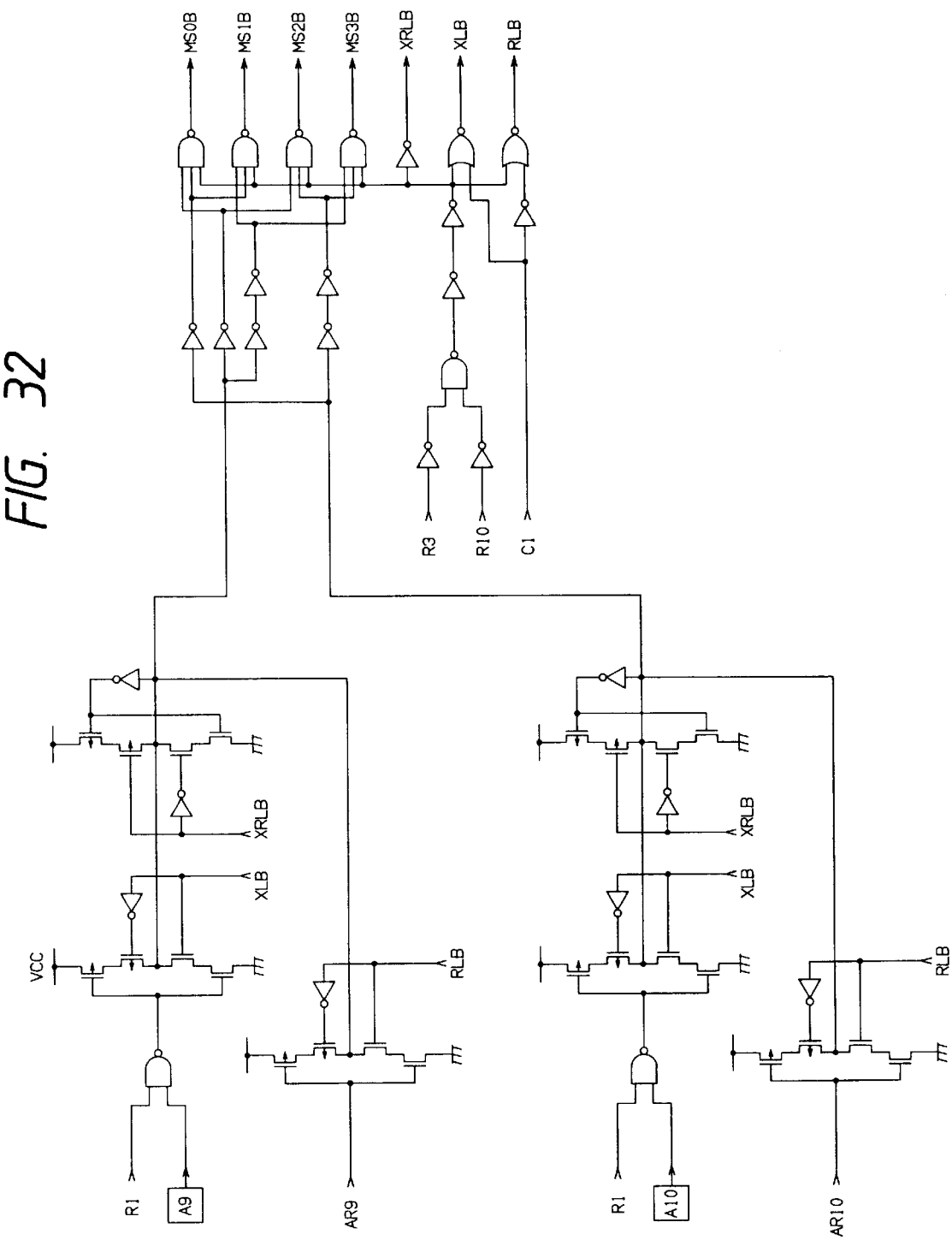
FIG. 32 is a circuit diagram showing one embodiment of the address buffer corresponding to the X-address signals A9 and A10.

FIG. 32 is a circuit diagram showing one embodiment of the address buffer circuits corresponding to the address signals A9 and A10.

The address input circuit made receptive of the address signal fed from the external terminal, the input circuit of the refresh address signal, and the latch circuit shared by the former two circuits will not be described because they are similar to that of FIG. 31. From the address signal taken into the aforementioned latch circuit, mat selection signals MS0B to MS3B are formed by an inverter circuit and a NAND gate circuit. From the signals R3, RD1 and C1 of the row system, moreover, there are formed the control signals of input gates which constitute the aforementioned latch circuit.

Figure 33:
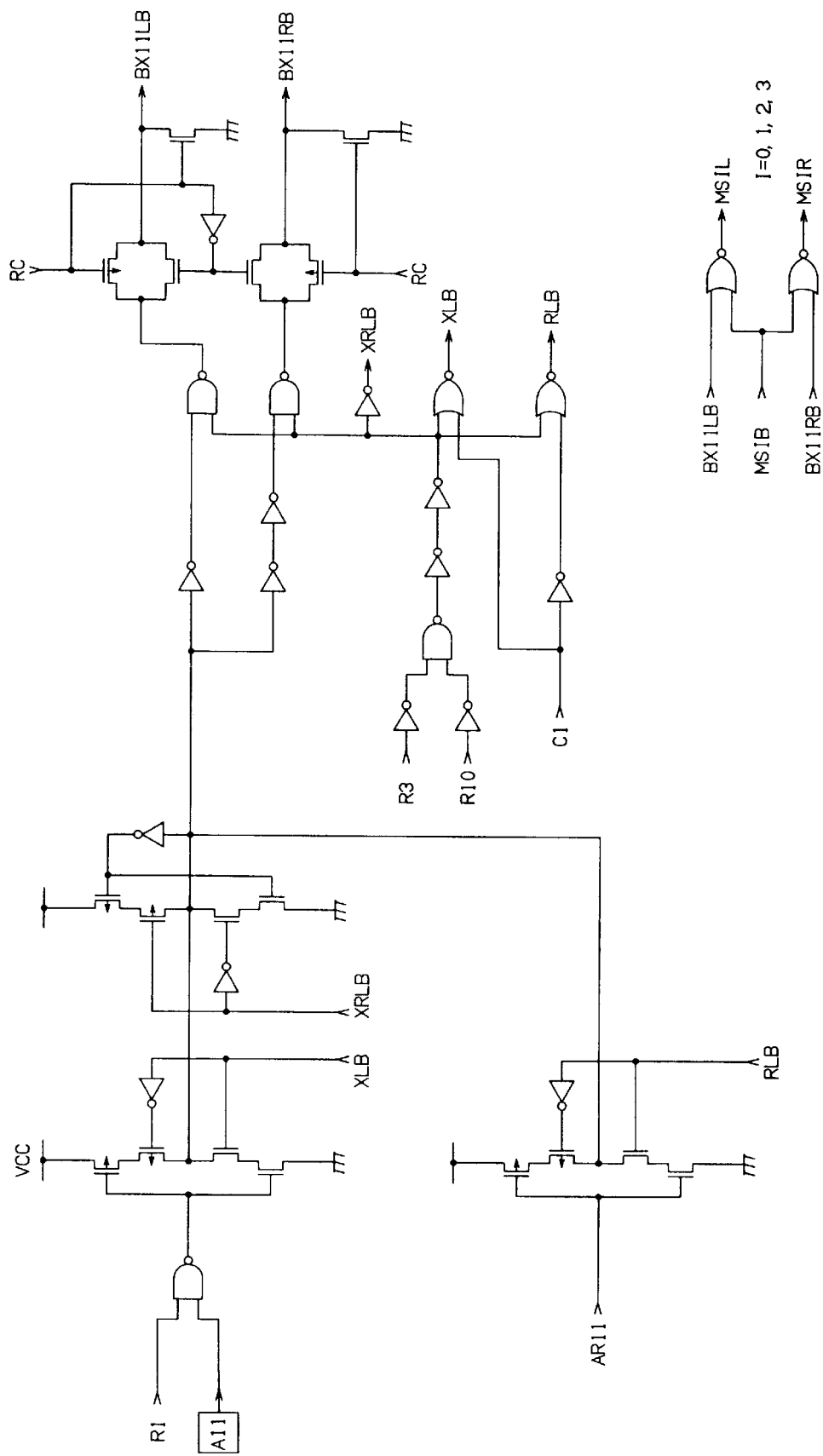
FIG. 33 is a circuit diagram showing one embodiment of the address buffer corresponding to the X-address signal A11.

FIG. 33 is a circuit diagram showing one embodiment of the address buffer circuit corresponding to the address signal A11.

The address input circuit made receptive of the address signal fed from the external terminal, the input circuit of the refresh address signal, and the latch circuit shared by the former two circuits will not be described because they are similar to that of FIG. 31. From the address signal taken into the aforementioned latch circuit, signals BX11LB and BX11RB are formed by an inverter circuit and a NAND gate circuit. These signals BX11LB and BX11RB select the righthand and lefthand sides of the mats to operate. The signals BX11LB and BX11RB are outputted through the CMOS transmission gate circuit which is composed of an N-channel MOSFET and a P-channel MOSFET. The CMOS transmission gate circuit is switched by the signal RC. The transmission gate circuit has its output side equipped with the reset MOSFET for receiving the aforementioned signal RC.

Mat selection signal MSLIL and MSIR are formed from the aforementioned signals BX11LB and BX11RB and the signal MSIB. Here, the letter I designates 0 to 3 so that the mat selection signals are composed of eight kinds. From the signals R3, Rd1 and C1 of the row system, moreover, there are formed control signals XRLB, XLB and RLB of input gates which constitute the aforementioned latch circuit.

In the normal mode, the signal RC is at the low level. As a result, the selection signals BX11LB and BX11RB of the righthand and lefthand mats corresponding to the address signals A11 and AR11 are formed through the aforementioned transmission gate circuit. In the test mode, on the contrary, the signal RC is set at the high level. As a result, the aforementioned gate circuit is turned OFF so that both the signals BX11LB and BX11RB are set at the low level by the reset MOSFET. This means that the righthand and lefthand mats MSIL and MSIR are simultaneously brought into the selected state. As a result, the refresh cycle in the test mode takes 2,084 cycles, which is half as high as 4,096 cycles in the normal mode for the low level of the signal RC. Thus, in this embodiment, the refresh cycle can be switched.

Figure 34:
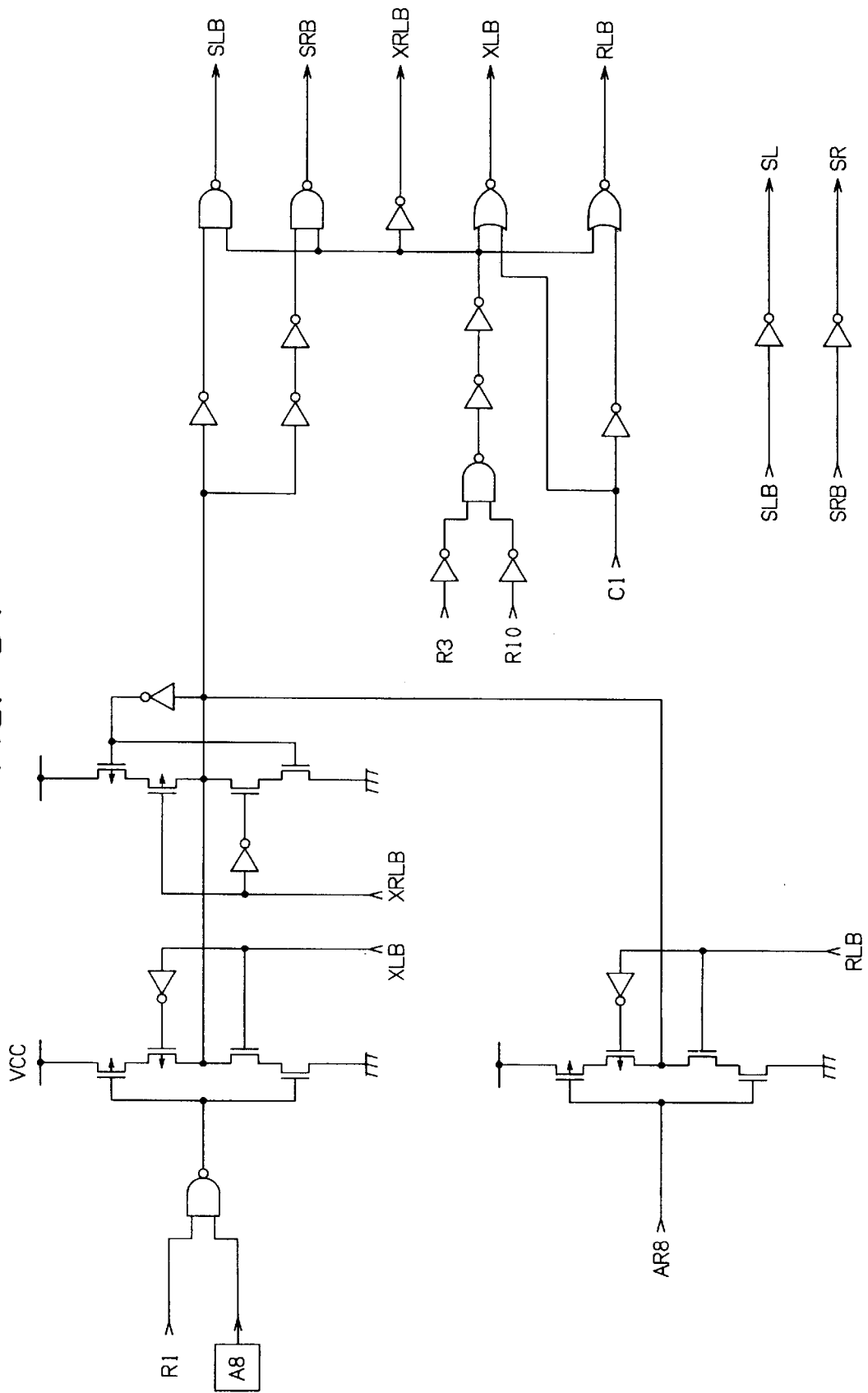
FIG. 34 is a circuit diagram showing one embodiment of the address buffer corresponding to the X-address signal A8.

FIG. 34 is a circuit diagram showing one embodiment of the address buffer circuit corresponding to the address signal A8.

The address input circuit made receptive of the address signal fed from the external terminal, the input circuit of the refresh address signal, and the latch circuit shared by the former two circuits will not be described because they are similar to that of FIG. 31. From the address signal taken into the aforementioned latch circuit, signals SLB and SRB are formed by an inverter circuit and a NAND gate circuit. These signals SLB and SRB are used to generate the righthand and lefthand selection signals SL and SR in the mat selected. From the signals R3, RD1 and C1 of the row system, moreover, there are formed the control signals XRLB, XLB and RLB of the gates which constitute the aforementioned latch circuit.

The aforementioned address signals A0 to A11 are transmitted to the gates of a number of MOSFETs such as the address comparators in the predecoder or redundancy circuit. As a result, the address buffer drives a large capacitive load so that the signal of the internal address signal is relatively retarded. Thus, the mat selections to be accomplished prior to the word line selections can be conducted at a high speed to achieve the high speed of the access time by providing the mat selecting address buffers for the address signals A8 to A11.

Figure 35:
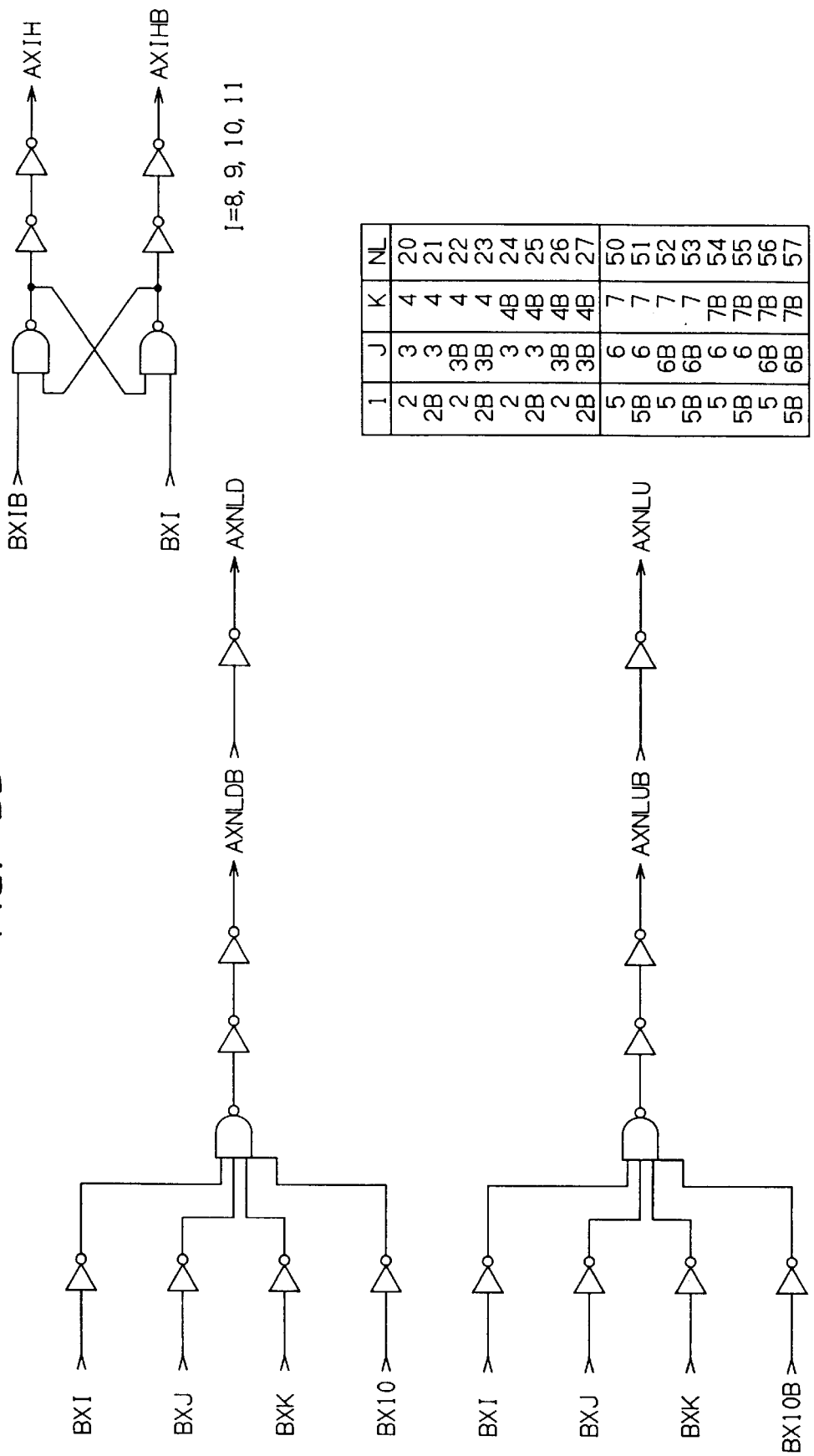
FIG. 35 presents circuit diagrams showing portions of one embodiment of a predecoder of a row system.

FIG. 35 presents circuit diagrams showing portions of one embodiment of the predecoder of the row system.

Signals AXNLD and AXNLU are used for controlling the X-decoders, and upper and lower mats are selected by address signals BX10 and BX10B.

Signals AXIH and AXIHB accomplish controls (corresponding to the remedy of the defect in the sense amplifiers or the Y-(column) selection lines) of the redundancy decoders of the Y-system. Here, letter I designates a numeral of 8 to 11. The aforementioned signals AXIH and AXIHB are formed by setting/resetting the latch circuit composed of a pair of NAND gate circuits in response to the signals BXIB and BXI. A signal AX10H controls the upper and lower mats of the Y-decoders and the signals AYNL and YIB. A signal AXIH latches one cycle period of $\overline{RAS}$ for controlling the Y-decoders.

Figure 72:
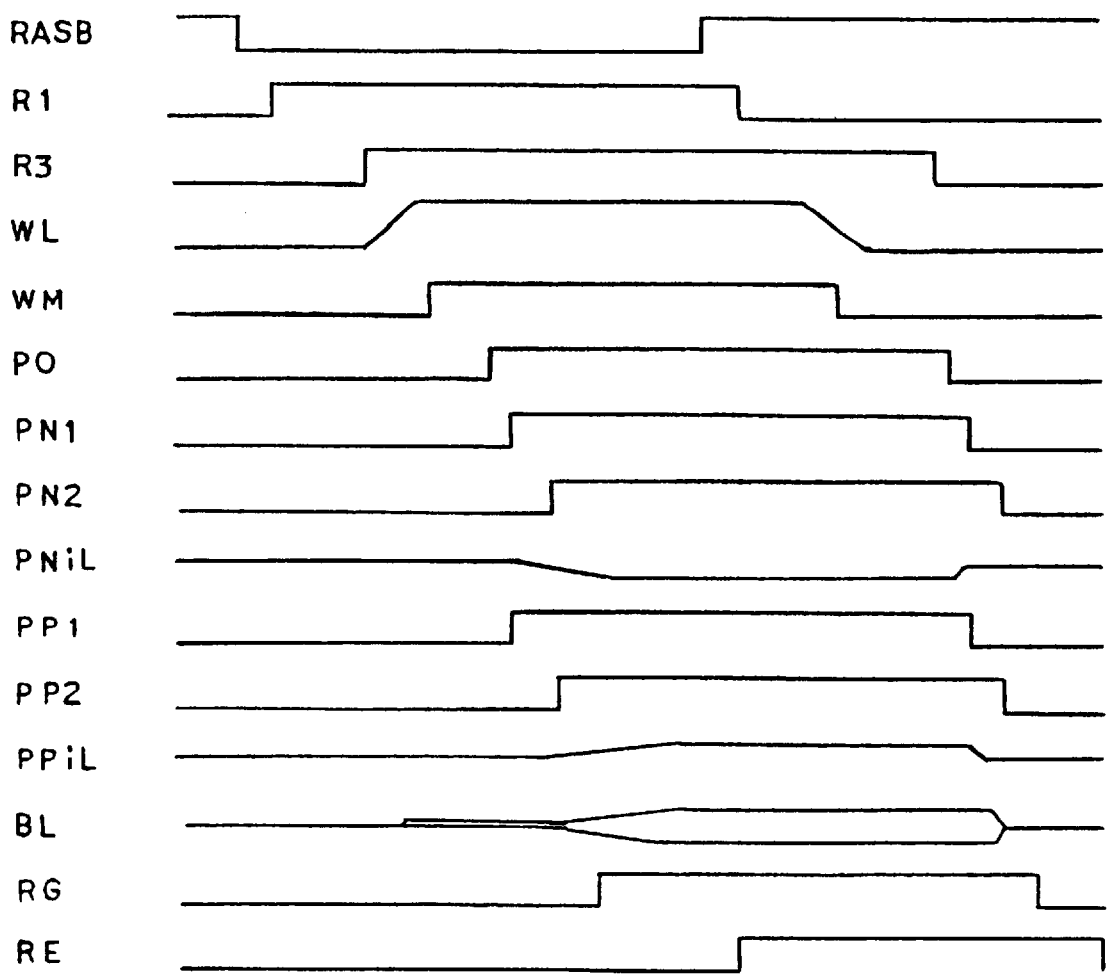
FIG. 72 is a timing chart showing one example of the operations of the RAS system.

FIG. 36 is a circuit diagram showing one embodiment of the redundancy circuit of the X-system. FIG. 72 is a timing chart showing the corresponding operations.

The fundamental concepts of the redundancy circuit of this embodiment will be described in the following.

The righthand and lefthand memory areas of each memory mats are individually equipped with four redundancy word lines. According to one defect remedy method of the DRAM of the prior art, a redundancy deocder is provided in one-to-one relation for each redundancy word line. The large storage capacity provided by the numerous memory mats as in this embodiment will increase the number of redundancy decoders.

In another defect remedy method of the DRAM of the prior art, a fuse is provided for the enable of the redundancy decoder and the address signals X0 to X7. Since the redundancy word lines are simultaneously selected in the blocks of $2^4=16$ which can be designated, their efficiency is dropped, and the probability of presence of a defect in the redundancy word lines is increased to drop the defect remedying efficiency.

Therefore, fuses are added to the address signals X8 to X11 so that the redundancy word line may be selected by only one of the sixteen blocks. In other words, the switching to the redundancy word line is accomplished by only the block (or mat) in which a effective word line is present. This operation is made possible by signals XR0DB to XR3DB (BX10) or XR0UB to XR3UB (BX10B) and the mat selection signals (MSiL/R and XL/SR).

If the X-address direction is divided into sixteen by the four bits of the address X8 to X11, each block has four redundancy word lines so that the redundancy decoders to be disposed can be 4×16=64 at the most. This makes it possible to set the redundancy decoders at an arbitrary number (desirably a multiple of 4) from the minimum 4 to the maximum 64. In the present embodiment, the number of 12 is so selected from 4 to 64 that the remedy efficiency may be the best (to give the maximum yield). The remedy efficiency of this defect remedying method can be substantially equalized to that of the case in which twelve redundancy word lines (or redundancy decoders) are disposed in another defect remedying method of the prior art. In other words, the number of redundancy word lines can be reduced one third while leaving the number of redundancy decoders unchanged.

In FIG. 36, the fuse FUSE is made of a polysilicon layer and is selectively cut by the exposure to a laser beam in a manner to correspond to a defective address to be stored, although not especially limitative.

The fuse FUSE is initialized through the MOSFET, which is turned ON by a signal FUS of one shot pulse, and fixed at the ground potential by the MOSFET which is turned ON by the high output level of the inverter circuit if the fuse FUSE is cut. Otherwise, the input of the inverter circuit is fixed at the high level.

A signal RDP implies that the defect remedy is not accomplished if the fuse FUSE located at the upper side of the same Figure is not cut, and a signal XRDJB then takes the low level. Here, letter J designates one of the numerical values of 0 to 11, which correspond to the number of twelve of the redundancy decoders. The fuse FUSE is cut for a defect remedy, and the signal XRDJB is raised to the high level in response to the signal RDP.

In the same Figure, the upper fuse is for the enabling operation, and lower fuse is for storing a defective address. For the defect remedy, the enable fuse is cut. A signal XRDJ takes the high level when the address programmed in the redundancy decoder J is identical to the input address X0 to X11. In the same Figure, the MOSFETs having their sources fed with signals XND0J to XND2J are of the N-channel type. A signal XRDJB takes the high level, when in the precharge, and the low level if any of the input address signals X0 to X11 is different by only 1 bit from the address programmed in the redundancy decoder J, namely, if the defect remedy address is not selected. The signal XRDJ takes the low level when in the precharge and is left at the low level in case the remedy address is not selected.

When in a non-remedy state, the enabling fuse is not cut. As a result, the signal XRDJB is fixed at the low level, and the signal XRDJ is fixed at the low level. Signals A, B6 and B7 are used for testing the redundancy word lines. In the test mode, a signal STB is dropped to the low level. As a result, the redundancy decoders of J=0, 3, 6 and 9 are brought into remedy state, and the address fuse is equivalently cut by the combination (0, 0), (1, 0), (0, 1) and (1, 1) of X6 and X7, which are caused to correspond to the four redundancy word lines XR0 to XR3, respectively, so that the redundancy word lines may be selected. At this time, the address comparators of I=8 to 11 are brought into coincident states irrespective of the input addresses so that the redundancy word lines are selected by all the sixteen blocks. Thus, it is possible to avoid the trouble that the redundancy word lines cannot be tested other than by one of the sixteen blocks.

In this embodiment, all the redundancy word lines are not necessarily used, but it is more frequent not to use all of them. Noting this, according to this embodiment, the redundancy decoders are used commonly for selecting the redundancy word lines which are provided for the plural memory mats.

In this embodiment, there are provided two address comparators, as will be reasoned in the following. In the redundancy decoder of the prior art, the coincidence is decided by the single address comparator, and the selection pass of the ordinary word lines is then stopped in response to the decision. This system requires one-step logic for inhibiting the ordinary word line selection pass and the timing margin for preventing the racing. In this embodiment, therefore, there are provided two address comparators for detecting the coincidence and incoincidence. The redundancy word lines are selected, when the coincidence is detected, and the ordinary word lines are selected if the incoincidence is detected. As a result, the one-step logic is reduced, and the timing relations of causing the racing of the prior art are eliminated so that the selections of the word lines can be speeded up.

Figure 37:
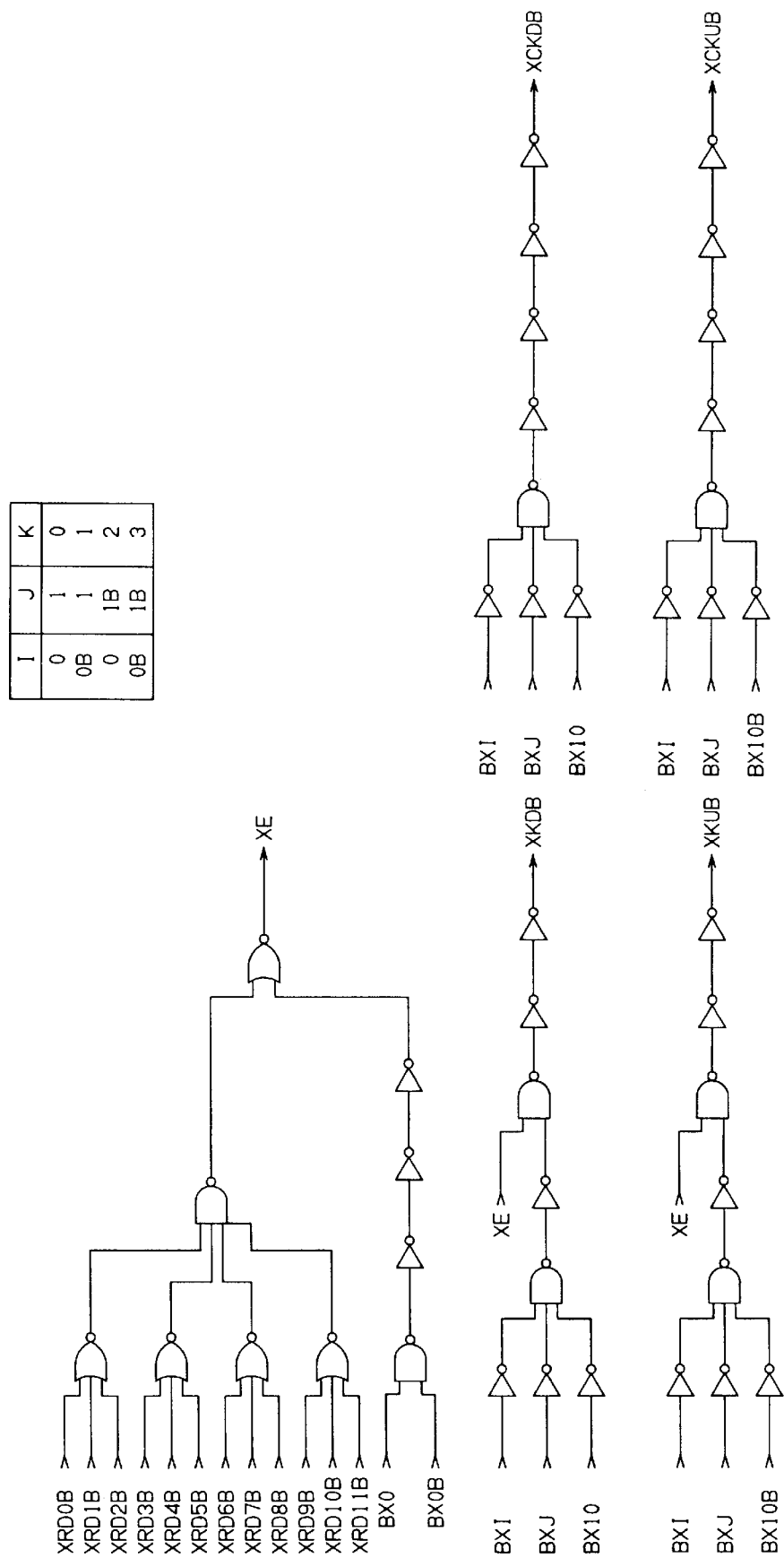
FIG. 37 presents circuit diagrams showing portions of one embodiment of a decoder circuit for selecting the word lines.
Figure 38:
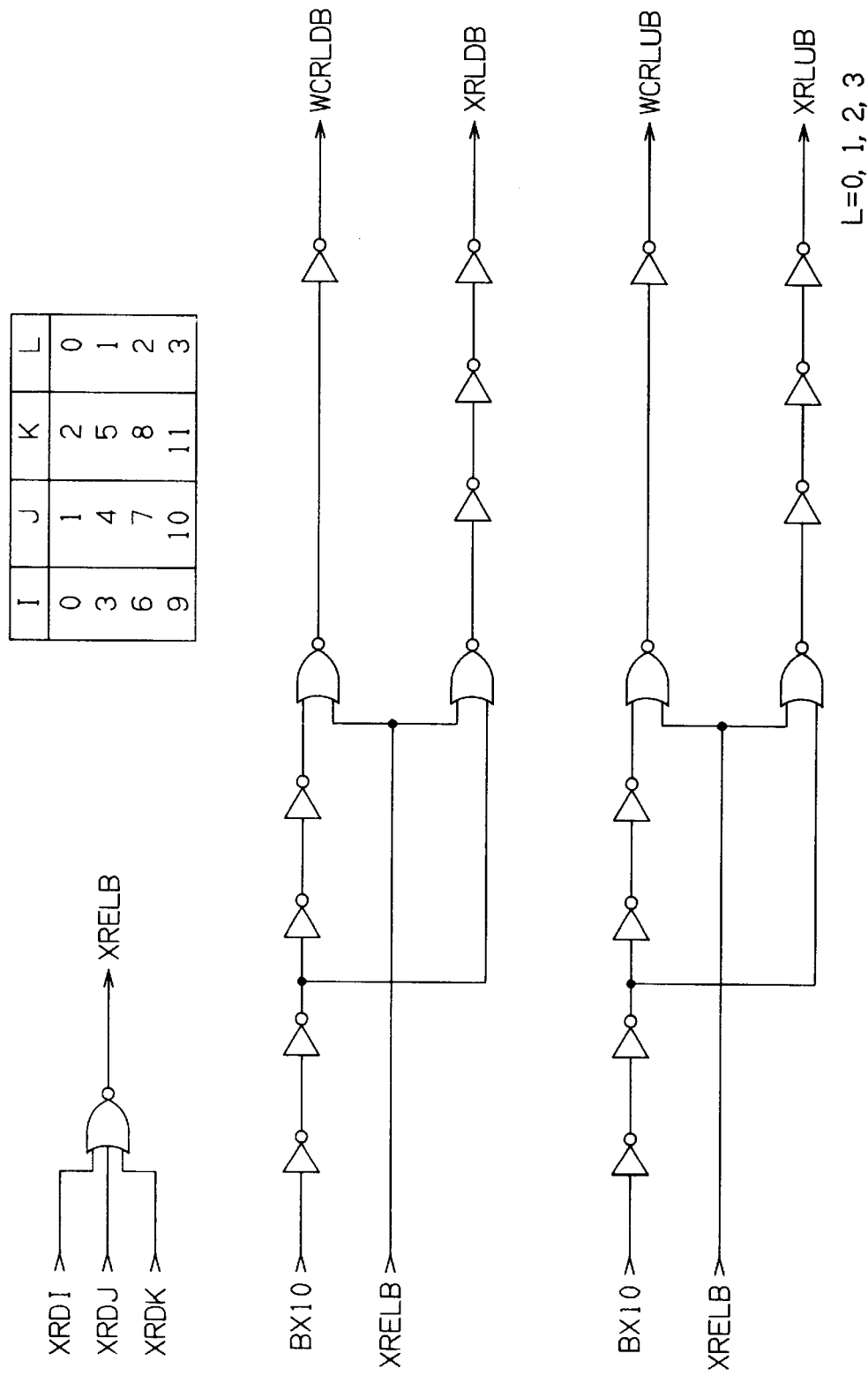
FIG. 38 presents circuit diagrams showing portions of one embodiment of a decoder circuit for selecting the redundant word lines.

FIGS. 37 and 38 are circuit diagrams showing decoder circuits for selecting the word lines and the redundancy lines.

In the circuit of FIG. 37, a signal XE is timing signal for selecting the word lines when in the normal operations. When the aforementioned enabling fuse is cut, all the signals XRD0B to XRD11B take the low level if word lines other than the defective one are accessed to. When any of the redundancy decoders of J=0 to 11 does not cut the enabling fuse, namely, when not in the remedy, signals BX0 to BX0B are dropped to the low level to raise the signal XE to the high level. From the signals BX0 and BX1, there are then formed pre-decode signals XKDB and XKUB (BX10 and BX10B). Signals WCKDB and WCKUB are corresponding signals for clearing of the word lines (at their remote ends).

In the circuit of FIG. 38, a signal XRELB is a signal for selecting the four redundancy word lines which are formed by dividing the twelve redundancy decoders into three sets. From this signal XRELB and the signals BX10 and BX10B, there are formed redundancy word line selection signals XRLDB and XRLUB and redundancy word line clearing signals WCRLDB and WCRLUB in a manner to correspond to the upper and lower mats.

Figure 39:
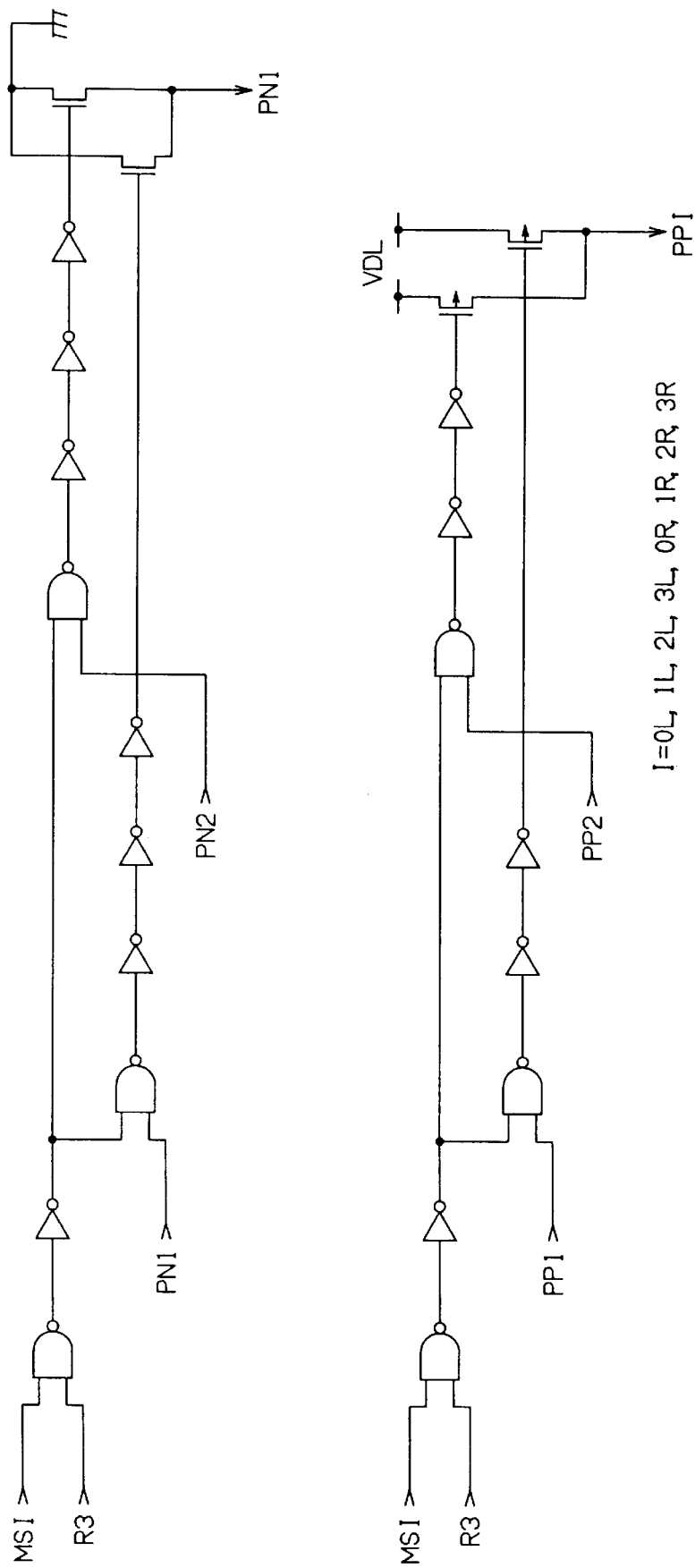
FIG. 39 is a circuit diagram showing one embodiment of a timing generator for activating the sense amplifier.

FIG. 39 presents circuit diagrams showing one embodiment of the timing generator for activating the sense amplifiers.

The ground potential is given by an N-channel MOSFET which is turned ON in response to a signal formed from the mat selection signal MSI and the signal R3 by a timing signal PN1 for the first-step amplification. The ground potential is also given by an N-channel MOSFET which is turned ON in response to a signal formed by a timing signal PN2 for the second-step amplification. The operation voltage VDL is given by a P-channel MOSFET which is turned ON in response to a signal formed from the mat selection signal MSI and the signal R3 by a timing signal PP1 for the first-step amplification. The operation voltage VDL is also given by a P-channel MOSFET which is turned ON in response to a signal formed by a timing signal PP2 for the second-step amplification.

Incidentally, the power lines are so shared that the aforementioned N-channel MOSFET or P-channel MOSFET may not be erroneously turned ON by power noises in case they are to be turned OFF when the ground potential (of the N-channel side) and the operation voltage VDL (of the P-channel side) of at least the final inverter of the circuit for controlling the gates of the N-channel MOSFET and the P-channel MOSFET are fed to the sense amplifiers, although not shown.

The N-channel MOSFET and P-channel MOSFET, which are turned ON at the first step, are caused to feed a relatively small current by having their conductances reduced to a relatively small value. The N-channel MOSFET and P-channel MOSFET, which are turned ON at the second step, are caused to feed a relatively large current by having their conductance raised to a relatively large value.

The aforementioned mat selection signal MSI (I: 0L/0R to 3L/3R) activates the sense amplifiers of the four of the thirty two mats.

Figure 40:
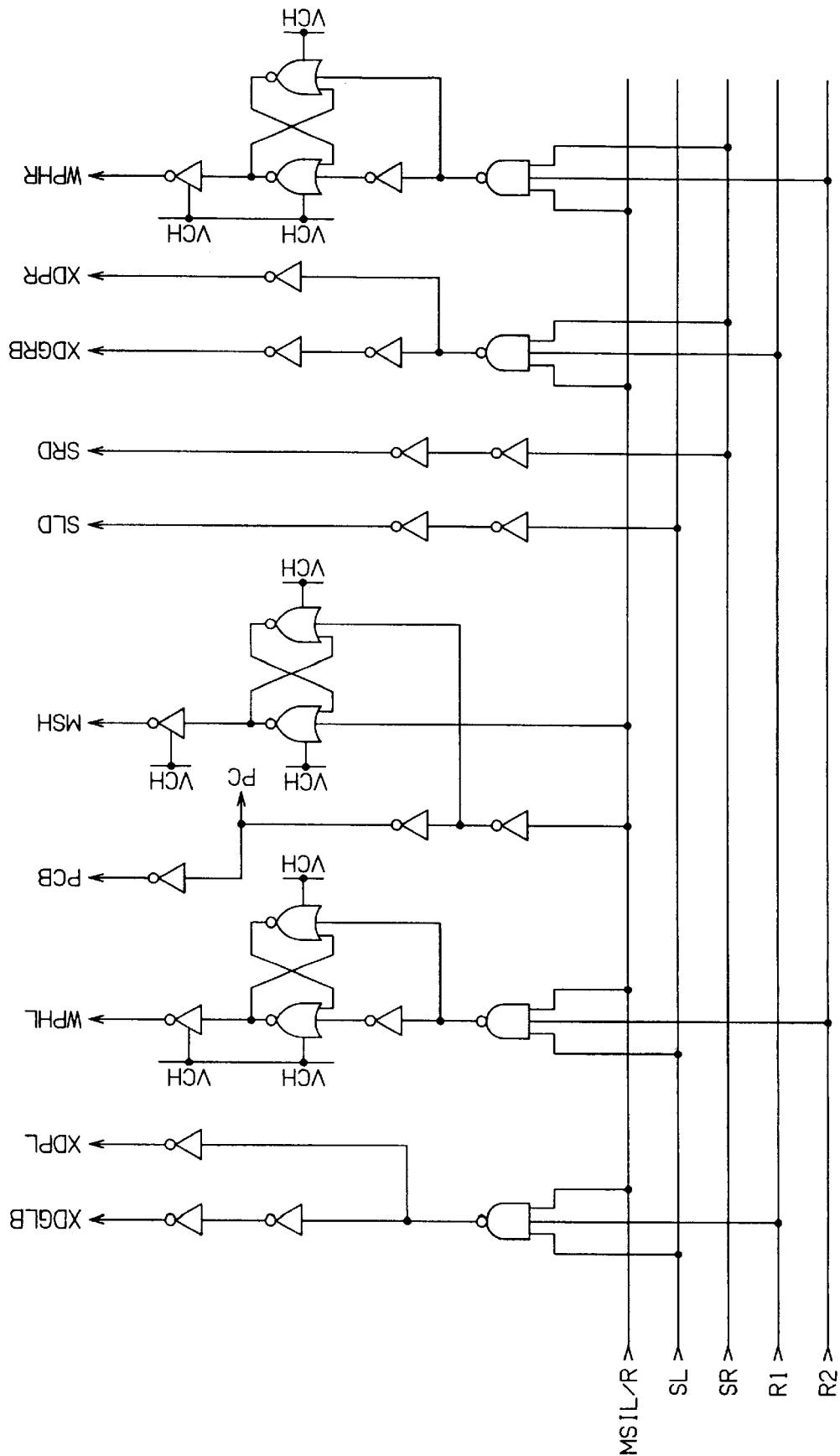
FIG. 40 presents circuit diagrams showing portions of one embodiment of a control circuit disposed in the memory mat.
Figure 41:
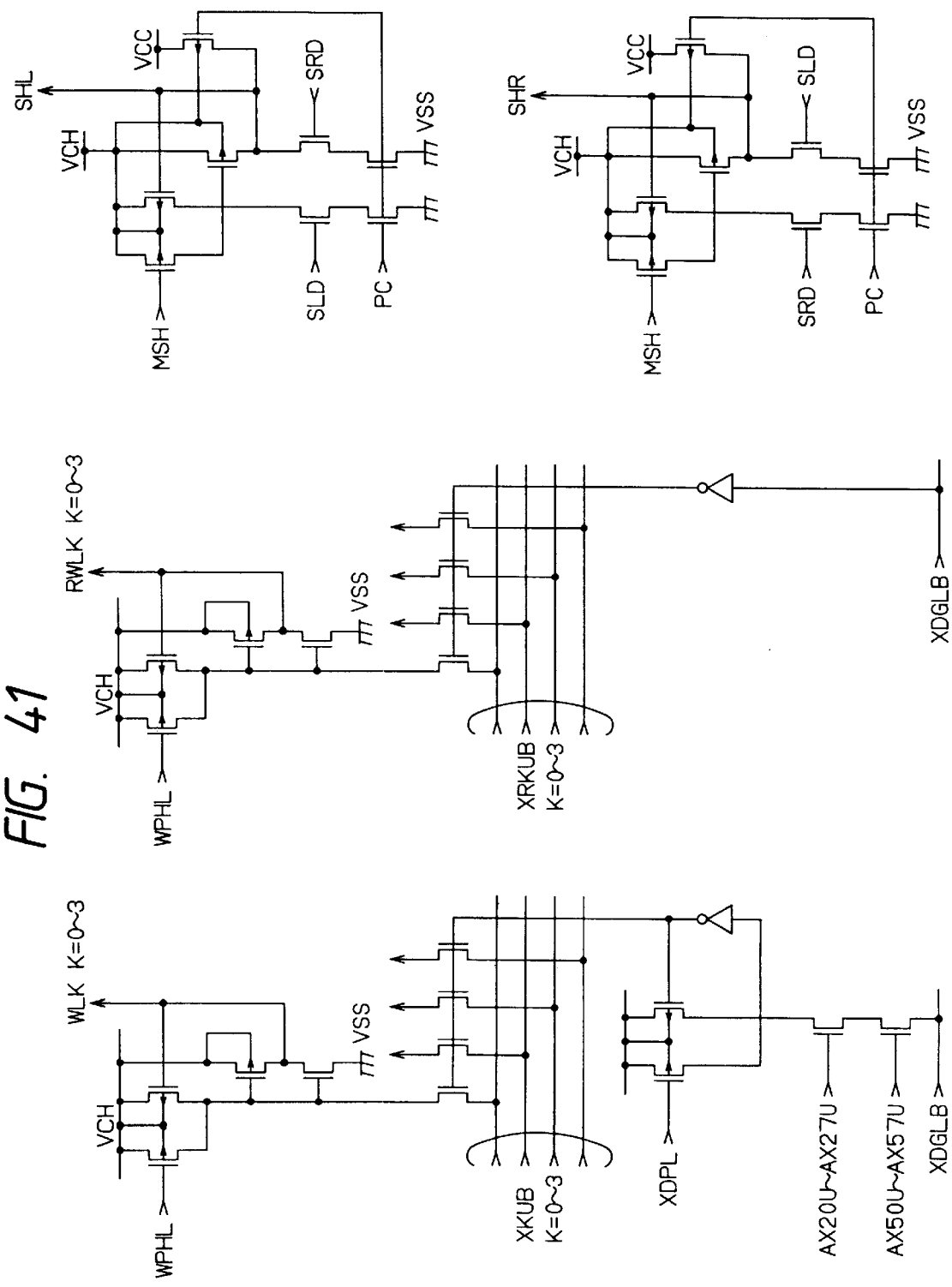
FIG. 41 is a circuit diagram showing one embodiment of an X-decoder, a word line driver and a shared control line driver.

FIGS. 40 and 41 are circuit diagrams showing one embodiment of the control circuit to be provided for the memory mats.

The circuit of FIG. 40 forms the following signals from mat selection signals MSIL/R, the signals SL and SR and the row timing signals R1 and R2. Here will be described the closed signal in one of the aforementioned thirty two mats. Therefore, the signals other than the signals MSIL/R have their suffixes omitted. From the aforementioned signals, there are formed X-decoder precharge signals XDPL/R, X-decoder extraction signals SDGLB/RB and a complementary data line precharge signal PCB. On the other hand, word line driving signals WPHL/R and a signal MSH have their levels changed by a NOR gate circuit of latch type which is operated by the aforementioned bootstrap voltage VCH. These signals at the changed high level are outputted through the inverter circuit which is operated by the aforementioned bootstrap voltage VCH. In the memory mat of this embodiment, therefore, the word lines to be selected are changed at a stroke from the non-selection level at the low level to the boosted selection level. As a result, the word line selections can be speeded up more than the structure of the prior art, in which the bootstrap voltage is established by using the word line selection signals and by combining their delayed signals.

The circuits of FIG. 41 are decoders and drivers for forming the word lines WL and redundancy word lines RWL which are selected by the aforementioned pre-decode signal, the X-decoder precharge signals SCPL/R and the X-decoder extraction signals SDGLB/RB.

The word line driver uses the aforementioned boosted voltage VCH as its operating voltage so that it raises the selected word lines linearly from the ground potential VSS of the low level to the boosted voltage VCH.

Shared line drive signals SHL/R formed by the selection signals MSH, SL and SR are also controlled by the aforementioned boosted voltage VCH. Therefore, signals can be transmitted without any level loss by the threshold voltage of the switching MOSFET between the sense amplifiers and the selected complementary data lines.

Figure 42:
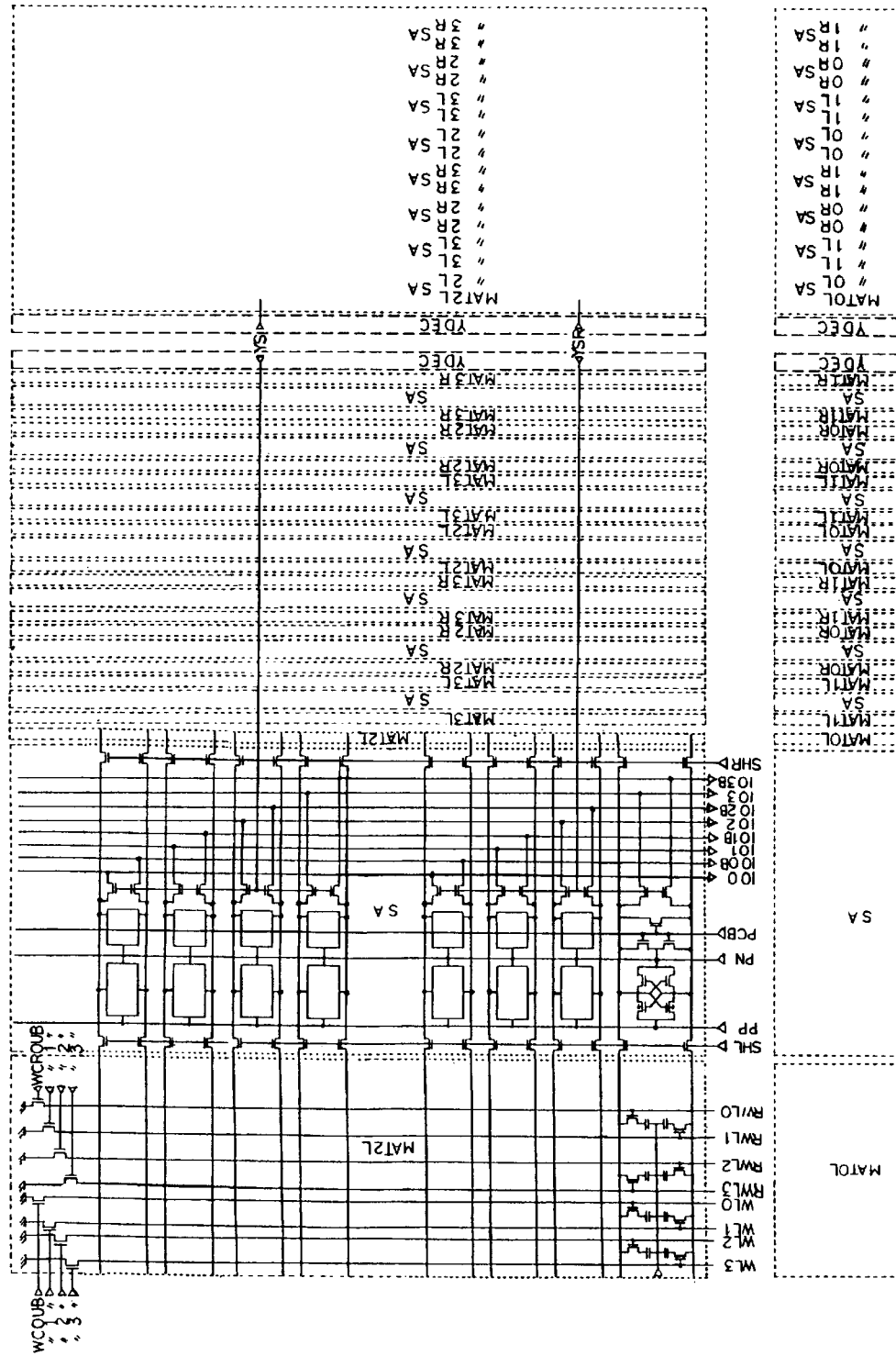
FIG. 42 is a circuit diagram showing one embodiment of a memory cell array.

FIG. 42 is a circuit diagram showing one embodiment of the memory cell array.

The memory cell is composed of an information storing capacitor and an address selecting MOSFET. This address selecting MOSFET has its drain connected with one of a pair of complementary data lines arranged in parallel. The gate of the address selecting MOSFET is connected with the word lines. The other end (or plate) of the information storing capacitor is supplied with the plate voltage.

In the same Figure, there are shown by way of example the paired complementary data lines, the four word lines WL0 to WL3 and the redundancy word lines RWL0 to RWL3.

The coupling due to the overlap between the word lines and the paired complementary data lines can be offset by the later-described differential sense amplifiers because it appears on the complementary data lines in the common mode. Incidentally, the complementary data lines are crossed at a constant interval and interchanged. Thus, the influences of the coupling of the complementary data lines can be eliminated.

With the remote ends of the aforementioned word lines, there are connected word line clearing switch MOSFETs which are fed with the aforementioned clearing signals WCL0 to WCL3 and RWCL0 to RWCL3.

The complementary data lines are coupled to the input/output nodes of the sense amplifiers through the switch MOSFETs made receptive of a shared line drive signal SHL. One sense amplifier, as representatively shown by way of example, takes the structure in which the input and output of the CMOS inverter circuit composed of P-channel and N-channel MOSFETs are crossly connected.

Incidentally in this embodiment, it should be noted that the sense amplifier means either the unit circuit, as described above, or the memory mat unit in which the unit circuits have a shared source.

In the sense amplifier, the P-channel MOSFETs have their common source PP fed with the operation voltage VDL through the power switch composed of the P-channel MOSFETs, and the N-channel MOSFETs have their common source PN fed with the ground potential VSS through the power switch composed of the N-channel MOSFETs, thus starting the amplifications of the sense amplifiers.

In this embodiment, there are provided column switch MOSFETs which are connected with four pairs of input/output lines IO0 and IO0B to IO3 and IO3B each for the unit of four pairs of complementary data lines. Thus, a Y-(column) selection line YS is connected commonly with the gates of the four pairs of column switch MOSFETs. Accordingly, the redundancy data lines are composed of four pairs, and four sets of selection signals YSR0 to YSR3 are also given, although not shown.

Figure 43:
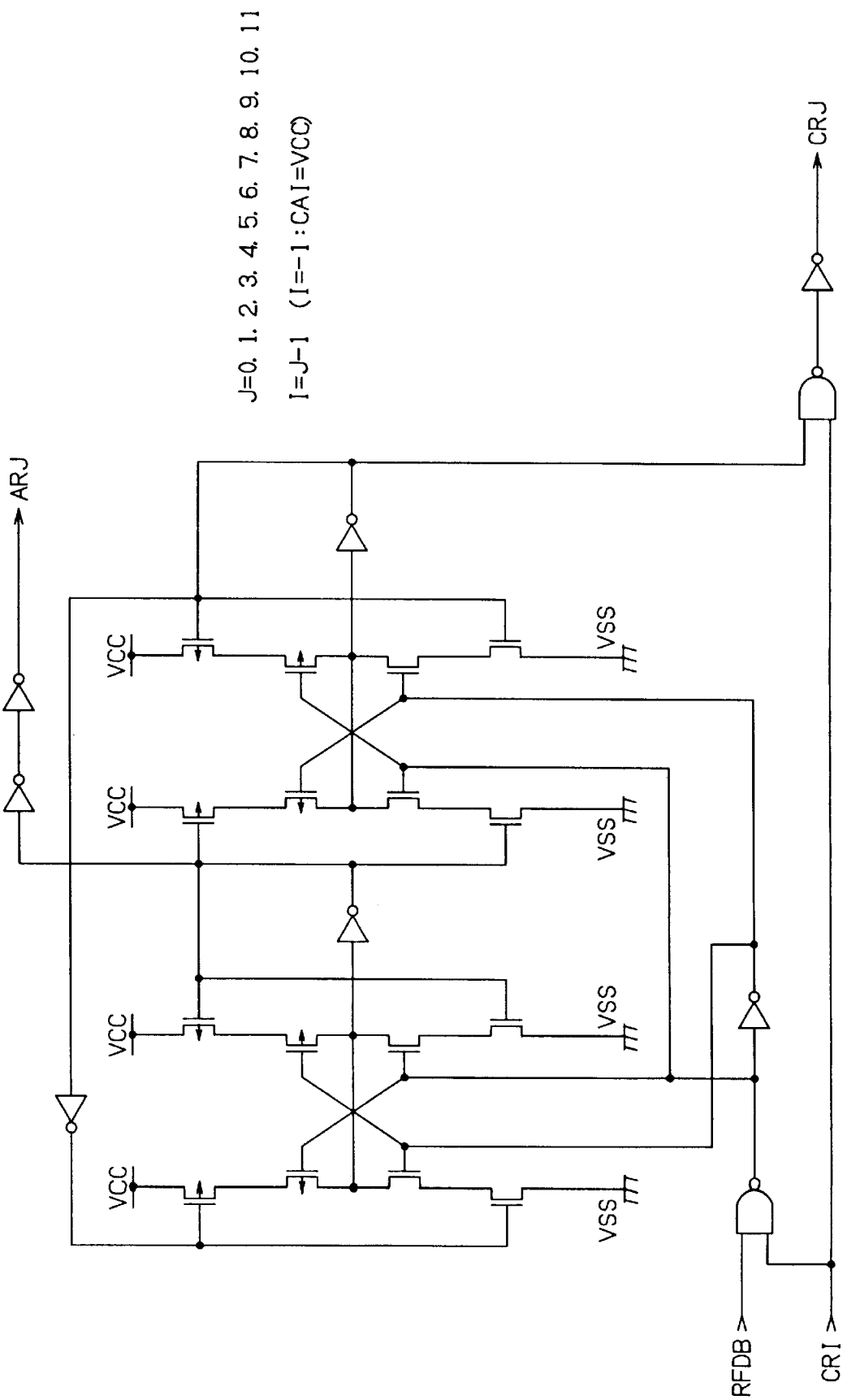
FIG. 43 is a circuit diagram showing one embodiment of a refresh address counter.

FIG. 43 is a circuit diagram showing one embodiment of the refresh counter circuit.

This CBR counter circuit accomplishes its counting operation to form a refresh address signal ARJ, when in the refresh mode, by using a signal RFDB corresponding to the $\overline{RAS}$ signal as its clock. A signal CAI is a carry input signal, and a signal CAJ is a carry-out signal. These twenty unit circuits are connected in tandem to generate refresh address signals AR0 to AR11 corresponding to the address signals A0 to A11. In this embodiment, the refresh operations of 4,096 bit scans are accomplished.

Figure 44:
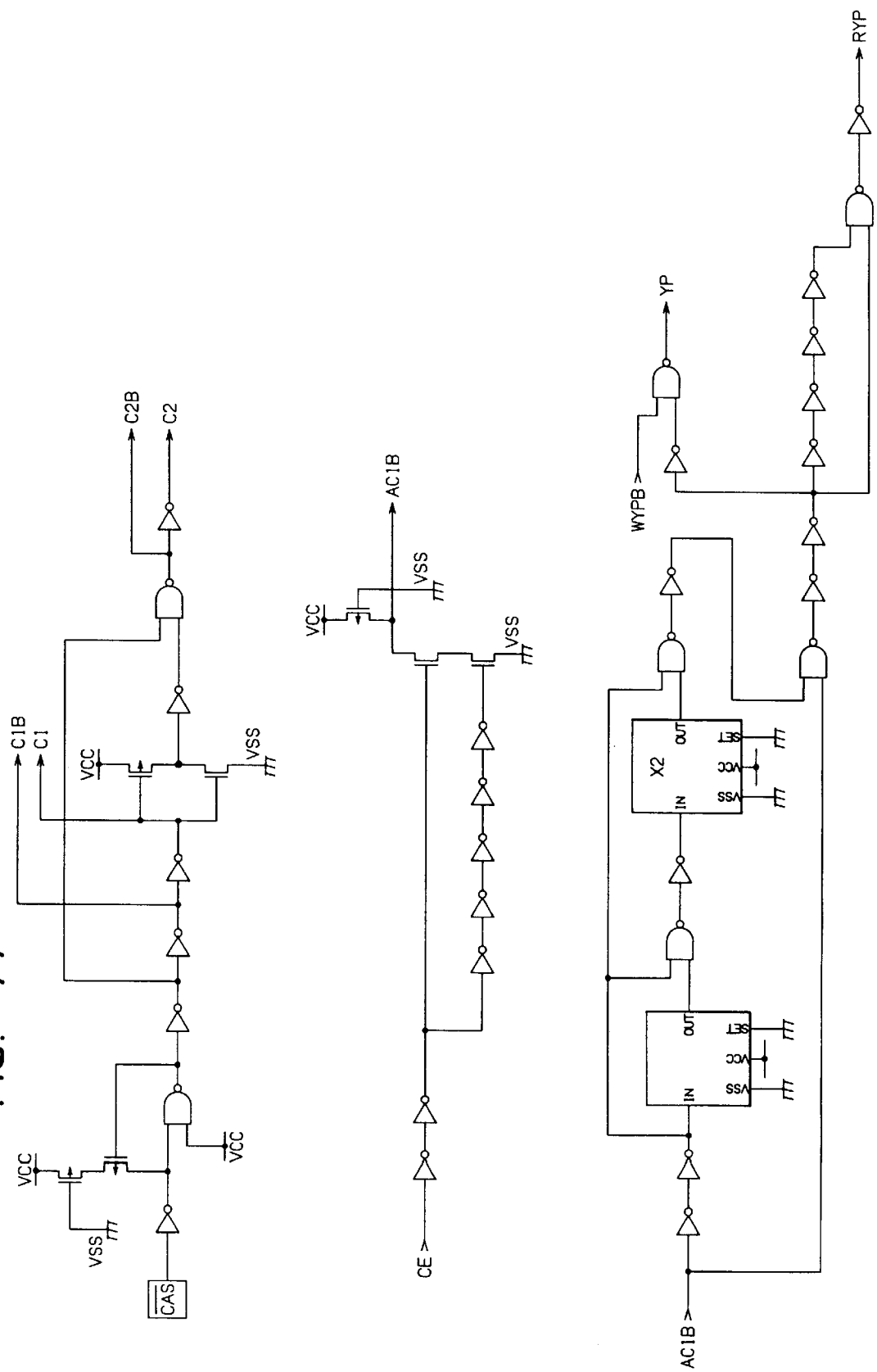
FIG. 44 presents circuit diagrams showing portions of one embodiment of a control circuit of the CAS system.
Figure 75:
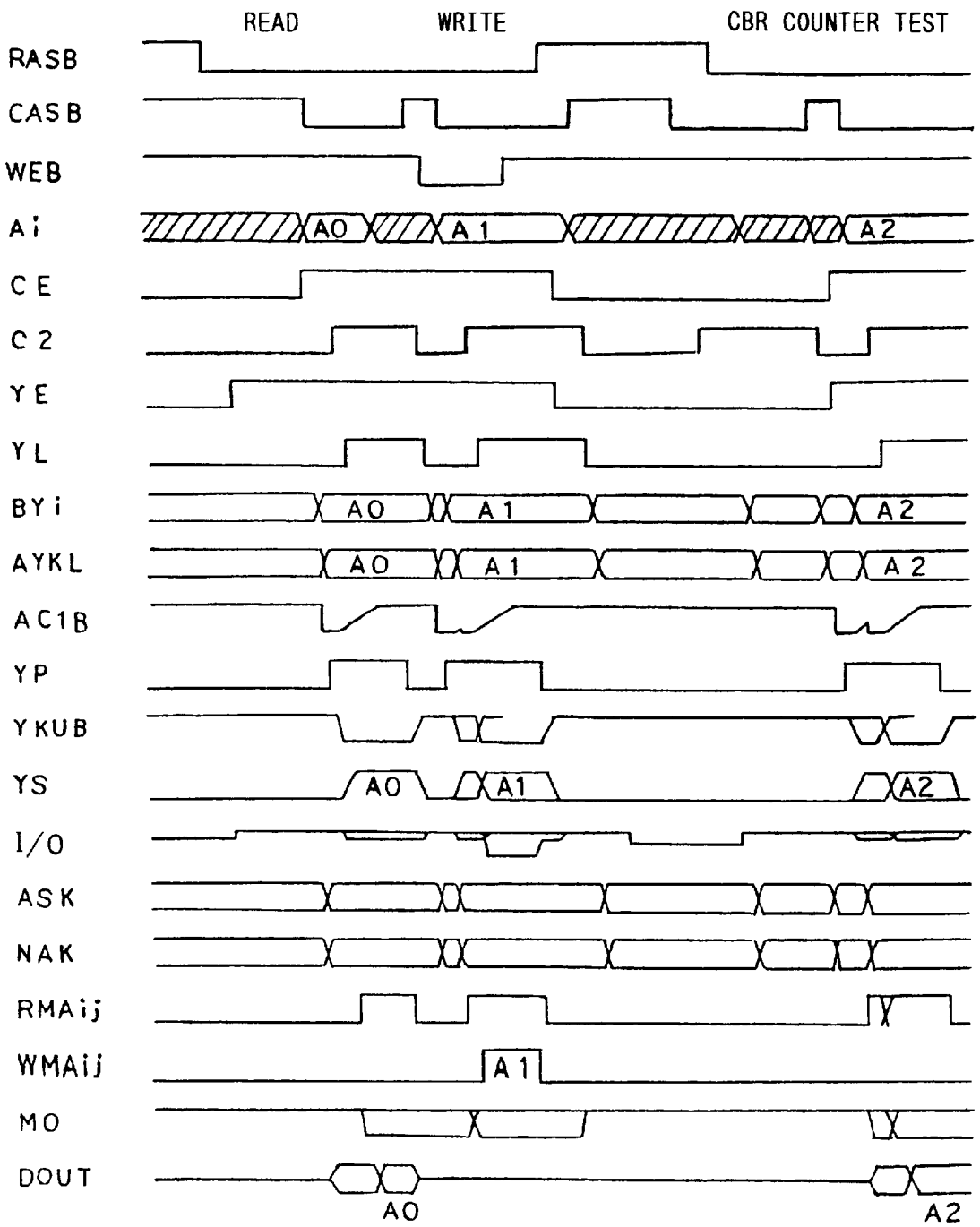
FIG. 75 is a timing chart showing one example of the address selecting operations of the CAS system.

FIG. 44 presents circuit diagrams showing portions of one embodiment of the control circuit of the CAS system. On the other hand, FIG. 75 is a timing chart showing one embodiment of the address selecting operations of the CAS system.

The $\overline{CAS}$ (Column Address Strobe) signal is fed to the input circuit constructed of a CMOS inverter circuit. This CMOS inverter circuit for the input buffer is caused to have a logic threshold voltage such as about 1.6 V like before. The operation voltage VCC is set at 3.3 V twice as high as the aforementioned logic threshold voltage of 1.6 V and corresponds to the signal at the TTL level. The operations of the circuit of the Y-system are started when the signal $\overline{CAS}$ is dropped to the low level.

The $\overline{CAS}$ signal having passed through the inverter circuit acting as the afore mentioned input buffer is used in a circuit like that for the aforementioned $\overline{RAS}$ signal. However, the signal corresponding to the signal WKB of the RAS circuit is omitted and the power voltage VCC of the circuit is steadily supplied.

Signals C1 and C2 are formed from the signal $\overline{CAS}$. The signal C1 is used for controlling the nibble counter, signals DoE, W3B and W5B and the signal CE. The signal C2B is used for controlling the signal WYP, and the signal C2 is used for controlling the signals W3B, YL and DL. The signal AC1B is formed from the signal CE so that the signals YP and RYP are formed.

The signal AC1B is a signal for controlling the operations of the main amplifiers and the Y-decoders and is generated in response to the signal CE. The signal YP is a signal for controlling the operations of the Y-decoders and is generated even when in the write operations. The signal RYP is a signal for controlling the operations of the main amplifiers.

Figure 45:
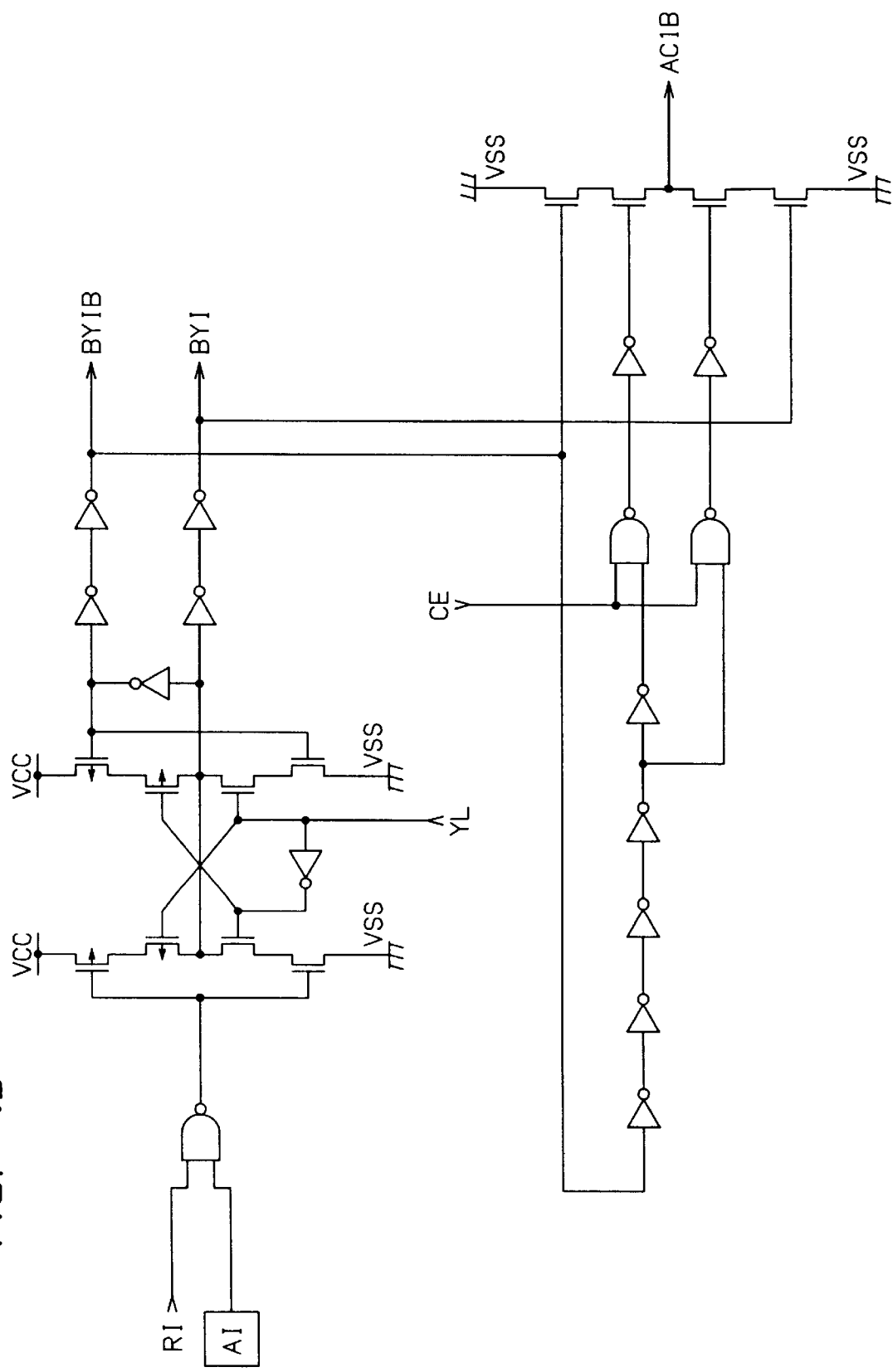
FIG. 45 is a circuit diagram showing one embodiment of a Y-address buffer.

FIG. 45 is a circuit diagram showing one embodiment of the unit circuit constituting the Y-address buffer.

A NAND gate circuit made receptive of both the address signal AI fed from an external terminal and the signal R1 constitutes an input buffer. Specifically, the NAND gate circuit has its gate opened, when the signal R1 takes the high level, to take thereinto the address signal fed from the external terminal AI. The signal R1 is used to reduce the electric current in the standby state. In this standby state in which the signal R1 takes the low level, the input circuit is kept away from responding to the signal of the address terminal AI. In the input buffer having such gate function, too, the logic threshold voltage is set at about 1.6 V, as has been described hereinbefore, and the operation voltage VCC is set at a twice level of 3.3 V. Thus, the logic threshold voltage is set at the middle point of the operation voltage so that the operation voltage can be efficiently used to enlarge input level margin.

Tri-state output circuit, in which the output high-impedance state is controlled by the signal YL, is used as the input gate circuit for taking the aforementioned address signal AI thereinto. A similar tri-state output circuit to be controlled by the taken signal YL of the address signal constitutes a positive feedback loop between the input and output of the CMOS inverter circuit, which is made receptive of the address signal through the aforementioned input gate circuit, to accomplish the address latching operations. The output of this address latch circuit forms internal address signals BYI and BYIB through an inverter circuit.

The aforementioned internal address signals BYI and BYIB and the signal CE form together a signal ACIB.

Figure 54:
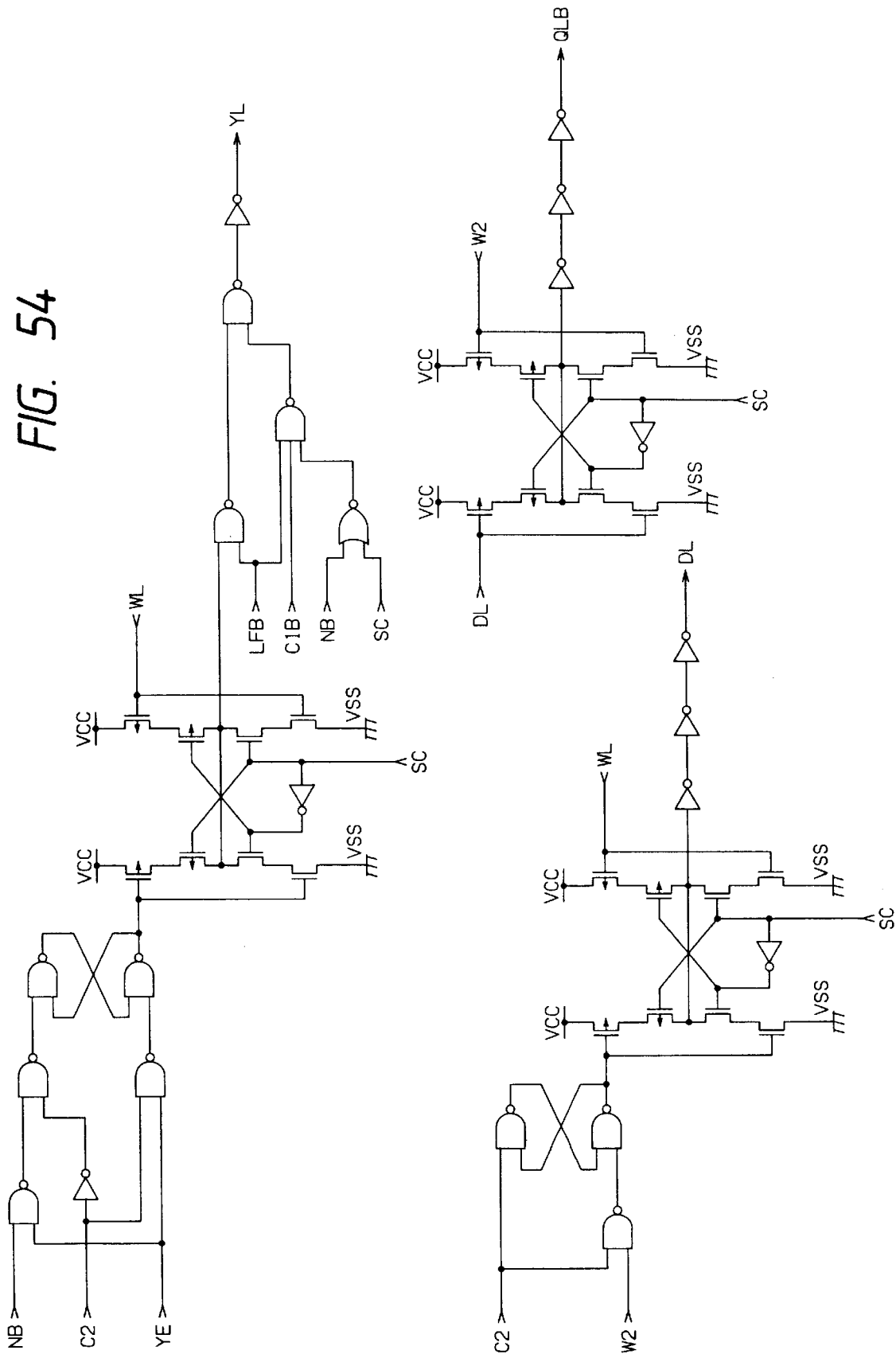
FIG. 54 presents circuit diagrams showing portions of one embodiment of a Y-control circuit.

The circuit for generating the signal YL is shown in FIG. 54, and the Y-address buffer has four operation modes in accordance with the generation modes of the signal YL. The first mode is a normal mode, in which the signal YL changes in response to the $\overline{CAS}$ signal to make the static column operation possible. The second mode is a nibble mode, in which the signal YL is formed in response to the first $\overline{CAS}$ signal to hold the address signal taken. The third mode is a CBR mode, in which the $\overline{CAS}$ signal is reset and then dropped to the low level to generate the signal YL so that the address signal is taken in. The fourth mode is a WCBR mode, in which the address signal accepted as effective between the signals R1 and YL is taken in as the signal for designating the test mode.

FIGS. 46 to 49 are circuit diagrams showing one embodiment of the Y-redundancy circuit and the predecoder circuit for remedying the defects of the data lines, the column selection lines (which may be simply called the YS lines) or the sense amplifiers. The fundamental concepts of the redundancy circuits of the Y-system in this embodiment are similar to those of the aforementioned X-redundancy circuit.

Specifically, there are sixteen blocks which are divided by X8 to X11. A defective data line of one block is remedied by the redundancy data lines. Thus, the address signals AX8H and AX8HB to AX11 and AX11B are inputted to the address comparator.

For four pairs of input/output lines I/O, four pairs of complementary data lines are selected in one column selection line. As a result, the remedy is accomplished for the four pairs of complementary data lines. Therefore, the addresses Y0 and Y1 are restricted so that their corresponding fuses are not provided. There is provided none of the fuses which correspond to the structure of ×4 bits and the addresses Y10 and Y11 to be restricted in the nibble mode. As a result, four redundancy YS lines simultaneously come out of one block. In the practical layout, one block is divided in the direction of word lines into four quarters (Y10 and Y11), which are longitudinally distributed and arranged in the chip. This will be apparent from the aforementioned address assignment of the block shown in FIG. 4.

In the simultaneous test mode of 64 bits, as will be described hereinafter, the addresses Y2 and Y3 are also restricted. If, however, the fuses corresponding to the addresses Y2 and Y3 are eliminated, sixteen redundancy YS lines are simultaneously formed in one block. Specifically, redundancy data lines of 16×4 (the number of I/O)=64 pairs are simultaneously remedied so that the efficiency is deteriorated because such a large number of redundancy data lines have to be prepared. For the addresses Y2 and Y3, therefore, only the YS lines corresponding to the complementary data lines having an actual defect when in the simultaneous test of 64 bits are changed to the redundancy YS lines, whereas the remainder selects the normal YS lines (i.e., the multi-selection of the 4 YS lines due to the restriction of the addresses Y2 and Y3). As a result, there is no necessity for preparing four times of the redundancy data lines despite of the test mode of 64 bits of the YS multi-selection type.

Since the YS lines extend over the plural blocks, as described above, the data lines are troubled in the plural blocks sharing the YS lines if a defect is caused in the YS lines. If the redundancy decoder is assigned to each block so as to remedy that trouble, the number of redundancy decoders is increased to drop the remedy efficiency. In order to prevent this, two fuses are attached to each of the block dividing addresses X8 to X11, and the lower fuse FUSE is cut. Then, the corresponding X-addresses are not compared. If the lower fuses FUSE of the addresses X8, X9 and X11, for example, are cut, the eight blocks sharing one YS line are restricted and can be remedied by one redundancy decoder to improve the efficiency. For a defective sense amplifier, likewise, the righthand and lefthand data lines of the sense amplifier can be remedied by one redundancy decoder if only the lower fuse FUSE of the address X8 is cut.

Figure 46:
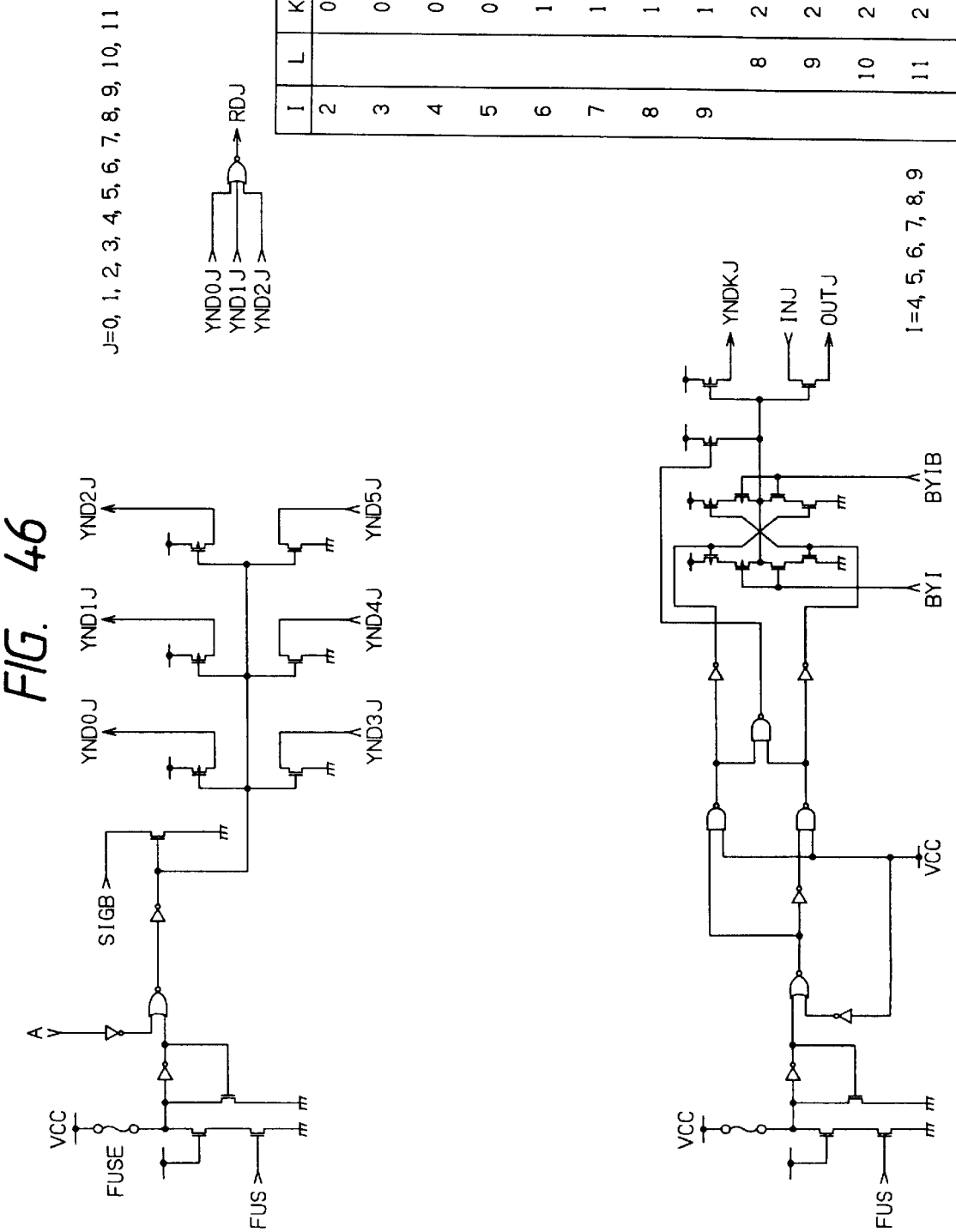
FIG. 46 presents circuit diagrams showing portions of one embodiment of a Y-redundancy circuit.
Figure 47:
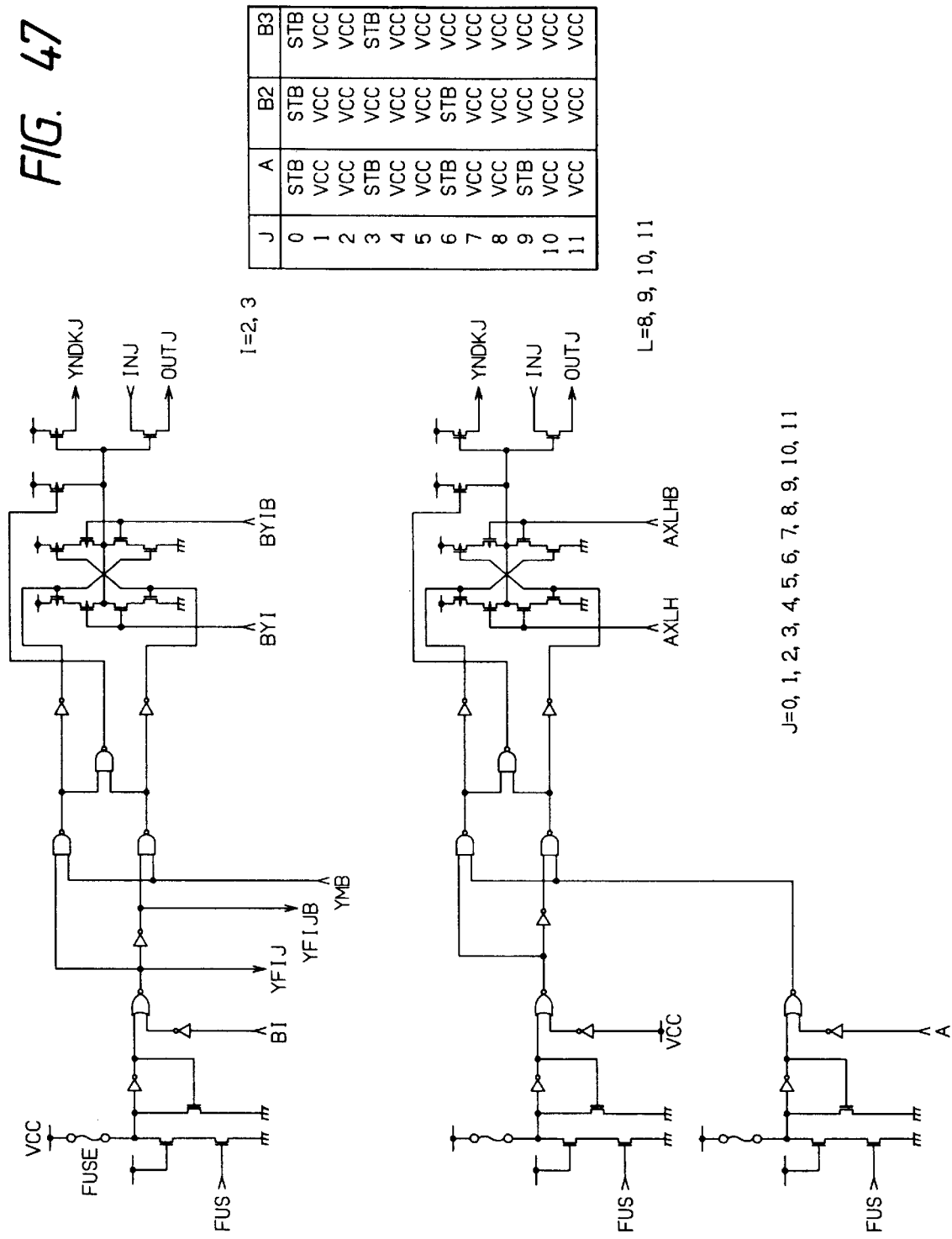
FIG. 47 presents circuit diagrams showing other portions of one embodiment of a Y-redundancy circuit.

In FIG. 46, the upper circuit corresponds to the enabling circuit, and the lower circuit corresponds to the addresses Y4 to Y9. In FIG. 47, the upper circuit corresponds to the addresses Y2 and Y3, and the lower circuit corresponds to the addresses X8 to X11.

The fuse FUSE is initialized through a MOSFET which is turned ON by the signal FUS of one-shot pulse. If the fuse FUSE is cut, it is fixed at the ground potential by a MOSFET which is turned ON by the high output level of the inverter circuit. If the fuse FUSE is not cut, the input of the inverter circuit is fixed at the high level.

During the remedy, a signal RDJ takes the high level, if the address programmed by the redundancy decoder is coincident to the input address, but takes the low level in the case of inconsistency. In the operation other than the remedy, the signal RDJ is fixed at the low level.

In the simultaneous test of 64 bits, a signal YMB takes the low level, and signals YFIJ and YFIJB output the states of the fuse corresponding to the addresses Y2 and Y3. These addresses Y2 and Y3 are not compared (but restricted). In the test of the redundancy data lines, the addresses X8 to X11 are restricted. When the addresses Y2 and Y3 are in the states of (0, 0), (1, 0), (0, 1) and (1, 1), the redundancy decoders of J=0, 3, 6 and 9 are remedied to correspond to the four redundancy YS lines. This structure is similar to that of the aforementioned X-redundancy circuit.

Figure 48:
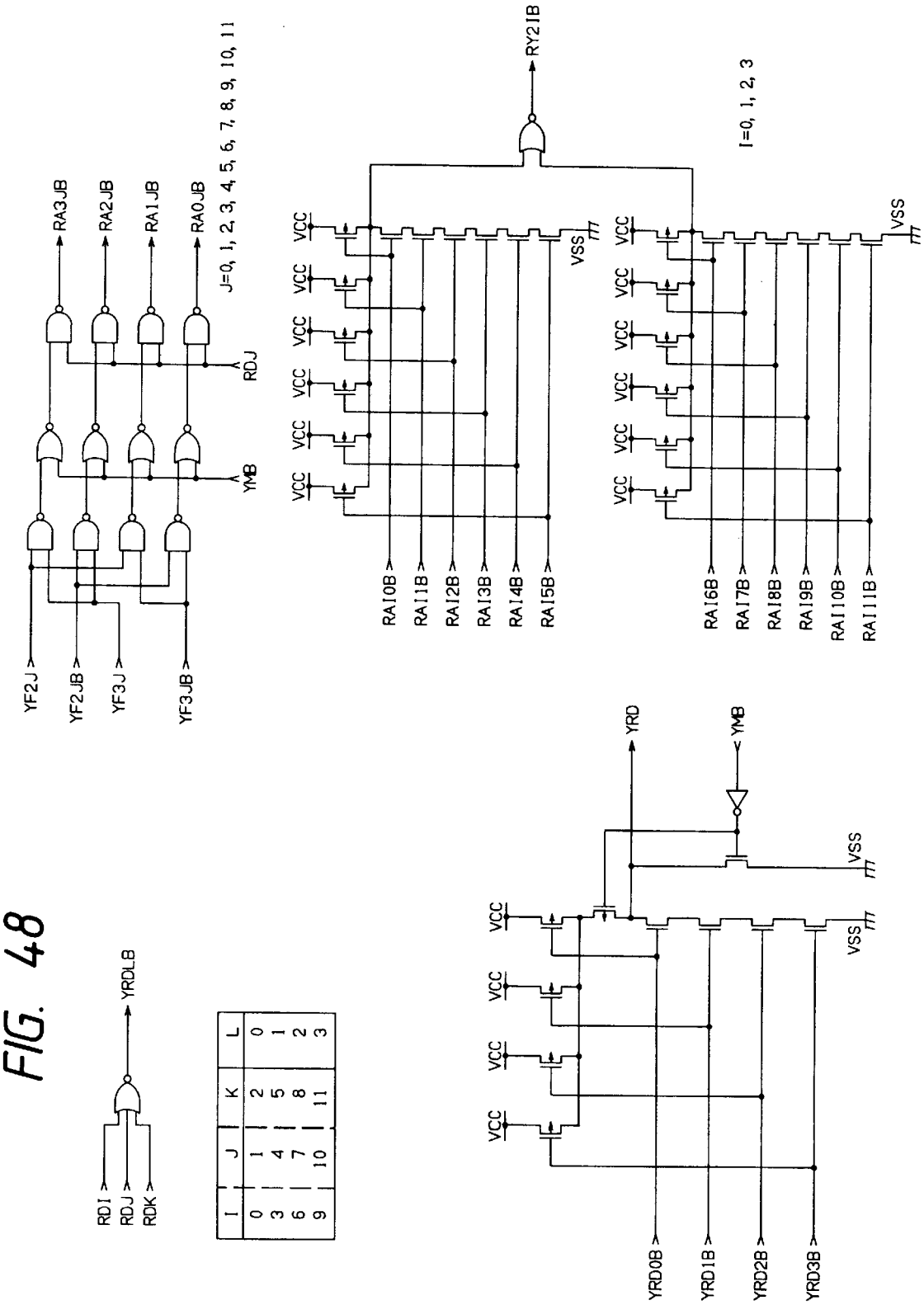
FIG. 48 presents circuit diagrams showing portions of one embodiment of a Y-redundancy circuit.

In FIG. 48, there are formed redundancy YS line selection signals YRD0B to YRD3B which correspond to signals RD0 to RD2, RD3 to RD5, RD6 to RD8, and RD9 to RD11, respectively.

The signal YRD inhibits the selection or the normal YS lines when in the redundancy selection, if it is at the high level. For the simultaneous tests of 64 bits, however, the signal YRD is fixed at the low level in response to the low level of a signal YMB so that the normal YS lines are simultaneously selected.

Signals RA0JB to RA3JB monitor the states of the fuses FUSE corresponding to the addresses Y2 and Y3. In the normal mode, the signals RA0JB to RA3JB are fixed at the high level in response to the high level of the signal YMB. In the simultaneous test of 64 bits, the states of the fuses of the addresses Y2 and Y3 are decoded in response to the high level of the signal RDJ, when the remedy address is selected, to drop one of the outputs to the low level (in a manner to correspond to the pre-decode signals of the defective addresses Y2 and Y3).

The signals RY20B to RY23B adopt the OR logic of J=0 to 11 so that two or more of the signals RY20B to RY23B can be dropped to the low level when the addresses of the twelve redundancy decoders of J=0 to 11 except the address Y2 and Y3 happen to be coincident so that they are remedied. In other words, in case two of the four YS lines to be restricted by the addresses Y2 and Y3 are remedied, they are distributed to the redundancy YS lines, whereas the remaining two are distributed to the normal YS lines.

In order to check the redundancy YS lines, namely, to select the redundancy YS lines in the test mode thereby to accomplish the write/read tests in the memory cells of the redundancy YS lines, the redundancy YS lines (e.g., YSR0 to YSR3) have to be selected for the designation of any address of the address signals X8 to X11. Moreover, the two bits of the address signals Y2 and Y3 are used for designating the redundancy YS lines. Specifically, the STB (i.e., the redundancy test signal) signal or the VCC signal is fed in response to signals BI (I=2 and 3) and A (corresponding to the redundancy decoders of L=8, 9, 10 and 11). As a result, the fuses of the defective address are cut not actually but equivalently by the address signals in the aforementioned test mode so that the redundancy YS lines of the designated addresses can be selected. Since this circuit is basically similar to the aforementioned redundancy circuit of the X-system, the detailed descriptions of the individual signals will be omitted.

The defect remedying method according to the present invention will be described from another view point in the following.

Figure 91A:
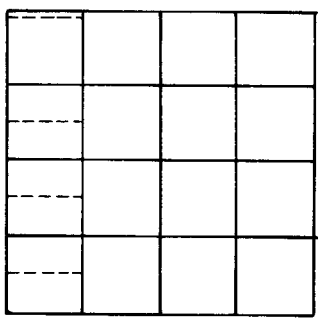
FIGS. 91(A) to 91(C) are conceptional diagrams for explaining the defect remedying method according to the present invention.

FIG. 91(A) is a conceptional diagram for explaining one example of the defect remedy in the simultaneous test mode of multiple bits by the aforementioned multiplex selection of the Y-system.

In the same Figure, the abscissa designates the X-address, and the coordinate designates the Y-address. In case a RAM is constructed to have a storage capacity of about 16 Mbits like this embodiment, the X-axis has 4,096 addresses, and the Y-axis also has 4,096 addresses. In the defect remedying technology of the prior art, a switching is made to the redundancy circuit in response to one defective address in the X- and Y-directions. If, therefore, one of the Y-addresses is defective, an access to its bit lines to be coupled to the 4,096 memory cells is inhibited, and a switching to the redundancy bit lines to be coupled to the 4,096 memory cells is accomplished. Since the scale of the redundancy circuit is thus enlarged, the memory cells in the shown embodiment are grouped into sixteen memory blocks by dividing the X- and Y-addresses into four blocks while using the higher two bits of the X- and Y-addresses so that the data lines can be designated at the unit of each block.

On the other hand, the Y-system is multiplexly selected in the aforementioned simultaneous test of multiple bits or when the higher 2 bits of the Y-addresses are restricted to make a structure of ×4 bits. In case there is any defect, therefore, the defect remedying method of the prior art changes all to the redundancy circuits. Then, it is necessary to change the bit lines having no defect to the redundancy bit lines only for the multi-selection test or for the structure of ×4 bits. When the Y-system is to be selected simultaneously for the four addresses, as shown in the same Figure, only the block having the defect bit lines and the YS selection lines is switched to redundancy bit lines RBL, and the bit lines corresponding to the remaining three addresses to be selected simultaneously are the normal bit lines NBL. Incidentally with this block structure, the other memory blocks to be divided by the X-addresses have their bits lines left unselected. Thanks to this structure, only the defective ones are switched to the redundancy bit lines so that the redundancy bit lines to be prepared can be drastically reduced.

Figure 91B:
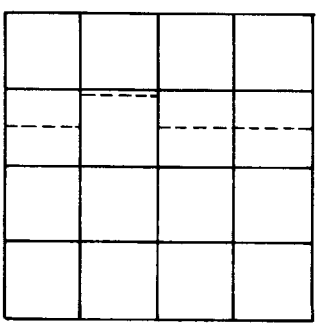

FIG. 91(B) is a conceptional diagram for explaining another embodiment of the defect remedy of bit lines when in the aforementioned normal mode.

In the example of the same Figure (B), only those of the bit lines belonging to the same Y-address, which are shared by a defective one of the four blocks divided by the X-addresses, are changed to the redundancy bit lines RBL, whereas the normal bit lines NBL are selected for the other blocks. By the defect remedy of such block unit, it is possible to reduce the number of redundancy bit lines or YS selection lines to be prepared.

Figure 91C:
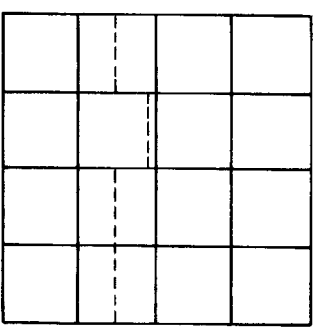

FIG. 91(C) is a conceptional diagram for explaining another embodiment of the defect remedy of word lines in the aforementioned normal mode.

In the example of the same Figure (C), only those of the word lines belonging to the same X-address, which are shared by a defective one of the four blocks divided by the Y-addresses, are changed to the redundancy word lines RWL, whereas the normal word lines NWL are selected for the other blocks. By the defect remedy of such block unit, it is possible to reduce the number of redundancy word lines to be prepared. However, the DRAM, to which the X-address signals of this embodiment are multiplexly inputted prior to the Y-address signals, cannot use these Y-address signals as they are. Therefore, the defect remedying method like the aforementioned one can be realized by programming the addresses called the block addresses equivalent to the Y-addresses by the aforementioned fuse means.

Figure 49:
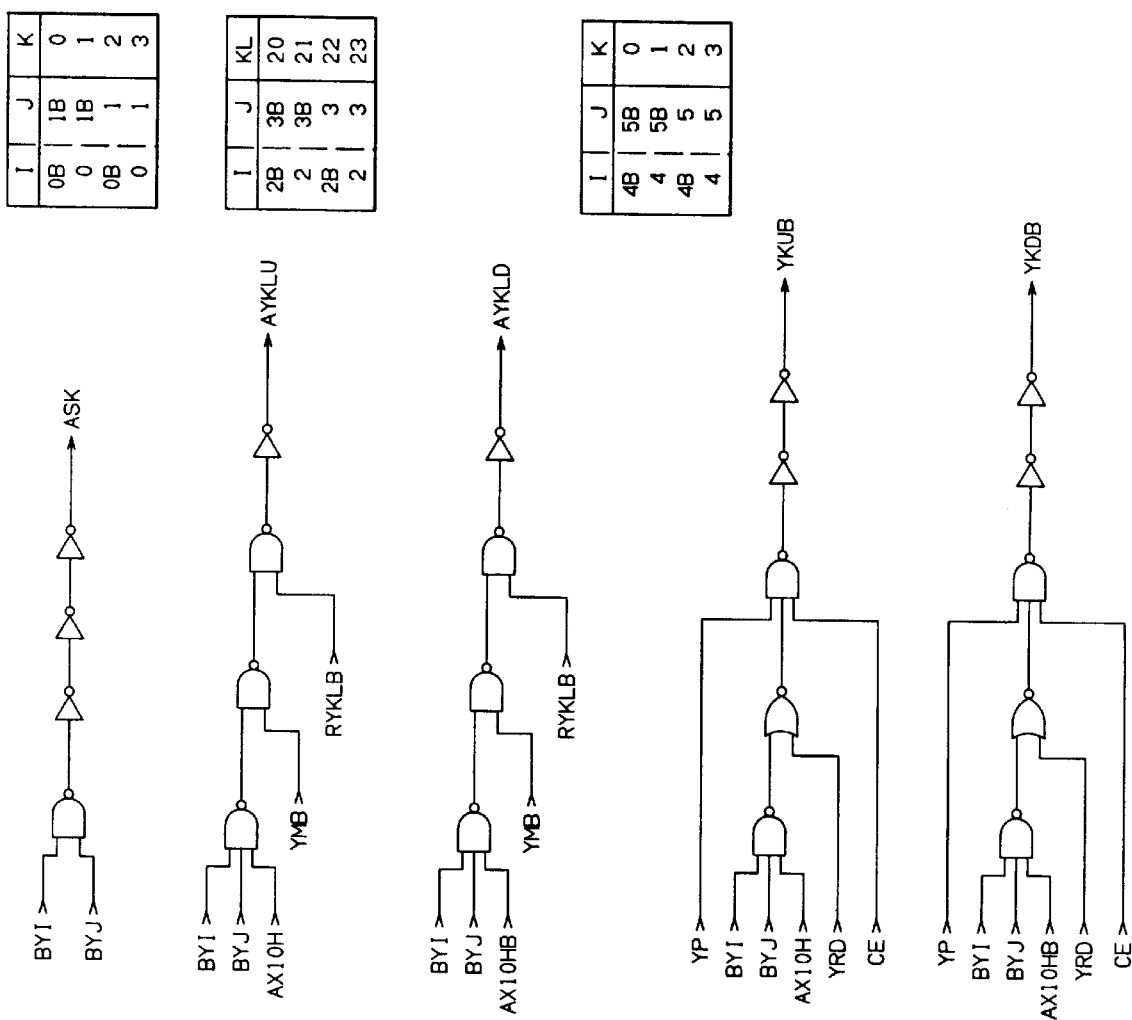
FIG. 49 is a circuit diagram showing one embodiment of the predecoder of a Y-address signal.

FIG. 49 presents circuit diagrams showing portions of one embodiment of the predecoder circuits of the Y-system including a circuit for forming the selection signals of the main amplifiers.

A signal ASK (AS0 to AS3) selects a group of main amplifiers (i.e., one of four pairs of I/O lines). Signals AY20U/D to AY23U/D predecode the addresses Y2 and Y3. The upper and lower mats are divided by the address X10. In the simultaneous test of 64 bits, the predecodes of the addresses Y2 and Y3 are ignored so that the signals RY20B to RY23B of FIG. 48 are outputted as they are.

Signals Y0UB to Y3UB and Y0DB to Y3DB are predecode signals, which are outputted in response to the signal YP by predecoding the addresses Y4 and Y5, and are set to have the data line selection timing. The reset timing is regulated by the signal CE. The signals Y0UB to Y3UB and Y0DB to Y3DB take the high level, when the signal YRD is at the high level, to inhibit the selection of the normal YS lines.

In the simultaneous test of 64 bits, the four signals AY20U/D to AY23U/D take the high level so that the four YS lines are selected, if the four YS lines to be restricted by the addresses Y2 and Y3 are not remedied. If the YS lines are remedied, on the contrary, one to four of the corresponding signals AY20U/D to AY23U/D are not outputted, but one to four redundancy YS lines are selected so that the redundancy YS lines and the normal YS lines are simultaneously selected. The signals AY60U/D to AY83U/D are the pre-decode signals of the addresses Y6 to Y9. Signals YR0U/DB to YR3U/DB select the redundancy YS lines and correspond to signals Y0U/DB to Y3U/DB.

FIG. 50 presents circuit diagrams showing the unit circuits of the Y-decoders and the redundancy YS line selection circuit.

The aforementioned pre-decode signals are decoded by a tri-input NAND gate circuit. The decoded outputs and the Y-selection timing signal YKUB (K=0 to 3) are fed to the NOR gate circuits to form column selection signals YS0 to YS3 from the respective NOR gate circuits. The redundancy column selection signals YSR0 to YSR3 are formed from the signals which are formed by the aforementioned redundancy decoder circuits.

Figure 51:
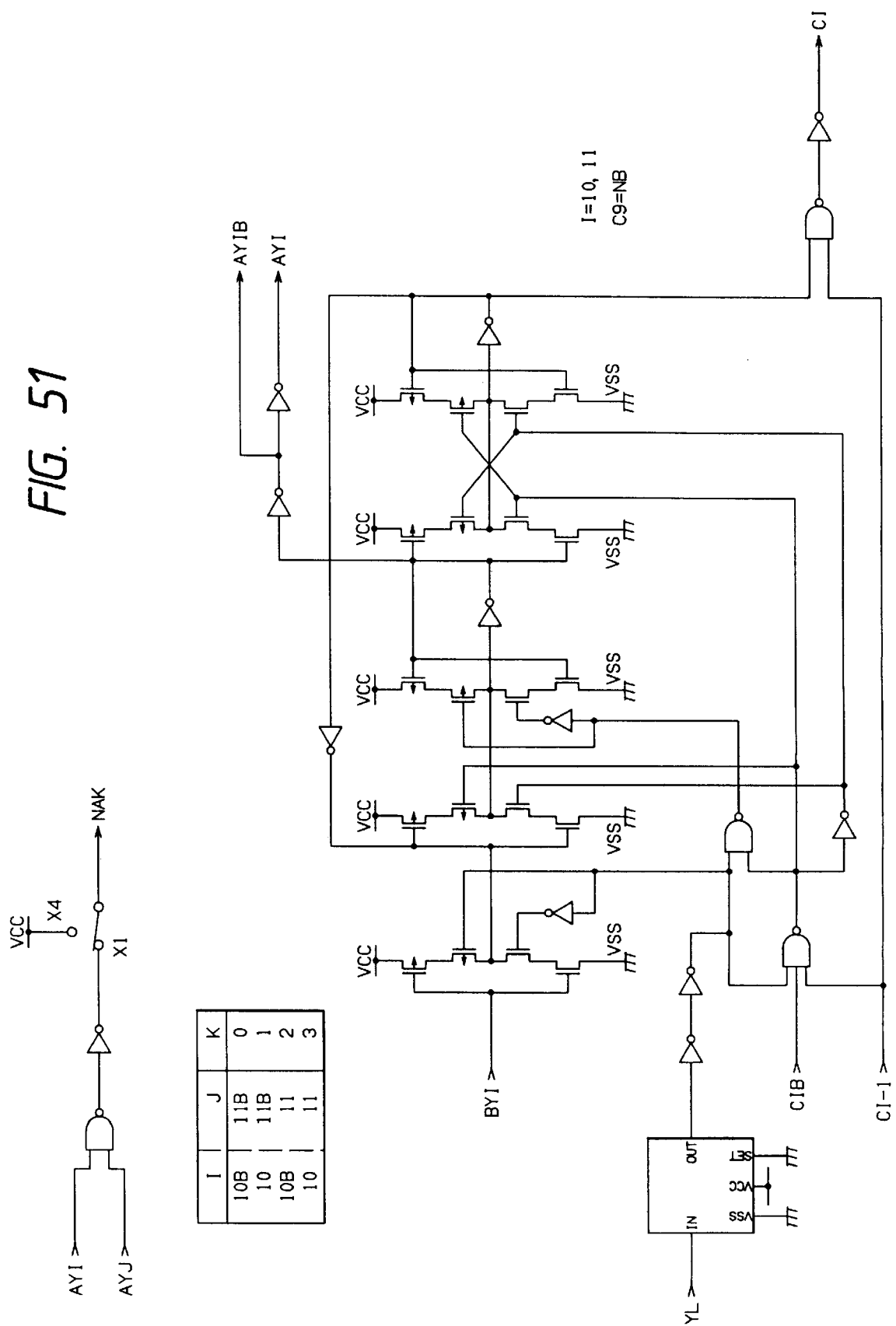
FIG. 51 is a circuit diagram showing one embodiment a nibble counter.

FIG. 51 presents circuit diagrams showing one embodiment of the nibble counter.

In the normal mode, an address signal NAK corresponding to the internal address signal BYI is outputted. In the nibble mode, the internal address signal BYI of the first cycle is counted up at first. When the memory access is to be accomplished by the structure of ×4 bits, the signal NAK is fixed at the high level (VCC) by the master slice in the switch mode.

FIG. 52 presents circuit diagrams showing one embodiment of the control circuit for generating the control signals of the Y-system.

A signal MA is one for controlling the main amplifier operations. A signal DS is one for controlling the output of the data of the main amplifiers. The signal MA is generated in accordance with the generation of a signal AC1B (RYP). A signal R1 determines the reset timing of the main amplifiers.

The signal DS is generated in response to the signal MA and is reset by the signals C1 and R1. Specifically, the control of the data output of the main amplifiers is reset when both the signals $\overline{RAS}$ and $\overline{CAS}$ are at the high level.

A signal WR is one for discriminating the read/write operations. The initial step is controlled by the signal R1 to reduce the current consumption in the standby state.

A signal DOE is one for controlling the data output buffer and is generated when in the read mode. In the case of the structure of ×1 bit, the signal DOE is generated by the logical product of the signals C1 and WR. In the case of the structure of ×4 bits, the signal DOE is generated by the logical product of the output enable signals OE, C1 and WR. A control signal OE is latched by the signal DL of the WE system for a time $t_{OEH}$ (i.e., the holding time period of the signal $\overline{OE}$ from the signal $\overline{WE}$).

Figure 53:
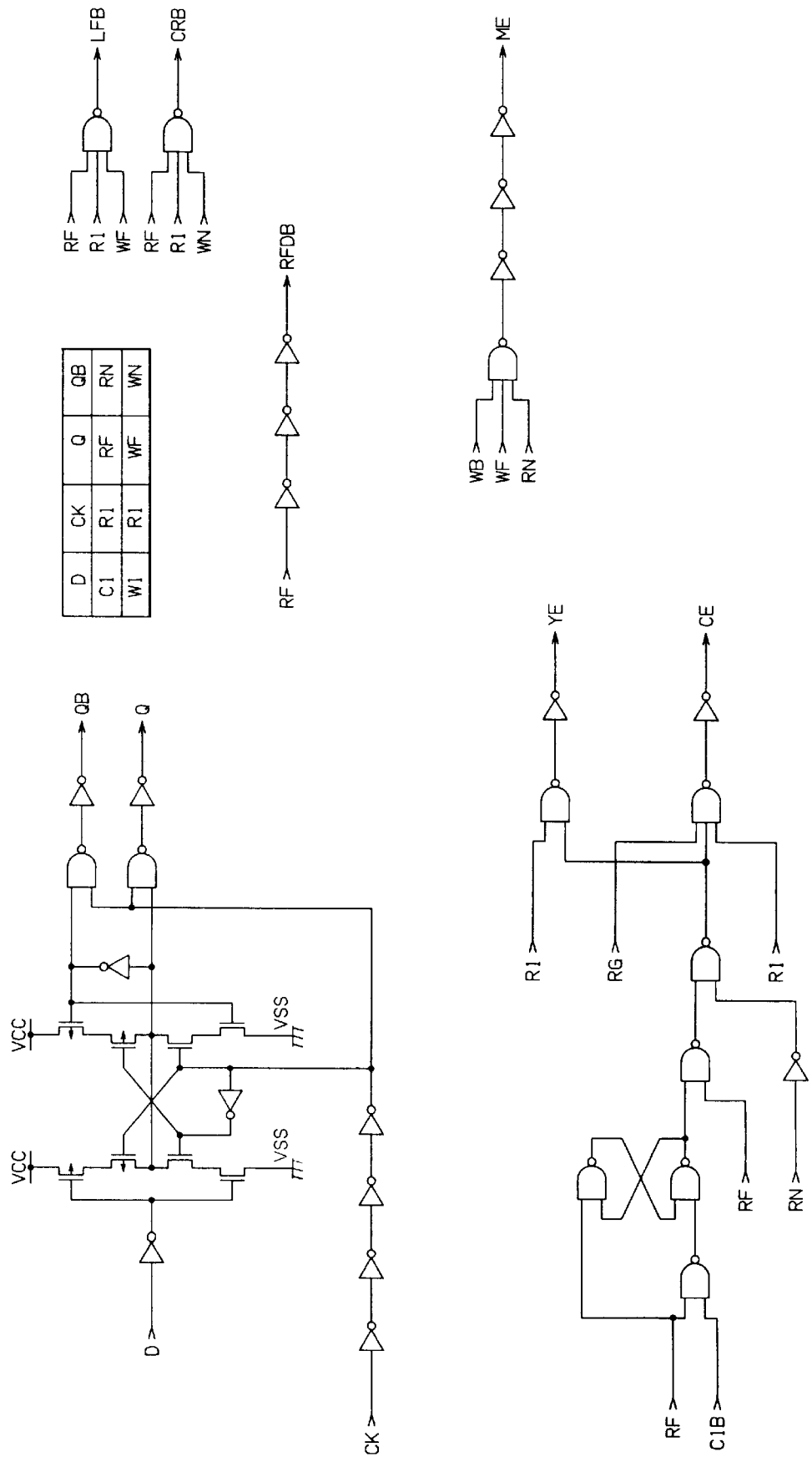
FIG. 53 is a circuit diagram showing one embodiment of the operation mode decoder.

FIG. 53 presents circuit diagrams showing one embodiment of the operation mode deciding circuit.

Signals RN and RF and signals WN and WF control the normal operations, the CBR operations and the WCBR operations. The signals RN and RF control the signals CE adn YE, and signals CRB and LFB control the testing circuits, i.e., the set/reset of the addresses of the WCBR operations.

FIG. 54 presents circuit diagrams showing portions of the embodiment of the control circuit of the Y-system.

Figure 77:
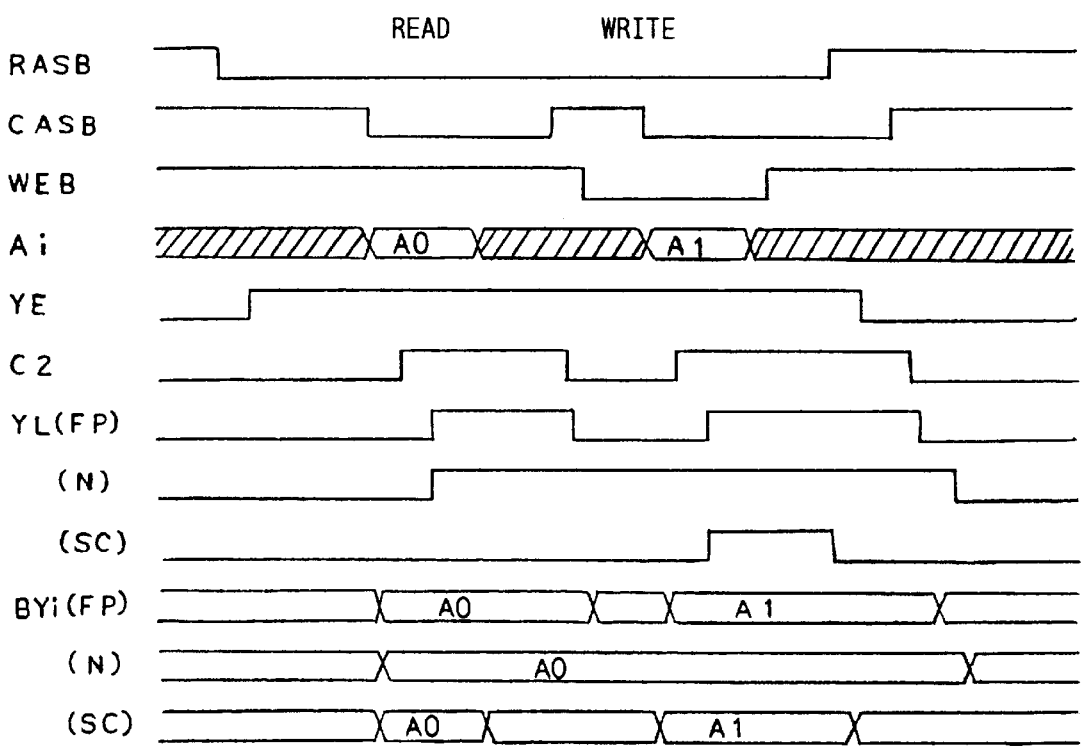
FIG. 77 is a timing chart showing one example of the operations of the Y-address buffer.

The signal YL causes the Y-address buffer shown in FIG. 45 to latch the addresses. The generation timings are different for the individual operations modes, as has been described hereinbefore. One example of the operation waveforms is shown in FIG. 77.

In response to the fast page mode (i.e., normal mode), the Y-addresses are latched in synchronism with the CAS. In the nibble mode, the Y-addresses are latched for the RAS cycle. This is because the address signals are generated by the nibble counter in the nibble mode. In the static column mode, the Y-addresses are latched when in the write operation. In the counter test mode of the CBR, the Y-addresses are latched. In the WCBR mode, the Y-addresses are latched for the RAS cycle period.

The signal DL controls the set-up/hold of the data of the data input buffer. In the fast page mode or nibble mode, the setting is accomplished when the $\overline{CAS}$ and the $\overline{WE}$ are at the low level, and the resetting is accomplished when the $\overline{CAS}$ is at the high level. In the static column mode, the setting is accomplished when the $\overline{CAS}$ or $\overline{WE}$ is at the low level, and the resetting is accomplished at the end of the write operation.

A signal OLB is one for latching the written data so that they may not be outputted to the DO. This signal corresponds to the read-modify-write operations, which in turn correspond to the time period $t_{WOH}$ (i.e., the output hold time period from the signal $\overline{WE}$) in the static column mode.

Figure 55:
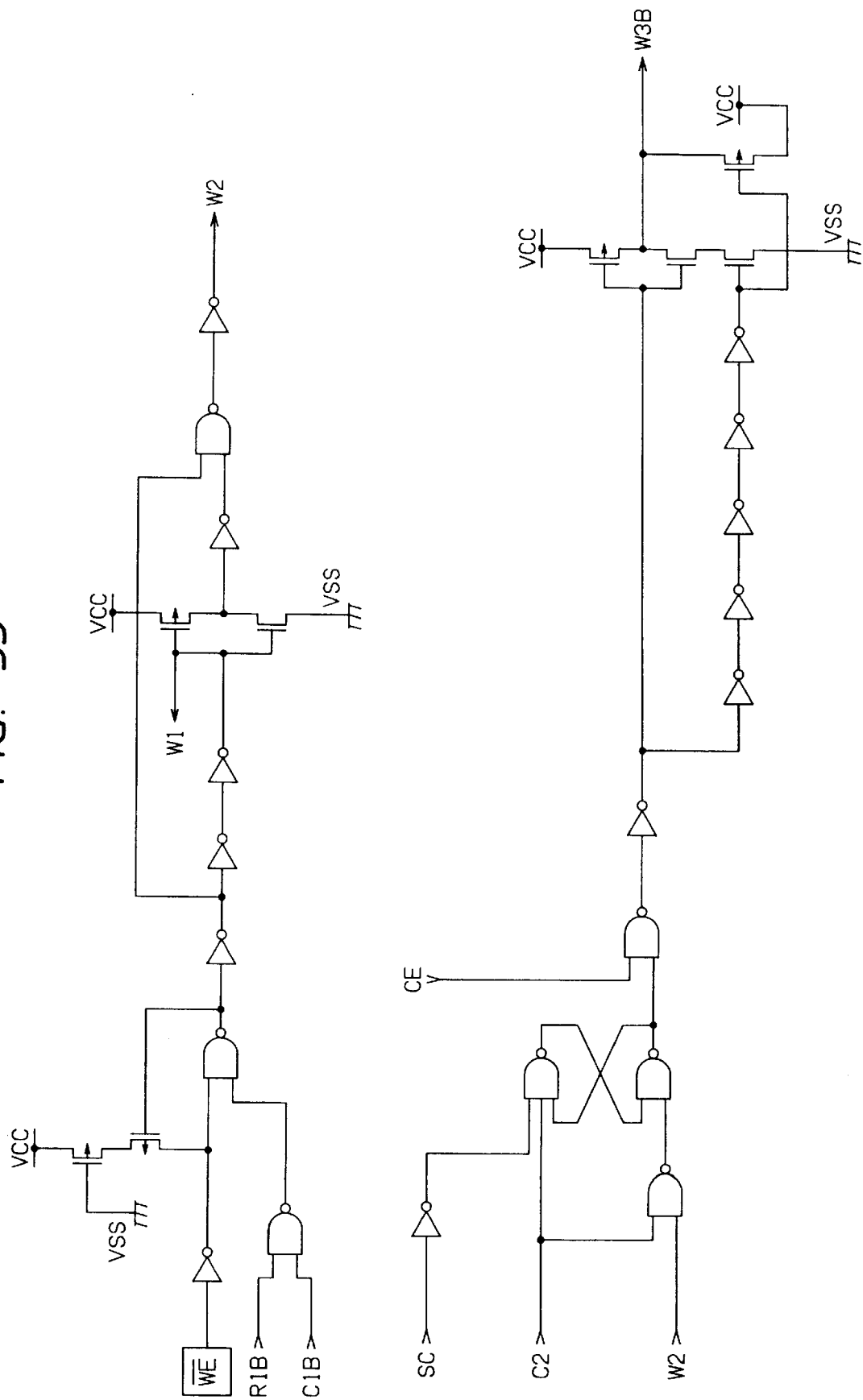
FIG. 55 presents circuit diagrams showing portions of one embodiment of a WE-control circuit.
Figure 56:
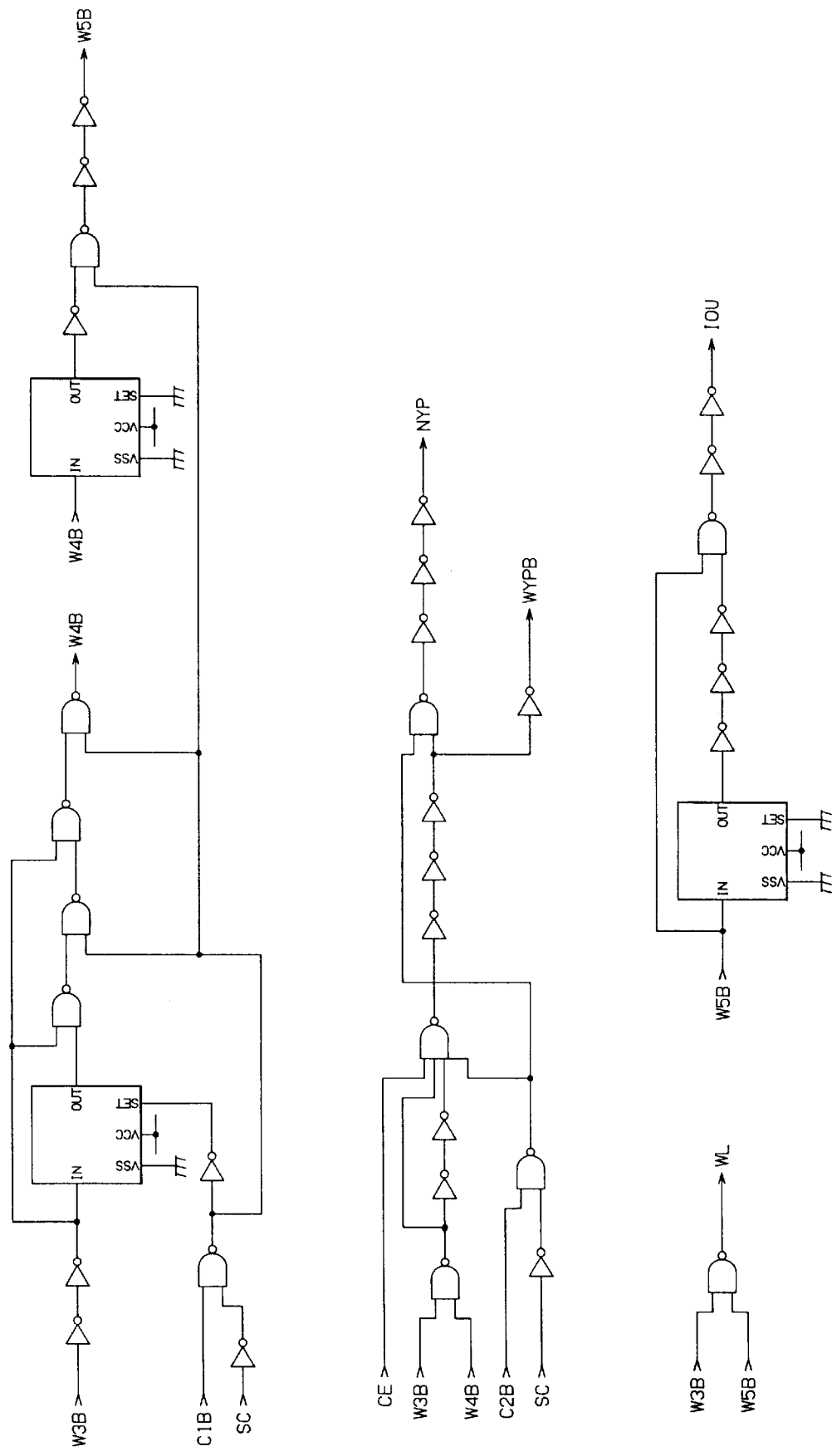
FIG. 56 presents circuit diagrams showing other portions of one embodiment of a WE-control circuit.

FIGS. 55 and 56 present diagrams showing the circuits of the portions of the control circuit of the WE system.

In FIG. 55, the $\overline{WE}$ (Write Enable) signal is fed to the input circuit constructed of the CMOS inverter circuit. This CMOS inverter circuit for the input buffer is made to have the logic threshold voltage such as about 1.6 V like before. The power source voltage VCC for the peripheral circuit of the DRAM of this embodiment is set at 3.3 V twice as high as the aforementioned logic threshold voltage of 1.6 V and corresponds to the signal at the TTL level.

Signals W1 and W2 are used for controlling the write operations. In the standby state, the signals W1 and W2 are dropped to the low level. In the operation, the signals W1 and W2 are changed in synchronism with the changes in the signal $\overline{WE}$. The signal W1 accomplishes the RAS/WE logic control (WN/WF), and the signal W2 accomplishes the CAS/WE logic control. The write setting is delayed to retain the time period $t_{ASC}$ (i.e., the column address set-up time period). A signal W3B is a one-shot pulse formed by the signal W2 to form a signal W4B.

In FIG. 56, a signal WYP performs the control till the write signal is transmitted from the data input buffer to the input/output lines I/O, and a signal WYPB performs the control till the write signal is transmitted from the input/output lines I/O to the bit lines.

Figure 76:
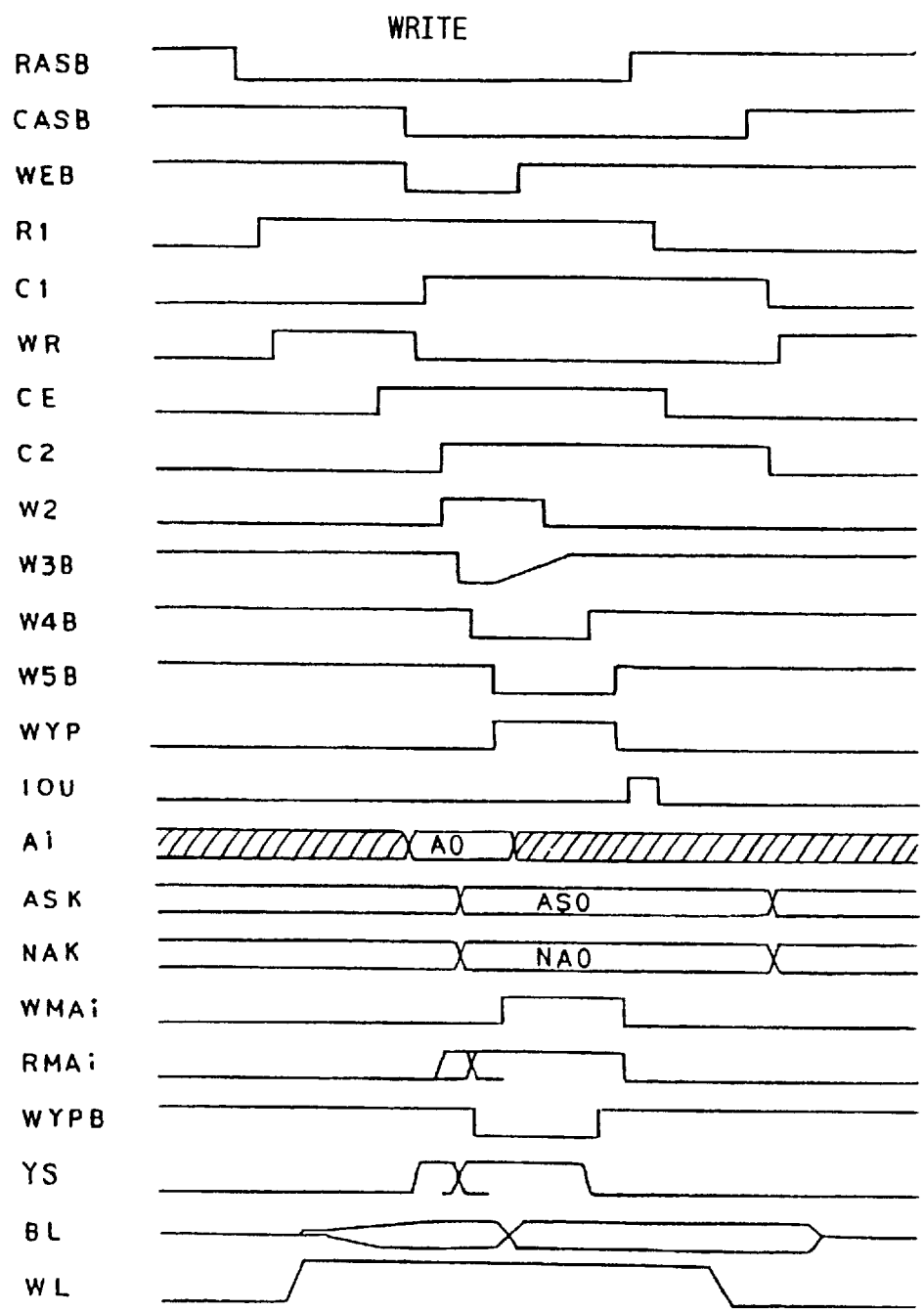
FIG. 76 is a timing chart showing one example of the writing operations.

A signal IOU precharges the input/output lines after the write operations so as to cope with the subsequent read cycle. A signal WL latches the addresses and data when in the static column mode. FIG. 76 is a timing chart showing one example of the write operations.

Figure 57:
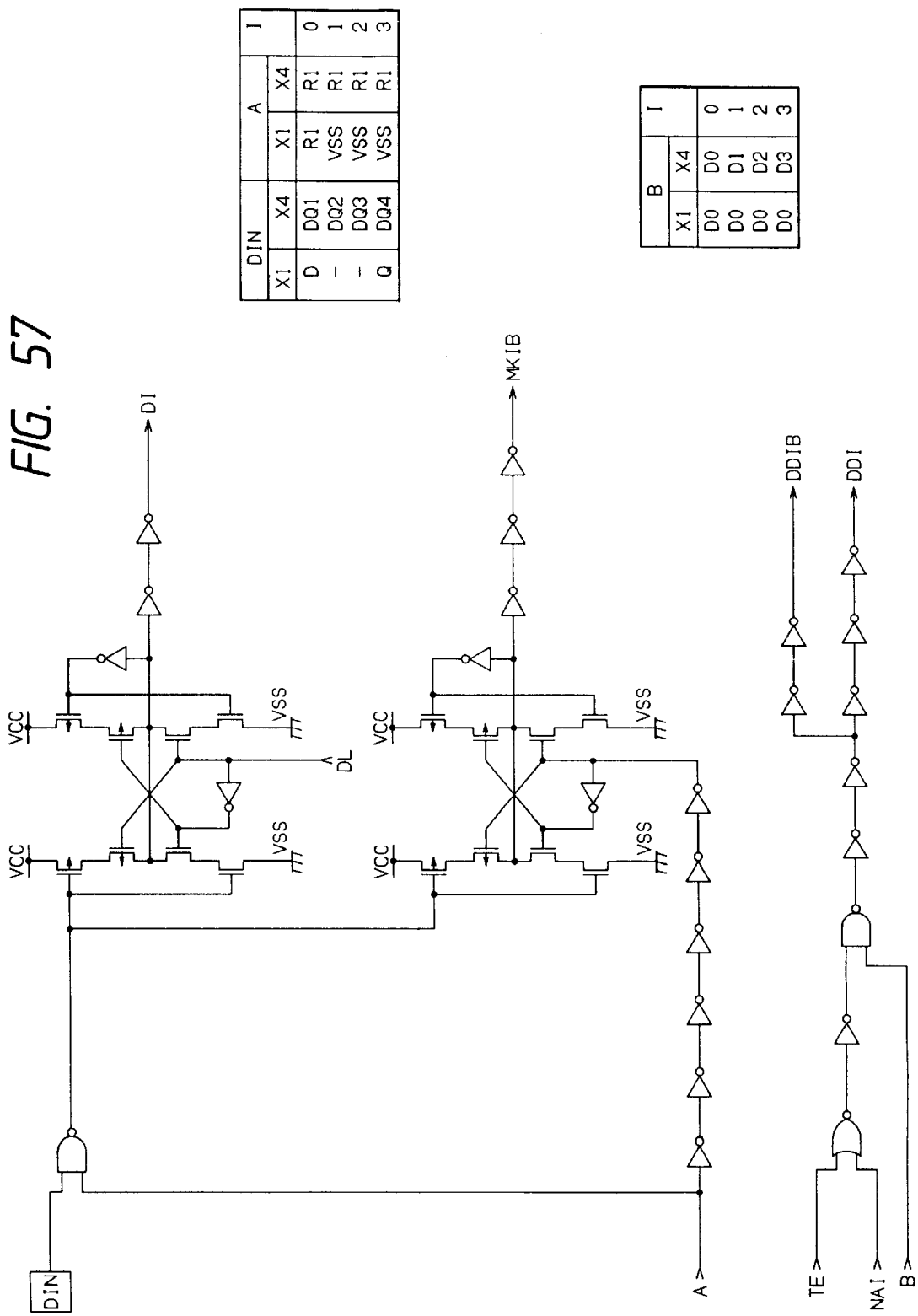
FIG. 57 is a circuit diagram showing one embodiment of the data input buffer.

FIG. 57 presents circuit diagrams showing one embodiment of the data input buffer.

An input circuit is constructed of a NAND gate circuit and has a logic threshold voltage similar to that of the aforementioned other input circuits. In the structure of ×1 bit, a control signal A of this gate is substantially invalidated when one of the four input buffers takes the signal R1 whereas the remaining three input buffers are fed with the ground potential VSS of the circuit. In the structure of ×4 bits, on the other hand, the signal A is the signal R1 in response to all the four input buffers. The reason why the NAND gate circuit is used at the input buffers to be operated and is fed with the signal R1 is to reduce the current consumption in the standby state like before. The set-up/hold of the write data are controlled by the signal DL.

A signal MKI is used to control the write mask mode in the structure of ×4 bits. The write/non-write are controlled by the data of the signals DQ1 to DQ4 when the signal $\overline{RAS}$ is set. A signal DI (0 to 3) is further divided at the unit of nibble address NAI.

Figure 58:
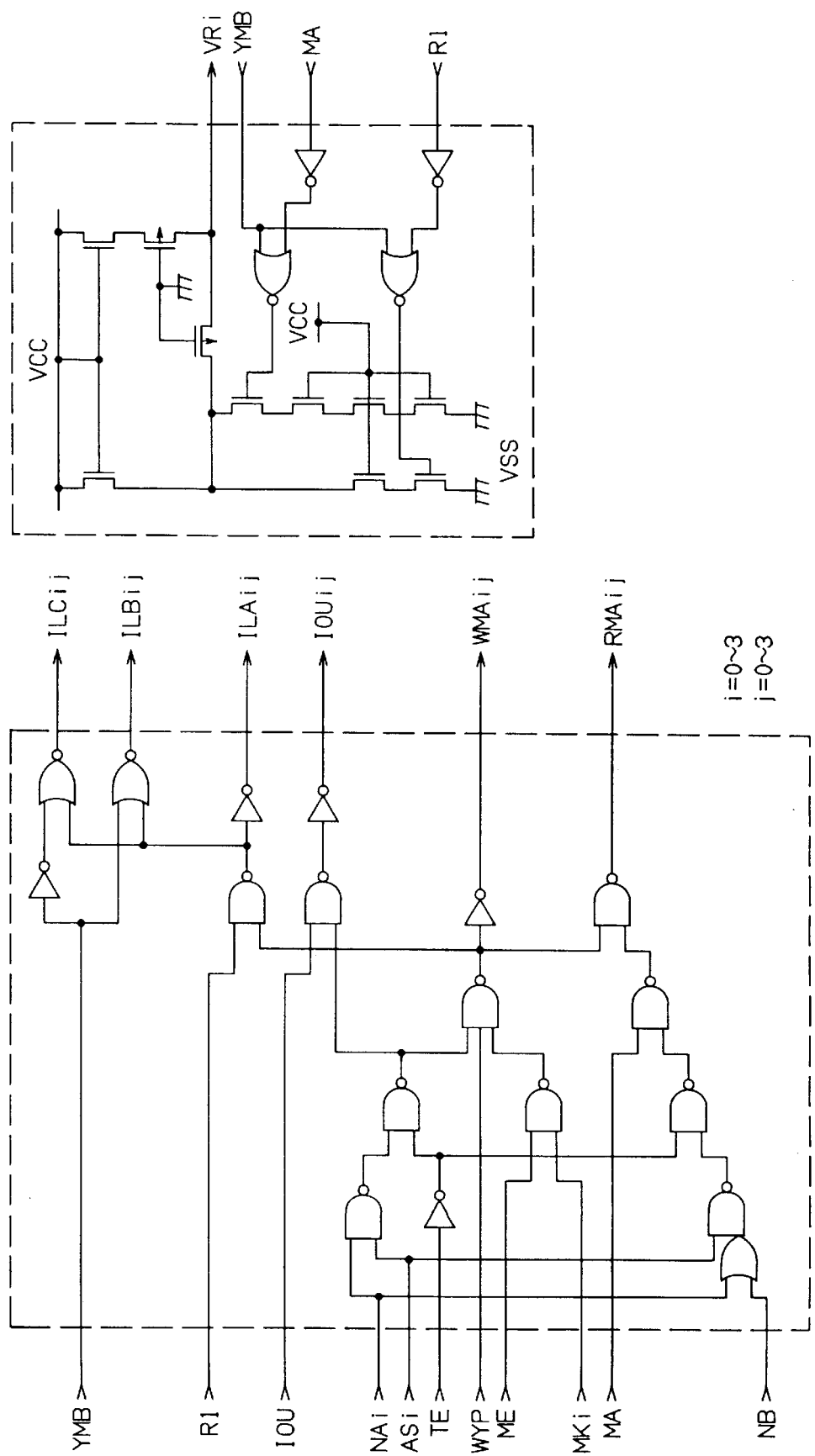
FIG. 58 is a circuit diagram showing one embodiment of the main amplifier control circuit.
Figure 59:
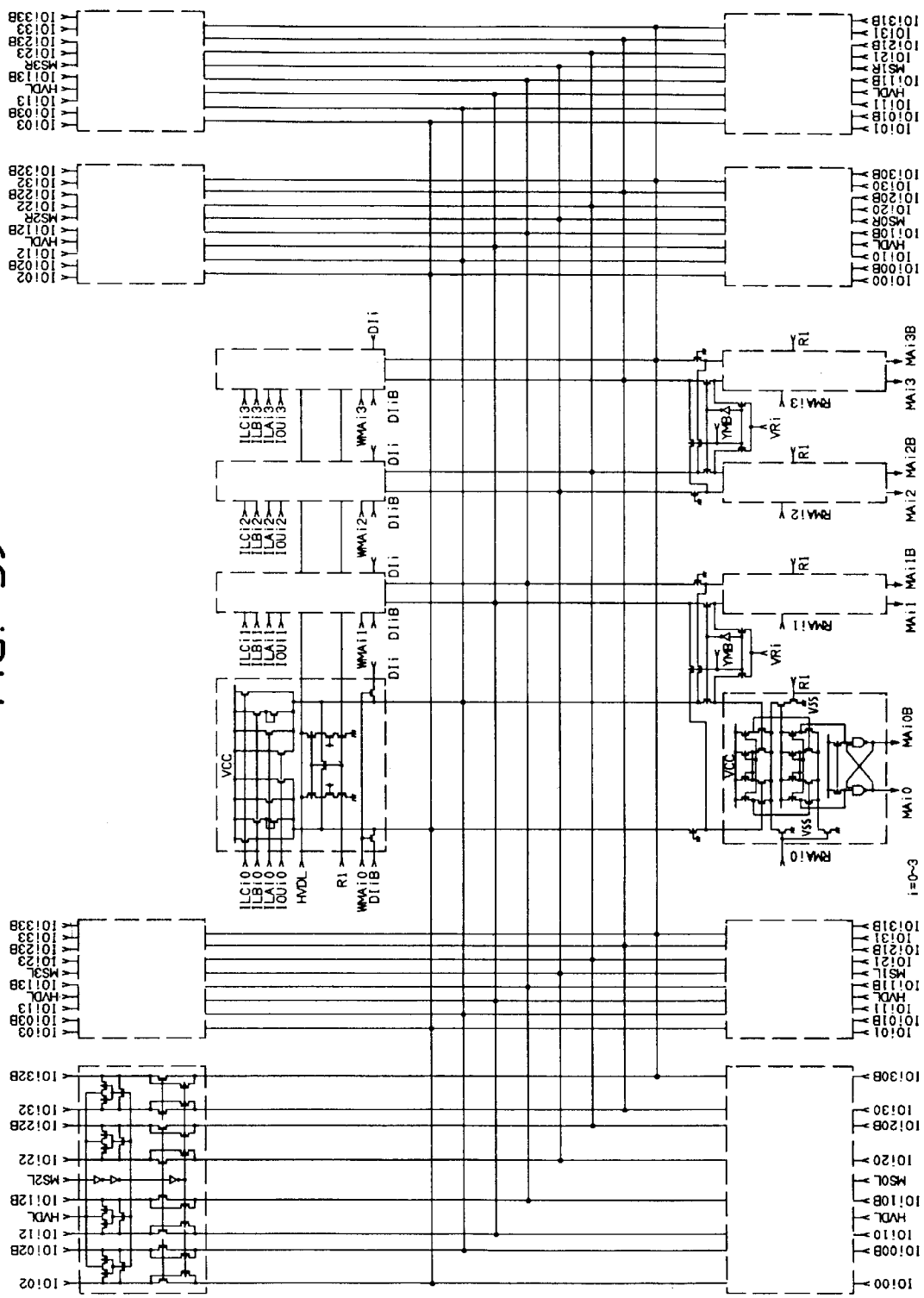
FIG. 59 is a circuit diagram showing one embodiment of the main amplifier.

FIG. 58 presents circuit diagrams showing one embodiment of the control circuit of the main amplifier, and FIG. 59 is a circuit diagram showing one embodiment of the main amplifier.

A signal RMA is a timing signal for controlling the operation of the main amplifier. A signal WMA control the signal transmission (or the write operation) from the data input buffer to the input/output lines I/). Signals ILAij to ILCij pull up the input/output lines I/O, and a signal IOU is one for shorting the input/output lines I/O.

Figure 89A:
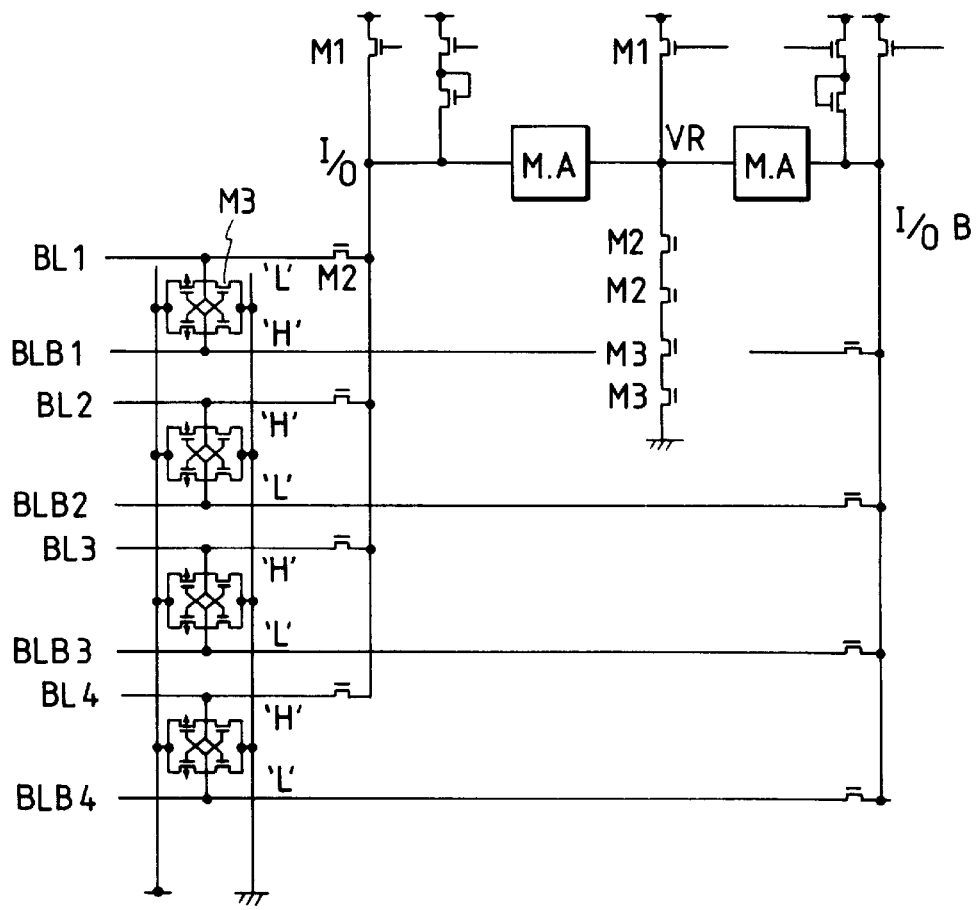
FIGS. 89(A) and 89(B) are a circuit diagram and a waveform chart for explaining the principle of the multi-bit testing method.

In the normal mode, one main amplifier is operated by the signal RMA. In one test mode, sixteen main amplifiers are brought altogether into operative states to compare all of 16 bits in response to a signal TE. In another test mode, moreover, 64 bits are compared altogether by the multiple selection of the YS lines in response to the signals TE and YMB. FIG. 89(A) is a circuit diagram for explaining the principle of the multi-bit test by taking the 4-bit parallel test using a pair of main amplifiers as an example. In accordance with the example of the same Figure, the aforementioned sixteen main amplifiers are grouped into eight pairs. The read data of total 8 bits are sent out through the two I/O pairs of 4 bits, which are multi-selected by the four YS lines of every two I/O pairs corresponding to the pair of the main amplifiers, in parallel to the aforementioned eight pairs of main amplifiers so that the multi-tests of total 64 bits are accomplished.

Figure 89B:
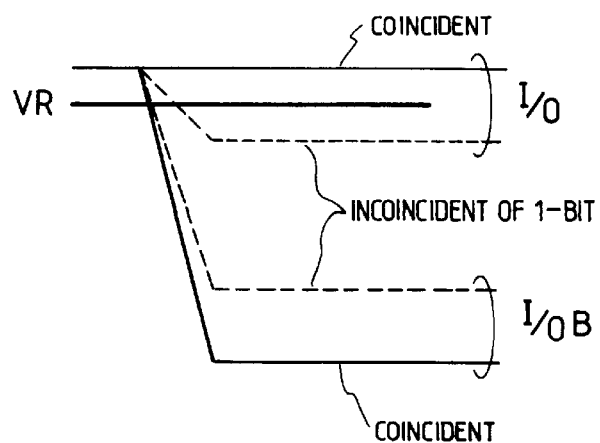

Further descriptions will be made with reference to FIG. 89(A). One of the paired main amplifiers MA has its input connected commonly with complementary bit lines BL1 and BLB1 to BL4 and BLB4, which correspond to read signals of 4 bits, through Y-switch MOSFETs and input/output lines I/O and I/OB, respectively. The other of the aforementioned paired main amplifiers MA has its input fed with a reference voltage VR. This reference voltage VR is set at an intermediate level between the read signal at the high level and the signal at incoincidence of 1 bit, as shown in the waveform chart of FIG. 89(B). If the complementary bit lines BL1 and BLB1 are at the logic "0" (namely, the BL1 is at the low level "L" whereas the BLB1 is at the high level "H"), as shown, the level of the input/output lines I/O is dropped to a lower level, as indicated by the broken line of the same Figure, to the extent which is caused by Y-switch MOSFET (M2) and the sense amplifier MOSFET (M3) are connected to the pull-up MOSFET (M1). Therefore, the aforementioned reference voltage VR is set at the intermediate level between the high level and the low level for the incoincidence of 1 bit by connecting the two Y-switch MOSFETs (M2) and the two sense amplifier MOSFETs (M3) in series with the aforementioned pull-up MOSFET (M1). In the embodiment shown in FIG. 89, therefore, the whole bit logic "1" is written. If the logic "0" of 1 bit is present, the output signals of the main amplifiers corresponding to the input/output lines I/O are changed from the high level to the same low level as that of the outputs of the main amplifiers corresponding to the input/output lines I/OB so that the errors are detected. If, on the contrary, the logic "0" is written in and read out from all the 4 bits, the input/output lines I/OB take the high level when the whole bit logic "0" is read out. If there is an inconsistency of 1 bit, the level of the input/output lines I/OB is dropped down like before so that the output signals of the main amplifiers corresponding to the input/output lines I/OB of the paired main amplifiers are changed from the high to low levels equal to that of the outputs of the main amplifiers corresponding to the input/output lines I/O, so that the errors are detected. Incidentally, if all the bits are coincident, the outputs of the paired main amplifiers are divided into the high and low levels.

In this multi-bit test, as in the state of FIG. 89, the input/output lines I/OB have a tendency of taking a relatively low level because they are fed with the low level of the outputs of the three sense amplifiers. As a result, there arises a fear that the low level of the input/output I/OB is transmitted to the bit line BLB1 which has been subjected to a defective reading so that it may possibly be written with the normal data by inverting the sense amplifiers.

As a counter measure for this, the conductance of the pull-up MOSFET (M1) is increased when in the aforementioned multi-bit test mode. In this mode, more specifically, there is provided the pull-up MOSFET which is to be turned ON in response to that signal. Thus, the drops of the low level of the input/output lines I/O and I/OB can be reduced to prevent the aforementioned erroneous writing.

In the aforementioned multi-bit test, on the other hand, the operation voltage is switched from the VCC to the VCCE of about 5 V or the boosted voltage VCH by the switch MOSFET which is to be turned ON in response to the control voltage. According to this structure, the level of the input/output lines can be raised to an extent corresponding to the aforementioned voltage switching so that the aforementioned erroneous writing due to the low level can be prevented.

On the other hand, the threshold voltage of the pull-up MOSFET can be dropped to the low threshold voltage so that the pull-up (or bias) level of the input/output lines may be accordingly raised. In the operation at the low voltage VCC such as about 3.3 V like this embodiment, the low-level margin for preventing the erroneous writing can be reduced because of the low pull-up level, if the threshold voltage of the pull-up MOSFET is high.

In the embodiment shown in FIG. 54, the two True and Bar I/O line pairs to be intrinsically connected with the aforementioned two main amplifiers are connected to each other so that the two main amplifiers are commonly used in the aforementioned mode. This prevents the number of main amplifiers from being doubled. The aforementioned eight pairs of main amplifiers compare the total 8 bits, i.e., 4 bits for each of the I/O line pairs so that 64 bits are simultaneously tested.

By adopting the aforementioned multi-bit test, it is possible to shorten the test time period of the RAM having a high storage capacity such as about 16 Mbits.

In the write mode, the signals from the data input buffers are fed to the aforementioned input/output lines I/O in response to the signal WMA, and the data are written in the main amplifiers in response to the signal RMA. This corresponds to the nibble mode and the fast page mode.

Figure 60:
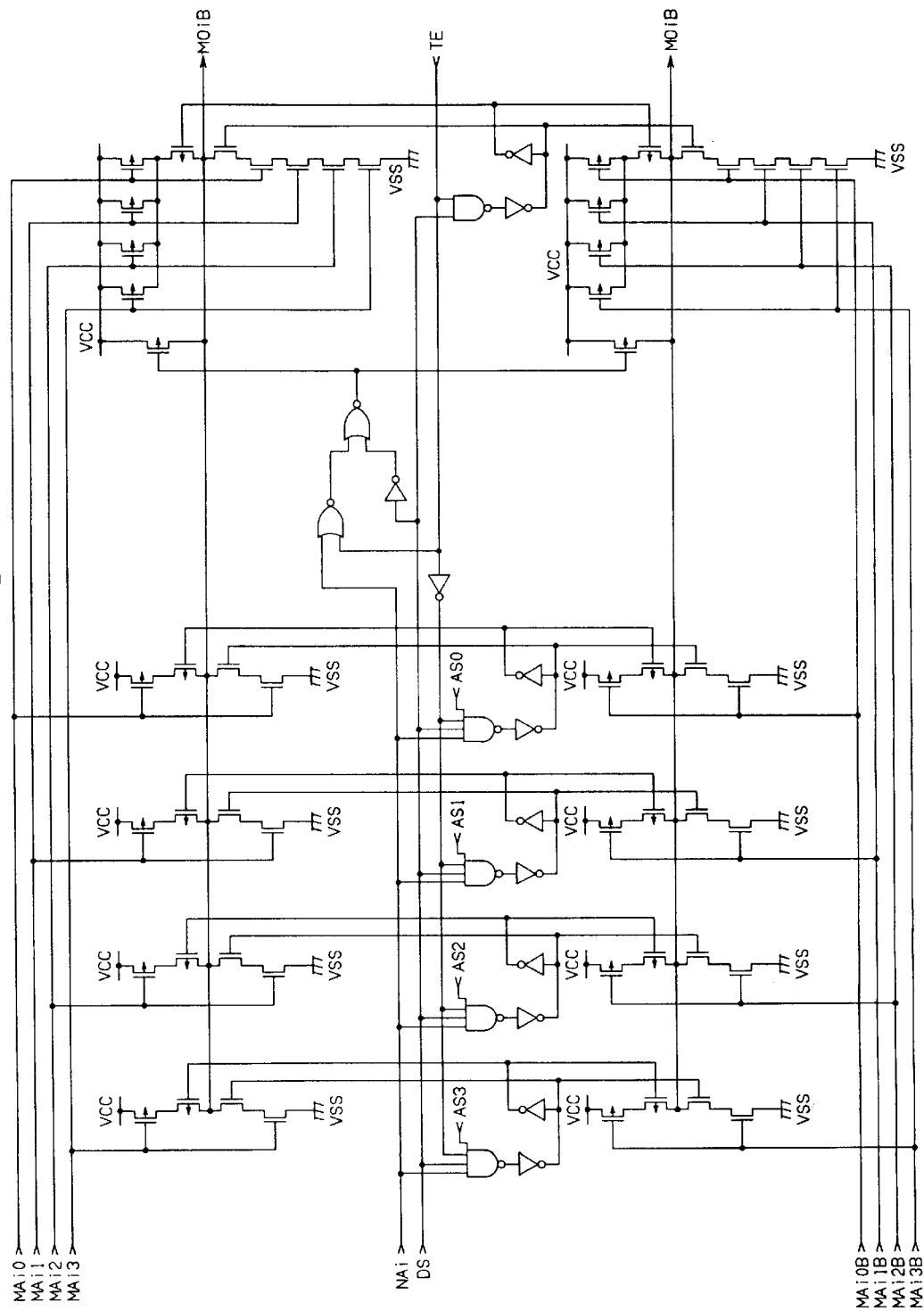
FIG. 60 is a circuit diagram showing one embodiment of the output control circuit of the data of the main amplifier.

FIG. 60 is a circuit diagram showing one embodiment of the output control circuit of the data of the main amplifiers.

One pair of main amplifier output groups MAi0 to MAi3 and MAi0B to MAi3B is selected by the main amplifier selection addresses AS0 to AS3, and the output groups selected by a nibble address NAi are sent out to output lines MOiB and MOi in response to the signal DS. Thus, one of sixteen main amplifiers is selected. At the output of the unit of ×4 bits, the nibble address NAi is fixed at the high level.

The signal DS is reset in response to the $\overline{\text{RAS}}$ and $\overline{\text{CAS}}$ resets when in the fast page mode. In the nibble mode, the signal DS is left at the high level because it is sufficient to feed the data to the four main amplifiers in the first cycle and to output the data from the main amplifiers in the second cycle.

In the test mode for forming the signal TE, the data of the four main amplifiers are gathered to one output signal MOi through the comparator (or NAND gate).

Figure 61:
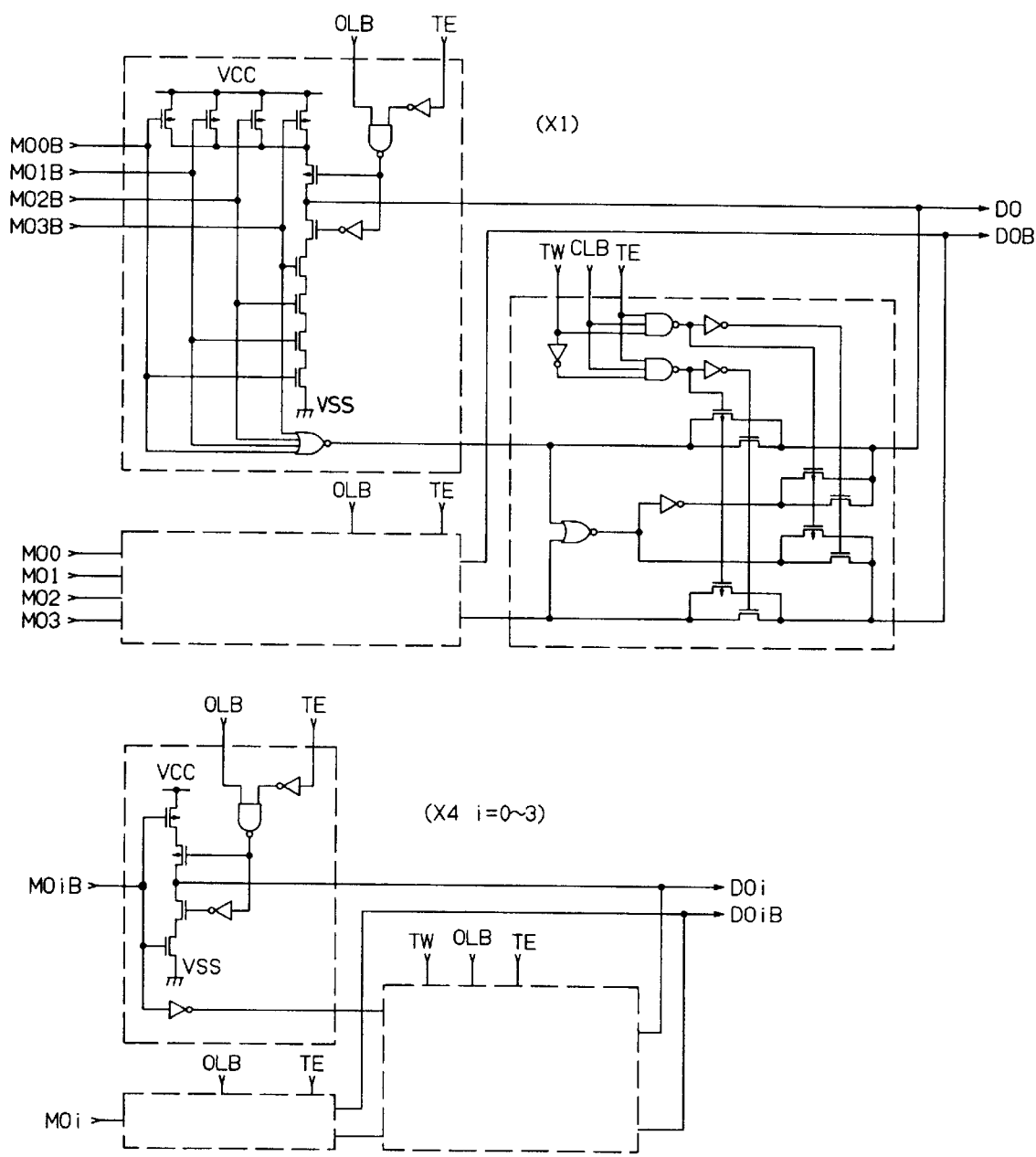
FIG. 61 is a circuit diagram showing one embodiment of the output control circuit of the main amplifier.

FIG. 61 presents circuit diagrams showing one embodiment of the output control circuit of the main amplifiers.

The signal OLB controls the data output to the data output buffer. The data latch is accomplished in the read-modify-write. In response to the signal TE, all the sixteen main amplifiers are activated in the test mode to output the data to output signals MO0 to MO3 and MO0B to MO3B. These comparison output system may be binary or ternary.

In the binary system, the high- and low-levels are outputted to the output DO/DOB for all logic "1" or logic "0", and the low- and high-levels are outputted for failure. In the ternary system, the high- and low-levels are outputted to the output DO/DOB for all logic "1", and the low- and high-levels are outputted for all logic "0". In the case of failure, the low- and low-levels are outputted.

The aforementioned binary output system is established if a signal TW is at the high level, and the aforementioned ternary output system is established if the signal TW is at the low level.

Figure 62:
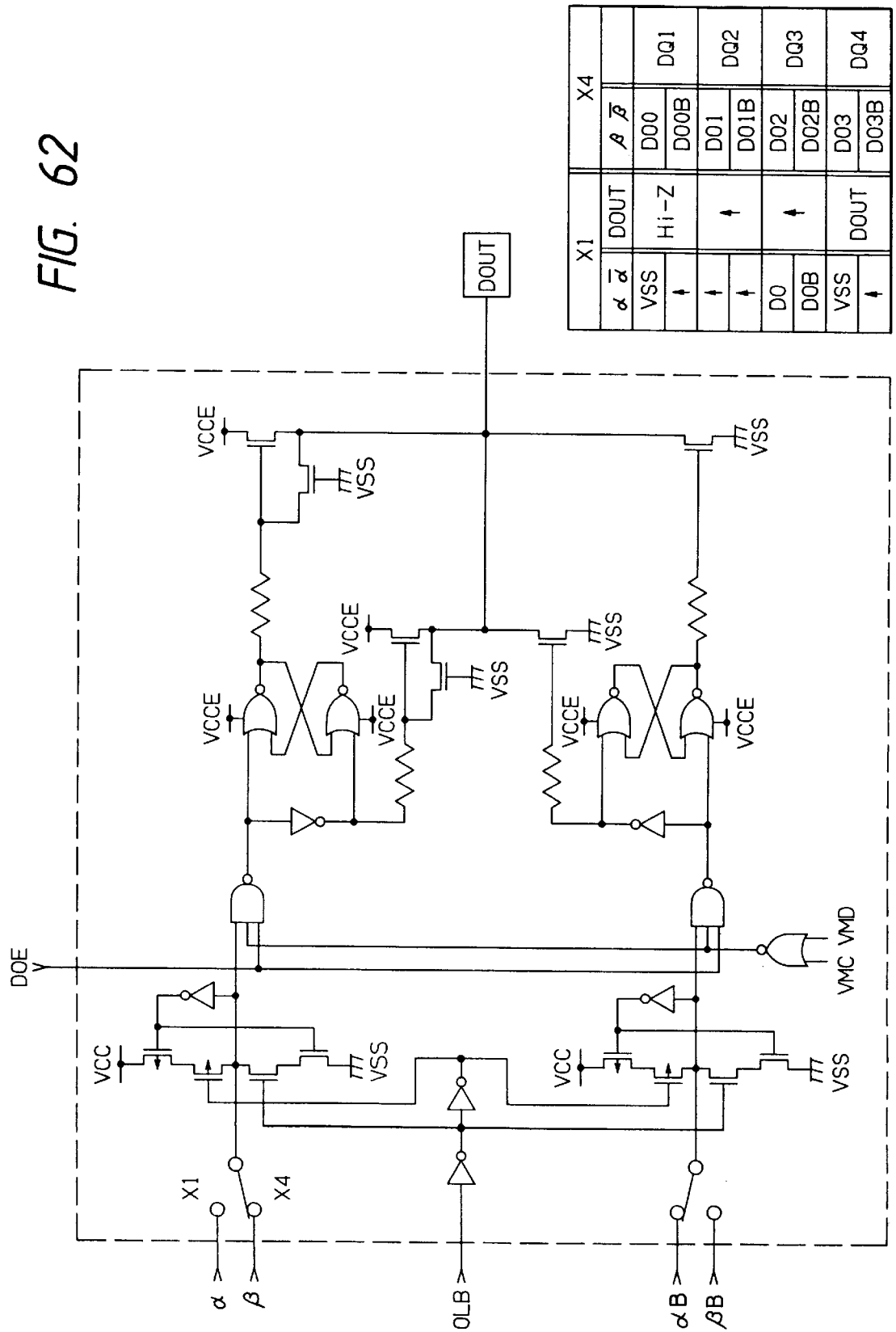
FIG. 62 is a circuit diagram showing one embodiment of the data output buffer.

FIG. 62 is a circuit diagram showing one embodiment of the data output buffer.

The data output buffer is equipped at its input portion with a level converter circuit. As has been described hereinbefore, the internal circuit is operated by the dropped voltage VCC. Therefore, the read data transmitted through the main amplifiers are generated in response to the operation voltage VCC. The data having passed through the NAND gate circuit in response to the signal DOE have their level converted by the NOR gate circuit of the latch mode, which is operated by the power voltage VCCE fed from the outside. Since the push-pull output unit composed of the N-channel MOSFET is driven by such level converter circuit, the output level at the high-level side can be raised, and the amplitude of the drive signal can be enlarged to speed up the operations.

The aforementioned output portion is equipped with MOSFETs and resistance elements for controlling the gates of the output MOSFETs. The threshold voltage of the MOSFET, which is connected between the gate and source of the output MOSFET at the side of the power voltage VCCE and has its gate supplied steadily with the ground potential VSS, is made lower than that of the output MOSFET. As a result, when an output terminal DOUT takes a negative potential, the MOSFET having the lower threshold voltage is turned ON to short the gate and source of the output MOSFET. As a result, the output MOSFET is not turned ON by the aforementioned negative voltage.

There is also provided an output circuit which is operated with the relatively fast timing having passed through the aforementioned output gate circuit, to quicken the rising and breaking timings of the output signal. Thus, the level is changed to the value which is regulated by the output circuit made receptive of the data having passed through the level converter circuit. Thanks to this structure, the output level can be linearly changed for a relatively long period while speeding up the operations, so that the level of the noises to be generated in the power lines or ground lines by the level change of the output signals can be reduced.

Figure 63:
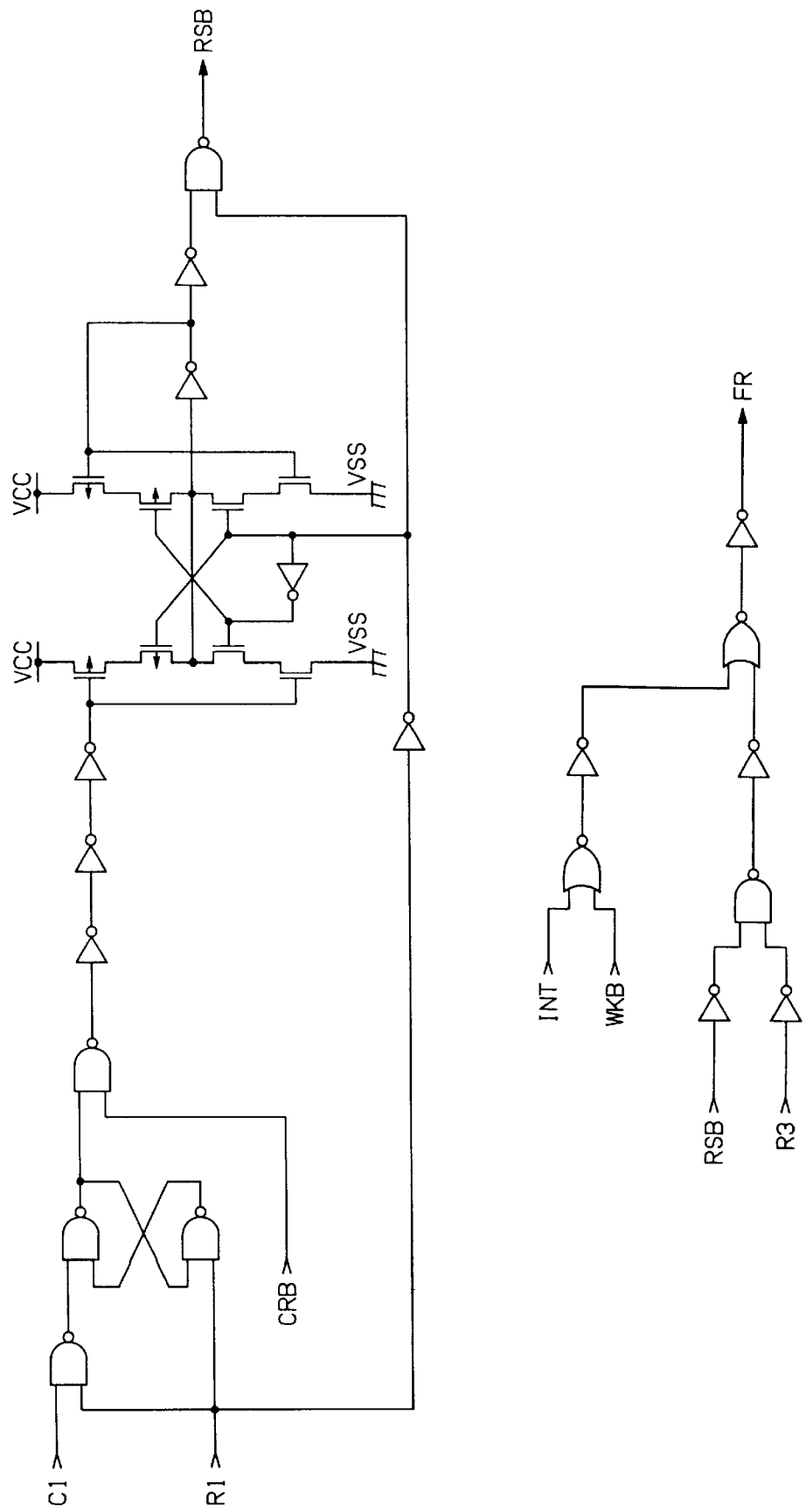
FIG. 63 presents circuit diagrams showing portions of one embodiment of the test circuit.
Figure 64:
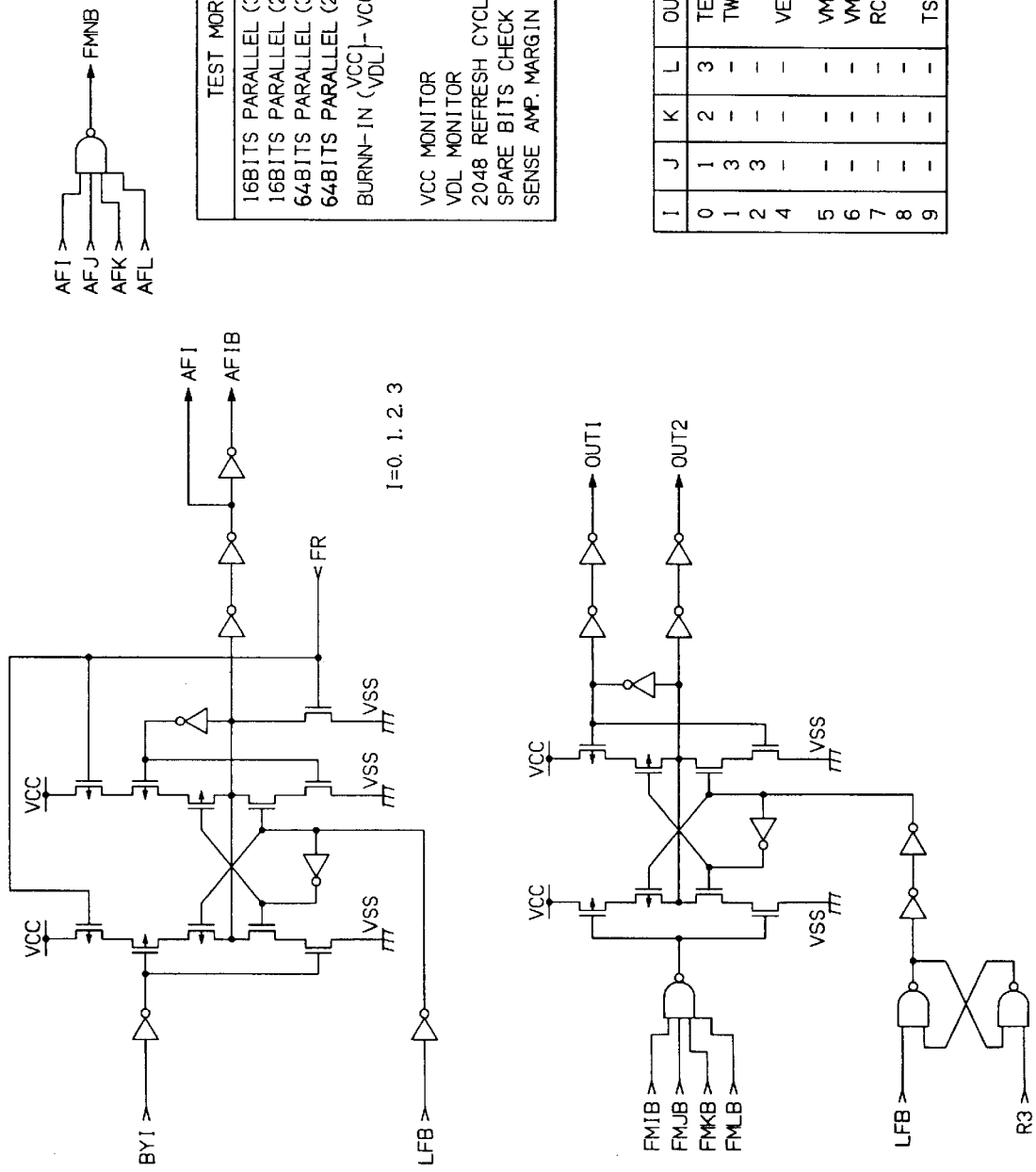
FIG. 64 presents circuit diagrams showing other portions of one embodiment of the test circuit.

FIGS. 63 and 64 are circuit diagrams showing one embodiment of the test circuit.

With the timing WCBR, the test function is set. By this WCBR, there is outputted the test signal which corresponds to the address taken in. The signal LFB is formed by the WCBR so that the external address signals can be taken in.

A signal FR resets all at the logic "0" when the power supply is made.

The reset of the test function is accomplished by resetting all the addresses at the logic "0" such that the signal FR is raised to the high level for the precharge period of the $\overline{\text{RAS}}$ signal for the $\overline{\text{RAS}}$ only refresh cycle and the CBR refresh cycle.

In the test mode, the following modes are prepared for signals FMNB which are formed by combining the AFI to AFL of 4 bits corresponding to the address signals Y0 to Y3. The modes are for: (1) the tests of ×16 bits; (2) the tests of ×64 bits; (3) the switching from the internal voltage VCC to the external voltage VCCE; (4) the monitor of the internal voltage VCC; (5) the monitor of the internal voltage VDL; (6) the refresh of 2,048 (or the operation of the 8,192 bits); (7) the redundancy area test; and (8) the speed-up test.

Figure 65:
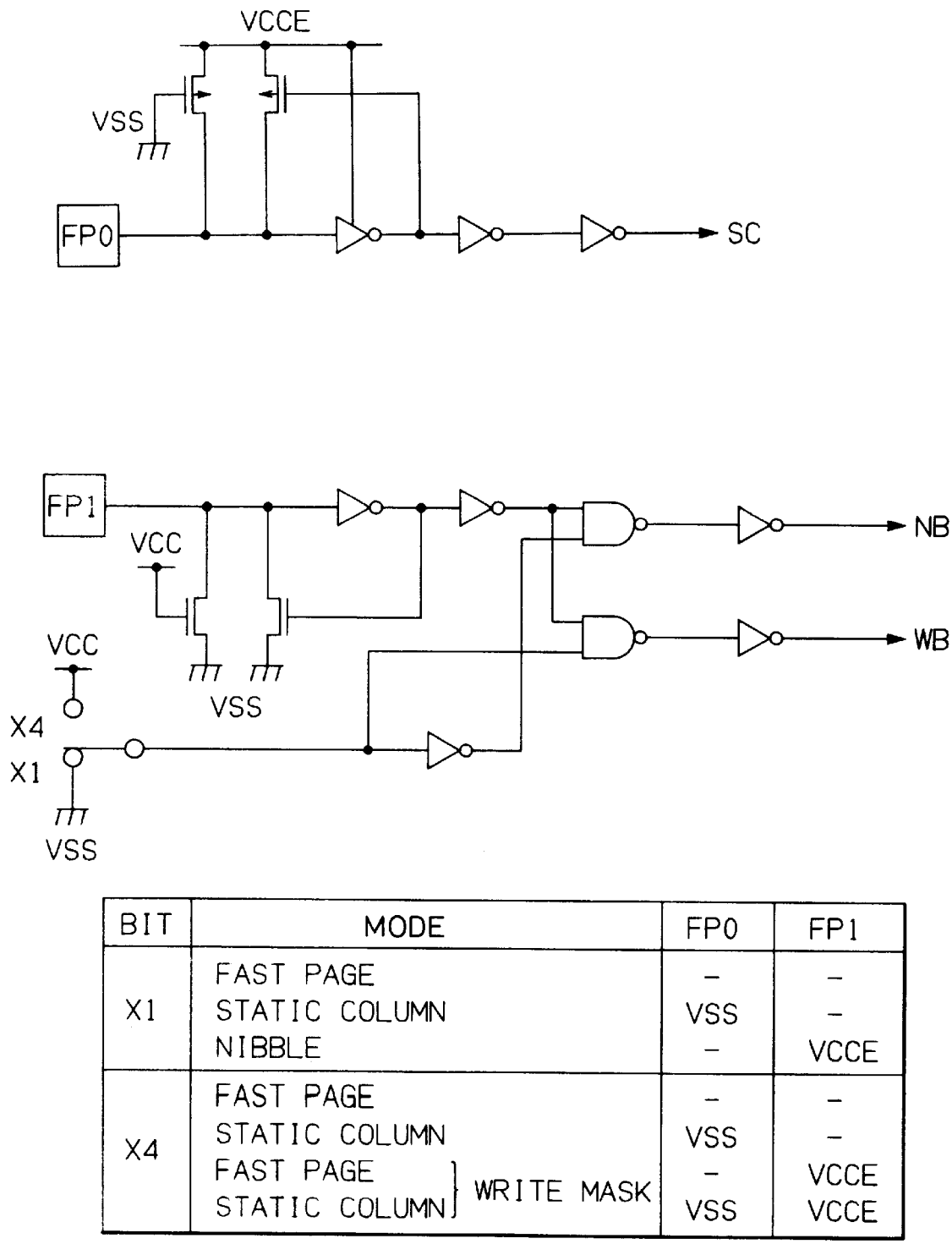
FIG. 65 is a circuit diagram showing one embodiment of the control circuit for designating the operation mode.

FIG. 65 presents circuit diagrams showing one embodiment of the control circuit for designating the operation modes.

By selecting the high-/low-levels and the high impedance for the bonding pads FP0 and FP1, the following modes are set from the selected combination in accordance with the structures of ×1 bit and ×4 bits designated by the aluminum mat slice.

In the structure of ×1 bit, both signals SC and NB are dropped to the low level to designate the fast page mode when both the pads FP0 and FP1 are at the high impedance. If the pad FP0 is at the low level whereas the pad FP1 is at the high impedance, the signal SC takes the high level to designate the static column mode. If the pad FP0 is at the high impedance whereas the pad FP1 is at the high level (VCCE), the signal NB takes the high level to designate the nibble mode.

In the structure of ×4 bits, when both the pads FP0 and FP1 are at the high impedance, both the signals SC and NB take the low level to designate the fast page mode. If the pad FP0 is at the low level whereas the pad FP1 is at the high impedance, the signal SC takes the high level to designate the static column mode. If the pad FP0 is at the high impedance whereas the pad FP1 is at the high level (VCCE), the signal WB is formed to cause the write mask mode with the fast page mode. If the pad FP0 is at the low level whereas the pad FP1 is at the high level (VCCE), the signal WB is likewise formed to cause the write mask mode with the static column. In the write mask mode, the pin to be written from the output terminal I/O can be set by setting the $\overline{\text{WE}}$ signal at the low level when the $\overline{\text{RAS}}$ signal breaks.

Figure 66:
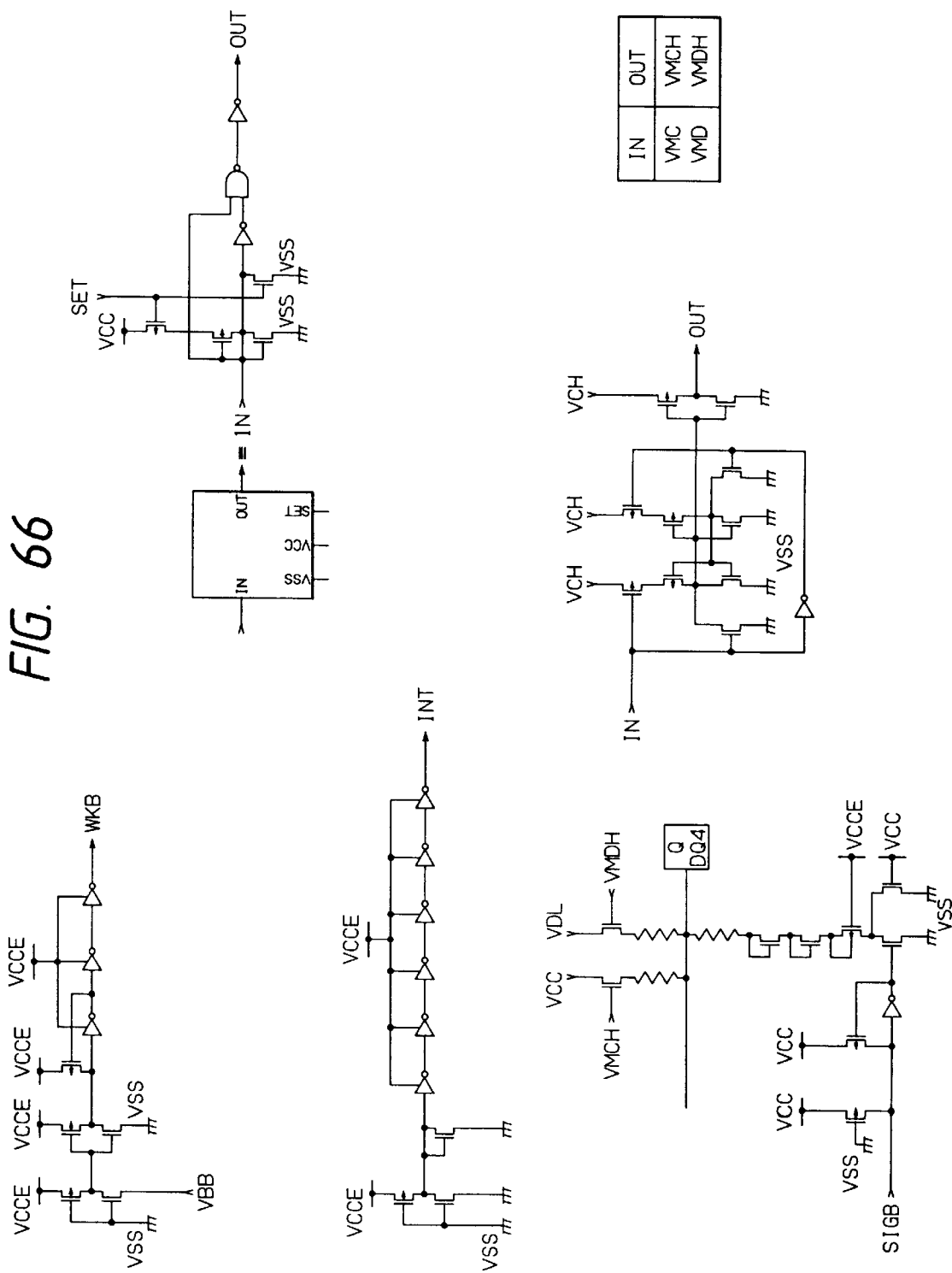
FIG. 66 is a circuit diagram showing one embodiment of another control circuit.

FIG. 66 presents circuit diagrams showing one embodiment of another control circuit.

The signal WKB monitors of the level of the bias voltage VBB of the substrate. When this substrate bias voltage VBB drops to −0.7 V or less, the signal WKB takes the low level. If the substrate bias voltage VBB is shallow, the threshold voltage of the MOSFET drops so that a relatively large through current is caused to flow by the circuit operations thereby to make the latch-up liable to occur. Therefore, the access to the RAM is inhibited by the high level of the signal WKB.

A signal INT monitors the level of the power voltage VCCE. The signal INT is dropped to the low level for the voltage VCCE>3V. In other words, the internal initial state is set in response to the signal INT when the external power voltage is low.

In this embodiment, the structure of the delay circuit, as indicated by a block box, is specifically shown. If a terminal SET is raised to the high level (VCC), the amount of delay can be shortened. This concept can be widely used for adjusting the timing of the RAS system and for generating the pulses of the CAS and WE system.

An output terminal Q/DQ4 is used as a monitor terminal of the internal voltage. With the data output buffer coupled to the monitor terminal being in the high impedance state, the operation voltage VCC for the peripheral circuit is outputted through the MOSFET to be switched by a signal VMCH, and an operation voltage VDL for the sense amplifier is outputted through the MOSFET which is switched by a signal VMDH.

On the other hand, the output terminal Q/DQ4 is also used as a signature terminal for deciding the presence of the defect remedy. In the chip having its defect remedied, the SIGB takes the low level. The, chip of defect remedy is decided in view of the fact that the current flows into the ground potential of the circuit in case a voltage three times or more of the threshold voltage Vth as high as the VCCE is applied to the Q/DQ4 terminal.

Figure 67:
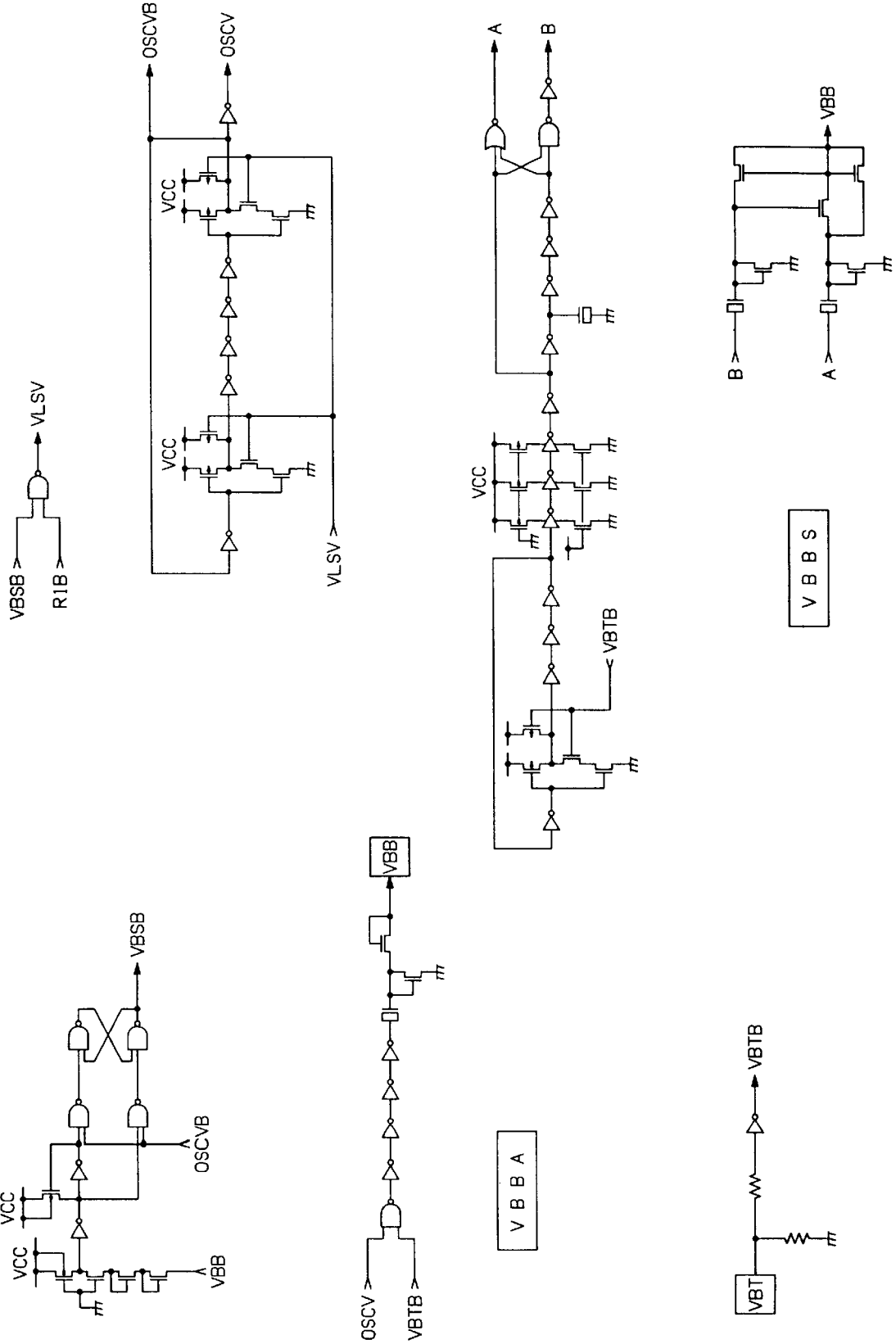
FIG. 67 is a circuit diagram showing one embodiment of the substrate back bias voltage generator.

FIG. 67 presents circuit diagrams showing one embodiment of the substrate back bias voltage generating circuit.

In this embodiment, the low voltage VCC for the peripheral circuit is used as the operation voltage. The substrate back bias voltage is thus formed by the internal voltage VCC because the internal voltage VCC is stabilized, as will be described in the following, so that the substrate bias voltage can be stabilized.

The substrate bias voltage VBB is formed by bias voltage generators VBBA and VBBS. The substrate bias voltage generator VBBA is a main generator which operates for compensating a substrate current $I_{BB}$ when the substrate level is shallow and due to the circuit when in the operation. The substrate bias voltage generator VBBS is a subsidiary generator which steadily operates for compensating the fluctuations of the VBB due to the leak current and the fine DC current.

A signal VBSB is a monitor output at the level of the substrate voltage VBB. The aforrmentioned oscillator is controlled by the signal VBSB to operate till the VBB is dropped to about −2 V by the circuit VBBA when the aforementioned substrate level is shallow.

A terminal VBT is used to interrupt the operations of the circuits VBBA and VBBS so that it may set the substrate voltage through the VBB pad from the outside to evaluate the operation margin.

Figure 68:
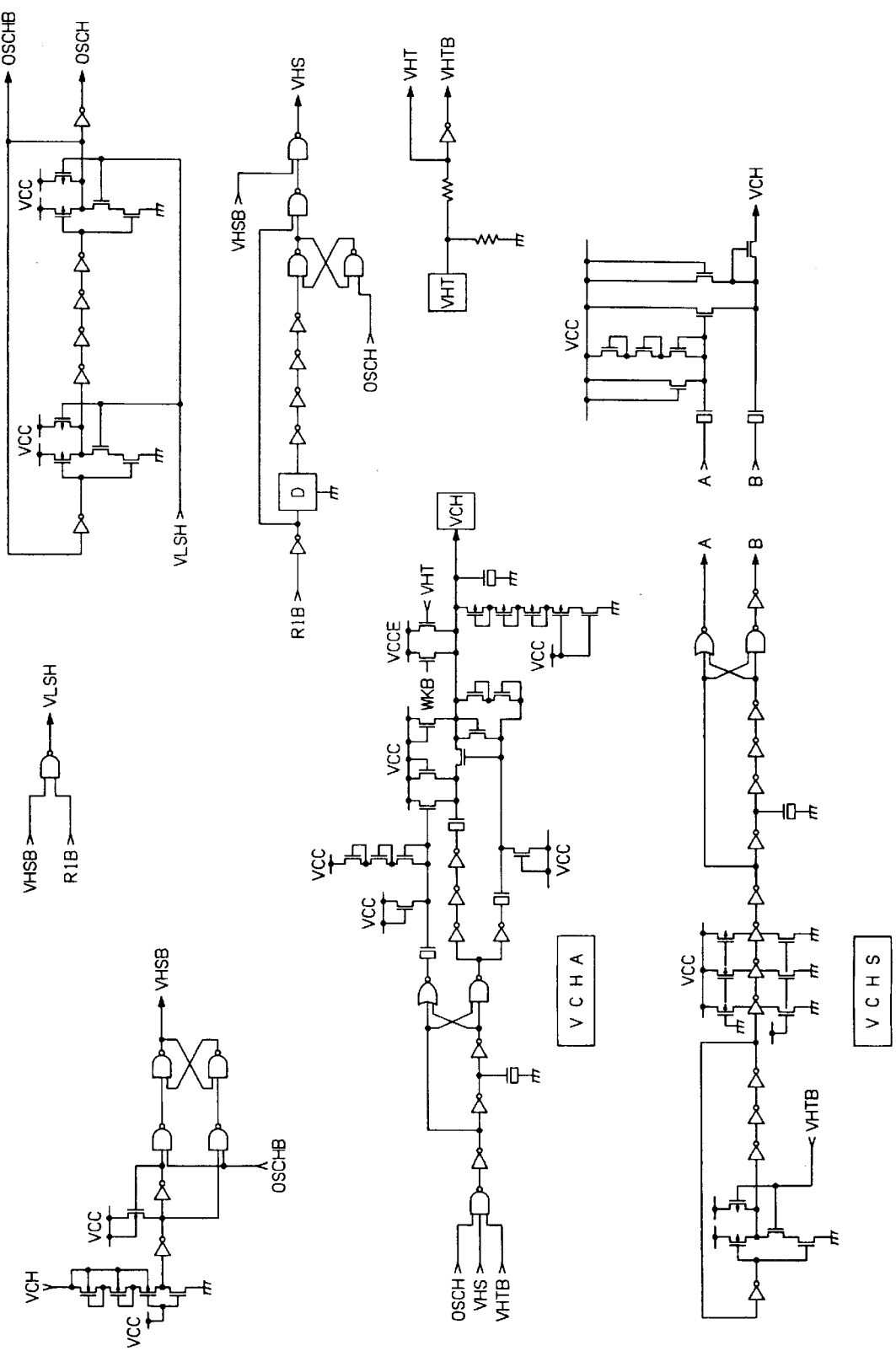
FIG. 68 is a circuit diagram showing one embodiment of the internal boost voltage generator.

FIG. 68 presents circuit diagrams showing one embodiment of the internal boost voltage generator.

A circuit VCHA is a main boost voltage. When the level is dropped by the monitor signal VHSB of the boost voltage VCH or when the RAM is accessed to by the signal RIB, the aforementioned boost voltage VCH such as about 5.3 V is generated by the charge pump circuit which is made receptive of the internal operation voltage VCC for the peripheral circuit and an oscillatory signal OSCH formed by the oscillator. A circuit VCHS is a subsidiary boost voltage generator which steadily operates to form the boost voltage VCH. This circuit VCHS has such a small current supply ability as can compensate the leakage current of the word lines.

For the acceleration tests, as will be described later, the internal voltage VCC is raised accordingly as the power voltage VCCE is raised to a constant level or more. In response to this, the boost voltage VCH is also raised to a constant level in accordance with the rise of the voltage VCC. This level is clamped by the MOSFET of the diode mode which is disposed at the output portion.

The terminal VHT is provided to interrupt the operations of the circuits VCHA and VCHS so that it may set the boost voltage through the VCH pad from the output side to evaluate the operation margin. Although not shown, the capacitor for dropping the power impedance of the boost voltage VCH is dispersed for the unit of the operating circuit such as each memory mat.

Figure 69:
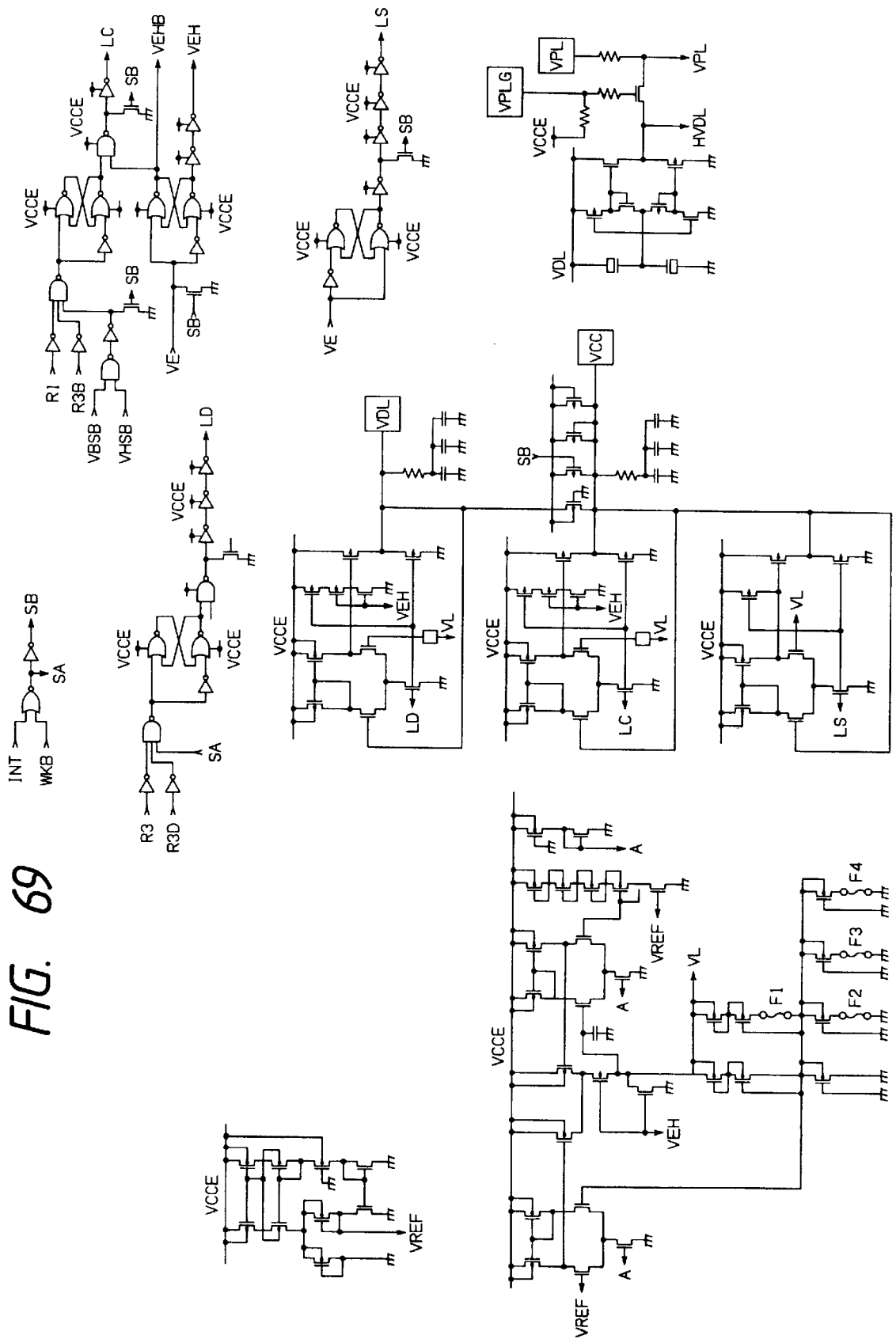
FIG. 69 is a circuit diagram showing one embodiment of the internal drop voltage generator.

FIG. 69 presents circuit diagrams showing one embodiment of the internal voltage drop circuit.

A reference voltage VREF is a highly precise reference voltage which is formed by making use of the difference between the threshold voltages Vth of the MOSFETs. From this voltage, the constant voltage VL is formed and amplified in series by the operation amplifier to generator the aforementioned voltages VDL and VCC of about 3.3 V. In order to reduce the operation current, the circuits for generating the voltages VCC and VDL, respectively, are operated only when the DRAM is brought into its operating state by signals LD and LC. There is provided another circuit which is steadily brought, when the power voltage VCCE is at a constant level or more, into its operating state to form the drop voltage for the standby by a signal LS.

Immediately after the power is made, a signal SB is formed by the signal INT till the external voltage VCCE reaches a constant level. In accordance with this, the signals LD, LC and LS are formed to bring all the circuits into operative states to raise the internal circuit operating voltage at a high speed.

In the same Figure, the circuits composed of resistors and capacitors are used for enlarging the phase margin for preventing the oscillations.

Fuses F1 to F4 can be selectively cut with a laser beam to adjust the reference voltage VL.

In the test function, the signals LD, LC and LS are dropped to the low level by a signal VE to interrupt the operations of the operation amplifier, and the low level is fed to the gate of the P-channel output MOSFET of the arithmetic amplifier to turn ON the MOSFET by the MOSFET which is to be turned ON by a signal VHE. As a result, the internal voltages VDL and VCC are switched by and to the external voltage VCCE through the P-channel MOSFET which is turned ON.

If, moreover, the external power voltage VCCE exceeds a constant level (e.g., about 6.6 V), the reference voltage VL accordingly rises to raise the internal voltages VCC and VDL. This corresponds to the acceleration test such as the aging.

FIG. 70 is a timing chart showing one example of the operations of the RAS system.

In the same Figure, there are shown schematic waveforms of the major timing signals for selecting and resetting the word lines WL from the start of the memory accesses by the $\overline{\text{RAS}}$ signals.

Figure 71:
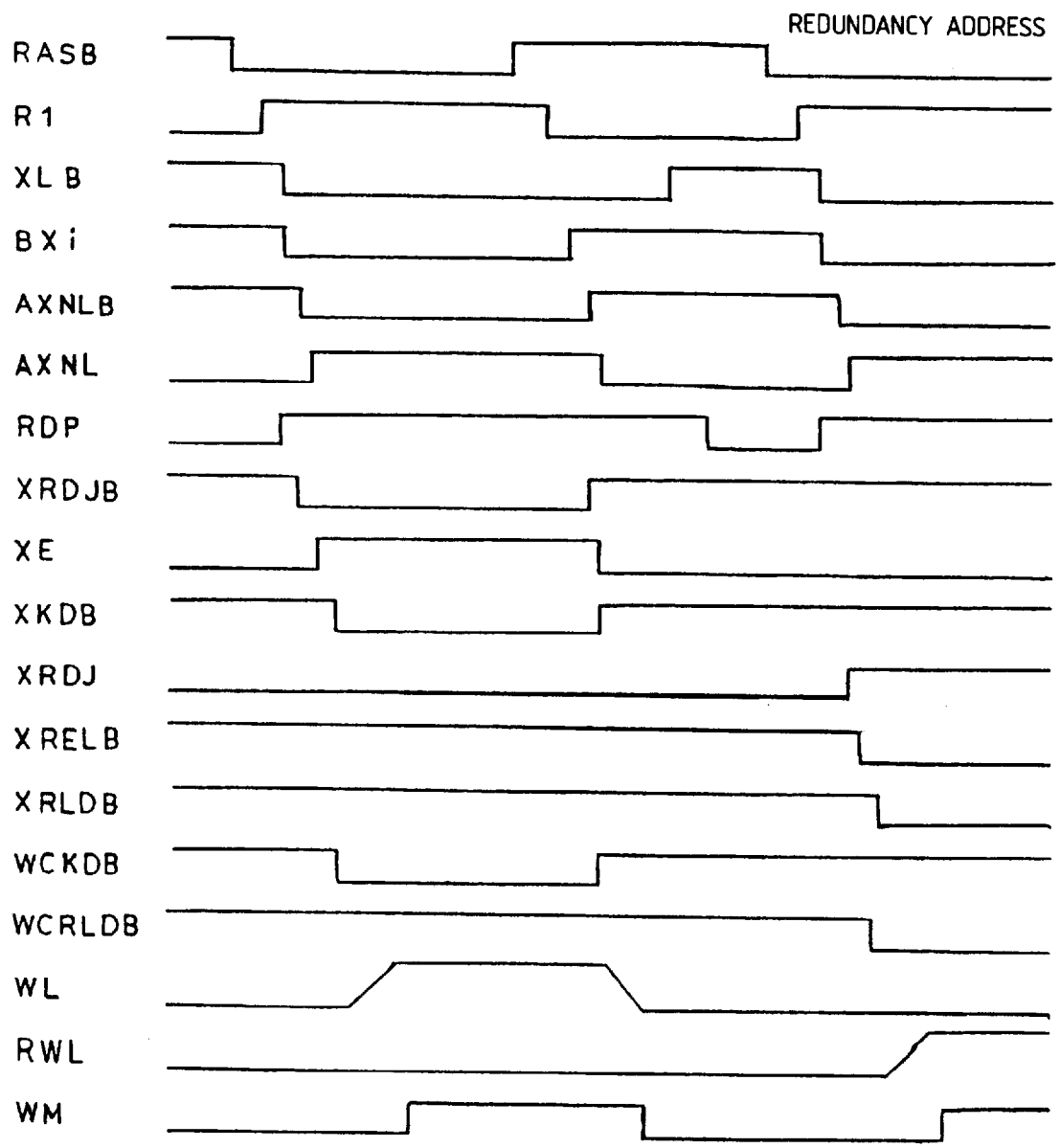
FIG. 71 is a timing chart showing one example of the operations of the RAS system.

FIG. 71 is a timing chart showing one example of the operations of the RAS system.

In the same Figure, there is shown the timing chart for selecting the word lines. In the second cycle, there is also shown the redundancy timing.

FIG. 72 is a timing chart showing one example of the operations of the RAS system.

In the same Figure, there are shown timing signals for activating the sense amplifiers and waveform charts to be driven by the former.

Figure 73:
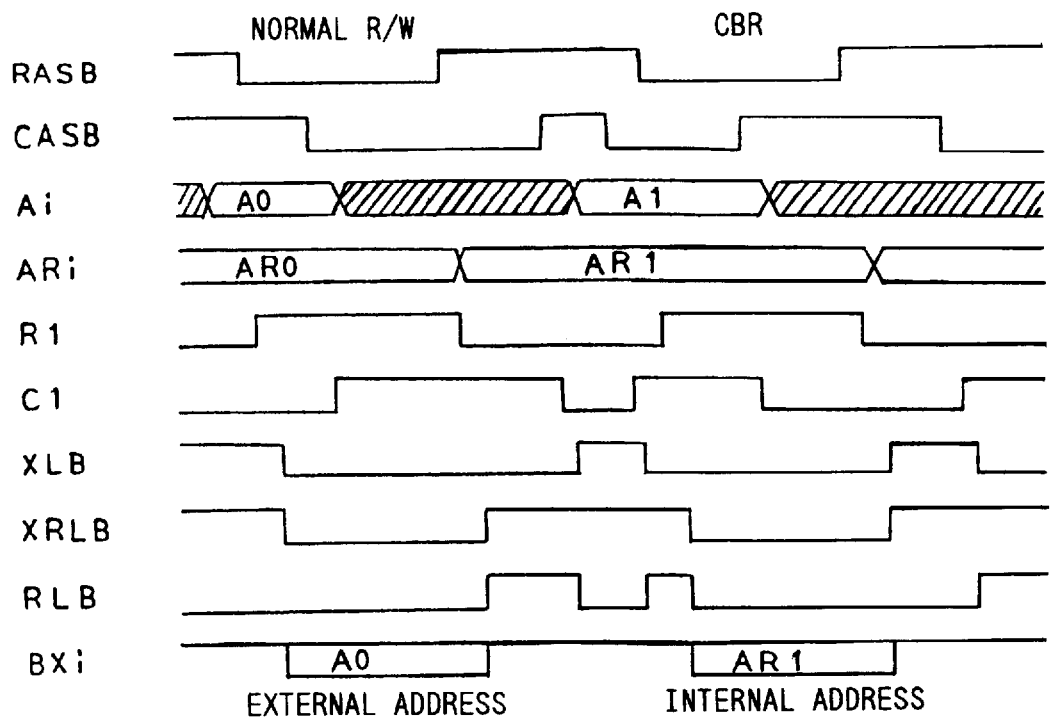
FIG. 73 is a timing chart showing one example of the operations of the X-address buffer.

FIG. 73 is a timing chart showing one example of the operations of the X-address buffers.

In the same Figure, there are shown the mutual timings between the $\overline{RAS}$ signals and the $\overline{CAS}$ signals.

Figure 74:
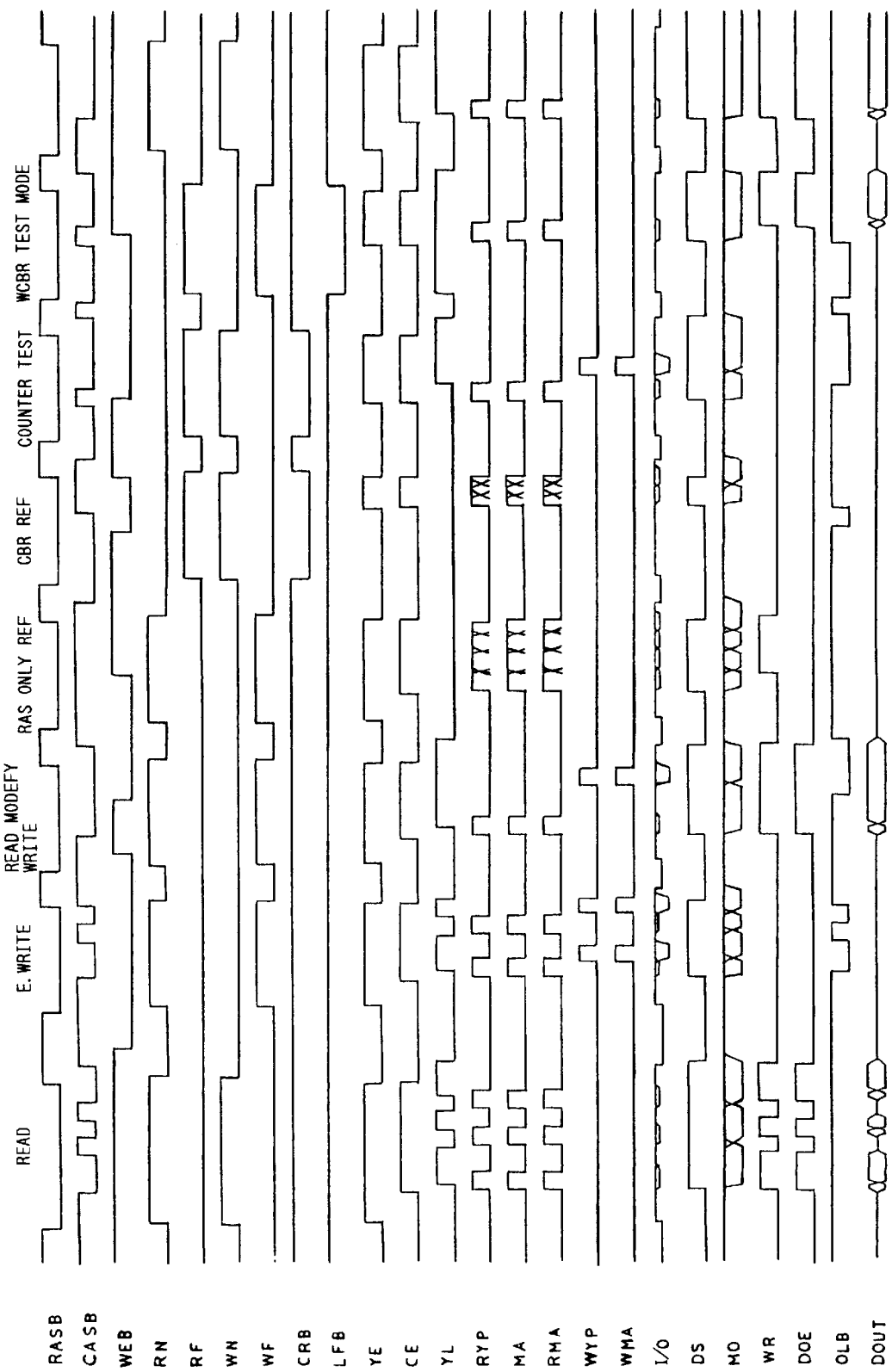
FIG. 74 is a timing chart showing one example of the operations of the CAS system.

FIG. 74 is a timing chart showing one example of the operations of the CAS system.

In the same Figure, there are presented waveform charts of the major signals in the order of the read mode (READ), the early write mode (EW), the read-modify-write mode (RMW), the RAS only refresh mode, the CBR refresh mode, the counter test mode and the test mode set (WCBR).

FIG. 75 is a timing chart showing one example of the address section operations of the CAS system.

In the same Figure, there are shown the major timing signals for the address selections of the Y-system.

FIG. 76 is a timing chart showing one example of the write operations.

In the same Figure, there are shown the major timing signals of the WE system.

FIG. 77 is a timing chart showing one example of the operations of the Y-address buffers.

In the same Figure, there is centered the timing signal YL for controlling the address latches in the fast page mode (FP), the nibble mode (N), and the static column mode (SC).

Figure 78:
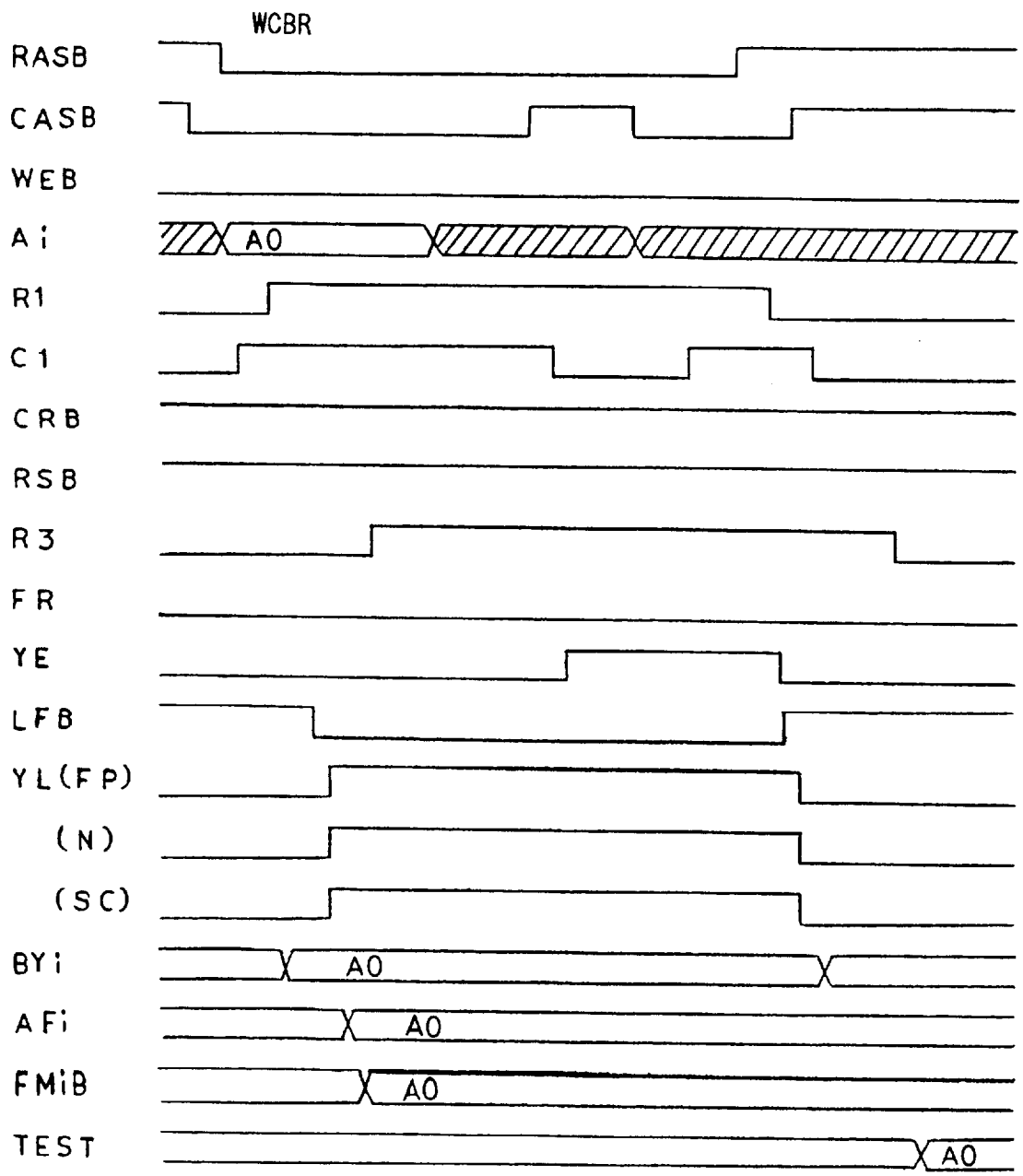
FIG. 78 is a timing chart showing one example of the operations of the test mode.

FIG. 78 is a timing chart showing one embodiment of the operations of the test mode.

In the same Figure, there are centered the address taking and latching operations.

Figure 79:
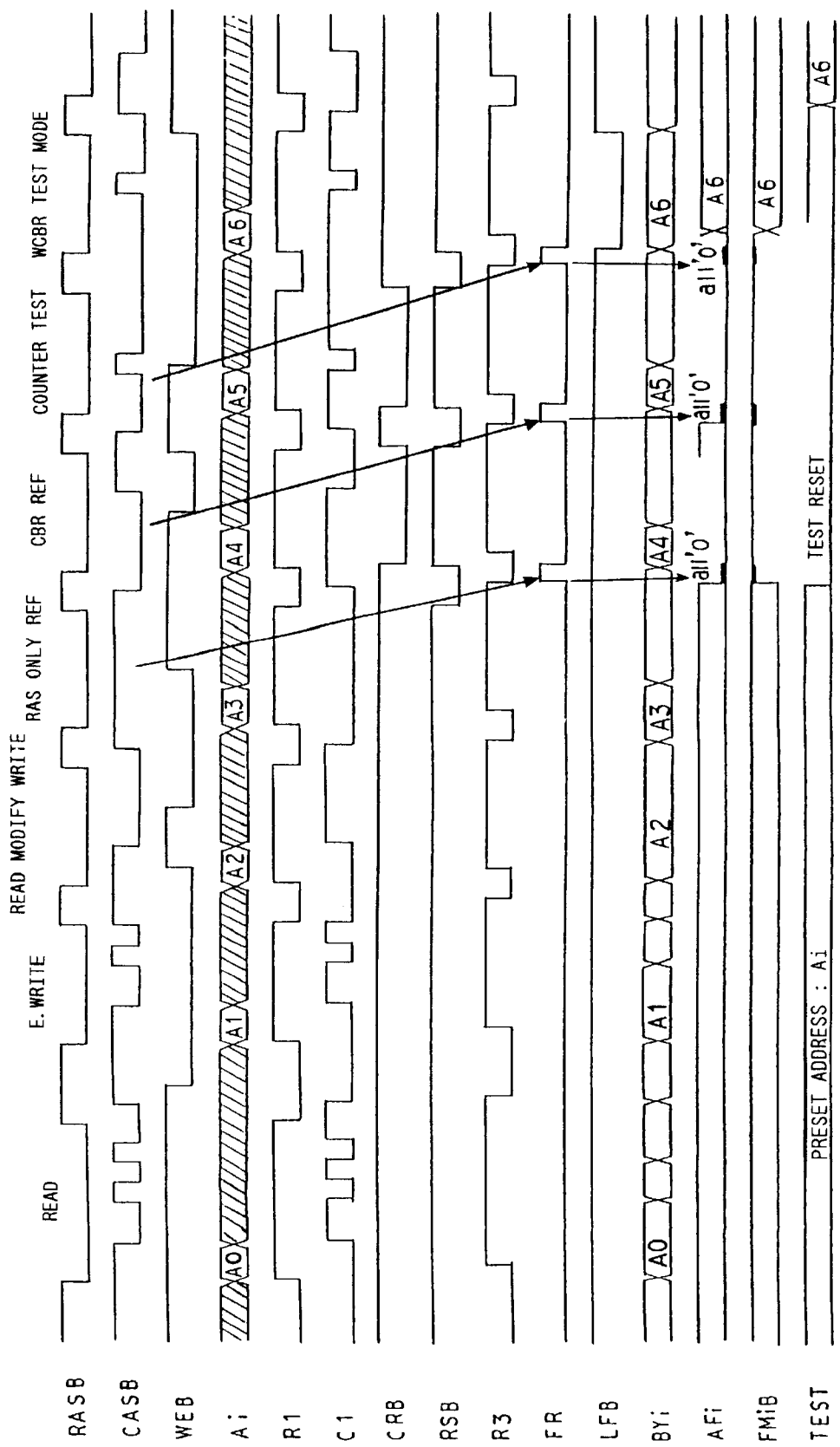
FIG. 79 is a timing chart showing one example of the operations of the CAS system.

FIG. 79 is a timing chart showing one example of the operations of the CAS system.

In the same Figure, there are exemplified waveform charts of the individual signals of the test mode system in the order of the read mode (READ), the early write mode (EW), the read-modify-write mode (RMW), the RAS only refresh mode, the CBR refresh mode, the counter test mode and the test mode set (WCBR).

Figure 80:
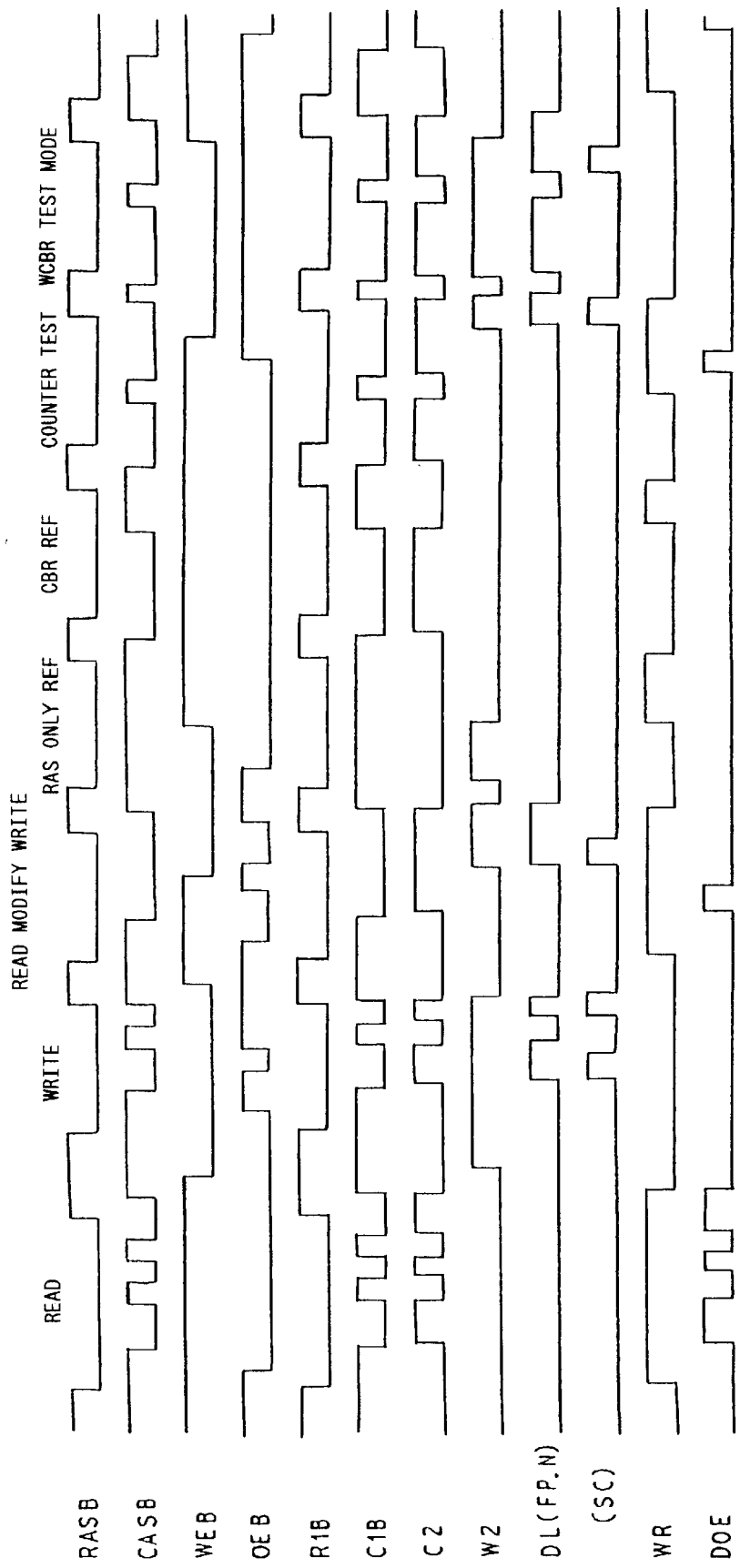
FIG. 80 is a timing chart showing one example of the operations of the CAS system.

FIG. 80 is a timing chart showing one example of the operations of the CAS system.

In the same Figure, there are exemplified waveform charts of the individual signals of the structure of ×4 bits in the order of the read mode (READ), the early write mode (EW), the read-modify-write mode (RMW), the RAS only refresh mode, the CBR refresh mode, the counter test mode and the test mode set (WCBR).

Figure 81:
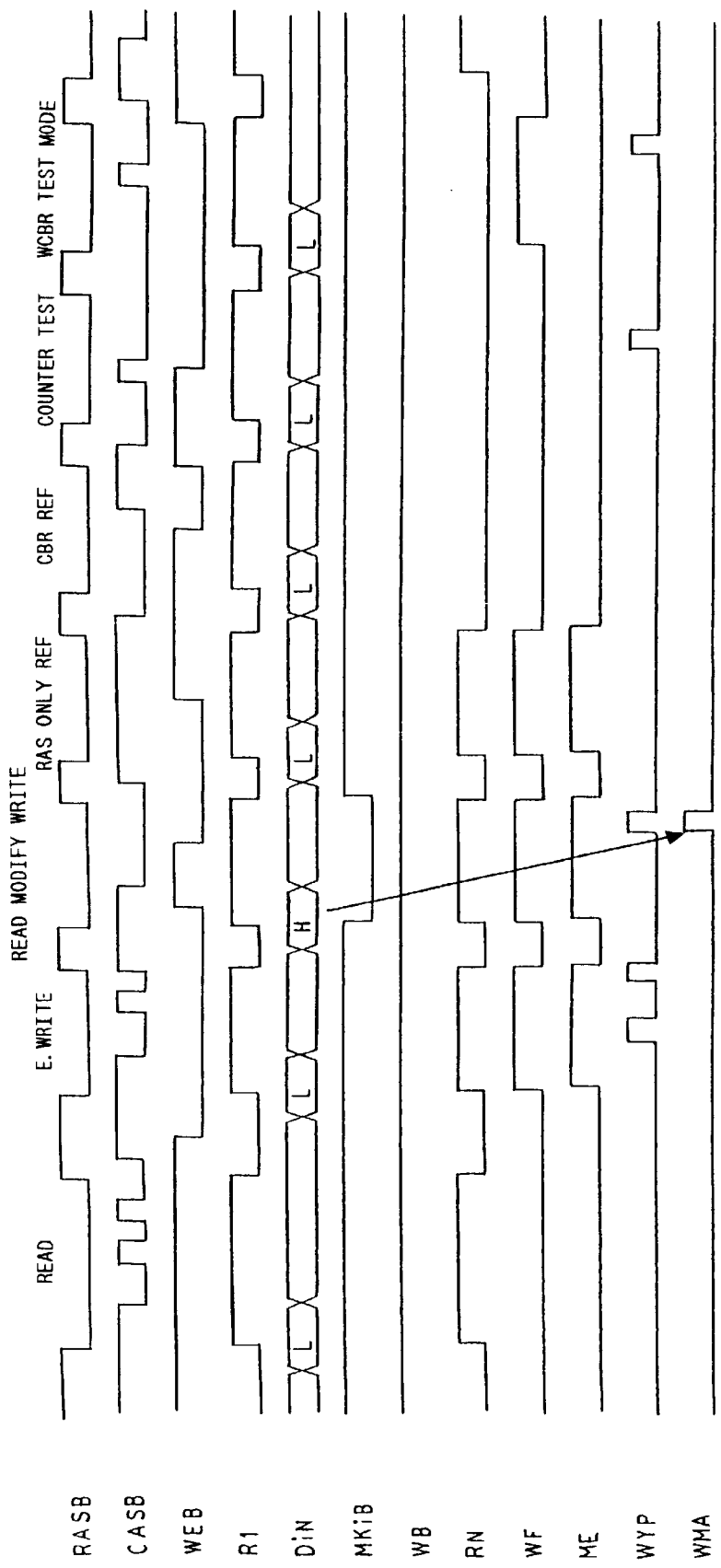
FIG. 81 is a timing chart showing one example of the operations of the CAS system.

FIG. 81 is a timing chart showing one example of the operations of the CAS system.

In the same Figure, there are exemplified waveform charts of the individual signals of the write mask mode in the order of the read mode (READ), the early write mode (EW), the read-modify-write mode (RMW), the RAS only refresh mode, the CBR refresh mode, the counter test mode and the test mode set (WCBR).

Figure 82:
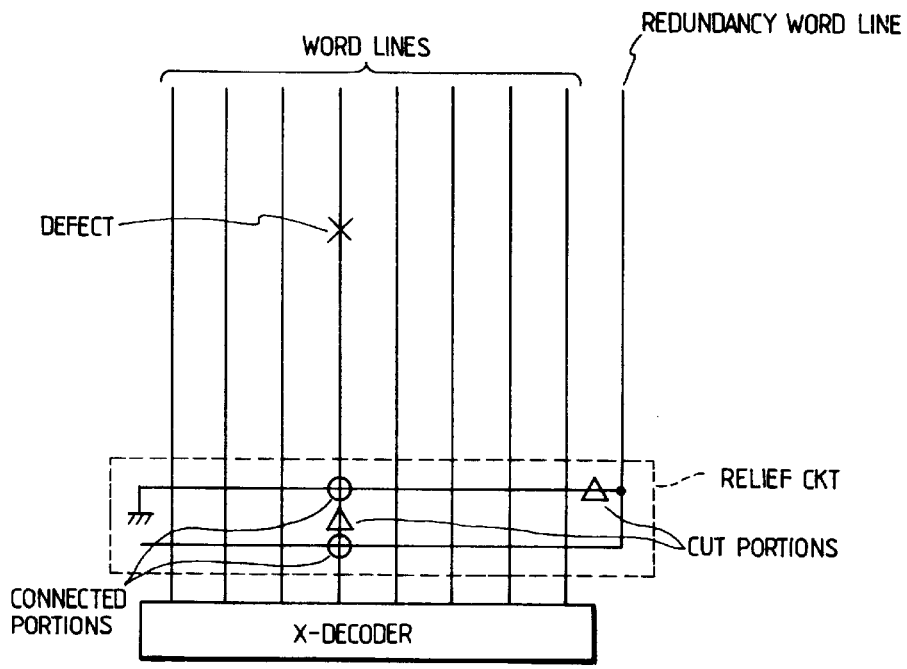
FIG. 82 is a block diagram showing another embodiment of the defect remedying method according to the present invention.

FIG. 82 is a block diagram showing another embodiment of the defect remedying method according to the present invention.

For a plurality of word lines to be selected by an X-decoder (including the word line driver), there is provided one redundancy word line. This redundancy line is arranged to intersect the plural word lines at the portion corresponding to the X-decoder, i.e, in parallel with the rows of the output terminals of the X-decoder. The redundancy word line intersects the plural word lines to be remedied by the two parallel wiring lines, although not especially limitative. These two parallel wiring lines have their one-side ends supplied with the ground potential.

In this structure, the word lines are steadily in non-selected state because the redundancy word line is supplied with the ground potential when the word lines have no defect.

If one word line is defective (e.g., cut) at a portion indicated by a letter X, the word line is cut at a portion indicated by a symbol of triangle. Likewise, the redundancy word line is so cut at the righthand side (at the side of the redundancy word line) from the defective word line as is indicated by the triangle so that it may be isolated from the ground potential. Moreover, the decode output forming the selection signal of the defective word line is connected with the redundancy word line at the portion of intersection, as indicated by a symbol of circle. Likewise, in order to bring the defective word line into the non-selected state. The aforementioned cutting and connecting operations of the wiring lines are accomplished by making use of the wiring working technology using the laser beam, although not especially limitative.

In this structure, the defective word line is cut from the output terminal of the word line selection circuit and is replaced by the redundancy word line, thus requiring neither the memory circuit for storing the defective address nor the address comparator. This makes it possible to highly integrate and reduce the power consumption of the semiconductor memory device. Since none of the aforementioned address comparison is required, the memory access can be speeded up.

In case, on the other hand, the aforementioned redundancy word line is provided for a plurality of word lines, it is steadily supplied, if not used, with the ground potential to establish the shield action for suppressing the coupling of the word lines.

Figure 83:
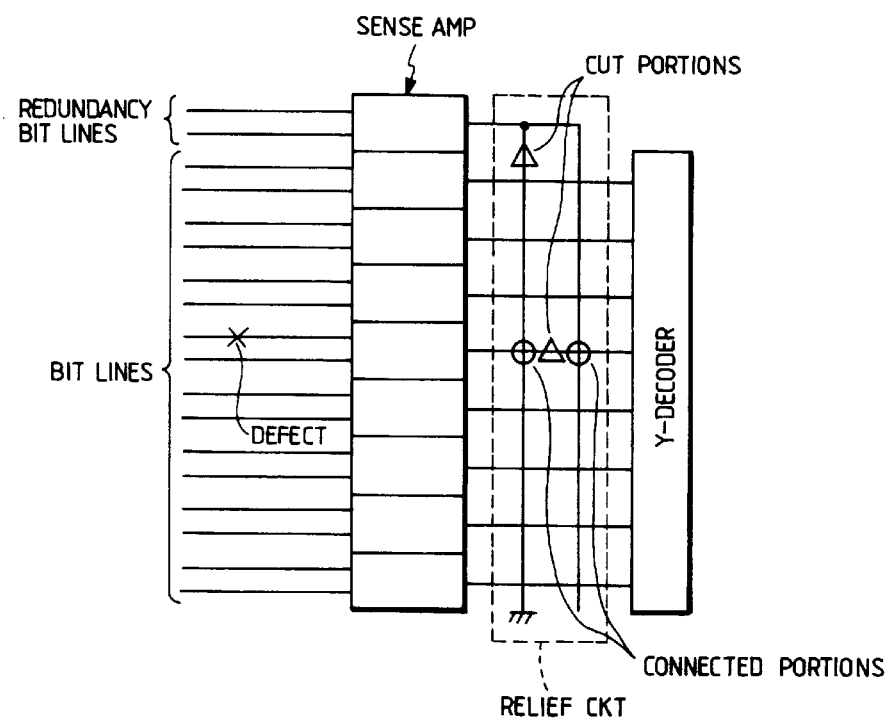
FIG. 83 is a block diagram showing another embodiment of the defect remedying method according to the present invention.
Figure 85A:
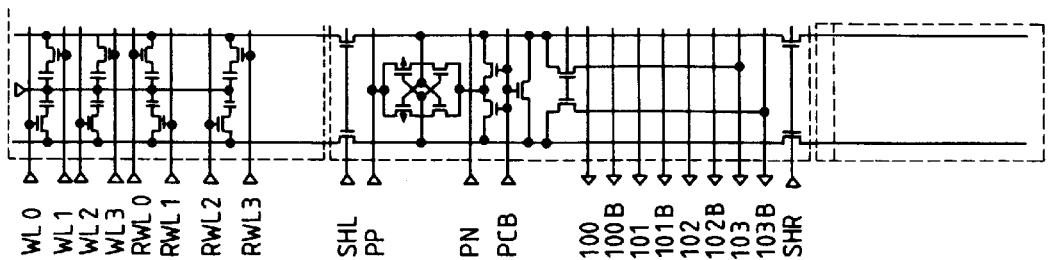
FIGS. 85(A) to 85(D) are waveform charts and circuit diagrams of one embodiment for explaining a signal amount margin testing method.
Figure 85B:
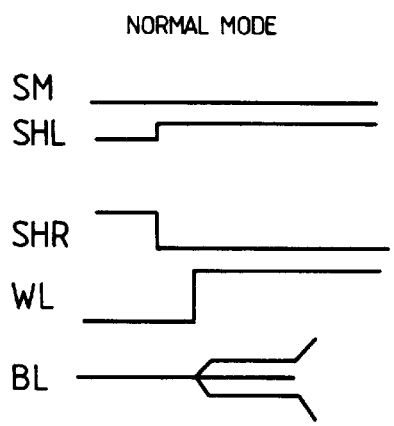
Figure 85C:
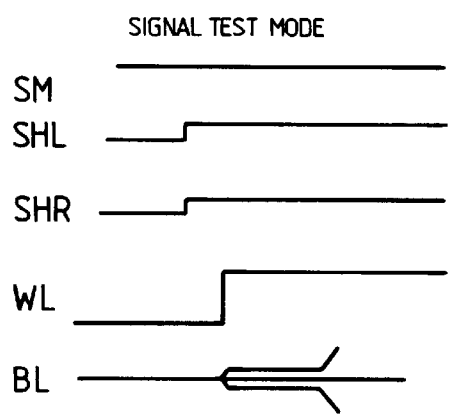
Figure 85D:
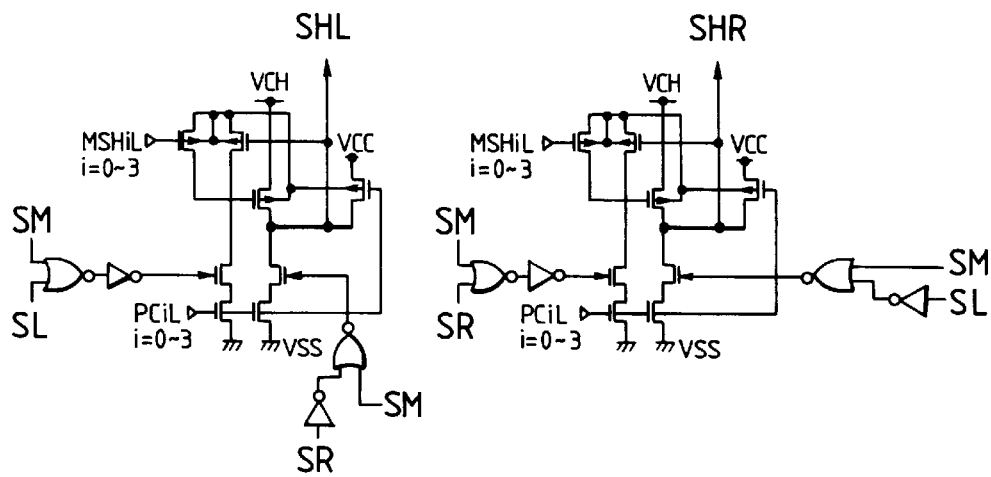

FIG. 83 is a block diagram showing another embodiment of the defect remedying method according to the present invention.

One redundancy column selection line is provided for a plurality of column selection lines which are formed by the Y-decoder circuit. These column selection lines are connected with the gates of the column switch MOSFETs, which are contained in the sense amplifiers, to connect the shown bit (or data) lines selectively with the common input/output lines. The redundancy column selection line is arranged to intersect the aforementioned plural column selection lines at the portions corresponding to the Y-decoder, namely, to extend in parallel with the rows of the output terminals of the Y-decoder. The aforementioned redundancy column selection lines intersect the plural column selections lines to be remedied by the two parallel wiring lines. These two parallel wiring lines have their one-side ends supplied with the ground potential.

In this structure, the bit lines and the sense amplifiers are steadily in non-selected state because the redundancy column selection is supplied with the ground potential when they have no defect.

If one bit line is defective (e.g., cut) at a portion indicated by a letter X, the column selection line is cut at a portion indicated by a symbol of triangle. Likewise, the redundancy column selection line is so cut at upper side (at the side of the redundancy column selection line) from the column selection line corresponding to the defective bit line as is indicated by the triangle so that it may be isolated from the ground potential. Moreover, the decode output forming the selection signal of the defective bit line is connected with the redundancy column selection line at the portion of intersection, as indicated by a symbol of circle. Likewise, in order to bring the column selection line corresponding to the defective bit line into the non-selected state. The aforementioned cutting and connecting operations of the wiring lines are accomplished by making use of the wiring working technology using the laser beam, although not especially limitative.

In this structure, the column selection line corresponding to the defective bit line is cut from the output terminal of the Y-decoder and is replaced by the column selection line corresponding to the redundancy bit line, thus requiring neither the memory circuit for storing the defective address nor the address comparator. This makes it possible to highly integrate and reduce the power consumption of the semiconductor memory device. Since none of the aforementioned address comparison is required, the memory access can be speeded up.

In case, on the other hand, the aforementioned redundancy column selection line is provided for a plurality of column selection lines, it is steadily supplied, if not used, with the ground potential to establish the shield action for suppressing the coupling of the column selection lines.

Figure 84:
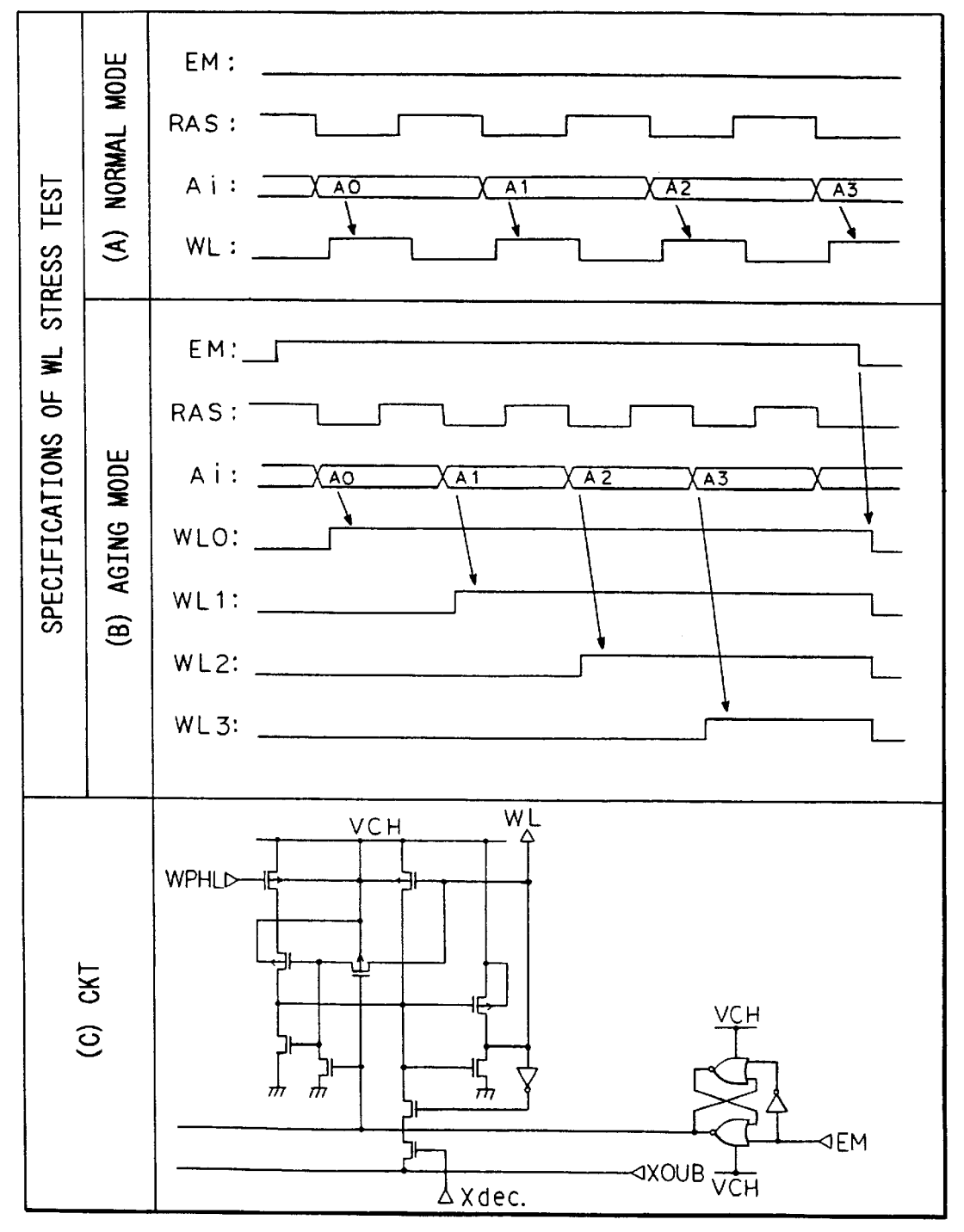

FIGS. 84(A) to 84(C) are waveform charts of one embodiment for explaining the testing method of the word lines and a circuit diagram corresponding to the former.

This embodiment is additionally provided with a control signal EM. This signal EM is newly added, as one test mode composed of address signals in the aforementioned test mode, to that fed from the external terminals. In the same Figure (A), there is shown a timing chart for the schematic selections of the word lines in the normal mode. In this normal mode, in accordance with the selections of the RAS system, the address designations A0 to A3 inputted select the corresponding word lines sequentially.

In the aging mode (to be set as one of the test modes) having the signal EM at the high level, on the contrary, the selected word line WL1 is maintained at the high level even if the $\overline{RAS}$ signal is reset from the low level to the high level. If, therefore, the addresses A0 to A3 advanced stepwise by the $\overline{RAS}$ signal are inputted, the word lines WL1 to WL3 selected sequentially as above are not reset irrespective of the high level of the $\overline{RAS}$ signal. These selected word lines WL1 to WL3 are reset by dropping the signal EM to the low level, although not especially limitative.

In the same Figure (C), there is shown a circuit diagram of one embodiment of the word line selection circuit. The signal EM has its level converted to the low level, if in the aging mode, by the level converter circuit which is constructed of a NOR gate circuit of latch mode using the boost voltage VCH as its operation voltage. As a result, the P-channel MOSFET is turned ON, and the P-channel MOSFET made receptive of the word line reset signal WPHL and the P-channel MOSFET connected therewith in series are turned OFF to invalidate the output of the P-channel MOSFET made receptive of the word line reset signal WPHL. As a result, the word line WL are held at the high level once they are raised to the high state.

When the word line WL is reset or when in the normal mode, the aforementioned level conversion output is raised to the high level (VCH) in response to the low level of the signal EM. As a result, the aforementioned P-channel is turned OFF, and the P-channel MOSFET made receptive of the aforementioned signal WPHL and the P-channel MOSFET connected therewith in series are turned ON so that the input of the CMOS inverter circuit for driving the word line WL is raised to the high level to reset the word line WL from the high to low levels.

Incidentally, at the input of the CMOS inverter circuit for driving the word line, there is provided a switch MOSFET which is to be controlled by the inverter circuit made receptive of the output signal. As a result, when in the aforementioned multi-selection, the high level of a non-selected signal X0UB is prevented from being transmitted to the CMOS inverter circuit to maintain the aforementioned selection level.

In the aging, If the word lines are selected one by one with the signal EM being set at the high level, they can be held in the selected state. Since the high-level period of the selected word lines can be elongated, the stress duty can be raised to effect the efficient aging for a relatively short time period.

FIGS. 85(A) to 85(D) show one embodiment of the signal mount margin test method. In this example, a control signal SM is additionally provided. This signal SM is added not only from the external terminal but also as one test mode of the combination of the address signal in the aforementioned test mode. In the same Figure (A), there is representatively shown each circuit such as the sense amplifier relating to a pair of complementary bit lines, the precharge circuit, the column switch and the shared switch circuit.

In the same Figure (B), there is shown a waveform chart of the operations of the normal mode. In this normal mode, the signal SM is dropped to the low level. In accordance with this, the shared selection signal SHL at the side of the selected word line (L), but the shared selection signal SHR at the side of the unselected word line (R) is dropped to the unselected low level. Therefore, the stored memory is read out from the selected memory cell to the complementary bit line BL.

In the same Figure (C), there is shown a waveform chart of the signal amount test mode. In this test mode, the signal SM is raised to the high level. In accordance with this, not only the shared selection signal SHL at the side of the selected word line (L) but also the shared selection signal SHR at the side of the unselected word line (R) is raised to the high level. Thus, the righthand and lefthand bit lines BL are coupled to the input of the sense amplifier so that the bit line capacity is substantially doubled. Therefore, the read level of the stored information from the selected memory cell is dropped to about one half in the aforementioned normal mode. In response to this, it is possible to accomplish the signal amount margin test for testing whether or not the sense amplifier performs its amplification accurately.

In the same Figure (D), there are presented circuit diagrams showing one embodiment of the shared selection signal generator. The control signal SM is added to control the validity/invalidity of selection signals SL and SR through the NOR gate circuit. When the signal SM is at the high level, more specifically, both the signals SL/SR are forced to the selection level to raise the aforementioned signals SHL and SHR to the high selection level. Incidentally, this selection level is at the boost voltage VCH like before.

FIG. 86 shows another embodiment of the function mode.

In response to the function set signal formed by the WCBR, binary numerical data are inputted directly from the address terminals A0 to A3. These numerical data are converted into analog signals S0V to S1V by a voltage decoder (i.e., digital/analog converter), for example. This analog voltage SiV is fed to the internal voltage generator constructed of the operation amplifier of voltage follower structure to form the internal voltage VCC or VDL. This structure can set the internal operation voltage at will. As a result, the voltage margin test or the acceleration test in the aging can be simplified.

On the other hand, the binary numerical data are inputted directly from the aforementioned address terminals A0 to A3 to the time decoder to form decode signals S0D to A10D, which signal SiD is inputted to a delay circuit. This delay circuit has its delay time made variable from 0 to 10 ns in accordance with the signals S0D to S10D. As a result, an arbitrary delay time can be attained in accordance with the signal SiD. This delay circuit is used as that for forming the time-series timing signals of the RAS or CAS system, for example. By making use of the delay circuit, it is possible to test the time margin, for example.

Figure 87A:
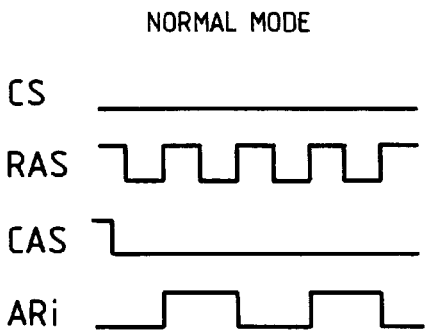
FIGS. 87(A) to 87(C) are waveform charts and a circuit diagram of one embodiment showing another embodiment of the refresh address counter.
Figure 87B:
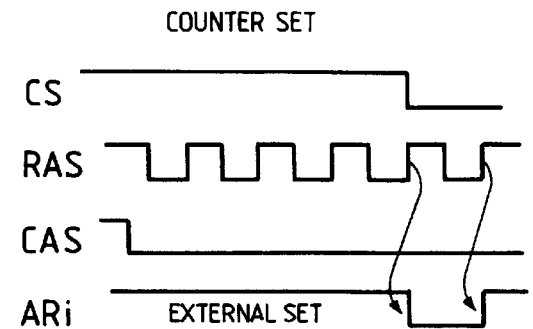
Figure 87C:
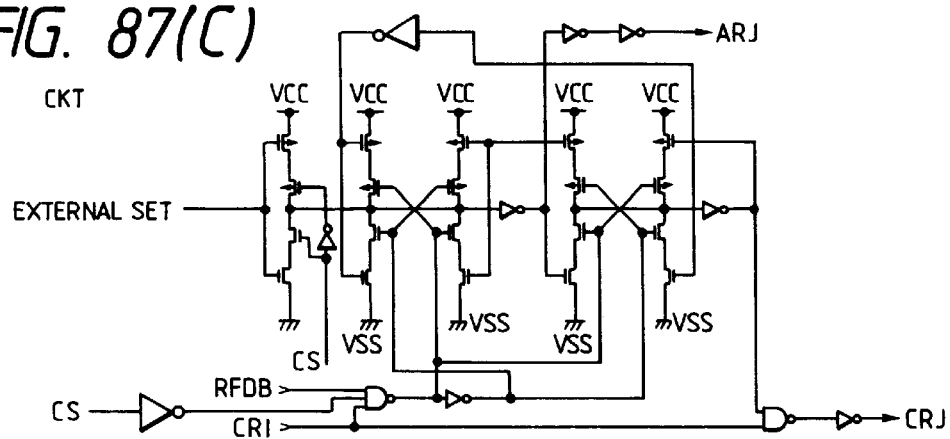

FIG. 87 shows another embodiment of the refresh address counter. To this embodiment, there is added a control signal CS. This signal CS is fed from the external terminal, added as one test mode composed of the combination of the address signals in the aforementioned test mode, or formed by the power-on detection signal.

In the same Figure (A), there is shown a waveform chart of the normal mode. In this normal mode, the signal CS is set at the low level. In accordance with this, the counter circuit accomplishes its counting operation using the $\overline{RAS}$ signal as the clock to form a refresh address signal ARi when in the CBR refresh.

In the same Figure (B), there is shown a waveform chart of the operations of the counter set. In the counter set, the signal CS is raised to the high level. If, at this time, the CBR is accomplished, the address signal to be inputted in synchronism with the low level of the $\overline{RAS}$ signal is inputted as the initial value of the counter. When the signal CS takes the low level, the counter circuit holds its initial value at +1.

In the same Figure (C), there is shown the circuit diagram. In order to make the aforementioned external input possible, there is added an external set input circuit which is controlled by the signal CS.

Figure 88A:
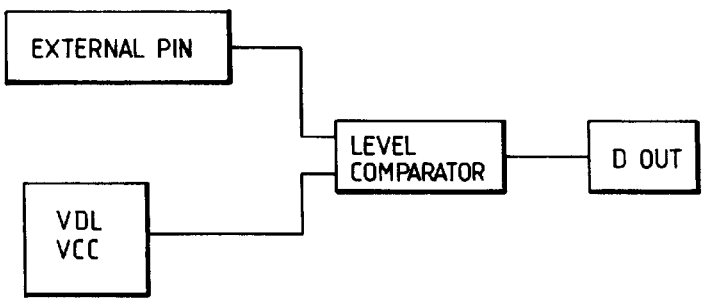
FIGS. 88(A) and 88(B) a block diagram showing another embodiment of the internal power monitor method and a waveform chart for explaining the same.
Figure 88B:
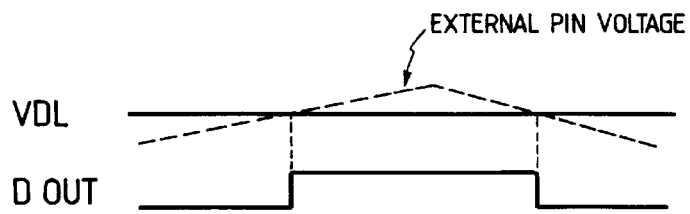

FIG. 88 shows another embodiment of the internal power monitor system.

In the same Figure (A), there is shown a block of this embodiment. The voltage VCC or VDL to be formed by the internal drop voltage power circuit VCC or VDL is inputted to one input of the level comparator. The reference voltage is fed through an external pin to the other input of the level comparator. This level comparator outputs the magnitude relation of the two as a binary signal to the external terminal DOUT.

In the same Figure (B), there is shown a waveform chart for explaining the operations of this embodiment. As indicated by broken lines, the level of the voltage VDL can be obtained indirectly from the changing point of the high/low levels of the output signal DOUT by changing the voltage to be fed to the external pin. The input voltage to be fed from the external pin may be either fed one-to-one to the level comparator or have their level attenuated or amplified. Likewise, the voltage VCC or VDL may have its level attenuated at a constant ratio. In case the level is thus attenuated, the level of the aforementioned boost voltage can be monitored. The structure, in which the level comparator is disposed inside like this embodiment, is kept away from the influences of the level fluctuations in the output voltage pass unlike the system, in which the analog voltage is outputted as it is to the outside, so that the level can be monitored highly precisely.

Figure 90:
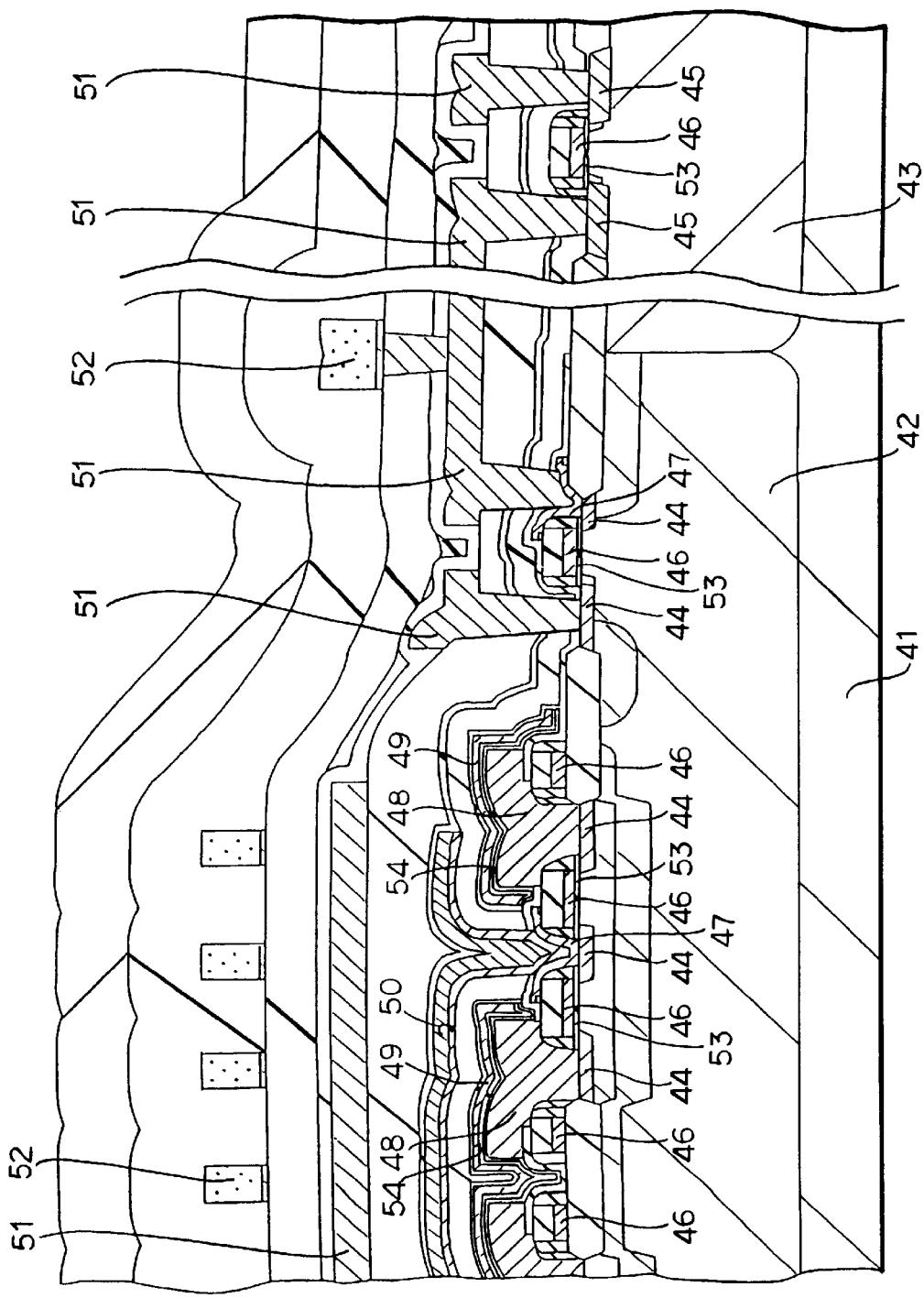
FIG. 90 is a section showing an element structure taken in the bit line direction according to one embodiment of the present invention.

FIG. 90 is a schematic section showing the element structure of one embodiment of a memory cell portion, an N-channel type column switch MOSFET for the Y-selection and a P-channel MOSFET to be used in another CMOS circuit. In the same Figure, there is shown a section of the schematic element structure taken in the direction of bit lines.

The memory cell and the N-channel MOSFET constituting the column switch are formed in a P-type WELL formed over a P-type substrate 41.

As shown one pair of memory cells are provided for bit lines 50 made of polysilicide. For the source and drain 44 shared between the address selection MOSFET constituting the paired memory cells, there is provided a pad contact 47 which is made of conductive polysilicon and formed in the contact hole formed by the self-alignment technology. Across the shared source and drain 44, there are formed the source and drain 44 of the capacitor side. A gate electrode 46 is formed through a thin gate insulating film 53 between the two regions. The gate electrode 46 is made of conductive polysilicon and constitutes a word line. This word line accomplishes the word shunt by an aluminum layer 52 formed thereover. In the same Figure, there is shown by way of example the word line 46 which is connected with the gate of the address selection MOSFET of another memory cell which has its pitch offset vertically. The word line 46 is formed over the relatively thick field insulating film.

The capacitor-side source and drain of the address selecting MOSFET are connected with the conductive polysilicon 48 constituting the store node of the information storing capacitor. This polysilicon 48 is equipped through a thin insulating film 54 with the polysilicon 49 constituting the plate electrode of the aforementioned capacitor.

Over the bit line 50, there is formed a tungsten layer 51 acting as a first metal layer for forming a column selection line. Although not especially limita tive, the polysilicide 50 constituting the aforementioned bit line is connected through the shared selection switch MOSFET, although not shown, with the aforementioned tungsten layer 51 and further with the source and drain 44 of one of the MOSFET constituting the columns switch of the same Figure. The I/O-side source and drain 44 are connected with the input/output lines I/O made of the second aluminum layer 52 through the first metal layer 51 through the pad contact 47 like the aforementioned address selecting MOSFET of the memory cell. Incidentally, the righthand side of the same Figure is provided with a P-channel MOSFET. This P-channel MOSFET is used as a sense amplifier or another CMOS. Thus, the P-channel MOSFET is formed in an N-type WELL 43 and composed of a source drain 45 and the gate 46.

In this embodiment, the N-channel MOSFET constituting the column switch to be connected with the aforementioned input/output lines I/O is exemplified by using the pad contact 47 similar to that of the address selection MOSFETs of the memory cell as the source and drain to be connected with the input/output lines I/O. In this structure, the self-alignment technology is used for boring the contact holes in the oxide film of the surface of the source and drain. As a result, the source and drain below the pad contact 47 need not be made large while considering the contact boring mask misalignment, so that the can be minimized. This makes it possible to increase the integration and to reduce the parasitic capacity. In case the sources and drains of the numerous column switch MOSFETs like the input/output lines I/O are connected, the paratisic capacity can be drastically reduced in accordance with the reduction in the parasitic capacity of the source and drain of the column switch MOSFETs. As a result, the wiring capacity of the input/output lines I/O can thus be drastically reduced, the write/read operations can be speeded up.

The MOSFET using the aforementioned pad contact can be utilized in each circuit requiring the fine structure and the low parasitic capacity such as not only the aforementioned column switch MOSFET but also a MOSFET constituting the sense amplifier, a bit line precharging MOSFET, a bit line shorting MOSFET, a shared sense amplifier selecting MOSFET or a word line driver MOSFET.

Figure 92:
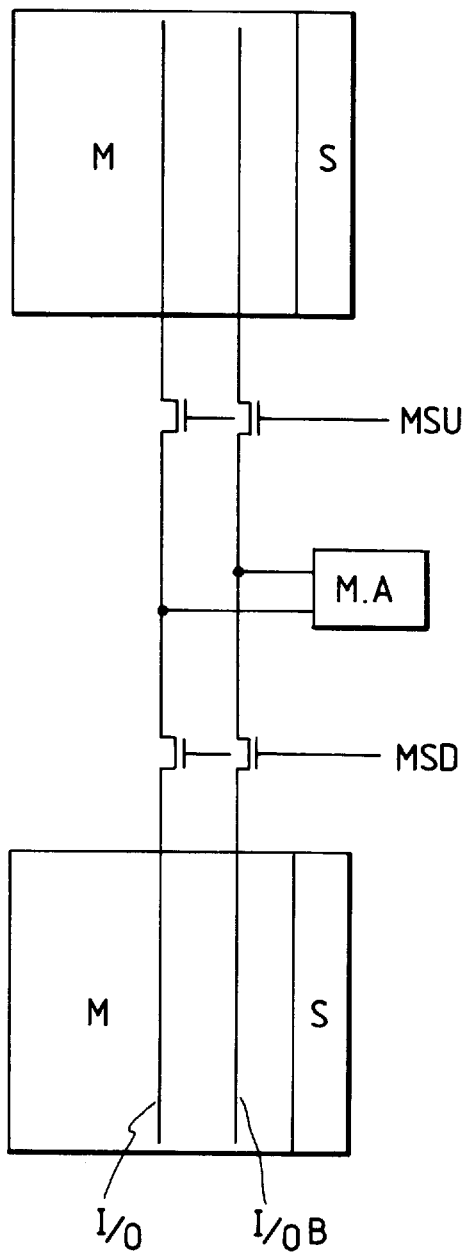
FIG. 92 is a block diagram showing one embodiment of the layout of the main amplifier and the memory cell array according to the present invention.

FIG. 92 is a schematic circuit diagram showing another embodiment of the main amplifier selection circuit.

In the embodiment of the same Figure, the main amplifier MA is used commonly for memory mats which are divided vertically with respect to the main amplifier MA. In other words, the main amplifier MA is arranged at the center between a pair of memory mats each composed of a memory cell array M and a sense amplifier S. The input/output lines I/O and I/OB of the memory mats are selectively connected with the inputs of the main amplifier MA through a switch MOSFET which is to be switched by mat selection signals MSU and MSD. The layout relation of the memory mats and the sense amplifiers is basically similar to that of the foregoing embodiment of FIG. 2 so that the number of the main amplifiers can be reduced.

If the number of main amplifiers is to be merely reduced, the main amplifier MA can be arranged above the upper memory mat or below the lower memory mat. In this case, however, those of the wiring lines of the input/output lines to be connected with the input terminals of the main amplifier MA, which correspond to the memory mat at the opposite side, are elongated. In the structure in which the main amplifier is arranged at the center of the divided memory mats, as in the embodiments shown in the same Figure or foregoing FIG. 2, on the contrary, the input/output lines I/O and I/OB to be arranged in the two memory mats can be equally shortened to speed up the memory accesses.

Figure 93:
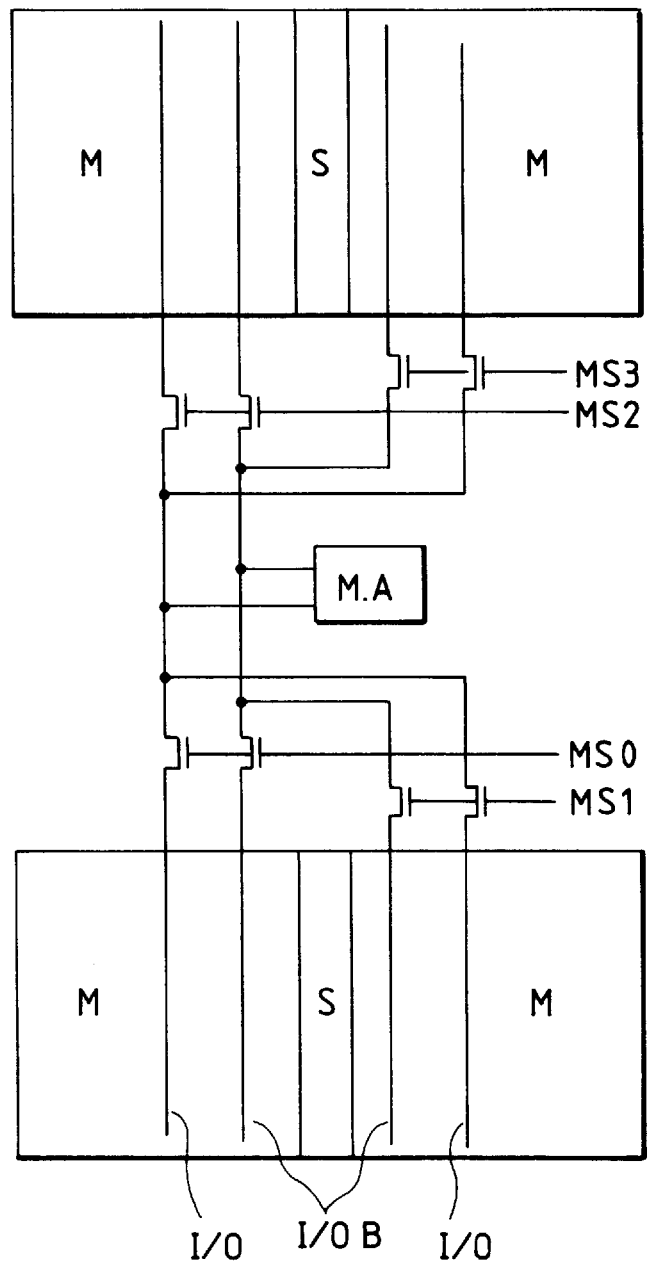
FIG. 93 is a block diagram showing another embodiment of the layout of the main amplifier and the memory cell array according to the present invention.

FIG. 93 is a schematic circuit diagram showing still another embodiment of the main amplifier selection circuit.

In the embodiment of the same Figure, the main amplifier MA is used commonly for the memory mats which are vertically divided and arranged with respect to the main amplifier MA. The memory mat of this embodiment is exemplified by the share sense amplifiers which have the memory cell arrays bisected to the right and left from the sense amplifier S. In this structure, the vertically divided memory cell arrays are deemed as the memory mats and arranged with input/output lines I/O and I/OB so that they are selectively connected with the input of the main amplifier MA through the switch MOSFET which are to be switched by mat selection signals MS0 to MS3. The layout relation between the memory mats and the sense amplifier is basically similar to that of the aforementioned embodiment of FIG. 2 so that it can reduce the number of the main amplifiers and substantially shorten the length of the input/output lines. In the structure, moreover, in which the input/output lines I/O and I/OB are arranged for each pair of memory cell arrays M as in this embodiment, the number of the column switch MOSFETs to be connected with the input/output lines I/O and I/OB can be halved. As a result, the length of the input/output lines can be substantially shortened, and the wiring capacity can be reduced so that the operations can be speeded up.

Figure 94:
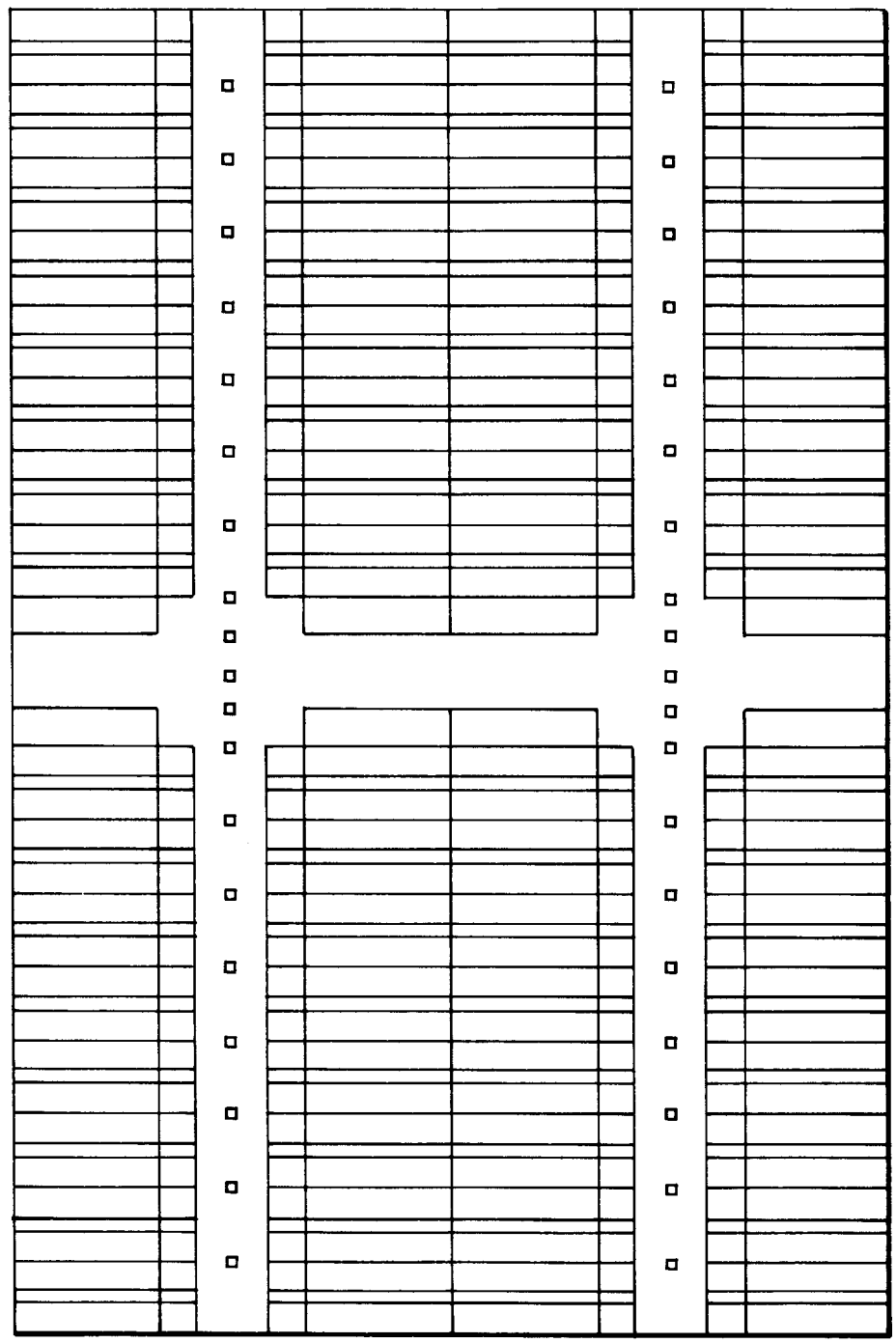
FIG. 94 is a fundamental layout showing another embodiment of the semiconductor chip according to the present invention.

FIG. 94 is a layout showing another embodiment of the DRAM according to the present invention.

This embodiment is based upon the foregoing layout of FIG. 2 and modified such that the semiconductor chip is bisected by the longitudinal center line and such that the layouts of FIG. 2 are arranged symmetrically with respect to that center line. In this structure, each of the halves of the memory chip is formed with cross areas composed of the aforementioned longitudinal and transverse center areas. In case the memory chip is divided by the longitudinal center line, as shown, the transverse center portions are arranged on one line. Thus, the memory arrays are divided into eight by the aforementioned two cross areas. Moreover, these two cross areas are arranged with the peripheral circuits and the bonding pads like the foregoing embodiment and are bonded by the LOC leads.

In case this layout is applied to the dynamic RAM having the aforementioned storage capacity such as 16 Mbits, the word line length can be halved to accelerate the high-speed access. Moreover, the memory mats is more finely divided so that the power consumption can be further dropped. Furthermore, the aforementioned cross area and the four divided areas are used as the fundamental components and arranged in two sets, as above, so that the storage capacity of the RAM can be further increased.

In addition to the shown structure in which the memory chip is bisected by the longitudinal center line and formed with the aforementioned cross areas, there may be another structure in which the memory chip is bisected by the transverse center line and formed with cross areas made by a similar method. Moreover, these structure may be combined and divided in another method.

Figure 95:
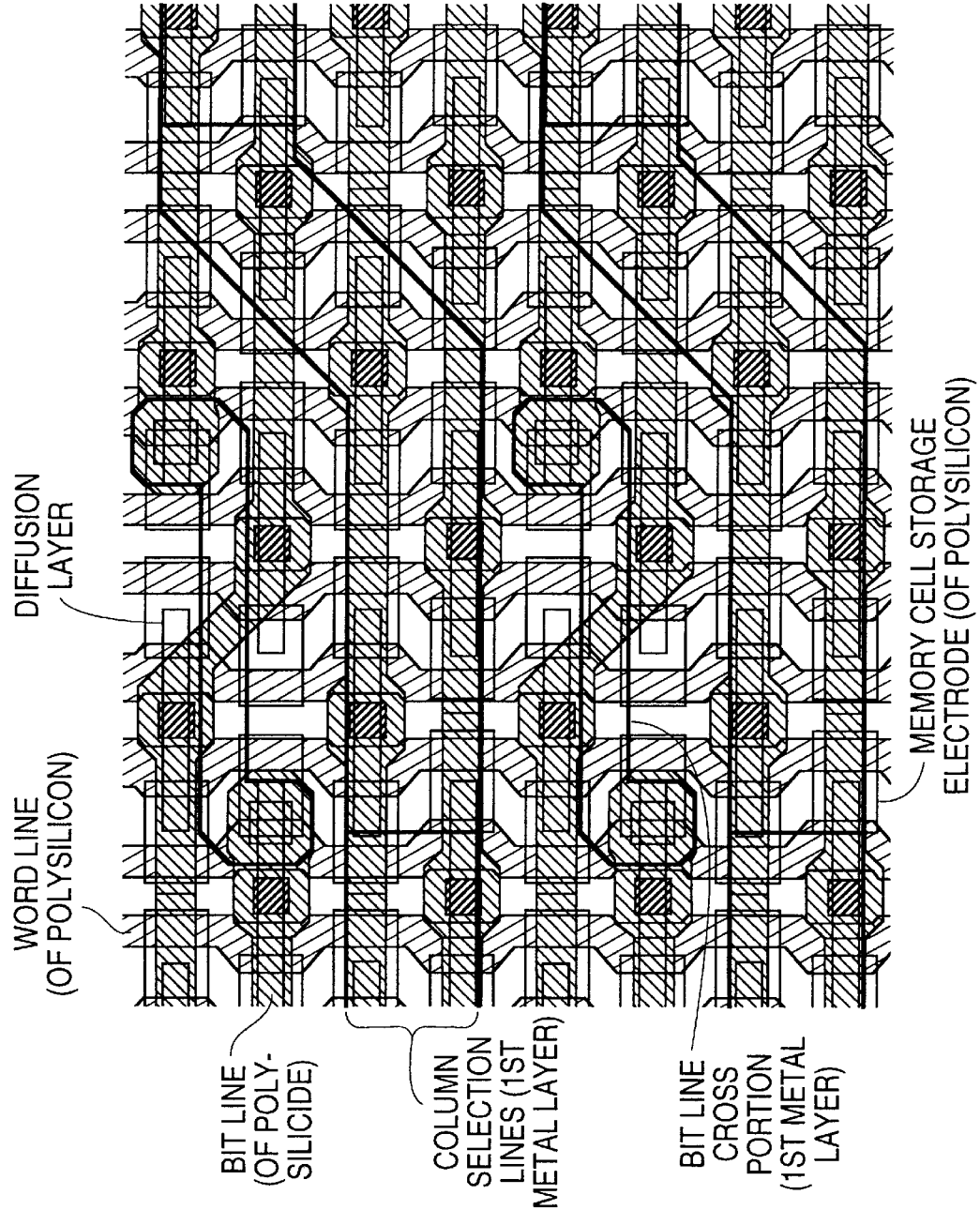
FIG. 95 is a pattern diagram showing one embodiment of the memory cell array according to the present invention.

FIG. 95 is a pattern diagram showing one embodiment of the memory cell array according to the present invention.

The bit lines are crossed at a constant spacing to reduce the coupling noises between the adjoining bit lines. If this bit line crossing is adopted, there arises a problem that the area of the bit line cross portions is increased. In this embodiment, therefore, the wiring layer to be used as the column selection line is used as the cross wiring line. In case the first metal layer is used as the column selection line, as shown in the same Figure, there is used, for the bit line made of a polysilicide layer to be replaced, the first metal wiring layer to be formed thereover.

By adopting the structure using this first metal layer, the wiring layer especially for the bit line cross portions can be eliminated.

In order to equalize the parasitic capacities of the aforementioned bit lines and the column selection lines extending in parallel, the column selection lines are so folded at the bit line cross portion that are shifted by one pitch. As a result, one column selection line is enabled to have an equal parasitic capacity for the two-paired bit lines, and the folded portions can be used as the bit line cross portions. No special area is required for the bit line cross portions so that the continuity of the various wiring patterns is not deteriorated.

In case, on the other hand, the cross portion of the bit lines is formed by making use of the upper wiring layer, the uniformity of the capacity constituting the underlying memory cell and the address selecting MOSFET is not adversely affected. This makes it possible to hold the continuity and uniformity of the devices (such as the capacitors or MOSFETs) constituting the memory cell and to reduce the dispersion of the characteristic margins of the individual bit lines. Since, moreover, the pattern continuity of the pattern is held and since the crossing contact is taken separately of the bit line contact, no problem raises in the fabricating and treating conditions.

This will be easily understood from a section shown in FIG. 96(A) and a schematic diagram shown in the same Figure (B). As shown in the section of the same Figure (A), at the cross portion of the bit lines, the underlying bit line pairs of polysilicide are separated from each other such that one bit line is replaced, while being made of the polysilicide, by the position of the other bit line whereas the other bit line is intersected with the one bit line by the first metal layer formed thereover and is replaced by the position of one bit line.

Figure 97:
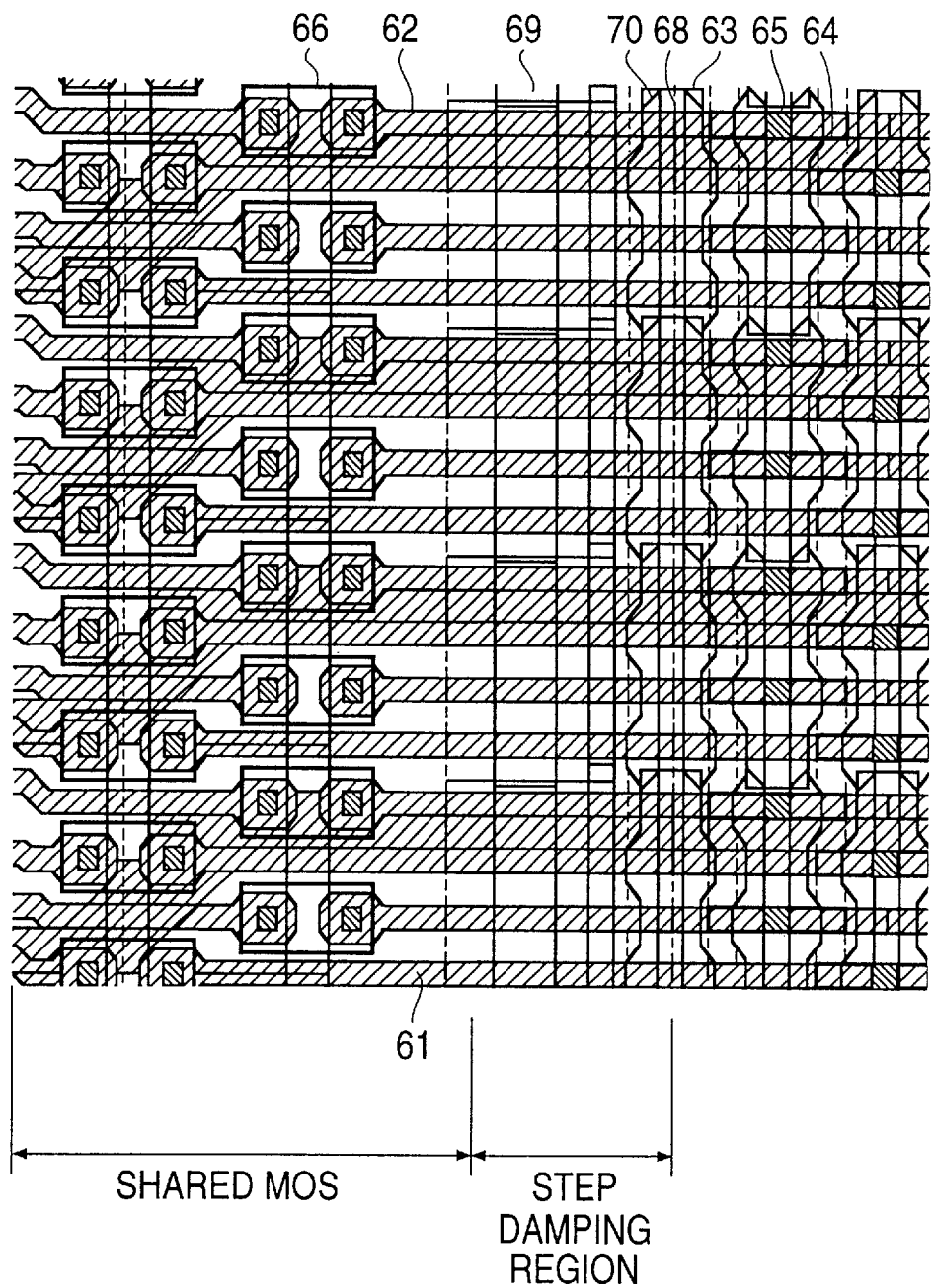
FIGS. 97 to 99 are pattern diagrams showing one embodiment of the shared sense amplifier column portion in the bit line direction and the corresponding memory cell array portion.
Figure 98:
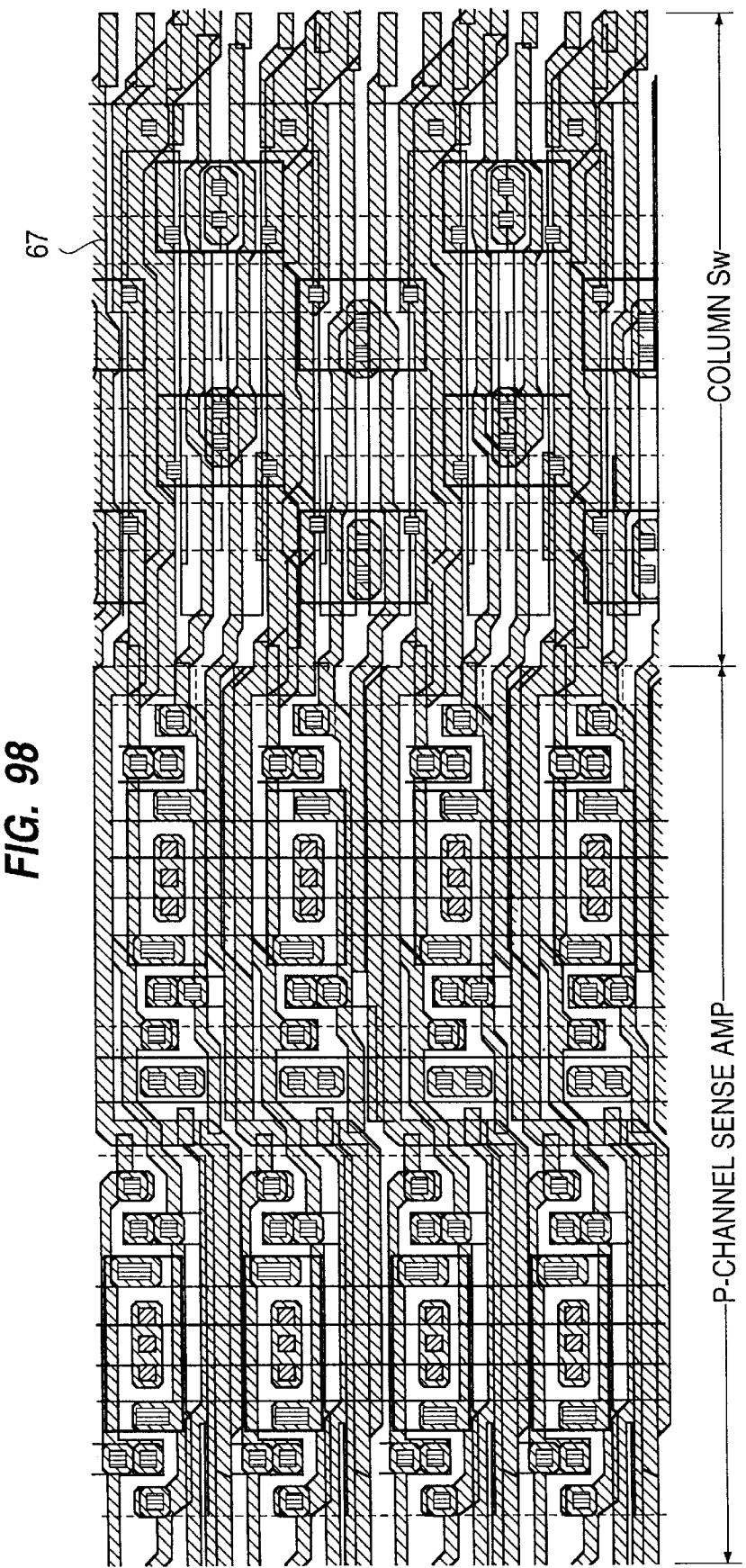
Figure 99:
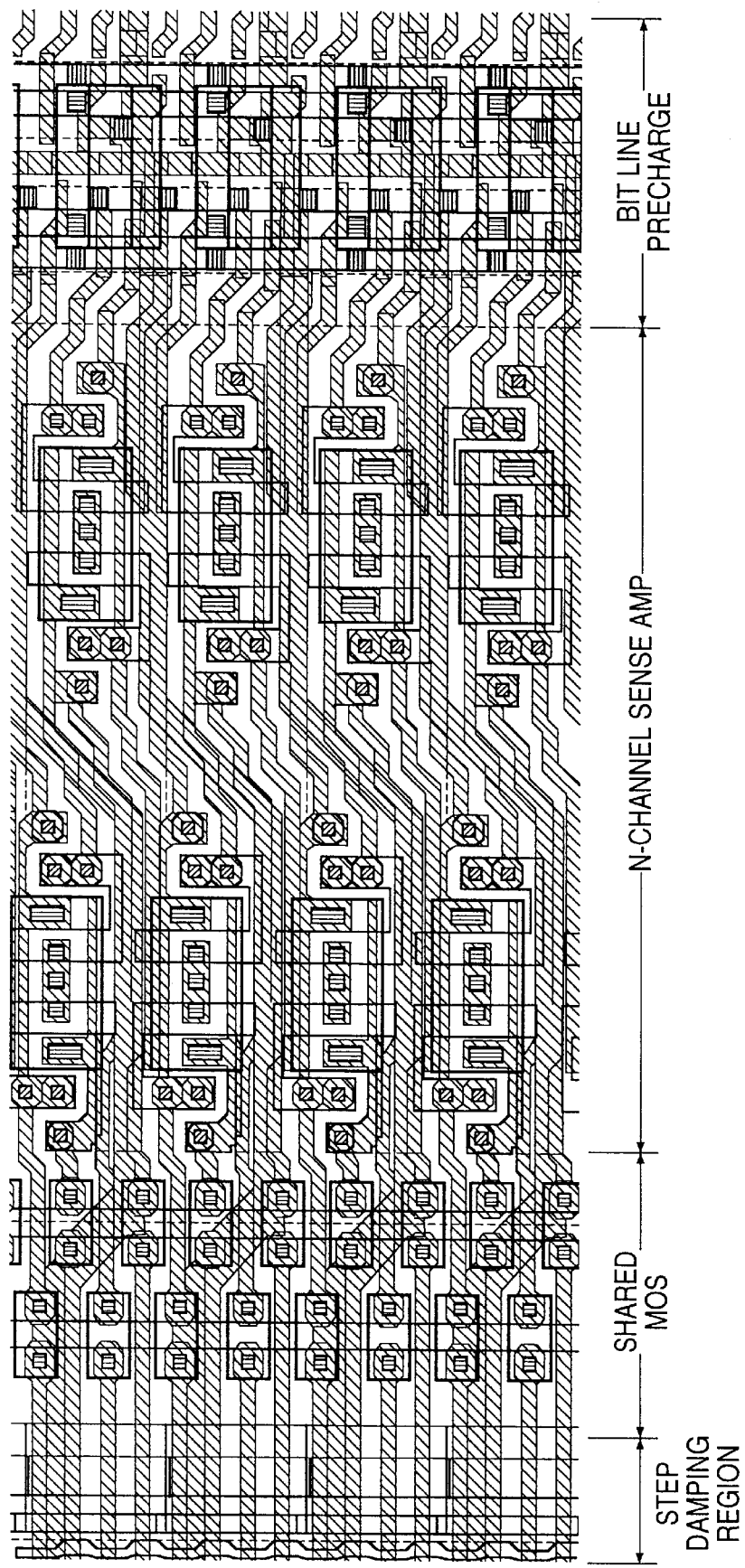

FIGS. 97 to 99 are layouts showing one embodiment of a shared sense amplifier column and a corresponding memory cell array portion.

In FIG. 97, there are formed between the memory cell array portion at the righthand side and the shared MOSFET dummy layers 69 and 70 which constitute a step damping region extending in the longitudinal direction. In case the stacked memory cell is used as in this embodiment, the step damping region has its memory cell array raised by about 1 microns from the remaining peripheral circuit. As a result, the step between the memory cell array portion and the peripheral circuit portion becomes so steep as to make it difficult to work the wiring layers and to open the contact holes in the vicinity of the step.

Figure 100:
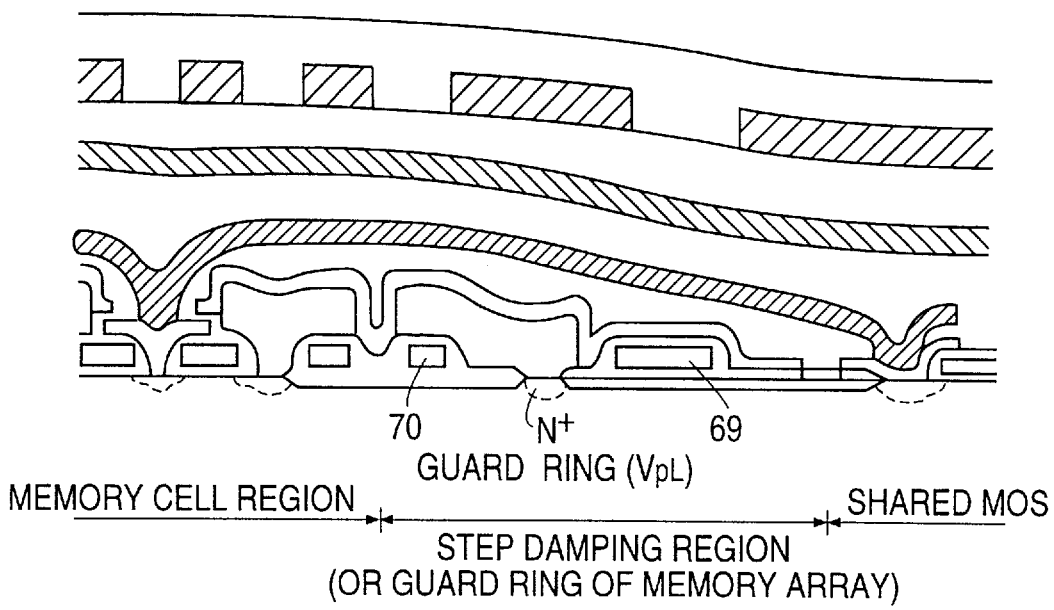
FIG. 100 is a section showing the step damping region.

As shown in the same Figure, the first polysilicon layer 69 to be formed simultaneously with the gate electrode of the MOSFET and the step damping word line 70 are formed as dummy layers. In this structure, as is apparent from the section of FIG. 100, the step between the memory cell array portion and the peripheral circuit portion can be made gentle by forming the aforementioned dummy layers.

In this embodiment, moreover, the step damping region is utilized and formed with an N$^+$-type diffusion layer so that the guard ring function of the memory cell array portion is given by supplying the voltage VDL. As a result, the minority carriers, which are generated by the operations at the peripheral circuit side, can be prevented from reaching the memory cell array portions and being coupled to the stored charges so that the holding time period is not shortened.

FIG. 98 is a pattern diagram showing the P-channel MOSFET constituting a Y-gate (i.e., the column switch MOSFET) arranged at the lefthand side of FIG. 97 and the sense amplifier. FIG. 99 is a pattern diagram showing a bit line precharge MOSFET arranged at a lefthand side, an N-channel MOSFET constituting the sense amplifier, a shared MOSFET and a memory cell array at the lefthand side. Thus, the step damping region is formed between the lefthand memory cell array portion and the shared MOSFET.

In FIGS. 97 to 99, reference numeral 61 designates a bit line which is made of polysilicide and arranged to extend in the transverse direction. Numeral 62 designates a column selection which is made of a first metal layer extending in the transverse direction like the foregoing embodiment. Numeral 63 designates a word line which is made of a polysilicon layer and shunted by a second metal layer 68 formed thereover. This word line is arranged to extend in the longitudinal direction, as shown. Numeral 64 designates an address selection MOSFET constituting a memory cell. A memory capacitor is omitted so as to avoid the complicatedness of the pattern. Numeral 65 is a bit line contact which is formed with the pad contact like the foregoing embodiment. Numeral 66 designates a diffusion layer. Numeral 67 designates an input/output line I/O which is made of a second metal layer like the word shunt and arranged to extend in the longitudinal direction, as shown in the same Figure.

By making use of the step damping region, moreover, the polysilicon constituting the gate of the shared MOSFET is shunted to drop the substantial resistance thereby to form the second metal layer for speeding up the operations.

FIGS. 101 to 108 are pattern diagrams showing one embodiment of the memory cell array portion in the direction of the word lines and the corresponding peripheral circuit.

Figure 101:
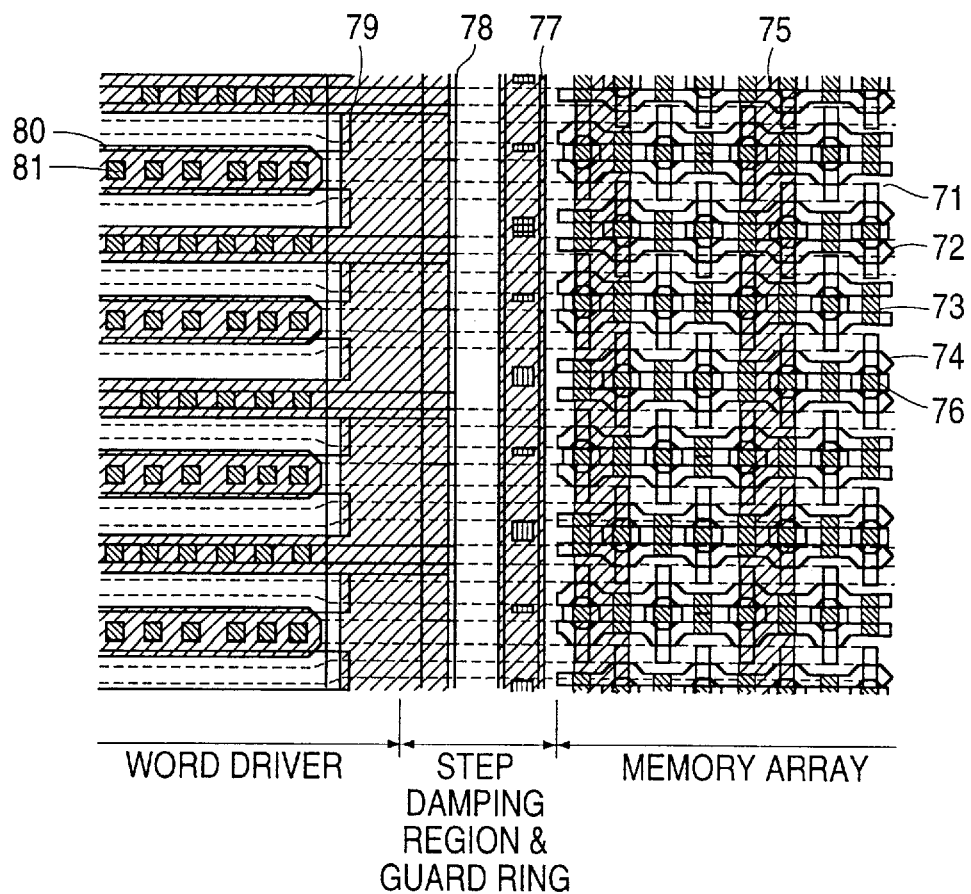
FIG. 101 is a pattern diagram showing one embodiment of the memory cell array in the word line direction and the corresponding word driver.
Figure 102:
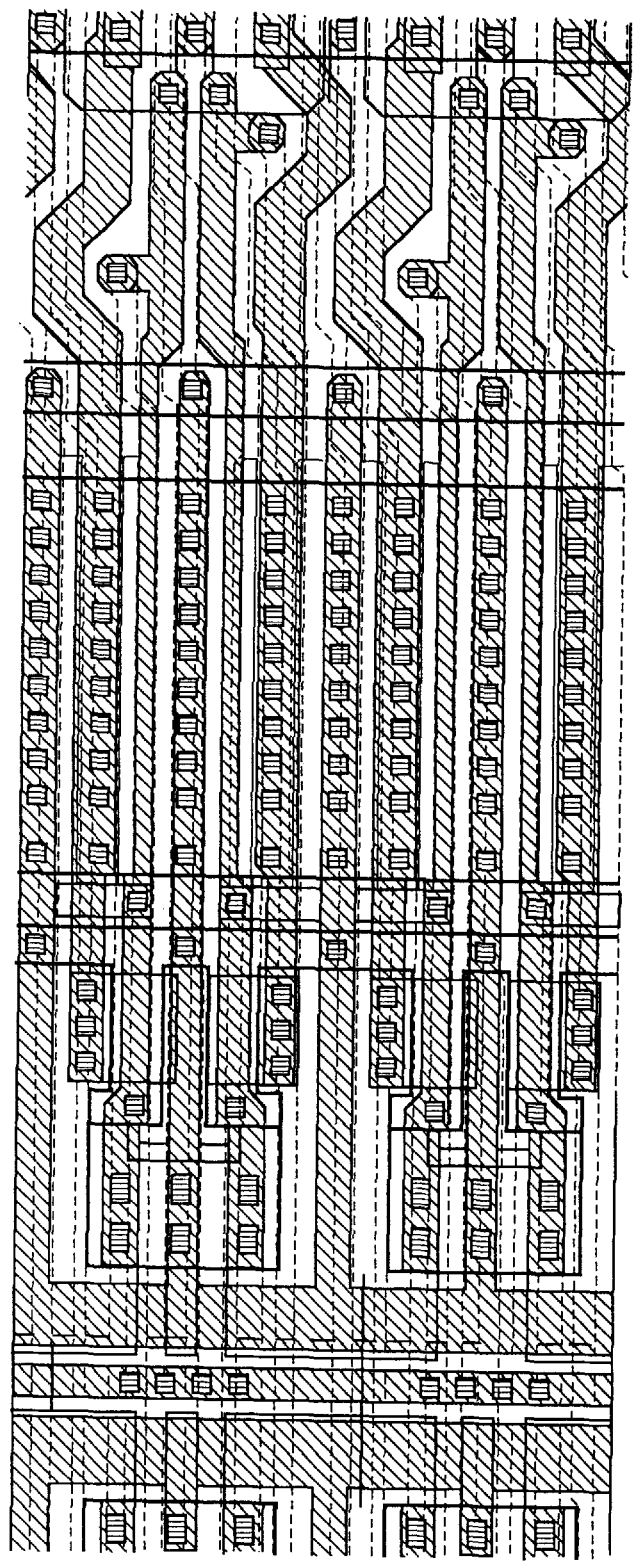
FIGS. 102 to 105 are pattern diagrams each showing one embodiment of the corresponding word drivers.
Figure 103:
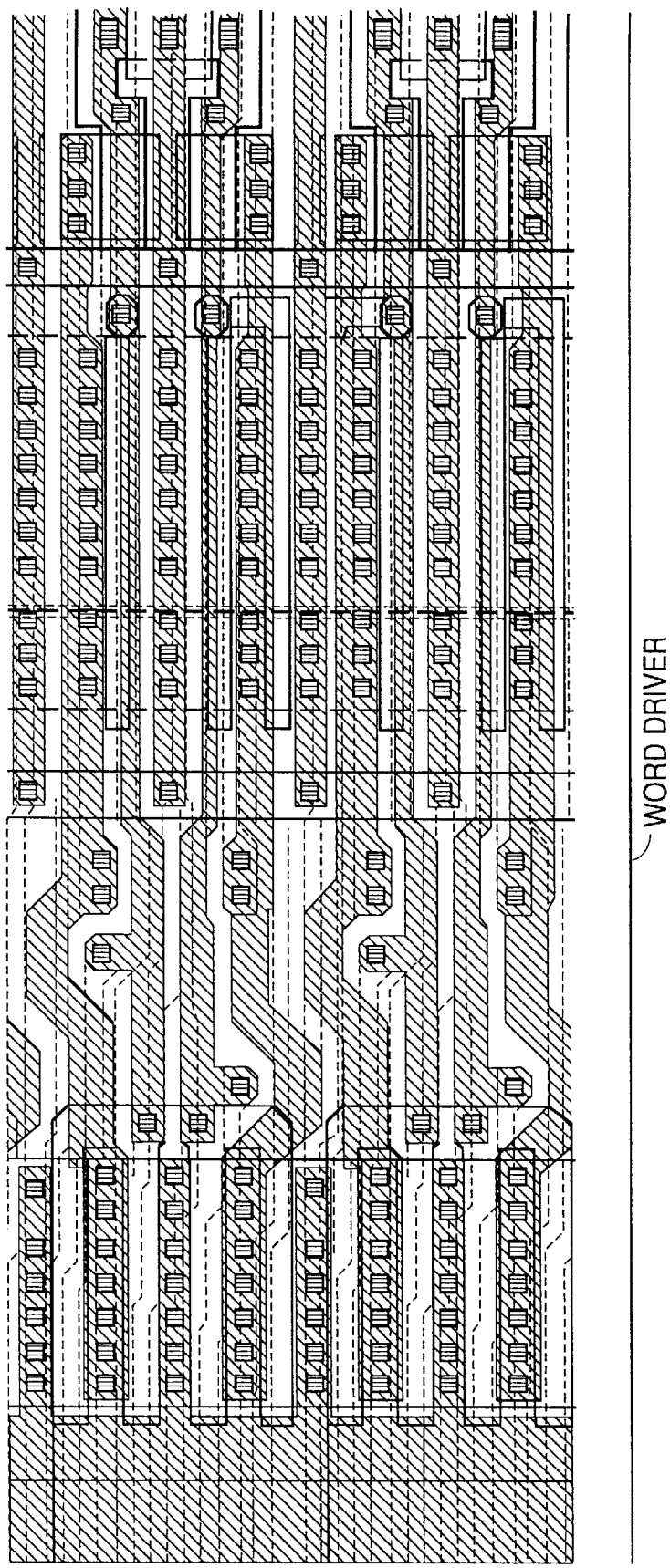
Figure 104:
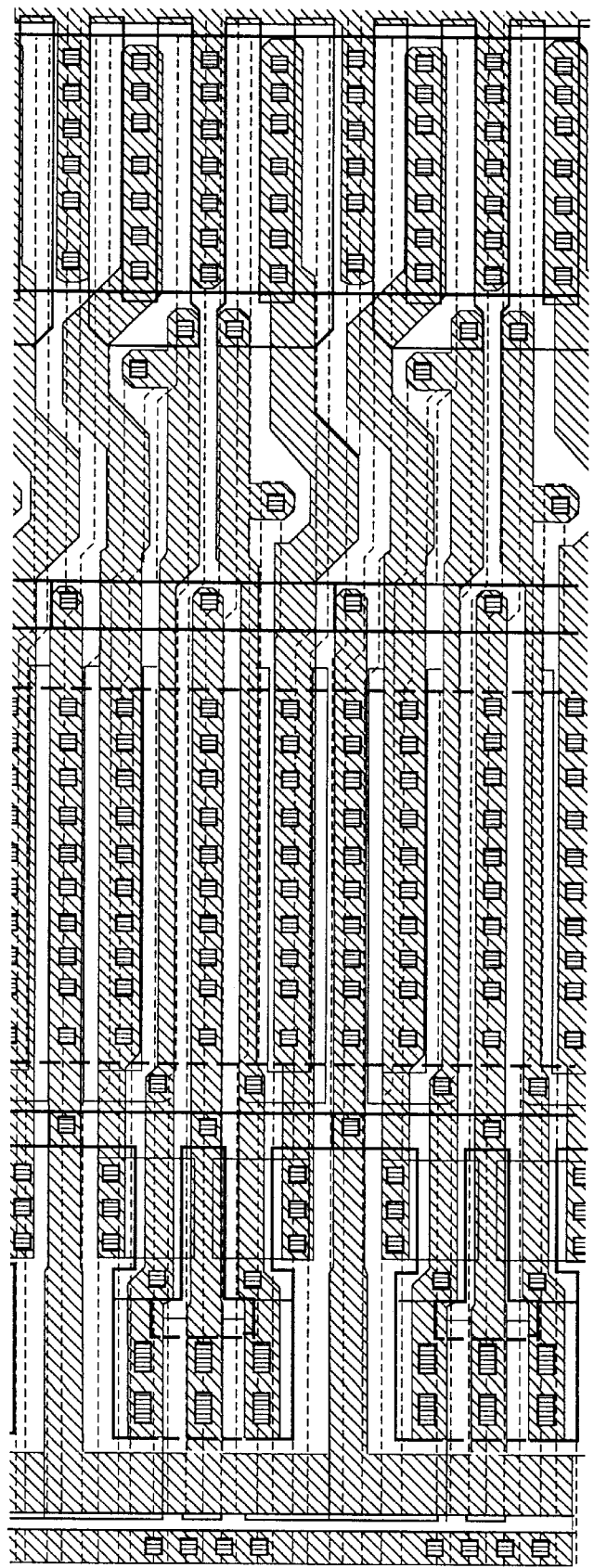

In FIG. 101, the aforementioned step damping region is formed at the lefthand side of the memory cell array. For this step damping, there is formed a dummy polysilicon wiring line 78. The substrate surface is formed below the step damping region with a guard ring diffusion layer of memory cell array and a wiring layer for applying the bias voltage VDL.

In the memory cell array, reference numeral 71 designates a diffusion layer, and numeral 72 designates a word line made of a polysilicon layer. From the same Figure, the pattern of the capacitor is omitted. Numeral 73 designates a bit line which is made of the aforementioned polysilicide. Numeral 74 designates a second metal layer for word shunting. Numeral 75 designates a column selection line which is made of a first metal layer. Numeral 76 designates a bit line contact which is made of the aforementioned pad contact.

At the lefthand side of the memory cell array portion, there is formed across the step damping region a word driver. In this word driver, reference numeral 79 designates the gate of a word driver MOSFET, and numeral 80 deisgnates the output side first metal layer which is connected with the word line of the driver MOSFET. Numeral 81 deisgnates contacts to be connected with the source and drain diffusion layers of the MOSFET. The whole word driver is arranged to extend leftward in the order of FIGS. 102 to 105 from the lefthand side of FIG. 101.

Figure 105:
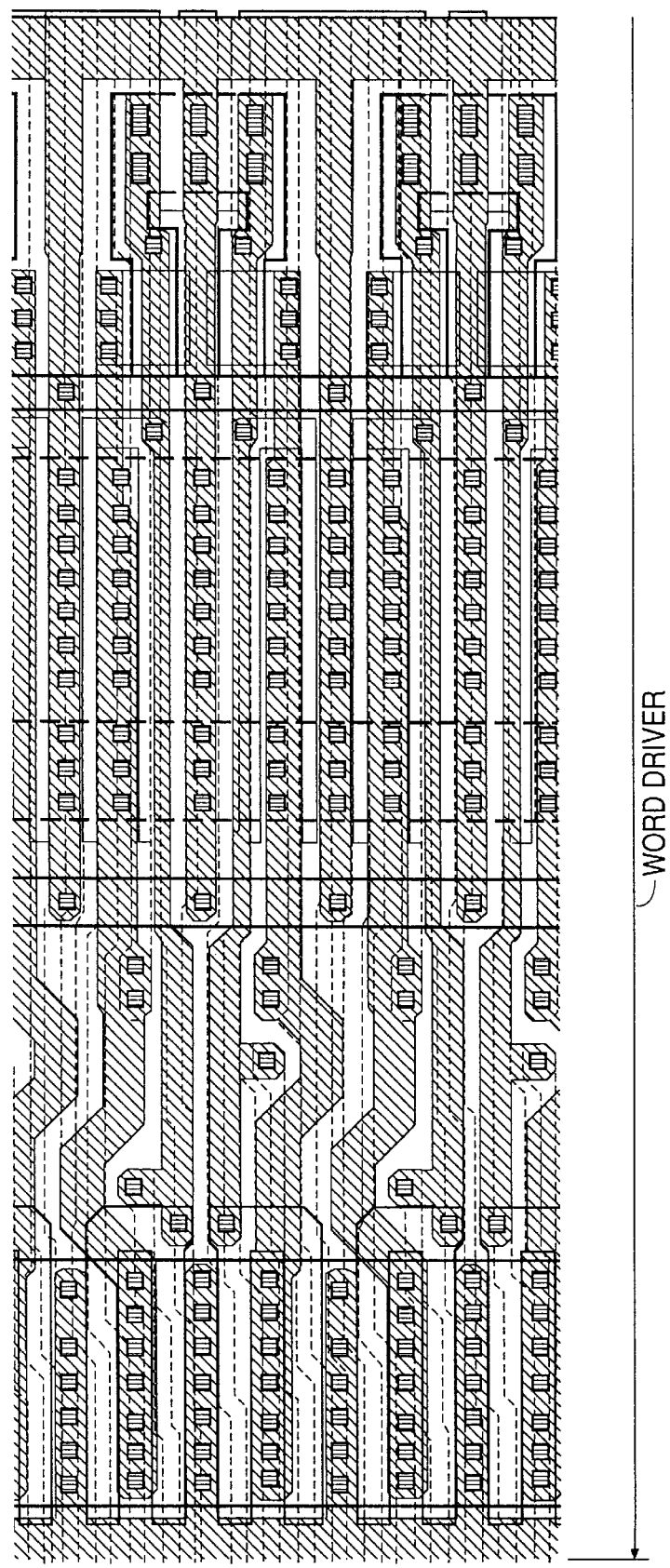
Figure 106:
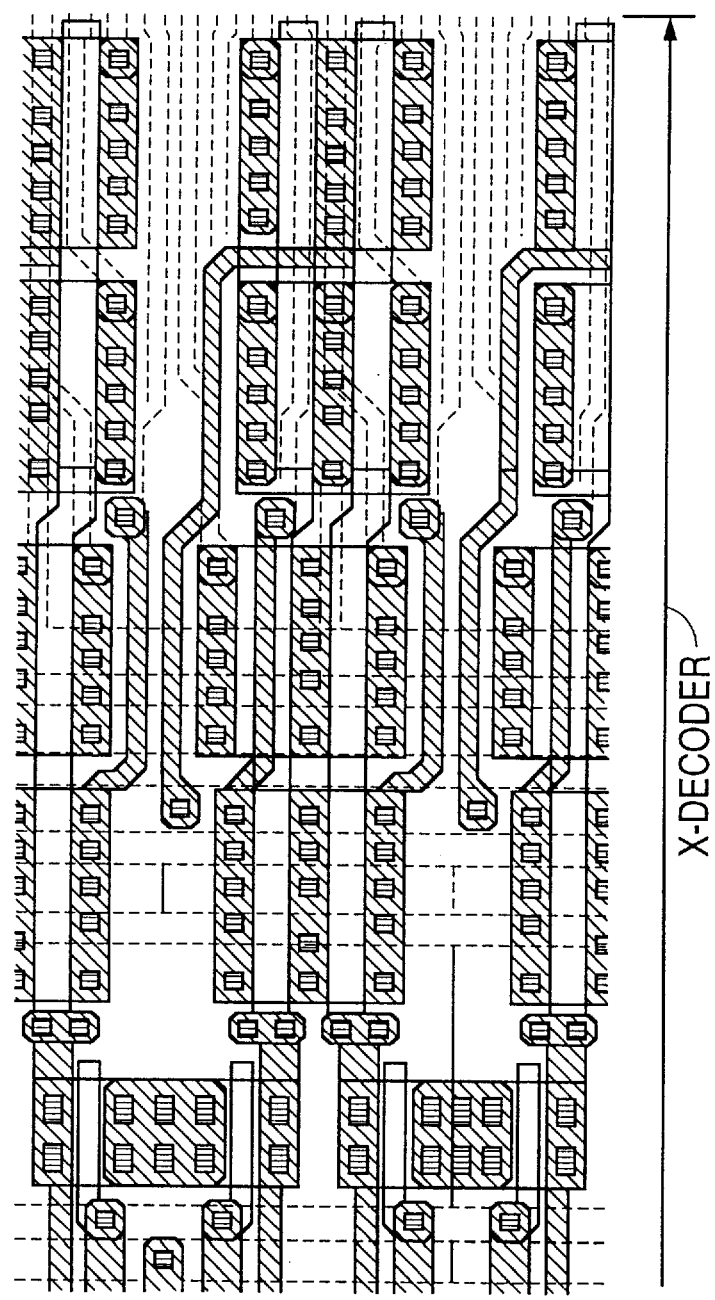
FIGS. 106 and 107 are pattern diagrams each showing one embodiment of the corresponding X-decoder.
Figure 107:
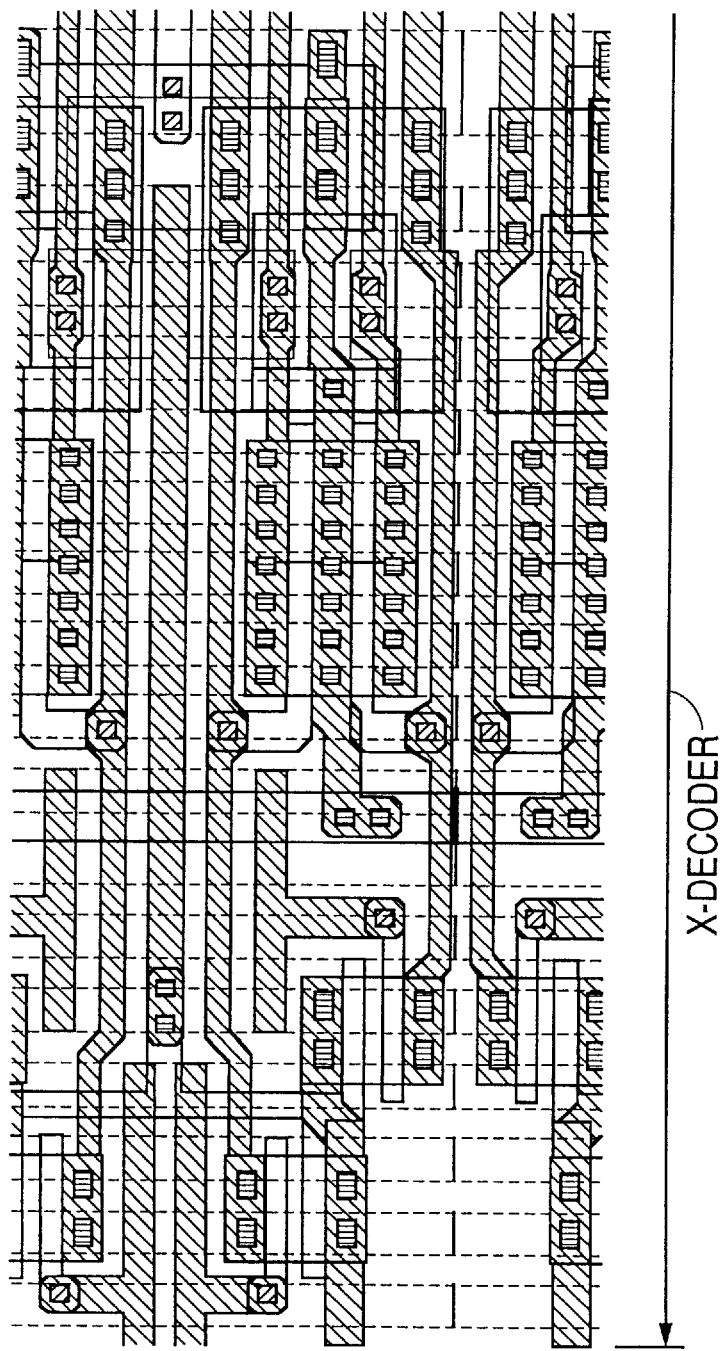

At the lefthand side of the aforementioned word driver shown in FIG. 105, there is arranged an X-decoder which extends leftward, as shown in FIGS. 106 and 107.

Figure 108:
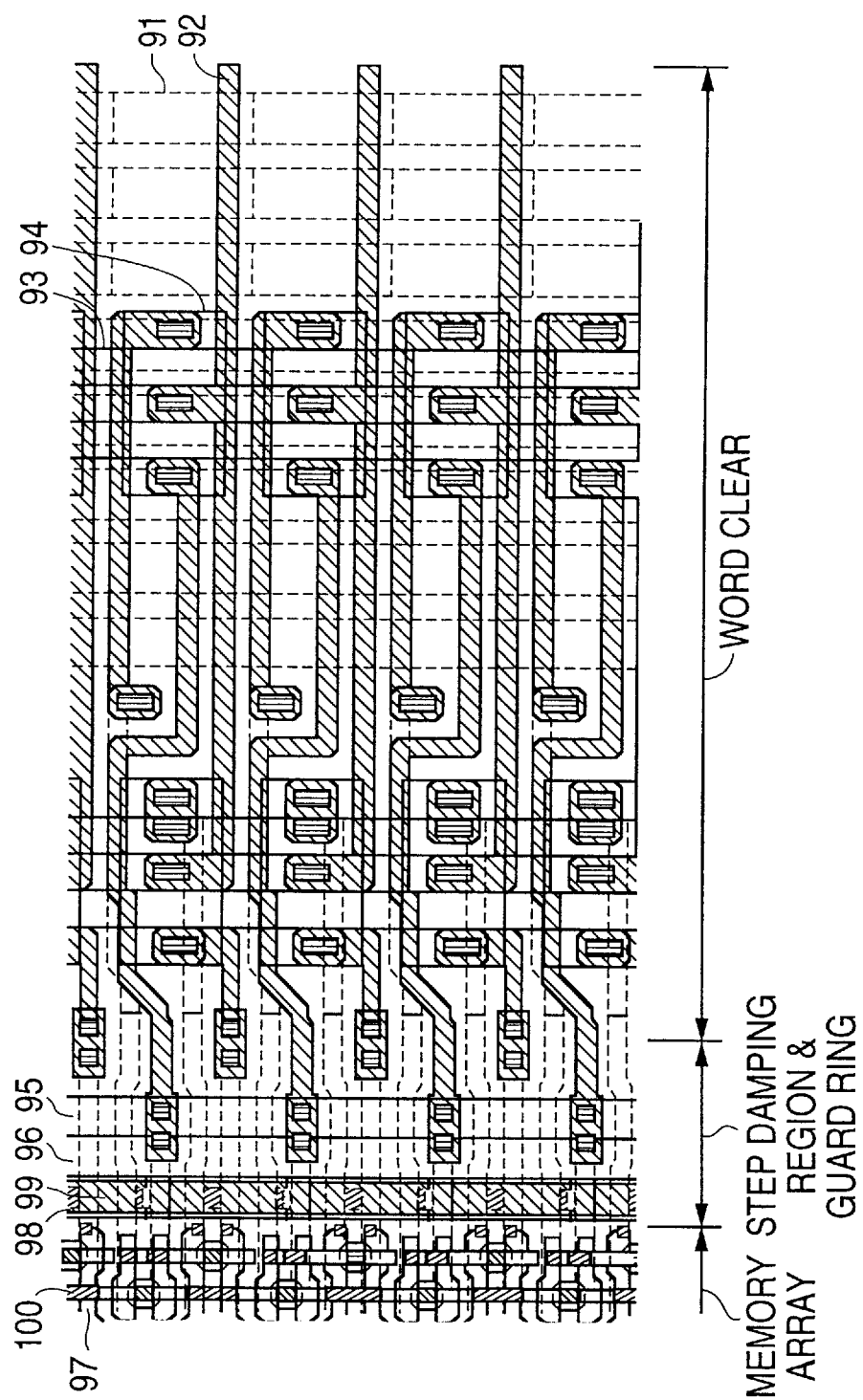
FIG. 108 is a pattern diagram showing one embodiment of the memory cell array in the word line direction and the word clear circuit.

In FIG. 108, there is shown a pattern diagram of one embodiment of the word clear circuit disposed at the righthand side of the memory cell array portion shown in FIG. 101, i.e., at the other end of the word line, with which is connected the output of the word driver.

In the same Figure, too, there is formed between the righthand end of the memory cell array portion and the word clear circuit a step damping region which is similar to the aforementioned one. This region is formed with a step damping wiring (polysilicon) and guard ring shunt 99.

In the same Figure, reference numeral 91 designates a word clear signal line which is formed of a second metal layer. Numeral 92 designates a ground line which is formed of a first metal layer. Numeral 93 designates a gate of the word clear, which is made of a polysilicon layer. Numeral 94 designates a diffusion layer. Numeral 95 designates a step damping dummy polysilicon layer. Numeral 96 designates a word line shunting layer which is formed of a second metal layer. Numeral 97 designates a word line made of polysilicon. Numeral 100 designates a bit line made of polysilicide. On the other hand, black squares designate contact portions.

The operational effects obtained from the embodiments thus far described are as follows:

(1) The semiconductor chip is arranged with the peripheral circuits in a cross area composed of the longitudinal center portions and the transverse center portions, and memory arrays are arranged in the four regions which are divided by the cross area. In this structure, the longest signal transmission pass can be shortened to about one half of the chip size in accordance with the arrangement of the chip center portion with the peripheral circuit, so that the DRAM intended to have a large storage capacity can be speeded up. If, moreover, the cross area is formed for the two regions which are bisected by the longitudinal center line of the semiconductor chip thereby to adopt the aforementioned layout, there can be attained a better effect that the storage capacity and the operating speed can be further improved.

(2) The edges of the cross area contacting with the memory arrays are arranged with X-decoders and Y-decoders so that the signal transmission passes to be formed in the cross area for the address buffers and the predecoders can be shortened. As a result, there can be effected a rational layout and a high speed.

(3) The regions of the longitudinal or transverse center portion of said cross area, which are interposed between the X-decoders, are arranged with at least one of a main amplifier, a common source switch circuit, a sense amplifier control signal generator and a mat selection control circuit. As a result, the peripheral circuits arranged in the cross area, which correspond to the X-decoders, the sense amplifiers, and the input/output lines I/O, can be disposed in their vicinities to rationalize the layouts of memory cell selection circuits and the storage information transmission passes so that the high integration and the high speed can be attained.

(4) The regions of the longitudinal or transverse center portion of said cross area, which are interposed between the Y-decoders, are arranged with at least one of an address buffer, a control logic circuit corresponding to a control signal, and a defect relief circuit. According to this structure, a rational layout according to the signal transmission pass can be realized to speed up the operations.

(5) The center portion of said cross area, where the longitudinal and transverse center portions are superposed, is arranged with at least one of at least the final driver circuit of a decoder inputting address signal generator and a power generator to be used inside. As a result, for the X- and Y-decoders for selecting the word lines and column selection lines, their input signals are transmitted four ways from the center of the chip. Thus, the signal transmission passes are divided and shortened, and the loads are shared and lightened so that the high-speed operations can be realized.

(6) Those circuits of the peripheral circuits, which may probably inject minority carriers into a substrate on principle, are arranged on two center lines of the cross area or their vicinities. While retaining the high-speed operations by arranging the peripheral circuits at the center of the chip, the influences of the minority carriers upon the memory cell array portions can be minimized.

(7) The memory arrays formed in the four quartered areas of said cross area are constructed of a block of plural memory mats at a unit having the same size as includes the sense amplifiers. Thanks to this structure, the mat selecting operations by the addresses of higher order are added to the selecting operations of the memory cells in the mat so that the selecting operations can be divided into two stages so that the decoder can be accordingly divided. As a result, there can be attained an effect that the loads upon the decode signal can be lightened to speed up the operations.

(8) The memory arrays formed in the four quartered areas of said cross area are arranged with at least X-decoders or Y-decoders in a manner to divide each of the memory arrays. As a result, the word lines or column selection lines can be shortened accordingly as they are substantially divided by the decoders, so that the memory cells can be selected at a high speed.

(9) Each unit memory mat includes a control circuit for generating a variety of timing signals for the memory cell selections on the basis of a mat selection signal. As a result, the time-series operation sequence can be executed in the memory mat with the optimized timing. In the DRAM of large storage capacity composed of a number of memory blocks, the timing margin between the different memory blocks need not be taken so that the fast memory access and the increaed operation margin can be attained. Moreover, the number of operating memory mats can be easily changed to facilitate the development of kinds (i.e., to drop the power).

(10) Two adjacent ones of the unit memory mats are paired to form one sub-block which is equipped with a control circuit for controlling the memory mats. In this structure, one memory mat can be selected in the sub-block so that the control circuit can be used commonly for the plural memory mats to increase the high integration and speed up the operations.

(11) A pair of axially symmetric sub-blocks are used to construct said unit memory mat. As a result, the control circuit can be used commonly for more memory mats to increase the high integration and speed up the operations.

(12) The control circuit is activated by the mat selection signal, the sub-block selection signal or the block selection signal. As a result, the wasteful current consumption at the unselected mat or sub-block can be suppressed to drop the power consumption.

(13) The control circuit controls at least one of the precharge of complementary data lines, the activation of sense amplifiers, the control of shared sense amplifiers, the activation of X-decoders, the activation of Y-decoders, the activation of word drivers, the selection of common input/output lines, the selection of main amplifiers, and the activation of main amplifiers. As a result, the operation sequence control in the mat can be otptimized.

(14) The unit memory mats are fed with selection signals for selecting word lines and complementary data lines belonging thereto. In this structure, the selection signals are formed by the pre-decode circuit so that the decoder circuit can be rationally divided.

(15) The circuits for generating the selection signals for selecting the word lines or complementary data lines belonging to said unit memory mats are provided commonly for the plural memory mats or sub-blocks. As a result, the excess handling of the mat control signals can be eliminated to drop the power and speed up the operations.

(16) The selection signals of said memory mats or memory blocks are generated by decoding the address signals inputted through an address buffer especially therefor. Thanks to this structure, the address signal for forming the mat selection signals can be separated from the relatively large load capacities such as the numerous address comparators disposed in the redundancy circuit, so that the operation can be speeded up and so that the mat selections can be accomplished prior to the selections of the memory cell arrays.

(17) Said cross area is arranged in its region with a portion or all of bonding pads. As a result, the signals can be exchanged from the center portion of the chip the signal transmission passes are extended four ways from the chip center portion to the periphery. Despite of the large size of the chip, however, the signal transmission passes can be shortened to speed up the operations.

(18) All of said bonding pads are zigzag arrayed in two rows in the longitudinal center portion of said cross area. As a result, the numerous bonding pads can be efficiently arranged for the high integration.

(19) The bonding pads arrayed in the longitudinal center portion of said cross area are bonded to an LOC lead frame. As a result, this lead frame can be formed into a portion of the wiring for the power supply pad, and the bonding pads can be disposed in the vicinity of the input circuit to improve the level margin and speed up the operations.

(20) Those of bonding pads, which are used for applying the power voltage of the circuit and the ground potential, are arranged at a suitable spacing according to circuit blocks requiring them and are connected to the common LOC lead frame to be fed with the power voltage of the circuit and the ground potential. As a result, the level of the noises accompanying the circuit operations can be suppressed to improve the operation margin.

(21) Those of said bonding pads for applying the ground potential are disposed in plurality along the chip distribution of the sense amplifier rows to be activated. As a result, the relatively high currents by the amplifications of the sense amplifiers are fed from the corresponding pads so that the level of the noises generated in the potential voltage of another circuit can be suppressed at a low level to enlarge the operation margin.

(22) The cross area of a semiconductor chip composed of a longitudinal center portion and a transverse center portion is arranged with peripheral circuits and bonding pads, and the four regions quartered by said cross area are arranged with memory arrays. Moreover, said semiconductor chip has its four corners stepped. As a result, the stress coming from the mold resin at the corners of the chip can be prevented from being applied directly to the memory cell portions.

(23) The steps formed in the four corners of said semiconductor chip are constructed by stacking the wiring layers which are formed by the same step as that for said memory arrays. The stress to be applied to the chip from the mold resin can be dispersed without adding the production step.

(24) The cross area of a semiconductor chip composed of a longitudinal center portion and a transverse center portion is arranged with peripheral circuits. The four regions quartered by said cross area area arranged with memory arrays. Said semiconductor chip has its outermost periphery arranged with a highly doped diffusion layer of the same conductivity type, which is to be fed with a substrate back bias voltage. Said semiconductor chip further has its inside arranged with a guard ring which is made of a diffusion layer of the polarity opposite to that of said substrate and which is to be fed with the power voltage. Thanks to this structure, it is possible to prevent the undesired noises from stealing into the memory array portions.

(25) The semiconductor memory device is constructed to comprise an internal drop voltage generator made operative in response to the power voltage fed from an external terminal and including one or more impedance converting output buffers made receptive of a reference voltage prepared by a reference voltage generator. Thanks to this structure, it is possible to drop the operation voltage according to the drop of the breakdown voltage accompanying the finer structure of the element and to drop the power consumption by the drop of the operation voltage. Since, moreover, the drop voltage is generated by the constant reference voltage, the operations of the internal circuit can be stabilized because they are freed from the influences of the fluctuations of the external power voltage.

(26) Said internal drop voltage generator is provided for each of a memory array operating voltage and a peripheral circuit operating voltage. As a result, it is possible to prevent the noises from being generated by the circuit operations.

(27) The drop voltage to be generated by said internal drop voltage generator is set at a level twice as high as the logic threshold voltage of an input buffer circuit to be fed therewith. As a result, the operation voltage can be effectively utilized to enlarge the input level margin.

(28) The output buffer for said impedance conversion has an output circuit made of the CMOS structure and is given a function to output the power voltage selectively through the power voltage side P-channel one of said output MOSFETs. Without any circuit being added, therefore, there can be attained a function to switch the internal operation valtage to the power voltage fed from the outside. This voltage switching function can be utilized for the aging.

(29) An internal drop voltage generator is made operative in response to a power voltage fed from an external terminal for generating an operating voltage of an internal circuit, and a level conversion circuit converts the output signal formed by said internal circuit to a signal level corresponding to the power voltage fed from said external terminal. The output MOSFET of the source follower type has its gate fed with the signal to be outputted through said level conversion circuit. In this structure, not only the level amplitude of the output signal but also the amplitude of the drive signal can be increased to speed up the operations.

(30) The output circuit including the output MOSFET of the source follower type is constructed such that the output MOSFET, which is made receptive of the signal formed by said internal circuit as it is, is disposed in parallel with the output MOSFET made receptive of the signal through said level conversion circuit. As a result, the covnersion of the output signal can be started at a relatively quick timing so that the signal conversion can be linearly accomplished for a relatively long time. Thus, it is possible to drop the level of the noises made on the power line or ground line when the output signal is converted, without sacrificing the output operation speed.

(31) The drop voltage generated by the internal drop voltage generator is selectively outputted, in the output high impedance state of a data output buffer in a test mode, from the output terminal of the data output buffer through a switch MOSFET to be switched by a signal at the bootstrap voltage or external power voltage level. As a result, whether or not the internal power circuit is normally operating can be monitored to retain the high reliability.

(32) The selection signal of word lines or shared sense amplifiers is formed by a selection circuit which is to be operated by a high voltage generated by boosting the internal drop voltage. As a result, the boost voltage can be stabilized without being influenced by the external power, and the selections of the word lines can be speeded up.

(33) The memory cell arrays are arranged symmetrically with respect to the main amplifier, and the main amplifier is selectively connected with the input/output lines of the paired memory cell arrays through a switch MOSFET to be switched in accordance with the selections of the paired memory cell arrays. Thanks to this structure, the number of the main amplifiers can be reduced, and the substantial wiring length of the input/output lines can be shortened to speed up the operations.

(34) Said memory cell arrays adopt shared sense amplifiers having sense amplifiers arranged at the center portion of the pair of its bisected data lines, and four pairs of input/output lines corresponding to the data line pairs divided by said sense amplifiers are connected with said main amplifiers through the switch MOSFET which is to be switched to correspond to the selections of said memory cell arrays. In this structure, the data line length of the shared sense amplifiers can be shortened, and the input/output lines can be accordingly divided to halve the wiring capacity of the input/output lines so that the operations can be speeded up.

(35) Said memory cell arrays are said unit memory mats. As a result, the number of the main amplifiers can be reduced, and the wiring length of the input/output lines coupled thereto can be shortened to realize the high-speed operations.

(36) The latch circuit is provided for latching a selection signal for word lines in response to a control signal so that a word line drive signal may be formed by the output signal of said latch circuit. As a result, the word lines can be sequentially selected in a multiplex manner so that the aging can be efficiently accomplished.

(37) Shared sense amplifiers are given an operation mode for connecting both selected/unselected data lines. As a result, the signal amount from the memory cell is reduced to one half as the capacity of the complementary data lines is doubled, so that the margin test of the signal amount can be easily executed.

(38) There is provided in a function setting mode a function to set the state of an internal circuit at a voltage or delay time corresponding to a digital signal which has a plurality of bits and which is inputted from an address terminal of plural bits. As a result, the internal operation voltage and the signal delay can be easily changed to accomplish the internal test efficiently.

(39) There is provided a refresh address counter circuit which has an additional resetting or initial value setting function in response to predetermined external control signal. As a result, the refresh operations can be utilized for address selections of the multiple selections and the various read/write testing address selections.

(40) An internal power voltage generator is provided for forming a voltage for operating an internal circuit and having a power monitor function to compare a voltage based upon the internal voltage and a voltage given from the outside to output a binary signal of the compared result. Thanks to this structure, the internal operation voltage can be monitored in high precision.

(41) At least one of the pull-up MOSFET of CMOS structure composed of the sense amplifier, the initial-step circuit of the main amplifier and the input/output lines, the short MOSFET composed of the complementary data lines and the complementary input/output lines, and the MOSFET of diode mode constituting the charge pump circuit is caused to have a low threshold voltage. As a result, the operations can be speeded up.

(42) At least one of a column switch MOSFET, a MOSFET constituting a sense amplifier, a precharge MOSFET, a shorting MOSFET, a word line driving MOSFET, and a MOSFET for cutting shared sense amplifiers has its source and drain contact made of a pad contact similar to the source and drain contact of a memory cell address selecting MOSFET. As a result, like the memory cell, the self-alignment technology can be utilized as the source-drain contacts so that these source-drain regions can be minimized, as necessary. Thus, the high integration and the low parasitic capacity can be achieved to speed up the operations.

(43) The cross portion of the bit line cross type makes use of the first metal wiring layer formed over the wiring layer forming the bit lines so that the wiring lines constituting the cross portion can be eliminated but that the equalities of the surfacing capacitor and the MOSFET are not adversely affected.

(44) The first metal wiring layer also forms the column selection lines, one of which is formed to correspond two pairs of bit lines and folded to overlap from one to other bit line pair at portion different from the cross portion of the bit lines. Any special cross wiring region is not required, but the parasitic capacity between the column selection lines and the bit lines can be equalized.

(45) A step damping region made of a dummy wiring layer is formed between a memory cell array portion of laminated type and a peripheral circuit. As a result, it is easy to treat the wiring lines.

(46) Said step damping region is formed therebelow with a guard ring so that the characteristics can be stabilized.

(47) There is constructed the memory array of a block which is composed of plurality units of memory mats having the same size and including sense amplifiers; forming redundancy word lines and/or redundancy data lines for each of said memory mats. The redundancy decoders of a number smaller than the total number of the redundancy word and/or data lines of all of said memory mats and larger than the total number of the redundancy word and/or data lines of each of said memory mats are formed so that they may be used for each of said memory mats or commonly for said memory mats. As a result, teh circuit scale necessary for defect remedy can be reduced to raise the integration and reduce the power consumption.

(48) Said redundancy decoder includes a defect address memory circuit and an address comparator and is arranged in proximity to corresponding X- and Y-address buffers. As a result, the signal transmission passes can be made the shortest to speed up the operations and effect the high integration.

(49) The preparatory word lines and/or preparatory column selection lines wired to intersect a plurality of word lines and/or column selection lines, respectively, are formed at the output of a word line or column selector. The word lines and/or the output lines of the column selector are cut by physical means, when a word line and/or a data line are defective, from the column selection lines corresponding to the defective word line and/or the defective data line and are connected with the preparatory word lines and/or the preparatory column selection lines. In this structure, the memory circuit and comparator circuit for the defective address can be eliminated to increase the integration and drop the power consumption.

(50) When in the multi-bit simultaneous testing mode by the multiplex selection of the column system, only the defective data or column selection line of the data lines or column selection lines is switched to a redundancy data line or a redundancy column selection in a manner to correspond to the memory cell array divided into a plurality of memory blocks. As a result, the number of the redundancy data lines or YS lines to be prepared can be reduced while shortening the test time resorting to the aforementioned multi-bit simultaneous testing function.

(51) The data lines are divided into a plurality of blocks by one of a specific-bit of the address signals of the row and/or column systems, a block address prepared inside, or the combination of the address signal and the block address, and a defective data line in a defective block only is switched to a redundancy data line by making use of a signal designating the block. Thus, the number of the redundancy data lines or YS lines to be prepared can be reduced.

(52) The word lines are divided into a plurality of blocks by assigning block addresses formed in the row system and/or inside, so that the defective word line may be switched to a redundancy word line only in the block having the defective word line by making use of a signal designating said block. Thus, the number of the redundancy word lines to be prepared can be reduced.

(53) Said block address is designated by the same program means as that for programming the defective address so that the program can be simplified.

Although our invention has been specifically described hereinbefore in connection with the embodiments thereof, it should not be limited to those embodiments but could naturally be modified in various manners without departing from the gist thereof. For example, the storage capacity of the dynamic RAM should not be limited to the aforementioned value of 16 Mbits but might be 4 Mbits or less or 64 Mbits or more. Moreover, there may be used the non-multi system, in which the X- and Y-addresses are fed as the address inputs from independent terminals, so that the storage capacity may be accordingly at about 8 Mbits or 24 Mbits.

The present invention can be applied widely to the semiconductor memory device having the aforementioned large storage capacity.

The effects obtainable from the representative of the invention disclosed herein will be briefly described in the following. Specifically, the semiconductor chip is arranged with the peripheral circuits in a cross area composed of the longitudinal center portions and the transverse center portions, and memory arrays are arranged in the four regions which are divided by the cross area. In this structure, the longest signal transmission pass can be shortened to about one half of the chip size in accordance with the arrangement of the chip center portion with the peripheral circuit, so that the DRAM intended to have a large storage capacity can be speeded up. The memory arrays formed in the four quartered areas of said cross area are constructed of a block of plural memory mats at a unit having the same size as includes the sense amplifiers. Thanks to this structure, the mat selecting operations by the addresses of higher order are added to the selecting operations of the memory cells in the mat so that the selecting operations can be divided into two stages so that the deocoder can be accordingly divided. As a result, there can be attained an effect that the loads upon the decode signal can be lightened to speed up the operations. Each unit memory mat includes a control circuit for generating a variety of timing signals for the memory cell selections on the basis of a mat selection signal. As a result, the time-series operation sequence control can be executed in the memory mat with the optimized timing so that the fast memory access and the increased operation margin can be attained. Moreover, the number of operating memory mats can be easily changed to facilitate the development of kinds. All of said bonding pads are zigzag arrayed in two rows in the longitudinal center portion of said cross area. Thus, the numerous bonding pads can be efficiently arranged and are bonded to an LOC lead frame. As a result, this lead frame can be formed into a portion of the wiring for the power supply pad, and the bonding pads can be disposed in the vicinity of the input circuit to improve the level margin and speed up the operations. The cross area of a semiconductor chip composed of a longitudinal center portion and a transverse center portion is arranged with peripheral circuits and bonding pads, and the four regions quartered by said cross area are arranged with memory arrays. At the four corners of the for regions, there are stacked the wiring layers which are formed by the same step as that for the memory array portions, so that the stress coming from the mold resin of the chip can be dispersed. The semiconductor memory device is constructed to comprise an internal drop voltage generator made operative in response to the power voltage fed from an external terminal and including one or more impedance converting output buffers made receptive of a reference voltage prepared by a reference voltage generator. Thanks to this structure, it is possible to drop the operation voltage according to the drop of the breakdown voltage accompanying the finer structure of the element and to drop the power consumption by the drop of the operation voltage. Since, moreover, the drop voltage is generated by the constant reference voltage, the operations of the internal circuit can be stabilized because they are freed from the influences of the fluctuations of the external power voltage. Said internal drop voltage generator is provided for each of a memory array operating voltage and a peripheral circuit operating voltage. As a result, it is possible to prevent the noises from being generated by the circuit operations. The drop voltage generated by the internal drop voltage generator is selectively outputted, in the output high impedance state of a data output buffer in a test mode, from the output terminal of the data output buffer through a switch MOSFET to be switched by a signal at the bootstrap voltage or external power voltage level. As a result, whether or not the internal power circuit is normally operating can be monitored to retain the high reliability. The selection signal of word lines or shared sense amplifiers is formed by a selection circuit which is to be operated by a high voltage generated by boosting the internal drop voltage. As a result, the boost voltage can be stabilized without being influenced by the external power, and the selections of the word lines can be speeded up. At least one of the pull-up MOSFET of CMOS structure composed of the sense amplifier, the initial-step circuit of the main amplifier and the input/output lines, the short MOSFET composed of the complementary data lines and the complementary input/output lines, and the MOSFET of diode mode constituting the charge pump circuit is caused to have a low threshold voltage. As a result, the operations can be speeded up. At least one of a column switch MOSFET, a MOSFET constituting a sense amplifier, a precharge MOSFET, a shorting MOSFET, a word line driving MOSFET, and a MOSFET for cutting shared sense amplifiers has its source and drain contact made of a pad contact similar to the source and drain contact of a memory cell address selecting MOSFET. As a result, like the memory cell, the self-alignment technology can be utilized as the source-drain contacts so that these source-drain regions can be minimized, as necessary. Thus, the high integration and the low parasitic capacity can be achieved to speed up the operations. The cross portion of the bit line cross type makes use of the first metal wiring layer formed over the wiring layer forming the bit lines so that the wiring lines constituting the cross portion can be eliminated but that the equalities of the surfacing capacitor and the MOSFET are not adversely affected. The first metal wiring layer also forms the column selection lines, one of which is formed to correspond two pairs of bit lines and folded to overlap from one to other bit line pair at portion different from the cross portion of the bit lines. Any special cross wiring region is not required, but the parasitic capacity between the column selection lines and the bit lines can be equalized. A step damping region made of a dummy wiring layer is formed between a memory cell array portion of laminated type and a peripheral circuit. As a result, it is easy to treat the wiring lines.

There is constructed the memory array of a block which is composed of plural units of memory mats having the same size and including sense amplifiers; forming redundancy word lines and/or redundancy data lines for each of said memory mats. The redundancy decoders of a number smaller than the total number of the redundancy word and/or data lines of all of said memory mats and larger than the total number of the redundancy word and/or data lines of each of said memory mats are formed so that they may be used for each of said memory mats or commonly for said memory mats. As a result, the circuit scale necessary for defect remedy can be reduced to raise the integration and reduce the power consumption. When in the multi-bit simultaneous testing mode by the multiplex selection of the Y-system or when the data lines or word lines are to be divided into a plurality of blocks by the address signal or the internally formed block address or their combination, only the defective block is replaced by the redundancy data line and the redundancy word line so that the number of the redundancy data lines or redundancy word lines to be prepared can be reduced.

Next, with reference to FIG. 109 to FIGS. 126(*a*) and 126(*b*), the refreshing operations of the DRAM, i.e., the refreshing system suitable for a DRAM having a large capacity of 16 Mbits or more will be described in the following in connection with the contents we have examined or devised.

For the capacity of n bits, the DRAM of the prior art is constructed to have refresh cycles in such a number of ½·V$\overline{n}$ as is necessary for refreshing the memory cells of n bits, and sense amplifiers in a number of 2·V$\overline{n}$ to be activated in one refreshing operation.

The DRAM refresh is disclosed in Japanese Patent Laid-Open No. 62-154291, for example.

The power to be consumed by the DRAM is occupied at a large ratio by the current which is used to charge or discharge the bit lines through the sense amplifiers to be activated for refreshing the memory cell. This current gets the higher for the larger capacity of the DRAM and occupies the larger ratio in the total consumed current. The rise in the power consumption increases the heat value of the chip to raise the chip temperature. This rise in the chip temperature leads to the rise in the junction temperature of the memory cell diffusion layer so that the junction leakage is increased to deteriorate the information holding characteristics of the memory cell.

In the DRAM of the prior art, for the capacity of n bits, the refresh cycle number is set at ½·V$\overline{n}$, and the number of sense amplifiers to be simultaneously activated is set at 2V$\overline{n}$. In the system in which both the row and column addresses are inputted by the address multiplex, the number of sense amplifiers to be activated for accessing predetermined memory cells may be V$\overline{n}$. If a 2V$\overline{n}$ number of sense amplifiers are activated, there arises a problem that the current consumption may be augmented. The present invention to be described hereinafter has an object to reduce the current.

This object can be achieved by setting the number of sense amplifiers to be simultaneously activated at V$\overline{n}$ or less (e.g., V$\overline{n}$, ½·V$\overline{n}$, ¼·V$\overline{n}$, ⅛·V$\overline{n}$, - - -, and so on). In other words, the number of refresh cycles is set at V$\overline{n}$ or more (e.g., V$\overline{n}$, 2V$\overline{n}$, 4V$\overline{n}$, 8V$\overline{n}$, - - -, and so on). However, such a large refresh cycle number will increase the number of refresh operations for refreshing all the memory cells within a constant time (i.e., refresh interval) thereby to drop the memory efficiency of the DRAM. In order to prevent the memory efficiency from being dropped, it is necessary to elongate the refresh interval and accordingly to improve the information holding characteristics of the memory cells. Since the information charges of the memory cells are reduced as a result of the junction leakage between the substrate and the diffusion layer, the information holding characteristics can be improved by using the memory cells of stereoscopic structure, which can reduce the junction area but does not uses the substrate as the electrode of the information charge storage capacity. Thus, the low power consumption can be achieved by increasing the aforementioned refresh cycle number.

By setting the refresh cycle number at V$\overline{n}$ or more, the number of sense amplifiers to be simultaneously activated can be reduced to V$\overline{n}$ or less. As a result, it is possible to reduce the bit line charging and discharging currents flowing through the sense amplifiers when in the refresh operation.

The present invention will be described in the following in connection with the embodiments thereof with reference to the accompanying drawings.

Figure 110:
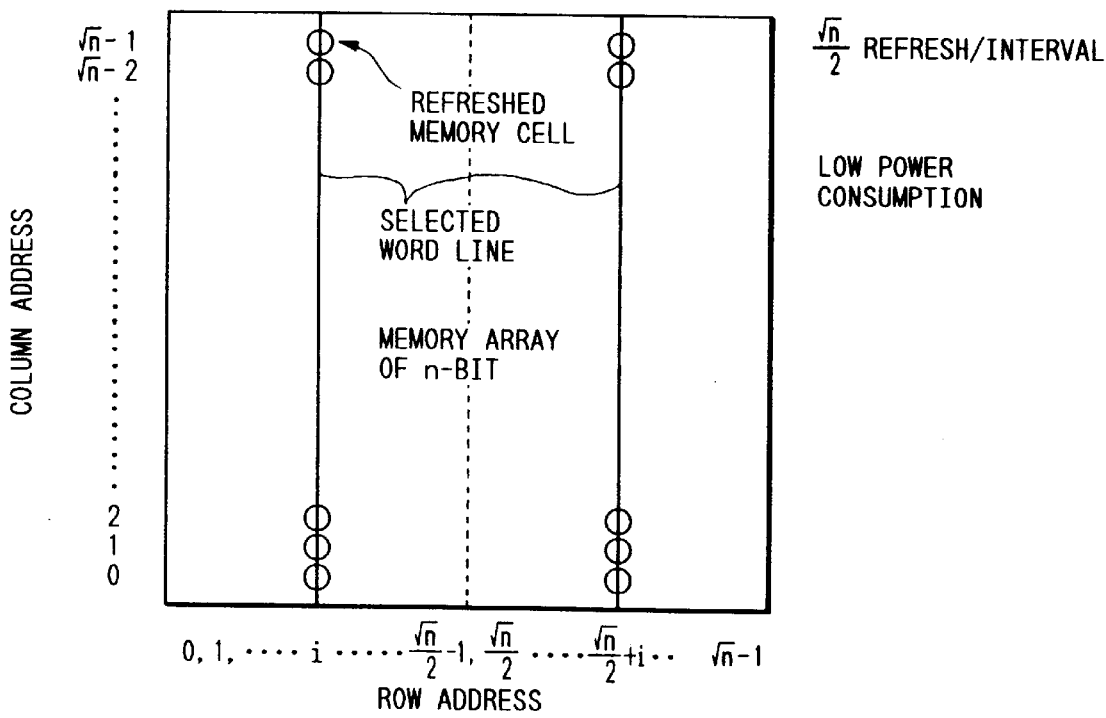
FIG. 110 is a diagram showing the system of the prior art, in which the number of resresh cycles is $\frac{1}{2}\cdot\overline{\sqrt{n}}$ whereas the number of sense amplifiers to be simultaneously activated is $2\overline{\sqrt{n}}$ for a capacity of n bits.

FIG. 110 shows the system of the prior art in which, for the capacity of n bits, the refresh cycle number is ½·V$\overline{n}$ whereas the number of sense amplifiers to be simultaneously activated is 2V$\overline{n}$. Two word lines are selected by the row addresses, and a 2V$\overline{n}$ number of memory cells to be connected therewith are refreshed. One of the two word lines is used not for accessing the memory cells but is selected for the refreshing.

Figure 109:
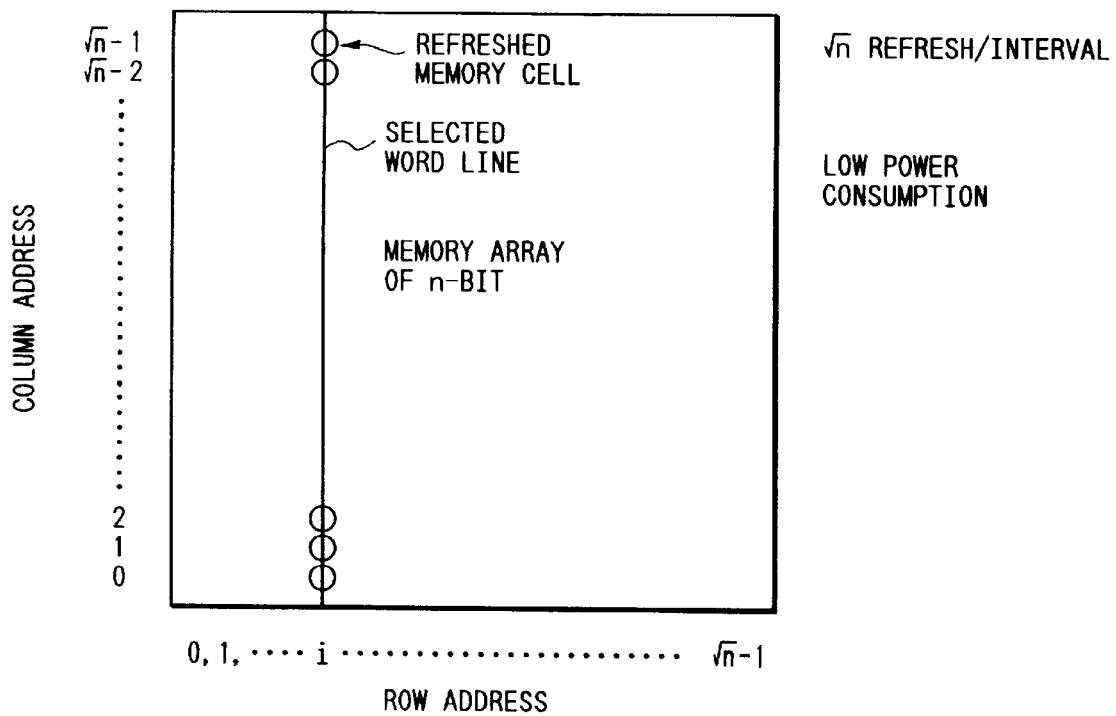
FIG. 109 is a diagram showing one embodiment of the present invention, in which the number of resresh cycles is $\overline{\sqrt{n}}$ whereas the number of sense amplifiers to be simultaneously activated is Vn for a capacity of n bits.

FIG. 109 shows one embodiment of the present invention, in which, for the capacity of n bits, the refresh cycle number is V$\overline{n}$ whereas the number of sense amplifiers to be simultaneously activated is V$\overline{n}$. One word line is selected by the row address so that an V$\overline{n}$ number of memory cells connected therewith are refreshed.

Figure 112:
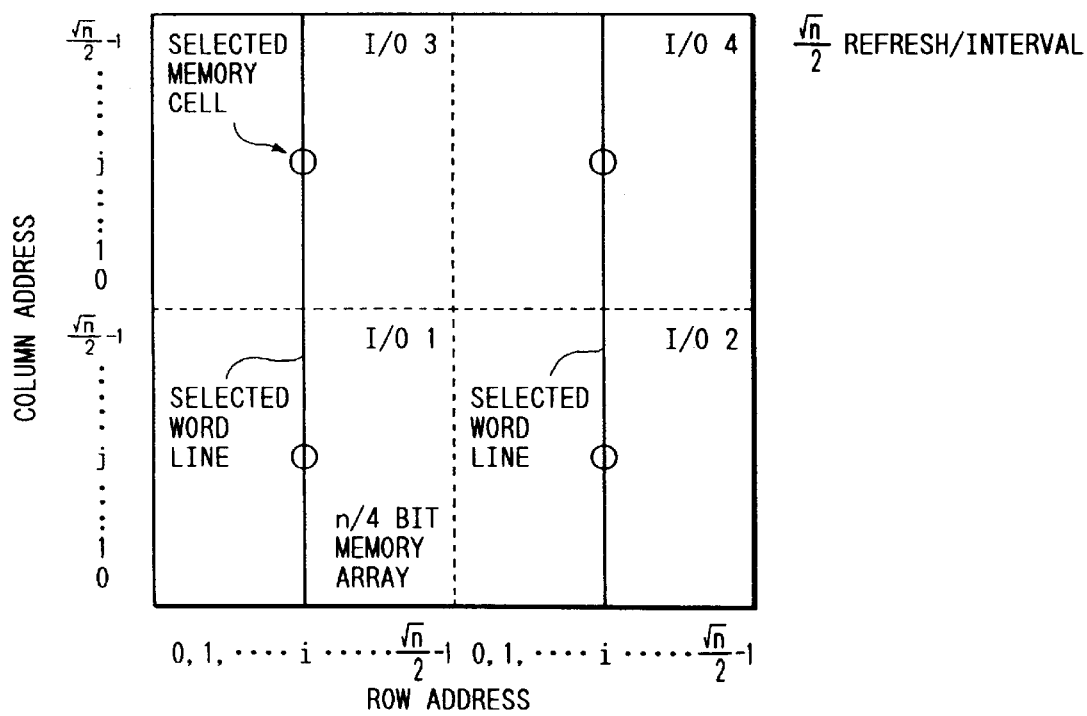
FIG. 112 is a diagram showing the DRAM having the structure of ¼·n words×4 bits of the prior art.

FIG. 112 shows the DRAM of ¼ n words×4 bits structure according to the prior art. Both the row address and the column address are halved so that the two bits are selected from each of the two selected word lines to provide a structure of 4 bits. The refresh cycle number is ½·V$\overline{n}$. Each of the row and column addresses is reduced by one.

Figure 111:
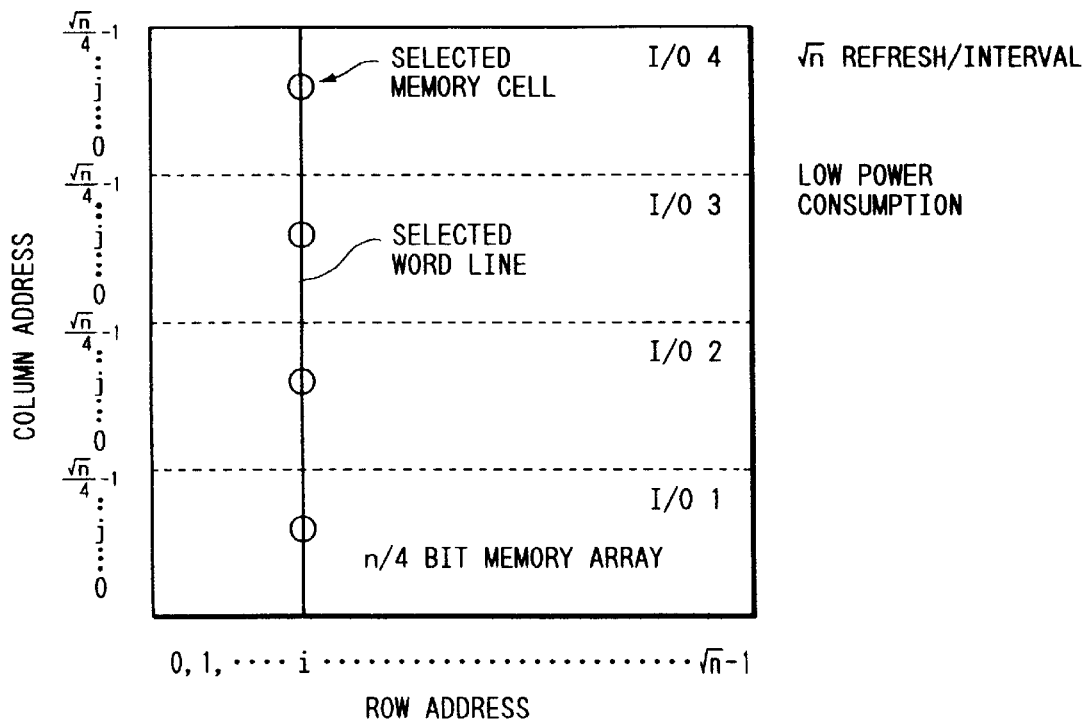
FIG. 111 is a diagram showing one embodiment of the DRAM having the structure of ¼·n words×4 bits according to the present invention.

FIG. 111 shows the DRAM of ¼ n words×4 bits structure according to the prior art. The column address is quartered so that four bits are selected from one word line to provide a structure of 4 bits. The refresh cycle number is V$\overline{n}$. Only the column addresses are reduced by two.

Figure 114:
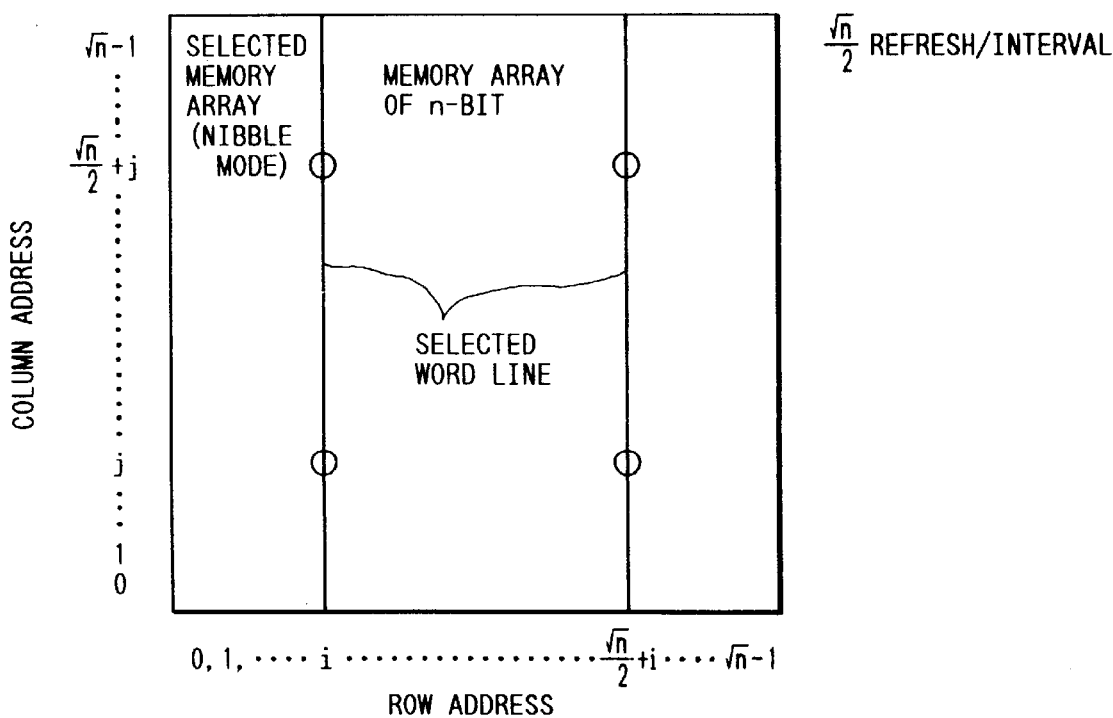
FIG. 114 is a diagram showing the structure of the nibble mode of the prior art.

FIG. 114 shows the structure of a nibble mode of the prior art. Like the case of the structure of 4 bits, two bits are selected from each of two words so that they are accessed sequentially bit by bit by the toggle of the $\overline{CAS}$. In this case, the addresses (i.e., nibble addresses) to be sequentially selected internally are in each of the row and column directions. The refresh cycle number is ½·V$\overline{n}$.

Figure 113:
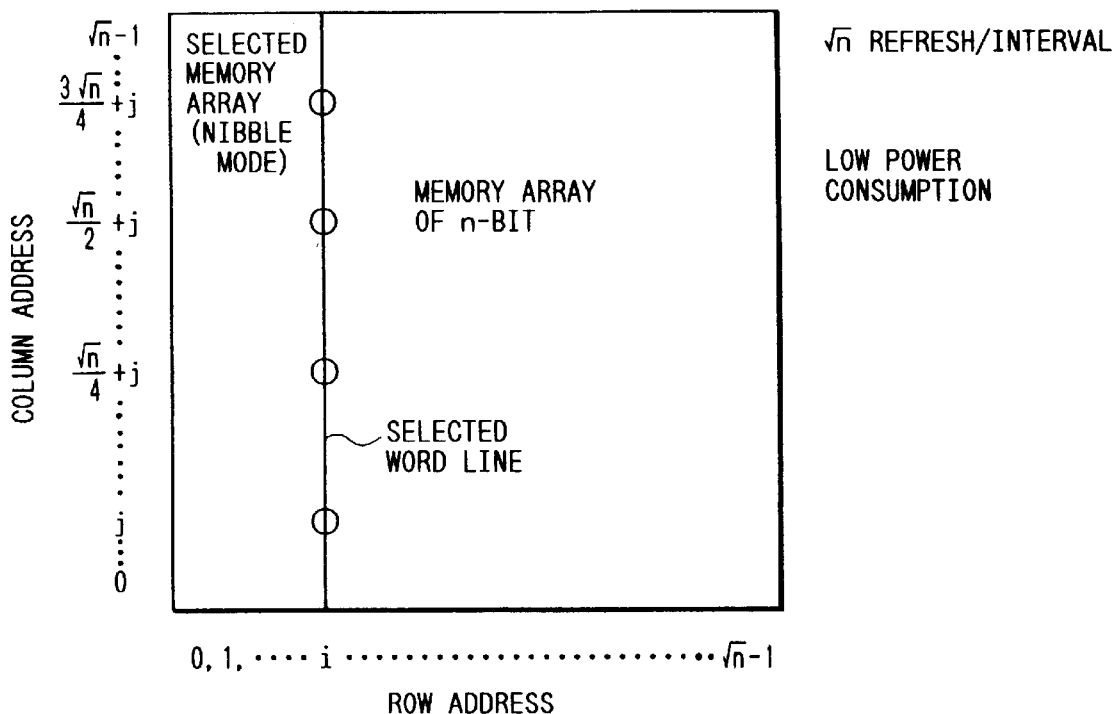
FIG. 113 is a diagram showing the structure of the nibble mode according to the present invention.

FIG. 113 shows the structure of a nibble mode according to the present invention. Like the case of the structure of 4 bits, four bits are selected from one word line so that it is accessed sequentially bit by bit by the toggle of the $\overline{CAS}$. In this case, the nibble addresses are two column addresses. The refresh cycle number is V$\overline{n}$.

FIG. 115(*a*) is a diagram comparing the address system of n words×1 bit structure between the system of the prior art and the embodiment of the present invention. In the system of the prior art, the refresh addresses (i.e., the row addresses necessary for refreshing all the memory cells) have a number of (i–1) of the an i-number of row addresses excepting the most significant address. On the other hand, the nibble addresses are the most significant row and column addresses. In the embodiment of the present invention, the refresh addresses are all of the i-number of row addresses, and the nibble addresses are the two more significant column addresses.

FIG. 115(b) shows the case comparing the address system of ¼ n words×4 bit structure between the system of the prior art and the embodiment of the present invention. In the system of the prior art, both the row and column addresses are deficient in the most significant one, as compared with the structure of x words×1 bit, and the refresh addresses are (i–1) in number like the structure of 1 bit. In the embodiment of the present invention, on the other hand, the column addresses are deficient in two, as compared with the structure of 1 bit, and the refresh addresses have an i-number like the structure of 1 bit. There are two address pins which do not belong to the address multiplex, so that the number of the address pins for the structure of ×1 is not reduced.

FIG. 116(a) shows an example of the external package view and the pin arrangement of the DRAM of 16 Mbits according to one embodiment of the present invention. FIG. 116(b) shows an example of the external package view and the pin arrangement of the DRAM of 4 Mbits according to one embodiment of the present invention. The shown case corresponds to n=16 Mbits. The package has an external view of the small outline j-bent package SOJ, the zigzag line package ZiP, and the structures of 16 Mwords×1 bit and 4 Mwords×4 bits. The difference from the system of the prior art resides in that the A11 pin is present in the structure of 4 bits. Moreover, the A10 and A11 pins are not the address multiplex input pins.

Figure 117A:
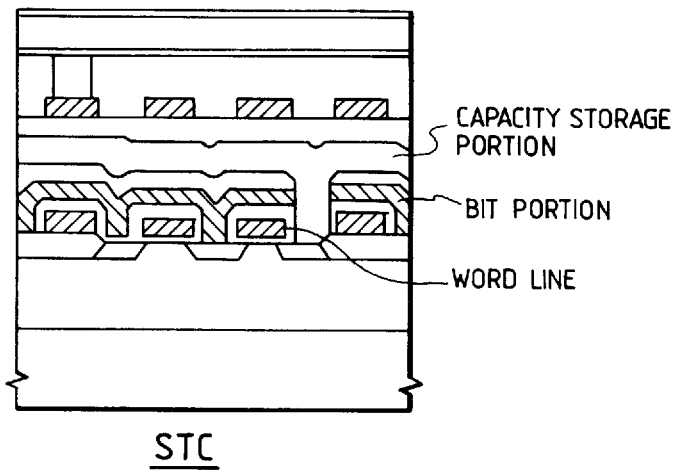
FIG. 117(a) is a diagram showing the memory cell structure using the stacked capacitor STC adopted in one embodiment of the present invention.

FIG. 117(a) shows the memory cell structure using the stacked capacitor STC which is adopted in one embodiment of the present invention.

Figure 117B:
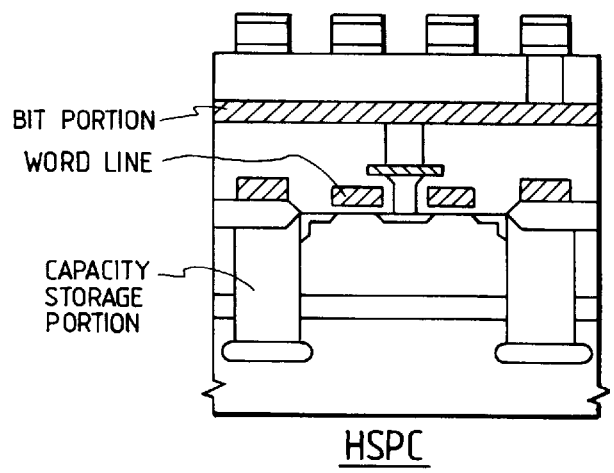
FIG. 117(b) is a diagram showing the memory cell structure using the high-speed plate capacitor HSPC adopted in one embodiment of the present invention.

Moreover, FIG. 117(b) shows the memory cell structure using the high-speed plate capacitor HSPC which is adopted in one embodiment of the present invention. Both the STC cell and the HSPC cell are those having the stereoscopic structures, in which the substrate is not used as the electrode of the storage capacity. As a result, the memory cells have a small area in the diffusion layer to be added to the node for storing the information charges so that they are less deteriorated in the information holding characteristics due to the junction leakage with the substrate. Thanks to this memory cell, the refresh cycle number can be increased without dropping the memory efficiency.

According to the present invention, moreover, the DRAM having a capacity as large as 16M or more can have its power consumption reduced to reduce the heat value of the chip thereby to improve the information holding characteristics of the memory cells.

Here, the memory cell having a small area and a stereoscopic structure is allowed to have a small diffusion layer region. As a result, the information holding characteristics due to the junction leakage are improved. Here, the power consumption can be dropped by combining the $\overline{Vn}$ refresh cycles. The information holding characteristics are improved better by the low heat value.

On the other hand, the DRAM having a capacity as large as 16 Mbits or more consumes a high power for charging or discharging the bit lines. The resultant high heat value also deteriorates the information holding characteristics. Here, the $\overline{Vn}$ refresh cycles are indispensable. As a result, these V $\overline{n}$ refresh cycles can drop the power consumption so that the resultant low heat value improve the information holding characteristics.

Figure 118A:
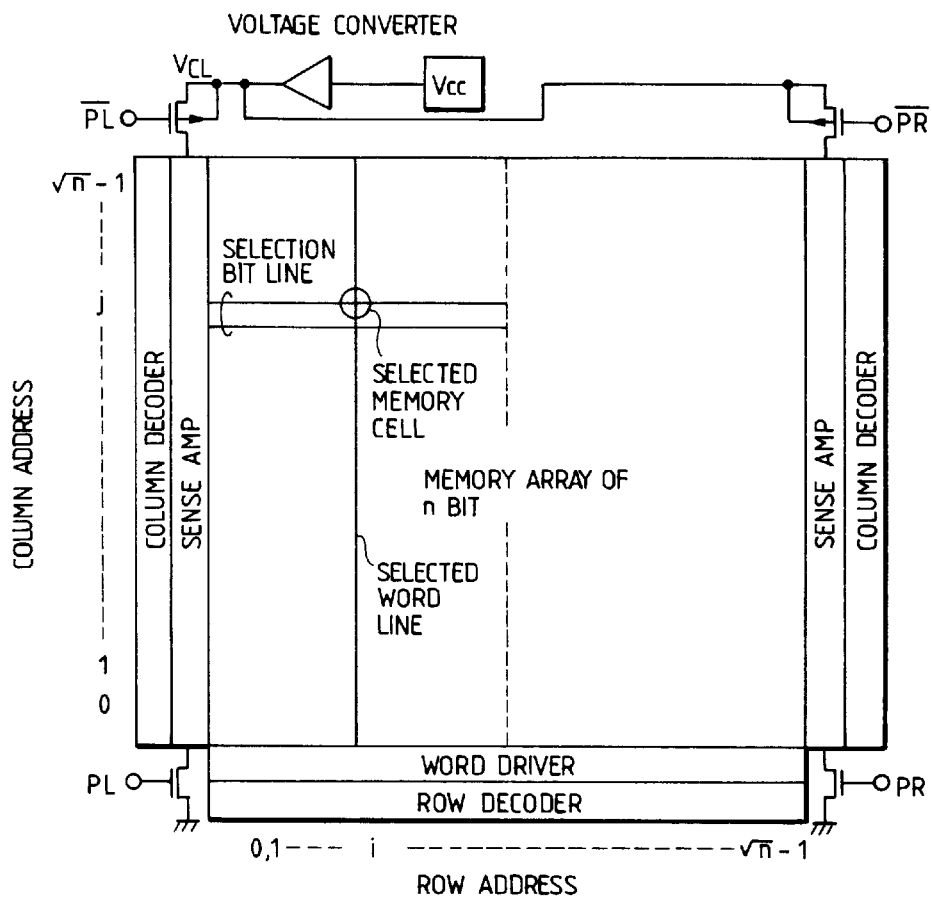
FIG. 118(a) is a diagram combining the refresh system using the present invention and the in-chip voltage converter.
Figure 118B:
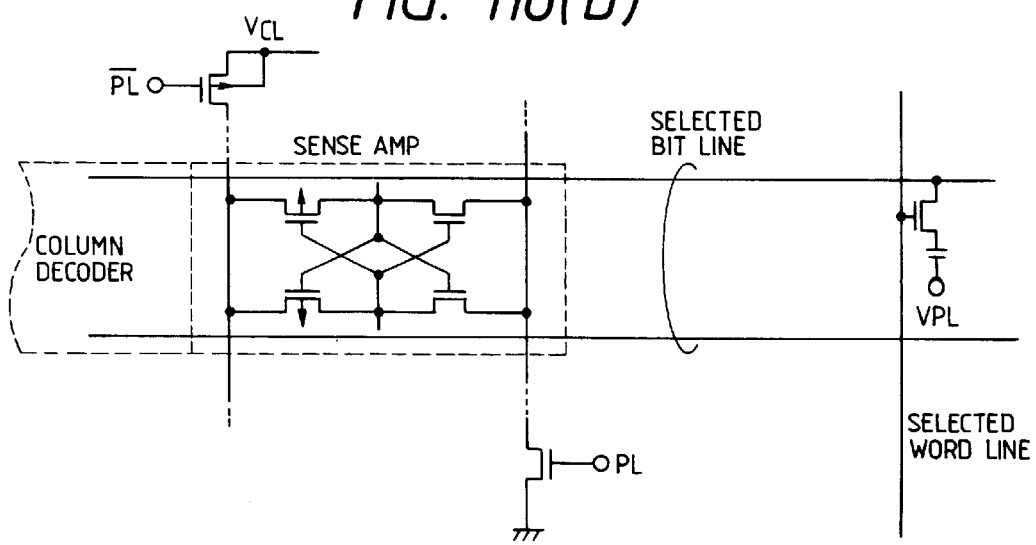
FIG. 118(b) is a diagram showing the method for the in-chip voltage $V_{CL}$ to charge the bit lines through the sense amplifier.

FIG. 118(a) shows an example in which the refresh system according to the present invention and an in-chip voltage converter are combined. FIG. 118(b) is a diagram showing a method for charging the bit lines through the sense amplifier by the in-chip voltage $V_{CL}$. The voltage converter has to be sufficiently low in impedance for feeding the charge current and accordingly has to have a large area to increase the chip area. According to the present invention, the bit line charging current can be dropped to reduce the area of the voltage converter and accordingly the chip area.

Figure 119:
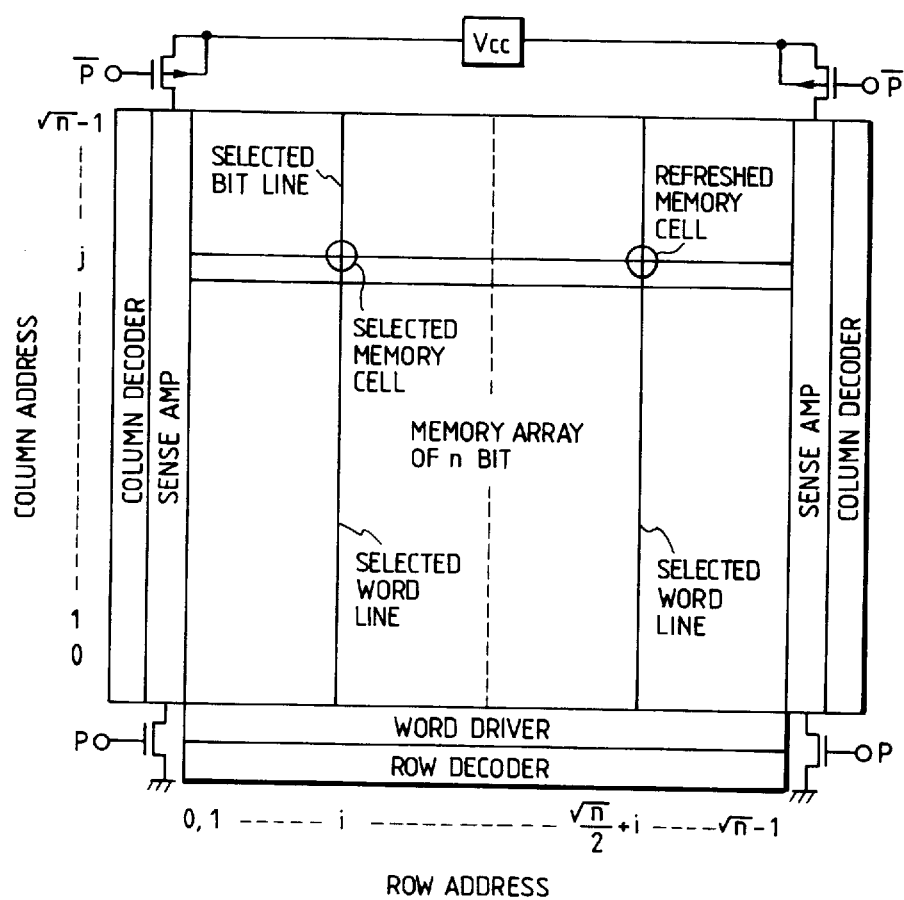
FIG. 119 is a diagram showing the DRAM of the prior art using no voltage converter.

FIG. 119 shows an example of the DRAM according to the prior art using no voltage converter.

Figure 120A:
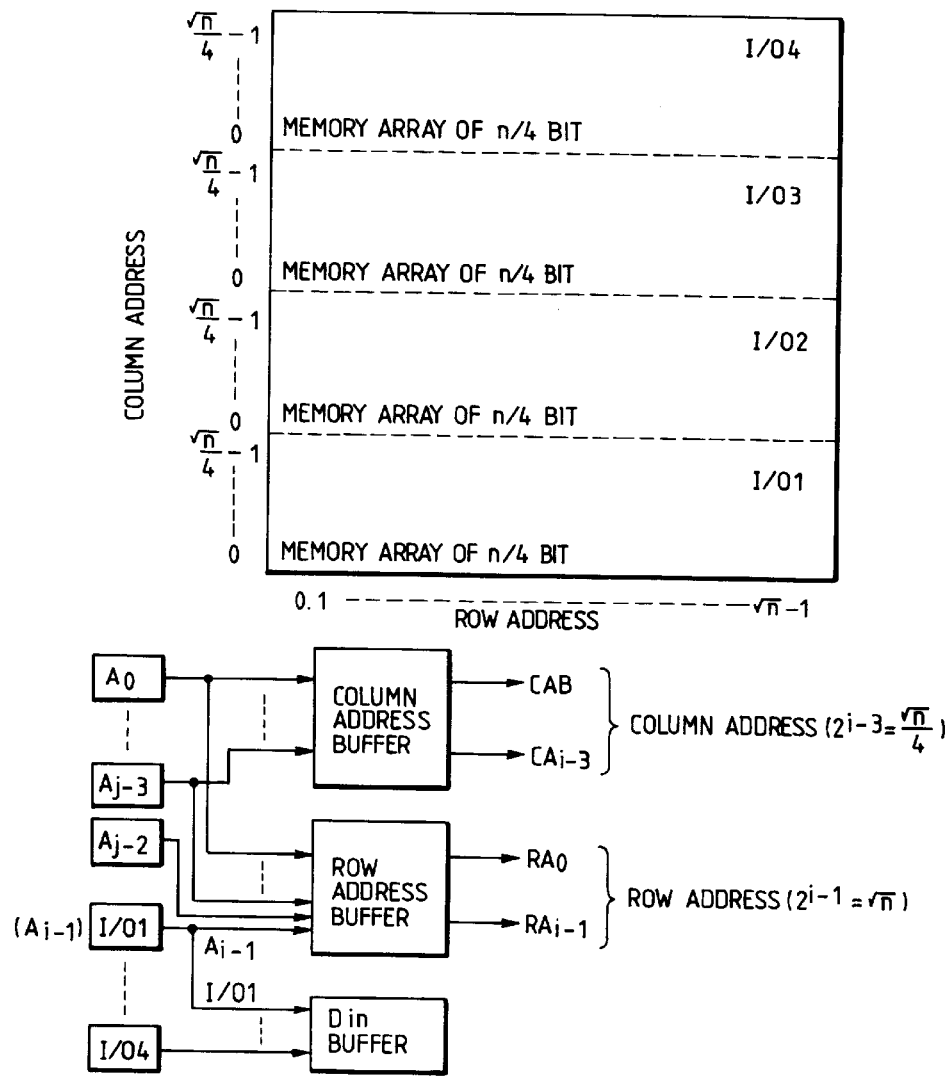
FIGS. 120(a) and 120(b) are a diagram and a time chart showing the DRAM having a $\overline{\sqrt{n}}$ refresh×4 structure for introducing the $A_{i-1}$ address from the I/O pins.
Figure 120B:
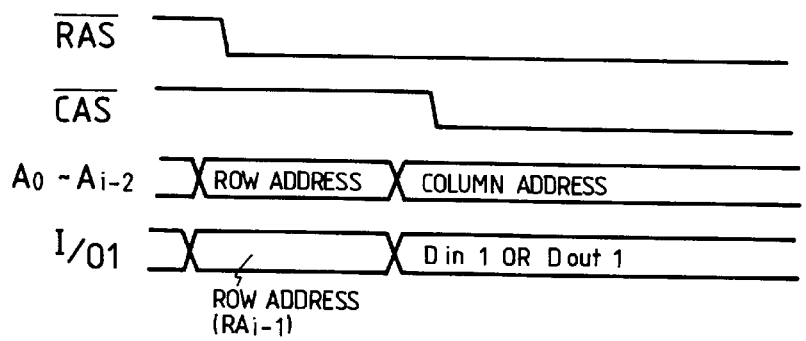

FIGS. 120(a) and 120(b) are diagrams and a time chart showing the DRAM of a structure of Vn refresh×4 for introducing the (Ai–1) address from the I/O pin. In the present invention, in the case of the structure of ¼ n words×4 bits, the addresses pins required are more by one than those of the system of the prior art (as shown in FIG. 115). This additional address is taken in from the I/O pin at the same timing as that of another row address. The data are then inputted to or outputted from the I/O pin in a time-series manner but without any operational problem. Thus, according to the present invention, it is possible to prevent the number of addresses pins from being increased more than that of the system of the prior art.

Figure 121A:
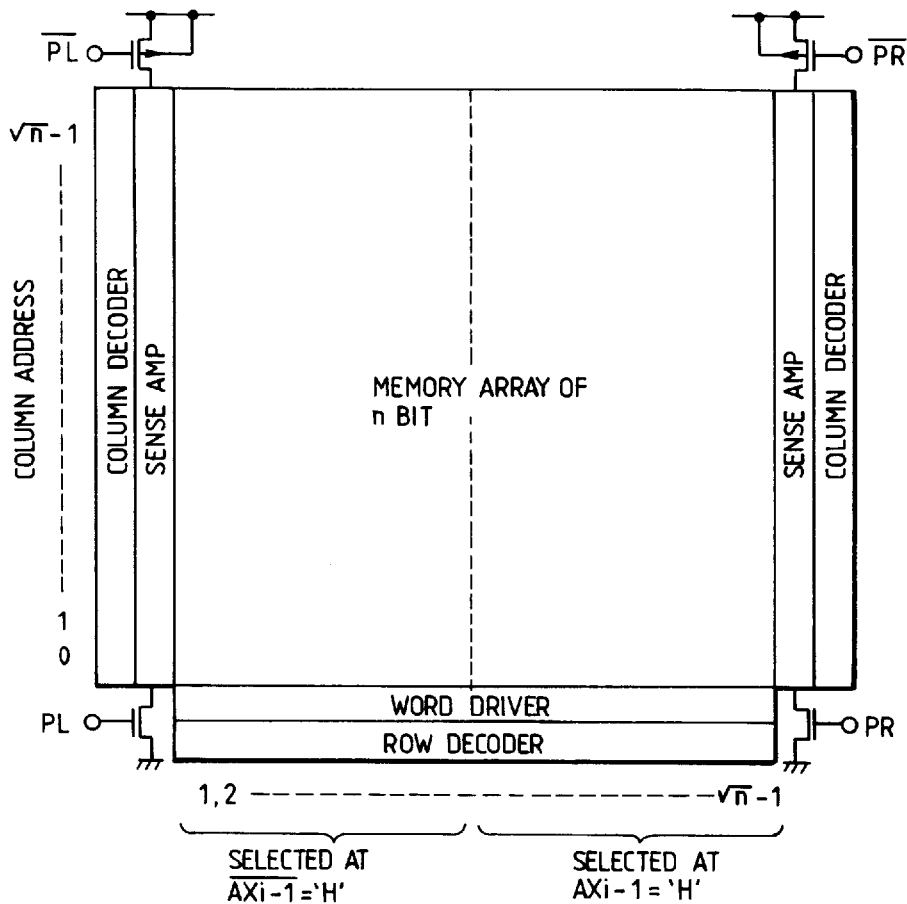
FIG. 121(*a*) is a diagram showing another embodiment of the present invention.
Figure 121B:
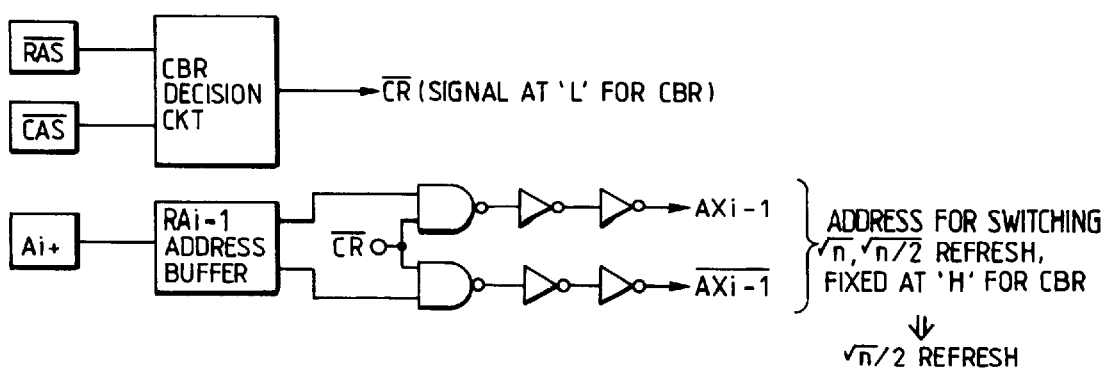

FIG. 121(a) is a layout showing another embodiment of the present invention. FIG. 121(b) is a circuit diagram showing a circuit for switching the $\overline{Vn}/2$ refresh cycles in response to only the column address signal $\overline{CAS}$ and the before row address signal $\overline{RAS}$. This circuit is operated in the ½·$\overline{Vn}$ refresh cycle when in the $\overline{CAS}$ before $\overline{RAS}$ (CBR) refresh operation but otherwise in the $\overline{Vn}$ refresh cycle of the present invention. Since the ratio of the refresh operation to the normal operation is about on hundredth, the current consumption is increased like the system of the prior art only when in the CBR refresh but can be dropped wholly on average. If, moreover, the refresh operation is accomplished in the CBR refresh, the refresh cycle number can be as small as that of the prior art.

In FIG. 121(b), letters $\overline{CR}$ designate a signal which takes the level 'L' when in the CBR refresh to accomplish a switching between the $\overline{Vn}$ refresh and ½ Vn refresh.

Figure 122:
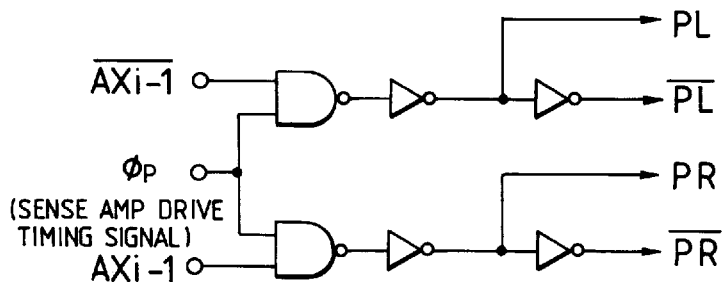

FIG. 122 shows a circuit for forming sense amplifier activating signals PL, $\overline{PL}$, PR and $\overline{PR}$ from refresh cycle switching address signals $A_{xi-1}$ and $\overline{A_{xi-1}}$ shown in FIG. 121(b). When the CBR decision signal $\overline{CR}$ takes the level 'L', both the signals $A_{xi-1}$ and $\overline{A_{Hi-1}}$ take the 'H' level. As a result, two word lines are selected, and all the signals PL, $\overline{PL}$, PR and $\overline{PR}$ are outputted so that a $2\overline{Vn}$ number of sense amplifiers are activated. In these ways, the operations of ½·$\overline{Vn}$ refresh cycles are accomplished when in the CBR.

Although not shown, the system for switching to that of the prior art may be selectively used when multiple bits are to be simultaneously accessed to, as in the multi-bit simultaneous test mode or in the burn-in mode, or when the number of the word line selections is increased to improve the burn-in stress duty for the word lines.

Figure 123A:
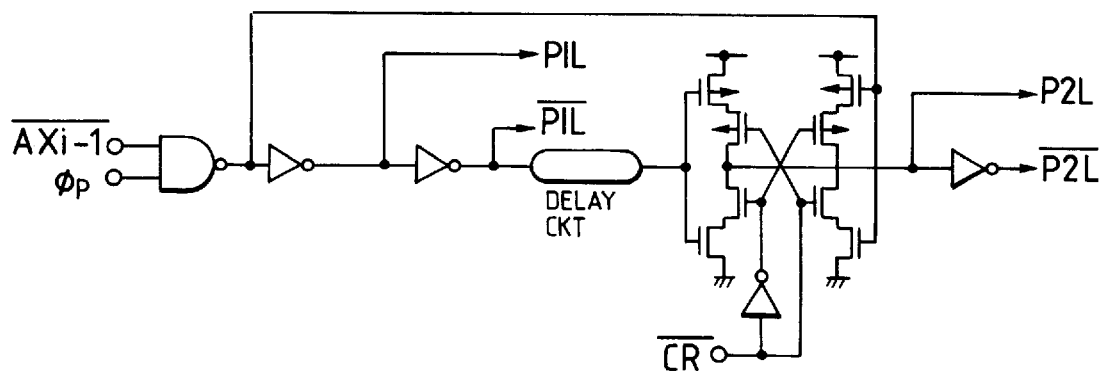
Figure 123B:
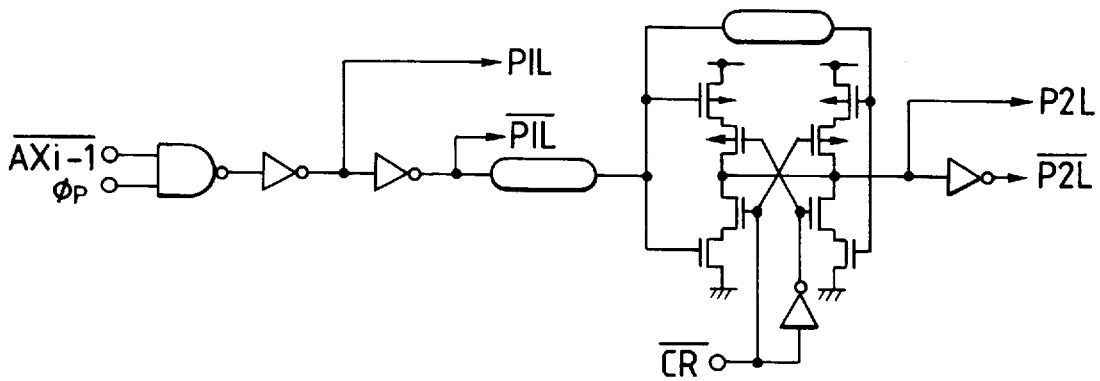

FIG. 123(a) is a diagram showing a peak current increase preventing circuit of single-phase drive type, and FIG. 123(b) is a diagram showing a peak current increase preventing circuit of two-phase drive type. The sense amplifier driving power switch is turned ON in response to two signals to change the timing between the two signals in response to the switching of the refresh system. When the CR takes 'L', as shown in FIG. 123(a), a timing delay is caused between the P1L and $\overline{\text{P1L}}$, and P2L and $\overline{\text{P2L}}$. When the $\overline{\text{CR}}$ takes 'L', as shown in FIG. 123(b), the timing delays between the P1L and $\overline{\text{P1L}}$ and between P2L and $\overline{\text{P2L}}$ grow the more. Either system is switched to the refresh system of the prior art, when in the CBR refresh, to prevent the peak value of the bit line charging and discharging current from being increased. Since, however, the bit line charging and discharging time is elongated by this system, the cycle time in the CBR refresh is elongated. FIG. 124 shows another embodiment of the present invention.

FIG. 125 is a chip layout of the DRAM using one embodiment of the present invention. At the chip center portion, there are arranged the bonding pads, the voltage converters ($V_{CL}$ or $V_{DL}$), the substrate voltage generator ($V_{BB}$) and so on. The deteriorations of the memory cell characteristics are prevented by arranging the center portion with the $V_{BB}$ generator, which is especially liable to inject the minority carriers into the substrate, namely, by keeping the $V_{BB}$ generator apart from the memory arrays.

Figure 126A:
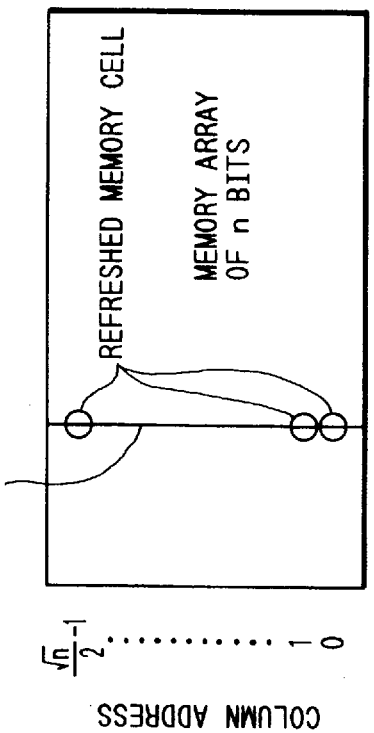
Figure 126B:
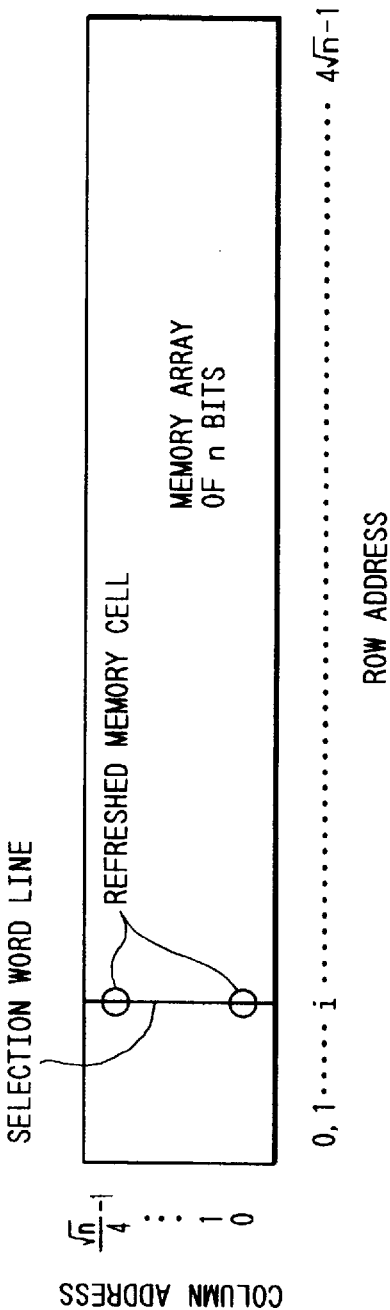

FIG. 126(a) is a diagram showing the case in which the refresh cycle number of the present embodiment is $2\sqrt{n}$, and FIG. 126(b) is a diagram showing the case in which the refresh cycle number of the present embodiment is $4\sqrt{n}$. The row addresses are more than the column addresses.

Since a DRAM of low power consumption and large capacity can be fabricated without dropping the memory efficiency according to the present invention, it is possible to provide the DRAM which can be easily used by the user. If the $\sqrt{n}$ refresh cycle system is adopted in the present invention as contrary to the $\frac{1}{2}\cdot\sqrt{n}$ refresh cycle system of the prior art, the bit line charging and discharging current (corresponding to 50 to 70% of the total current to be consumed by the chip) can be dropped to one half.

Next, with reference to FIGS. 128 and 129, the dynamic RAM having a built-in voltage drop circuit will be described in connection with the contents we have investigated and devised.

The voltage drop circuit is disclosed in Japanese Patent Laid-Open No. 57-061981, for example.

The dynamic RAM has one built-in voltage drop circuit, as disclosed above, which is steadily brought into operative state by the power voltage supplied. Therefore, the voltage drop circuit is designed to have a relatively large current feeding capacity for warranting the maximum operation current of the dynamic RAM when this RAM is selected. Our investigations have found a problem that the standby current of the dynamic RAM in the unselected state is increased to obstruct the low power consumption.

The invention to be disclosed hereinafter has an object to reduce the standby current of the dynamic RAM having the built-in voltage drop circuit thereby to promote the low power consumption.

The aforementioned and other objects and novel features of the present invention will become apparent from the following description taken with reference to the accompanying drawings.

The representative of the invention to be disclosed herein will be briefly described in the following. Specifically, a voltage drop circuit to be built in the dynamic RAM or the like is constructed to comprises: a first voltage drop circuit designed to have an ability to supply such a relatively small current as can supply a standby current when the dynamic RAM is brought into an unselected state; and a second voltage drop circuit designed to have an ability to supply such a relatively large current as can supply its operating current together with said first voltage drop circuit when the dynamic RAM is brought into a selected state.

According to the above-specified means, the standby current of the dynamic RAM can be reduced while protecting the circuit element which has its breakdown voltage dropped in accordance with the high integration, dropping the power consumption of the circuit element and warranting the maximum operation current of the circuit element in the selected state. Thus, it is possible to promote the reduction in the power consumption of the dynamic RAM having the built-in voltage drop circuit.

FIG. 127 is a circuit diagram showing one embodiment of the voltage drop circuits VD1 and VD2 to which the present invention is applied. On the other hand, FIG. 128 is a block diagram showing one embodiment of the dynamic RAM which has the voltage drop circuits VD1 and VD2 of FIG. 127 built therein. With reference to these Figures, the structures of the voltage drop circuits VD1 and VD2 and the dynamic RAM according to this embodiment will be described together with the summary of the operations and the features thereof. Here, the individual circuit elements of FIG. 127 and the circuit elements composing each block of FIG. 128 are formed over one semiconductor substrate of single crystalline silicon or the like, although not especially limitative, by the well-known fabrication technology of the semiconductor integrated circuit. In FIG. 127, moreover, the MOSFETs having their channels (or back gates) indicated by arrows are of the P-channel type such that they are discriminated from the N-channel MOSFETs having no arrow.

The dynamic RAM of this embodiment has a relatively large storage capacity and has its circuit elements made remarkably fine, although not especially limitative. As a result, the circuit elements have their breakdown voltages dropped so that the power voltage VCC at +5V or the like supplied from the outside cannot be fed as it is to the internal circuits. Therefore, the dynamic RAM of this embodiment is equipped with the voltage drop circuit which is operative to drop the power voltage VCC to an internal power voltage Vcd of +3 V, for example, and to feed it to the internal circuits, so that the power consumption of the dynamic RAM may be dropped. In this embodiment, the aforementioned voltage drop circuit is constructed of: a (first) voltage drop circuit VD1 designed to have an ability to supply such a relatively small current as can supply a standby current when the dynamic RAM is brought into an unselected state; and a (second) voltage drop circuit VD2 designed to have an ability to supply such a relatively large current as can supply its operating current together with said first voltage drop circuit, when the dynamic RAM is brought into a selected state, and brought selectively into an operation state in accordance with the row address strobe signal $\overline{\text{RAS}}$ (i.e., start control signal). As a result, the dynamic RAM has its standby current reduced to promote its low power consumption.

In FIG. 128, a memory array MARY is composed of: a plurality of word lines arranged in parallel in the vertical directions of the same Figure; a plurality of complementary data lines arranged in parallel in the horizontal direction; and a plurality of dynamic memory cells arranged in a lattice form at the intersections between the word lines and the complementary data lines.

The word lines composing the memory array MARY are coupled to the row address decoder RAD so that they are alternatively brought into the selected state. The row address decoder RAD is fed, although especially limitative, with:

complementary internal address signals ax0 to axi (as the non-inverted internal address signals ax0 and the inverted internal address signal $\overline{ax0}$ will be indicated together by the complementary internal address signals ax0) from the row address buffer RAB; and a timing signal φx from the timing generator TG.

The row address decoder RAD is selectively brought into the operative state when the timing signal φx is raised to the high level. In this operative state, the row address decoder RAD decodes the aforementioned complementary internal address signals ax0 to axi to bring the corresponding word lines of the memory array MARY alternately into the selected state of the high level.

The row address buffer RAB responds to the timing signal φar fed from the timing generator TG, to take and hold the row address signals which are transmitted from the address multiplexer AMX. On the basis of the row address signals, moreover, the row address buffer RAB form the aforementioned complementary internal address signals ax0 to axi and feed them to the row address decoder RAD.

When the dynamic RAM is in the normal operation mode so that the timing signal φref of the low level is fed from the timing generator TG, although not especially limitative, the address multiplexer AMX selects the X-address signals AX0 to AXi, which are fed in the time-series manner through the external terminals A0 to Ai, to transmit them as the aforementioned row address signals to the row address buffer RAB. When, on the other hand, the dynamic RAM is brought into the refresh mode so that the timing signal φref is raised to the high level, the address multiplexer AMX selects the refresh address signals ar0 to ari, which are fed from the refresh address counter RFC, to transmit them as the aforementioned row address signals to the row address buffer RAB.

When the dynamic RAM is in the refresh mode, although not especially limitative, the refresh address counter RFC accomplishes its stepwise advances in accordance with the timing signal φrc fed from the timing generator TG. As a result, the refresh address counter RFC forms and feeds the aforementioned refresh address signals ar0 to ari to the address multiplexer AMX.

On the other hand, the complementary data lines constituting the memory array MARY are coupled at one hand to the corresponding unit amplifier of the sense amplifier SA and at the other to the corresponding switch MOSFET of the column switch CSW.

The sense amplifier SA includes a plurality of unit amplifiers which are provided to correspond to the individual complementary data lines of the memory array MARY. These unit amplifiers are commonly fed with the timing signal φpa from the timing generator TG.

Each of the unit amplifiers of the sense amplifier SA is selectively brought into an operative state when the aforementioned timing signal φpa is raised to the high level. In this operative state, each unit amplifier amplifies the fine read signal, which is outputted through the corresponding complementary data line from a plurality of memory cells coupled to the selected word line of the memory array MARY, and uses it as a binary read signal at the high or low level.

The column switch CSW includes plural pairs of switch MOSFETs which are provided to correspond to the individual complementary data lines of the memory array MARY. These switch MOSFETs are coupled at one hand to the corresponding complementary data lines of the memory array MARY, as has been described hereinbefore, and at the other alternately and commonly to the non-inverted signal line CD and the inverted signal line $\overline{CD}$ of the complementary common data lines. The switch MOSFET of each pair have their gates commonly coupled and fed with the corresponding data line selection signal from the column address decoder CAD.

The switch MOSFETs of each pair of the column switch CSW are selectively turned ON as the corresponding data line selection signals are alternately raised to the high level. As a result, the corresponding complementary data lines of the memory array MARY are selectively connected with the aforementioned complementary common data lines CD and $\overline{CD}$.

The column address decoder CAD is fed, although not especially limitative, with the complementary internal address signals ay0 to ayi of (i+1) bits from the column address buffer CAB and the timing signal φy from the timing generator TG.

The column address decoder CAD is selectively brought into an operative state as the aforemenioned timing signal φy is raised to the high level. In this operative state, the column address decoder CAD decodes the aforementioned complementary internal address signals ay0 to ayi to raise the corresponding data line selection signals alternately to the high level. These data line selection signals are fed to the corresponding switch MOSFETs of the column switch CSW, as has been described hereinbefore.

The column address buffer CAB responds to the timing signal φac fed from the timing generator TG, to take and hold the Y-address signals AY0 to AYi which are fed in time-series through the external terminals A0 to Ai. In accordance with these Y-address signals, moreover, the column address buffer CAB forms and feeds the complementary internal address signals ay0 to ayi to the column address decoder CAD.

The complementary common data lines CD and $\overline{CD}$ are coupled to the data input/output circuit I/O, although not especially limitative.

This data input/output circuit I/O includes a data input buffer and a data output buffer, although not especially limitative. Of these, the data input buffer has its input terminal coupled to the data input terminal Din and its output terminal coupled to the complementary common data lines CD and $\overline{CD}$. The data input buffer is fed with the timing signal φw from the timing generator TG, although not especially limitative. On the other hand, the data output buffer has its input terminal commonly coupled to the aforementioned complementary common data lines CD and $\overline{CD}$ and its output terminal coupled to the data output terminal Dout. The data output buffer is fed with the timing signal φr from the timing generator TG.

The data input buffer of the data input/output circuit I/O is selectively brought into an operative state when the dynamic RAM is brought into the write mode so that the aforementioned timing signal φw is raised to the high level. In this operative state, the data input buffer forms the complementary write signal according to the write data fed through the data input terminal Din and feeds it to the selected memory cell of the memory array MARY through the complementary common data lines CD and $\overline{CD}$. The output of the data input buffer is brought into the high-impedance state, although not especially limitative, when the timing signal φw is dropped to the low level.

The data output buffer of the data input/output circuit I/O is selectively brought into an operative state when the dynamic RAM is brought into the read mode so that the aforementioned timing signal φr is raised to the high level. In this operative state, the data output buffer further amplifies the binary read signal, which is outputted through the corresponding complementary data lines and the complementary common data lines CD and $\overline{CD}$ from the selected memory cells of the memory array MARY, and feeds it out from the data output terminal Dout. When the timing signal φr is dropped to the low level, although not especially limitative, the output of the data output buffer is brought into the high impedance state.

The timing generator TG forms and feeds the various timing signals to the individual circuits of the dynamic RAM on the basis of the row address strobe signal $\overline{RAS}$, the column address strobe signal $\overline{CAS}$ and the write enable signal $\overline{WE}$, which are fed as the start control signals from the outside.

The dynamic RAM of this embodiment has the voltage drop circuits VD1 and VD2 built therein, as has been described hereinbefore. These voltage drop circuits are fed with the power voltage VCC through the external terminals VCC and have their output terminals coupled commonly to the internal power voltage supply point Vcd. Here, the power voltage VCC is set at a positive level such as +5 V, although not especially limitative. The voltage drop circuit VD2 is further fed with the timing signal φce from the timing generator TG.

The voltage drop circuit VD1 is basically composed, as shown in FIG. 127, of a pair of N-channel MOSFETs Q11 and Q12 of difference mode, although not especially limitative. Between the drains of the MOSFETs Q11 and Q12 and the aforementioned power voltage VCC, there are connected P-channel MOSFETs Q1 and Q2. Of these, the MOSFET Q1 has its gate and drain coupled commonly to each other and further to the gate of the MOSFET Q2. As a result, the MOSFETs Q1 and Q2 are in the current mirror mode to act as the active load for the MOSFETs Q11 and Q12.

Between the commonly coupled sources of the MOSFETs Q11 and Q12 and the ground potential of the circuit, there is connected an N-channel MOSFET Q13, although not especially limitative. This MOSFET Q13 is designed to have a relatively small conductance and has its gate and drain coupled commonly to each other to provide a diode mode. Thus, the aforementioned differential MOSFETs Q11 and Q12 are always fed with the relatively small operation current corresponding to the conductance of the MOSFET Q13. As a result, the voltage drop circuit VD1 is steadily held in its operative state on condition that it is fed with the power voltage VCC.

The commonly coupled drains of the MOSFETs Q2 and Q12 are further coupled to the gate of a P-channel MOSFET Q3. This MOSFET Q3 has its source coupled to the aforementioned power voltage VCC and its drain coupled to the gate of the aforementioned MOSFET Q11 and further to the internal power voltage supply point Vcd. Thus, the MOSFET Q3 acts as a current feeding MOSFET for feeding the internal power voltage Vcd substantially to the internal circuit and as a voltage controlling MOSFET for controlling the level of the internal power voltage Vcd when its gate voltage is changed. In this embodiment, the MOSFET Q3 is designed to have a relatively small conductance. As a result, the voltage drop circuit VD1 is made to have such a relatively low current supply ability as can feed the standby current in the unselected state of the dynamic RAM, because the aforementioned MOSFET Q13 is designed to have the relatively small conductance.

The MOSFET Q12 has its gate supplied with a predetermined reference potential Vr. Here, the reference potential Vr is generated at a constant voltage such as +3 V, for example, by the not-shown constant voltage generator of the dynamic RAM, although not especially limitative.

From these, the differential MOSFETs Q11 and Q12 function as the differential amplifier using the MOSFETs Q1 and Q2 as the active load when the differential power voltage VCC is supplied. At this time, the differential amplifier compares the internal power voltage Vcd, which is supplied to its non-inverted input terminal, i.e., the gate of the MOSFET Q11, and the reference potential, which is supplied to its inverted input terminal, i.e., the gate of the MOSFET Q12, and enlarges the level difference to transmit it to the non-inverted output terminal, i.e., the commonly coupled drains of the MOSFETs Q2 and Q12, i.e., the gate of the MOSFET Q3. As a result, the level of the internal power voltage Vcd is controlled and converted to the aforementioned reference potential Vr, i.e., +3 V.

When the level of the internal power voltage Vcd is raised to exceed the reference potential Vr, the conductance of the MOSFET Q11 is increased whereas the conductance of the MOSFET Q12 is decreased. As a result, the MOSFET Q3 has its gate voltage raised but its conductance decreased so that the level of the internal power voltage Vcd is dropped. If, on the other hand, the level of the internal power voltage Vcd is dropped to a value lower than the reference voltage Vr, the conductance of the MOSFET Q11 is decreased whereas the conductance of the MOSFET Q12 is increased. Thus, the MOSFET Q3 has its gate voltage dropped and its conductance increased so that the level of the internal power voltage Vcd is raised. As a result, the level of the internal power voltage Vcd is converged to and stabilized at the reference potential Vr, i.e, +3 V. Since the MOSFET Q3 is designed to have the relatively low conductance, as has been described hereinbefore, the current supply ability of the voltage drop circuit VD1 is accordingly reduced.

Next, the voltage drop circuit VD2 is basically composed, as shown in FIG. 127, of a pair of N-channel MOSFETs Q14 and Q15 of differential mode, although not especially limitative. Between these MOSFETs Q14 and Q15 and the aforementioned power voltage VCC, respectively, there are connected P-channel MOSFET Q4 and Q5. Of these, the MOSFET Q4 has its gate and drain coupled commonly to each other and further to the gate of the MOSFET Q5. Thus, the MOSFETs Q4 and Q5 are constructed to have the current mirror mode and to act as the active loads for the MOSFETs Q14 and Q15.

Between the commonly coupled sources of the MOSFETs Q14 and Q15 and the ground potential of the circuit, there are connected in parallel N-channel MOSFETs Q16 and Q17, although not especially limitative. Of these, the MOSFET Q16 has its gate fed with the aforementioned timing signal φce, and the MOSFET Q17 has its gate and darain coupled commonly to form a diode mode. Here, the MOSFET Q16 is designed to have a relatively large conductance, whereas the MOSFET Q16 is designed to have a relatively small conductance. On the other hand, the timing signal φce is formed, as shown partially in FIG. 127, by inverting the row address strobe signal $\overline{RAS}$ or the start control signal of the dynamic RAM by the inverter circuit N1 of the timing generator TG, although not especially limitative, so that it is selectively caused to take the high level when the dynamic RAM is brought into its selected state.

As a result, the differential MOSFETs Q14 and Q15 thus constructed are fed with a relatively small operation current corresponding to the conductance of the MOSFET Q17, when the dynamic RAM is in its unselected state, and a relatively large operation current corresponding to the conductance of the MOSFET Q16 when the dynamic RAM is in its selected state. Thus, the voltage drop circuit VD2 is selectively brought into its operative state when the dynamic RAM is substantially brought into the selected state so that the timing signal φce is given the high level. In the unselected state of the dynamic RAM, the relatively small operation current is fed to the differential MOSFETs Q14 and Q15 through the MOSFET Q17 so that the later-described non-inverted output terminals, i.e,. the commonly coupled drains of the MOSFETs Q5 and Q15 are maintained substantially at the reference potential Vr, i.e., at +3 V. As a result, the rise of the voltage drop circuit Vd2 is accelerated at the beginning of the selected state of the dynamic RAM.

The commonly coupled drains of the MOSFETs Q5 and Q15 are further coupled to the gate of the P-channel MOSFET Q6, This MOSFET Q6 has its source coupled to the aforementioned power voltage VCC and its drain coupled to the gate of the MOSFET Q14 and commonly to the aforementioned internal power voltage supply point Vcd. As a result, the MOSFET Q6 acts substantially as a current supply MOSFET for supplying the internal power voltage Vcd to the internal circuits and as a voltage control MOSFET for controlling the level of the internal power voltage Vcd when its gate voltage is changed. In this embodiment, the MOSFET Q6 is designed to have a relatively large conductance. Since, moreover, the MOSFET Q16 is also designed to have a relatively large conductance, the voltage drop circuit VD2 is made to have a relatively large current supply ability for supplying the operation current in the selected state of the dynamic RAM in association with the aforementioned voltage drop circuit VD1.

The gate of the MOSFET Q15 is fed with the aforementioned reference potential Vr. Thus, the differential MOSFETs Q14 and Q15 function substantially as a differential amplifier using the MOSFETs Q4 and Q5 as active loads when the dynamic RAM is brought into the selected state so that the aforementioned timing signal φce takes the high level. At this time, the differential amplifier compares the internal power voltage Vcd, which is fed to its non-inverted input terminal, i.e., to the gate of the MOSFET Q14, and the reference potential Vr, which is fed to its inverted input terminal, i.e., the gate of the MOSFET Q15, and enlarges their level difference to feed it to the non-inverted output terminal, i.e., the commonly coupled drains of the MOSFETs Q5 and Q15, i.e., the gate of the MOSFET Q6. As a result, the level of the internal power voltage Vcd is controlled and converged, like the case of the aforementioned voltage drop circuit VD1, to the reference potential Vr, i.e., +3 V.

In this voltage drop circuit VD2, as has been described hereinbefore, in parallel with the aforementioned MOSFET Q16, there is connected a MOSFET Q17 which has a relatively small conductance and a diode mode. Thus, the foregoing differential MOSFETs Q14 and Q15 are always fed with the relatively small operation current through the MOSFET Q17. As a matter of fact, therefore, the voltage drop circuit VD2 is steadily held in the operative state so that the potential at its non-inverted output terminal, i.e., at the commonly coupled drains of the MOSFETs Q5 and Q15 is maintained substantially at the same level as that of the operative state. As a result, the voltage drop circuit VD2 has its rise speeded up faster, while reducing the standby current, than the case in which the aforementioned MOSFET Q17 is omitted to set the non-inverted output terminal substantially at power voltage VCC. Since the MOSFETs Q16 and Q6 are designed to have the relatively large conductance, it is needless to say that the current supply ability of the voltage drop circuit VD2 in the selected state of the dynamic RAM is accordingly increased to supply the operation current sufficiently.

As described above, the dynamic RAM of this embodiment has built therein the voltage drop circuit for dropping the power voltage VCC fed from the outside, such as +5 V to +3 V, for example, to feed it as the internal power voltage Vcd to the internal circuits. In this embodiment, the voltage drop circuit is composed of: the voltage drop circuit VD1 designed to have the relatively small current supply ability and steadily held in its operative state; and the voltage drop circuit VD2 designed to have the relatively large current supply ability and brought selectively into its operative state substantially in response to the row address strobe signal $\overline{RAS}$. Thus, the dynamic RAM of the present embodiment can have its standby current reduced and its low power consumption promoted, while protecting its circuit elements, which have their breakdown voltages dropped in accordance with the high integration, reducing its power consumption and warranting the maximum operation current in the selected state.

As has been disclosed in the present embodiment, the following effects can be attained by applying the present invention to the semiconductor integrated circuit device such as the dynamic RAM having the voltage drop circuit built therein.

(1) The voltage drop circuit to be built in the dynamic RAM is composed of the first voltage drop circuit designed to have an ability to supply such a relatively small current as can supply a standby current when said dynamic RAM is brought into an unselected state; and the second voltage drop circuit designed to have an ability to supply such a relatively large current as can supply its operating current together with the first voltage drop circuit when the dynamic RAM is brought into a selected state. There can be attained an effect that the standby current of the voltage drop circuit can be reduced.

(2) According to the above item (1), the dynamic RAM of the present embodiment can have its standby current reduced, while protecting its circuit elements, which have their breakdown voltages dropped in accordance with the high integration, reducing its power consumption and warranting the maximum operation current in the selected state.

(3) According to the above items (1) and (2), there can be attained an effect that the reduction in the power consumption of the dynamic RAM can be further promoted.

Although our present invention has bee specifically described in connection with the embodiments thereof, it should not be limited to the specific embodiments but can naturally be modified in various manners without departing the gist thereof. For example, the MOSFET Q17 of the voltage drop circuit VD2 may be omitted from FIG. 127. Moreover, the MOSFETs Q6 and Q16 may be replaced by a plurality of P-channel MOSFETs or N-channel MOSFETs in parallel mode. The dynamic RAM may have its voltage drop circuits VD1 and/or VD2 composed of a plurality of voltage drop circuits. At this time, the plural voltage drop circuits corresponding to the voltage drop circuit VD2 may be classified in accordance with their applications or functions so that they may be selectively brought into operative states under optimum conditions. The conditions for forming the timing signal φec may be exemplified in various manners. In case the dynamic RAM has the self-refresh function, for example, the starting condition for starting the refresh circuit by a refresh timer circuit may be added to the conditions for forming the aforementioned timing signal φce. In the dynamic RAM is in a quasi-static mode, the timing signal φce may be formed in response to the chip enable signal $\overline{CE}$, for example. In FIG. 128, the memory array MARY may be composed of a plurality of memory mats or may be of the so-called "multi-bit structure", in which memory data of plural bits are simultaneously inputted and outputted. The values of the power voltage VCC fed from the outside and the internal power voltage Vcd are not limited by this embodiment. Moreover, a variety of modes of embodiments can be taken in the specific circuit structures of the voltage drop circuits VD1 and VD2 shown in FIG. 127, the block structures of the dynamic RAM shown in FIG. 128, and the combination of the control signals and the address signals.

Although our invention has been described hereinto before in case it is applied to its background field such as the dynamic RAM, it should not be limited to those embodiments but can be applied a variety of semiconductor memory devices such as a static RAM or a variety of digital integrated circuit devices. The present invention can also be applied widely to a semiconductor integrated circuit device having at least a built-in voltage drop circuit.

We claim:
1. A semiconductor device comprising:
    a rectangular shaped semiconductor chip having bonding pads formed on a main surface thereof, said bonding pads being arranged in a direction substantially parallel to longer edges of said rectangular shaped semiconductor chip and in a zigzag formation;
    leads being arranged on said main surface of said rectangular shaped semiconductor chip; and
    wires electrically connecting said bonding pads with said leads.
2. A semiconductor device according to claim 1, further comprising a molding resin sealing said rectangular shaped semiconductor chip, a portion of each of said leads and said wires.
3. A semiconductor device according to claim 1, wherein said bonding pads are arranged in two rows.
4. A semiconductor device according to claim 3, wherein said leads includes first leads arranged at one side of said bonding pads, and second leads arranged at the other side of said bonding pads, wherein said first leads are electrically connected with said bonding pads in one of said two rows, and wherein said second leads are electrically connected with said bonding pads in the other of said two rows.

5. A semiconductor device according to claim 4, wherein said bonding pads are arranged at a substantially central position of said rectangular shaped semiconductor chip.
6. A semiconductor device comprising:
    a rectangular shaped semiconductor chip having first bonding pads and second bonding pads formed on a main surface thereof, each of said first and second bonding pads being arranged in a direction substantially parallel to longer edges of said rectangular shaped semiconductor chip, said first bonding pads being arranged on a first imaginary line at a predetermined interval, said second bonding pads being arranged on a second imaginary line at the predetermined interval, each of said first and second imaginary lines extending in the direction substantially parallel to said longer edges of said rectangular shaped semiconductor chip, said second bonding pads being arranged at intersecting positions of said second imaginary line and third imaginary lines, each of said third imaginary lines being arranged at a substantially central position of adjacent ones in said first bonding pads and extending in a direction substantially perpendicular to said first and second imaginary lines, each of said first to third imaginary lines being imaginarily formed on said main surface of said rectangular shaped semiconductor chip;
    leads being arranged on said main surface of said rectangular shaped semiconductor chip; and
    wires electrically connecting said first and second bonding pads with said leads.
7. A semiconductor device according to claim 6, further comprising a molding resin sealing said rectangular shaped semiconductor chip, a portion of each of said leads and said wires.
8. A semiconductor device according to claim 6, wherein said leads include first leads arranged at one side of said first and second bonding pads, and second leads arranged at the other side of said first and second bonding pads, wherein said first leads are electrically connected with said first bonding pads, and wherein said second leads are electrically connected with said second bonding pads.
9. A semiconductor device according to claim 8, wherein said first and second bonding pads are arranged at a substantially central position of said rectangular shaped semiconductor chip.
10. A semiconductor device according to claim 1, wherein the semiconductor device is a semiconductor memory device, wherein the bonding pads are arranged in said zig zag formation along a longitudinal center line of the semiconductor device, and wherein peripheral circuits are also arranged along the longitudinal center line and along a transverse center line of the semiconductor chip, while memory arrays are arranged in four regions which are created by the intersection of the longitudinal center line and the transverse center line.
11. A semiconductor device according to claim 10, wherein said peripheral circuits and said memory arrays are electrically connected to predetermined ones of said bonding pads.

12. A semiconductor device comprising:

a rectangular shaped semiconductor chip having bonding pads formed on a main surface thereof, said bonding pads being arranged in a direction substantially parallel to longer edges of said rectangular shaped semiconductor chip and in a zigzag formation; and leads being arranged on said main surface of said rectangular shaped semiconductor chip, each of said leads being electrically connected with a corresponding bonding pad.

13. A semiconductor device comprising:

a rectangular shaped semiconductor chip having bonding pads formed on a main surface thereof, said bonding pads being arranged in a direction substantially parallel to longer edges of said rectangular shaped semiconductor chip and in a zigzag formation;

leads being arranged over said main surface of said rectangular shaped semiconductor chip;

an insulating film being disposed between said main surface of said rectangular shaped semiconductor chip and said leads, said leads being adhered to said main surface of said rectangular shaped semiconductor chip via said insulating film;

wires electrically connecting said bonding pads with said leads; and a molding resin which seals said rectangular shaped semiconductor chip, a portion of each of said leads, said insulating film and said wires.

14. A semiconductor device according to claim 13, wherein said leads include a signal lead and a fixed potential lead, and wherein said fixed potential lead has a portion extending along said bonding pads.

* * * * *

UNITED STATES PATENT AND TRADEMARK OFFICE
CERTIFICATE OF CORRECTION

PATENT NO.   : 5,854,508
DATED        : December 29, 1998
INVENTOR(S)  : Kazuhiko Kajigaya et al.

It is certified that error appears in the above-identified patent and that said Letters Patent is hereby corrected as shown below:

<u>Title page,</u>
Item [63], Related U.S. Application Data, replace "Patent No. 5,548,547" with -- Patent No. 5,602,771 --.

Signed and Sealed this

Twenty-fourth Day of September, 2002

*Attest:*

*Attesting Officer*

JAMES E. ROGAN
*Director of the United States Patent and Trademark Office*